(12) United States Patent
Ruzicka et al.

(10) Patent No.: US 12,372,858 B2
(45) Date of Patent: Jul. 29, 2025

(54) SHAPE MEMORY ALLOY ACTUATORS AND METHODS THEREOF

(71) Applicant: Hutchinson Technology Incorporated, Hutchinson, MN (US)

(72) Inventors: Ryan N. Ruzicka, Waconia, MN (US); Yasushi Sakamoto, Hutchinson, MN (US); Mark A. Miller, Hutchinson, MN (US)

(73) Assignee: Hutchinson Technology Incorporated, Hutchinson, MN (US)

( * ) Notice: Subject to any disclaimer, the term of this patent is extended or adjusted under 35 U.S.C. 154(b) by 0 days.

(21) Appl. No.: 18/407,667

(22) Filed: Jan. 9, 2024

(65) Prior Publication Data

US 2024/0184188 A1   Jun. 6, 2024

Related U.S. Application Data

(60) Continuation of application No. 18/103,745, filed on Jan. 31, 2023, now Pat. No. 11,892,759, which is a
(Continued)

(51) Int. Cl.
*G03B 17/56* (2021.01)
*F03G 7/06* (2006.01)
(Continued)

(52) U.S. Cl.
CPC ......... *G03B 17/563* (2013.01); *F03G 7/0665* (2021.08); *G02B 6/3576* (2013.01); *G02B 6/3859* (2013.01); *G03B 17/38* (2013.01); *H10N 30/50* (2023.02); *G03B 2205/0061* (2013.01); *G03B 2205/0076* (2013.01)

(58) Field of Classification Search
CPC ................... H10N 30/00; H10N 30/50; G03B 2205/0076; G03B 2205/0061
See application file for complete search history.

(56) References Cited

U.S. PATENT DOCUMENTS 5,588,295 A   12/1996   Brotz
6,367,252 B1   4/2002   Hill et al.
(Continued)

FOREIGN PATENT DOCUMENTS

CA   2018302 A1   11/1991
CN   1333178 A   1/2002
(Continued)

OTHER PUBLICATIONS

Beyer et al., "Resistance Welding of TiNi-Shape Memory Alloys", European Symposium on Martensitic Transformations (ESOMAT), pp. 199-206, 1989.
(Continued)

*Primary Examiner* — Minh Q Phan
(74) *Attorney, Agent, or Firm* — DLA Piper LLP (US)

(57) ABSTRACT

SMA actuators and related methods are described. One embodiment of an actuator includes a base; a plurality of buckle arms; and at least a first shape memory alloy wire coupled with a pair of buckle arms of the plurality of buckle arms. Another embodiment of an actuator includes a base and at least one bimorph actuator including a shape memory alloy material. The bimorph actuator attached to the base.

13 Claims, 90 Drawing Sheets

Related U.S. Application Data division of application No. 17/569,268, filed on Jan. 5, 2022, now Pat. No. 11,815,794, which is a continuation-in-part of application No. 17/412,030, filed on Aug. 25, 2021, now Pat. No. 12,049,877, which is a division of application No. 16/775,207, filed on Jan. 28, 2020, now Pat. No. 11,105,319, which is a continuation-in-part of application No. 15/971,995, filed on May 4, 2018, now Pat. No. 10,920,755.

(60) Provisional application No. 63/152,299, filed on Feb. 22, 2021, provisional application No. 62/826,106, filed on Mar. 29, 2019, provisional application No. 62/650,991, filed on Mar. 30, 2018, provisional application No. 62/502,568, filed on May 5, 2017.

(51) Int. Cl.
   *G02B 6/35*     (2006.01)
   *G02B 6/38*     (2006.01)
   *G03B 17/38*    (2021.01)
   *H10N 30/50*    (2023.01)

(56) References Cited

U.S. PATENT DOCUMENTS

| | | | |
|---|---|---|---|
| 6,384,514 | B1 | 5/2002 | Slutskiy et al. |
| 6,698,201 | B1 | 3/2004 | Sarkar et al. |
| 7,256,518 | B2 | 8/2007 | Gummin et al. |
| 7,349,236 | B2 | 3/2008 | Lin et al. |
| 7,444,812 | B2 | 11/2008 | Kirkpatirck et al. |
| 8,448,436 | B2 | 5/2013 | Browne et al. |
| 8,607,619 | B2 | 12/2013 | Djakov et al. |
| 8,707,694 | B2 | 4/2014 | Olson et al. |
| 9,362,853 | B2 | 6/2016 | Dehe |
| 9,581,147 | B2 | 2/2017 | Flaschentrager et al. |
| 10,270,959 | B1 | 4/2019 | Bart et al. |
| 10,427,934 | B1 | 10/2019 | Coutu, Jr. et al. |
| 10,920,755 | B2 | 2/2021 | Miller et al. |
| 11,105,319 | B2 | 8/2021 | Miller et al. |
| 11,199,183 | B2 | 12/2021 | Miller et al. |
| 11,306,706 | B2 | 4/2022 | Ruzicka et al. |
| 11,333,134 | B2 | 5/2022 | Miller et al. |
| 11,448,853 | B2 | 9/2022 | Miller et al. |
| 11,668,288 | B2 | 6/2023 | Ruzicka et al. |
| 11,686,294 | B2 | 6/2023 | Miller et al. |
| 11,815,794 | B2 | 11/2023 | Ruzicka et al. |
| 11,859,598 | B2 | 1/2024 | Jelkin et al. |
| 11,867,160 | B2 | 1/2024 | Miller et al. |
| 11,892,759 | B2 | 2/2024 | Ruzicka et al. |
| 11,982,263 | B1 | 5/2024 | Ruzicka |
| 12,049,877 | B2 | 7/2024 | Miller et al. |
| 12,055,844 | B2 | 8/2024 | Ruzicka et al. |
| 2001/0002226 | A1 | 5/2001 | Tanaka et al. |
| 2002/0057148 | A1 | 5/2002 | Johnson et al. |
| 2004/0256920 | A1 | 12/2004 | Gummin et al. |
| 2004/0261411 | A1 | 12/2004 | MacGregor |
| 2005/0063038 | A1 | 3/2005 | Filhol |
| 2006/0038643 | A1 | 2/2006 | Xu et al. |
| 2006/0092514 | A1 | 5/2006 | Koo et al. |
| 2007/0030573 | A1 | 2/2007 | Batchko et al. |
| 2007/0090314 | A1 | 4/2007 | Van Der Wijngaart et al. |
| 2007/0119165 | A1 | 5/2007 | Yson et al. |
| 2007/0279497 | A1 | 12/2007 | Wada et al. |
| 2007/0280668 | A1 | 12/2007 | Kubo et al. |
| 2008/0198249 | A1 | 8/2008 | Tanimura et al. |
| 2008/0247748 | A1 | 10/2008 | Tanimura et al. |
| 2008/0259467 | A1 | 10/2008 | Chung |
| 2008/0259470 | A1 | 10/2008 | Chung |
| 2008/0287167 | A1 | 11/2008 | Caine |
| 2009/0025501 | A1 | 1/2009 | Mitteer |
| 2009/0097140 | A1 | 4/2009 | Choi et al. |
| 2009/0159311 | A1 | 6/2009 | Zheng et al. |
| 2009/0167108 | A1 | 7/2009 | Yang |
| 2010/0027119 | A1 | 2/2010 | Kollar et al. |
| 2010/0060776 | A1 | 3/2010 | Topliss et al. |
| 2010/0074607 | A1 | 3/2010 | Topliss et al. |
| 2010/0276492 | A1 | 11/2010 | Wang et al. |
| 2011/0009979 | A1 | 1/2011 | Shaw et al. |
| 2011/0026148 | A1 | 2/2011 | Tanimura et al. |
| 2011/0063741 | A1 | 3/2011 | Park et al. |
| 2011/0102920 | A1 | 5/2011 | Shyu et al. |
| 2011/0103784 | A1 | 5/2011 | Hashizume et al. |
| 2011/0107758 | A1 | 5/2011 | Kotanagi et al. |
| 2011/0122201 | A1 | 5/2011 | Silverbrook |
| 2011/0169920 | A1 | 7/2011 | Ryu et al. |
| 2011/0179786 | A1 | 7/2011 | Topliss et al. |
| 2011/0217031 | A1 | 9/2011 | Eromaki |
| 2011/0249131 | A1 | 10/2011 | Topliss et al. |
| 2011/0249336 | A1 | 10/2011 | Sato |
| 2012/0019675 | A1 | 1/2012 | Brown |
| 2012/0026387 | A1 | 2/2012 | Kosaka et al. |
| 2012/0108980 | A1 | 5/2012 | Shilling et al. |
| 2012/0174571 | A1 | 7/2012 | Villanueva et al. |
| 2012/0249868 | A1 | 10/2012 | Kamatani et al. |
| 2013/0002933 | A1 | 1/2013 | Topliss et al. |
| 2013/0016419 | A1 | 1/2013 | Morita et al. |
| 2014/0007571 | A1 | 1/2014 | Jee |
| 2014/0028906 | A1 | 1/2014 | Chen |
| 2014/0298794 | A1 | 10/2014 | Flaschentrager et al. |
| 2014/0340575 | A1 | 11/2014 | Kim |
| 2014/0355120 | A1 | 12/2014 | Yeo |
| 2015/0090356 | A1 | 4/2015 | Clingman et al. |
| 2015/0146312 | A1 | 5/2015 | Gutierrez et al. |
| 2015/0289994 | A1 | 10/2015 | Engeberg et al. |
| 2015/0304561 | A1* | 10/2015 | Howarth ............... G02B 7/026 |
| | | | 348/374 |
| 2015/0346507 | A1 | 12/2015 | Howarth |
| 2016/0017870 | A1 | 1/2016 | Mather |
| 2016/0187613 | A1 | 6/2016 | Seo et al. |
| 2016/0201654 | A1 | 7/2016 | Apdalhaliem et al. |
| 2016/0227088 | A1 | 8/2016 | Brown et al. |
| 2017/0146769 | A1 | 5/2017 | Huang et al. |
| 2017/0219443 | A1 | 8/2017 | Davis et al. |
| 2017/0276122 | A1 | 9/2017 | Van Den Aker |
| 2018/0025974 | A1 | 1/2018 | Basker et al. |
| 2018/0033948 | A1 | 2/2018 | Ee |
| 2018/0052381 | A1 | 2/2018 | Koepfer |
| 2018/0120583 | A1 | 5/2018 | Avivi et al. |
| 2018/0171991 | A1 | 6/2018 | Miller et al. |
| 2019/0264664 | A1 | 8/2019 | Zamani et al. |
| 2019/0285060 | A1 | 9/2019 | Mirvakili et al. |
| 2020/0150443 | A1 | 5/2020 | Ebert |
| 2021/0131405 | A1 | 5/2021 | Miller et al. |
| 2021/0381497 | A1 | 12/2021 | Miller et al. |
| 2023/0131889 | A1 | 4/2023 | Sturm et al. |
| 2023/0176457 | A1 | 6/2023 | Ruzicka et al. |
| 2023/0248579 | A1 | 8/2023 | Evans et al. |
| 2024/0036446 | A1 | 2/2024 | Ruzicka et al. |
| 2024/0077782 | A1 | 3/2024 | Miller et al. |
| 2024/0125306 | A1 | 4/2024 | Miller |
| 2024/0344505 | A1 | 10/2024 | Ruzicka et al. |

FOREIGN PATENT DOCUMENTS

| | | |
|---|---|---|
| CN | 101896719 A | 11/2010 |
| CN | 101923633 A | 12/2010 |
| CN | 102055890 A | 5/2011 |
| CN | 102099939 A | 6/2011 |
| CN | 103168264 A | 6/2013 |
| CN | 103670980 A | 3/2014 |
| CN | 104364699 A | 2/2015 |
| CN | 105164413 A | 12/2015 |
| CN | 105487194 A | 4/2016 |
| CN | 107735712 A | 2/2018 |
| CN | 110709757 A | 1/2020 |
| CN | 112654786 A | 4/2021 |
| CN | 111396274 B | 5/2022 |
| EP | 1 243 793 A2 | 9/2002 |
| EP | 1 630 416 A1 | 3/2006 |
| EP | 2 262 095 A1 | 12/2010 |
| EP | 2 551 523 A1 | 1/2013 |
| GB | 2577203 A | 3/2020 |

(56) References Cited

FOREIGN PATENT DOCUMENTS

| JP | 4-337222 A | 11/1992 |
|---|---|---|
| JP | 2000-137155 A | 5/2000 |
| JP | 2002-98911 A | 4/2002 |
| JP | 2009-251244 A | 10/2009 |
| JP | 2016-501338 A | 1/2016 |
| JP | 2019-28439 A | 2/2019 |
| KR | 10-2020-0003864 A | 1/2020 |
| TW | 201106039 A | 2/2011 |
| WO | WO 00/58980 A1 | 10/2000 |
| WO | WO 2009/072748 A1 | 6/2009 |
| WO | WO 2012/020212 A1 | 2/2012 |
| WO | WO 2016/189314 A1 | 12/2016 |
| WO | WO 2018/204888 A1 | 11/2018 |
| WO | WO 2020/205453 A1 | 10/2020 |

OTHER PUBLICATIONS

International Search Report and Written Opinion in International Application No. PCT/US2018/031256 dated Oct. 15, 2018.
International Preliminary Report on Patentability in International Application No. PCT/US2018/031256 dated Nov. 14, 2019.
Office Action in Chinese Patent Application No. 201880029763.5 dated Apr. 29, 2021.
Office Action in Chinese Patent Application No. 201880029763.5 dated Dec. 20, 2021.
Office Action in Chinese Patent Application No. 201880029763.5 dated May 20, 2022.
Notice of Granting Patent Right for Invention in Chinese Patent Application No. 201880029763.5 dated Aug. 23, 2022.
Examination Report in United Kingdom Application No. 1917208.9 dated Aug. 13, 2021.
Examination Report in United Kingdom Application No. 1917208.9 dated Oct. 22, 2021.
Examination Report in United Kingdom Application No. 1917208.9 dated Mar. 8, 2022.
Search Report in United Kingdom Application No. 1917208.9 dated Mar. 30, 2022.
Notice of Preliminary Rejection in Korean Application No. 10-2019-7035566 dated Jan. 4, 2023.
Notice of Allowance in Korean Application No. 10-2019-7035566 dated Jul. 1, 2023.
Combined Search and Examination Report in United Kingdom Application No. 2206304.4 dated May 17, 2022.
International Search Report and Written Opinion in International Application No. PCT/US2020/025065 dated Jun. 23, 2020.
International Preliminary Report on Patentability in International Application No. PCT/US2020/025065 dated Oct. 14, 2021.
Office Action in Chinese Patent Application No. 202080004847.0 dated Jul. 1, 2022.
Office Action in Chinese Patent Application No. 202080004847.0 dated Jan. 28, 2023.
Examination Report in United Kingdom Application No. 2113598.3 dated Jun. 23, 2022.
Office Action in Japanese Patent Application No. 2021-557623 dated Dec. 5, 2023.
Office Action in Taiwan Patent Application No. 109110412 dated Sep. 11, 2023.
International Search Report and Written Opinion in International Application No. PCT/US2021/037947 dated Sep. 23, 2021.
International Preliminary Report on Patentability in International Application No. PCT/US2021/037947 dated Jan. 5, 2023.
Examination Report in United Kingdom Application No. 2219080.5 dated Dec. 12, 2023.
International Search Report and Written Opinion in International Application No. PCT/US2021/036211 dated Sep. 8, 2021.
International Preliminary Report on Patentability in International Application No. PCT/US2021/036211 dated Dec. 22, 2022.
Examination Report in United Kingdom Application No. 2218440.2 dated Nov. 29, 2023.
Combined Search and Examination Report in United Kingdom Application No. 2114527.1 dated Mar. 9, 2022.
Office Action in Chinese Utility Model Application No. 202121424905.3 dated Oct. 27, 2021.
International Search Report and Written Opinion in International Application No. PCT/US2022/017100 dated Jun. 2, 2022.
International Preliminary Report on Patentability in International Application No. PCT/US2022/017100 dated Aug. 31, 2023.
Office Action in Chinese Patent Application No. 202111072217.X dated Dec. 1, 2022.
Office Action in Chinese Utility Model Application No. 202222023197.3 dated Oct. 11, 2022.
International Search Report and Written Opinion in International Application No. PCT/US2022/032259 dated Sep. 22, 2022.
International Preliminary Report on Patentability in International Application No. PCT/US2022/032259 dated Dec. 21, 2023.
Office Action in Chinese Patent Application No. 202111072378.9 dated Dec. 1, 2022.
Office Action in Chinese Patent Application No. 202111072378.9 dated Apr. 28, 2023.
International Search Report and Written Opinion in International Application No. PCT/US2023/035154 dated Mar. 22, 2024.
Office Action in U.S. Appl. No. 15/971,995 dated Aug. 22, 2019.
Office Action in U.S. Appl. No. 15/971,995 dated Nov. 20, 2019.
Office Action in U.S. Appl. No. 15/971,995 dated Apr. 28, 2020.
Notice of Allowance in U.S. Appl. No. 15/971,995 dated Sep. 30, 2020.
Office Action in U.S. Appl. No. 17/146,213 dated Nov. 22, 2023.
Office Action in U.S. Appl. No. 17/146,213 dated Mar. 19, 2024.
Office Action in U.S. Appl. No. 16/775,207 dated Jun. 5, 2020.
Office Action in U.S. Appl. No. 16/775,207 dated Jun. 9, 2020.
Office Action in U.S. Appl. No. 16/775,207 dated Sep. 30, 2020.
Office Action in U.S. Appl. No. 16/775,207 dated Jan. 11, 2021.
Notice of Allowance in U.S. Appl. No. 16/775,207 dated Apr. 28, 2021.
Office Action in U.S. Appl. No. 17/412,030 dated Sep. 21, 2023.
Office Action in U.S. Appl. No. 17/412,030 dated Dec. 22, 2023.
Notice of Allowance in U.S. Appl. No. 17/412,030 dated Apr. 9, 2024.
Office Action in U.S. Appl. No. 16/859,929 dated Jun. 9, 2020.
Office Action in U.S. Appl. No. 16/859,929 dated Sep. 24, 2020.
Office Action in U.S. Appl. No. 16/859,929 dated Apr. 16, 2021.
Notice of Allowance in U.S. Appl. No. 16/859,929 dated Aug. 3, 2021.
Office Action in U.S. Appl. No. 17/549,348 dated Oct. 28, 2022.
Office Action in U.S. Appl. No. 17/549,348 dated Apr. 14, 2023.
Notice of Allowance in U.S. Appl. No. 17/549,348 dated Aug. 23, 2023.
Office Action in U.S. Appl. No. 17/195,497 dated May 17, 2021.
Office Action in U.S. Appl. No. 17/195,497 dated Sep. 8, 2021.
Notice of Allowance in U.S. Appl. No. 17/195,497 dated Dec. 14, 2021.
Office Action in U.S. Appl. No. 17/339,797 dated Nov. 17, 2021.
Office Action in U.S. Appl. No. 17/339,797 dated Mar. 7, 2022.
Notice of Allowance in U.S. Appl. No. 17/339,797 dated May 16, 2022.
Notice of Allowance in U.S. Appl. No. 17/714,069 dated Jan. 24, 2023.
Office Action in U.S. Appl. No. 17/207,530 dated May 27, 2021.
Office Action in U.S. Appl. No. 17/207,530 dated Sep. 8, 2021.
Notice of Allowance in U.S. Appl. No. 17/207,530 dated Jan. 18, 2022.
Office Action in U.S. Appl. No. 17/729,877 dated Oct. 13, 2022.
Notice of Allowance in U.S. Appl. No. 17/729,877 dated Feb. 14, 2023.
Office Action in U.S. Appl. No. 17/569,268 dated Jan. 27, 2023.
Office Action in U.S. Appl. No. 17/569,268 dated May 25, 2023.
Notice of Allowance in U.S. Appl. No. 17/569,268 dated Aug. 1, 2023.
Office Action in U.S. Appl. No. 18/103,725 dated Jun. 14, 2023.
Office Action in U.S. Appl. No. 18/103,725 dated Oct. 4, 2023.
Office Action in U.S. Appl. No. 18/103,725 dated Jan. 19, 2024.

(56) References Cited

OTHER PUBLICATIONS

Notice of Allowance in U.S. Appl. No. 18/103,725 dated Apr. 24, 2024.
Office Action in U.S. Appl. No. 18/103,745 dated Jun. 14, 2023.
Notice of Allowance in U.S. Appl. No. 18/103,745 dated Sep. 22, 2023.
Office Action in U.S. Appl. No. 18/379,105 dated Apr. 22, 2024.
Office Action in U.S. Appl. No. 17/831,318 dated Apr. 20, 2023.
Notice of Allowance in U.S. Appl. No. 17/831,318 dated Aug. 14, 2023.
Office Action in U.S. Appl. No. 18/142,471 dated Sep. 19, 2023.
Notice of Allowance in U.S. Appl. No. 18/142,471 dated Jan. 18, 2024.
International Search Report and Written Opinion in International Application No. PCT/US2024/022084 dated Aug. 7, 2024.
Combined Search and Examination Report in United Kingdom Application No. 2406075.8 dated Sep. 17, 2024.
Office Action in U.S. Appl. No. 18/379,105 dated Aug. 14, 2024.
Notice of Reasons for Rejection in Japanese Patent Application No. 2021-557623 dated Jul. 2, 2024.
Decision of Rejection in Taiwan Patent Application No. 109110412 dated Mar. 13, 2024.
Office Action in U.S. Appl. No. 17/146,213 dated Jul. 25, 2024.

\* cited by examiner

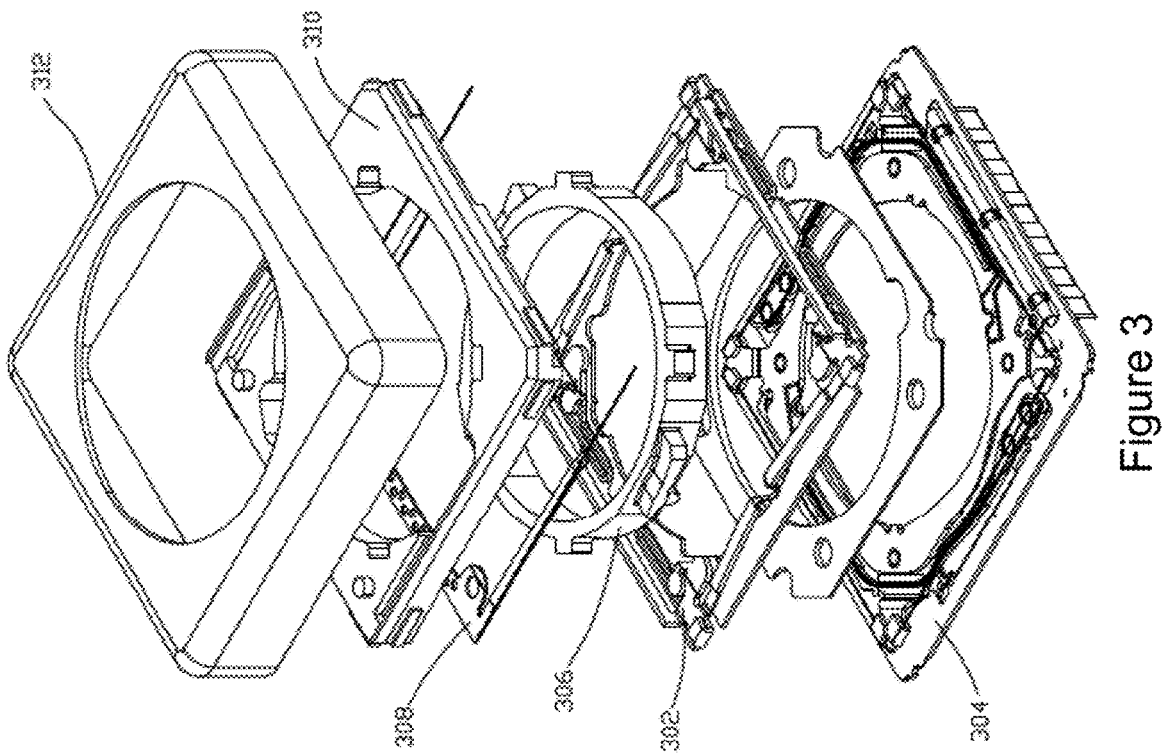
Figure 3
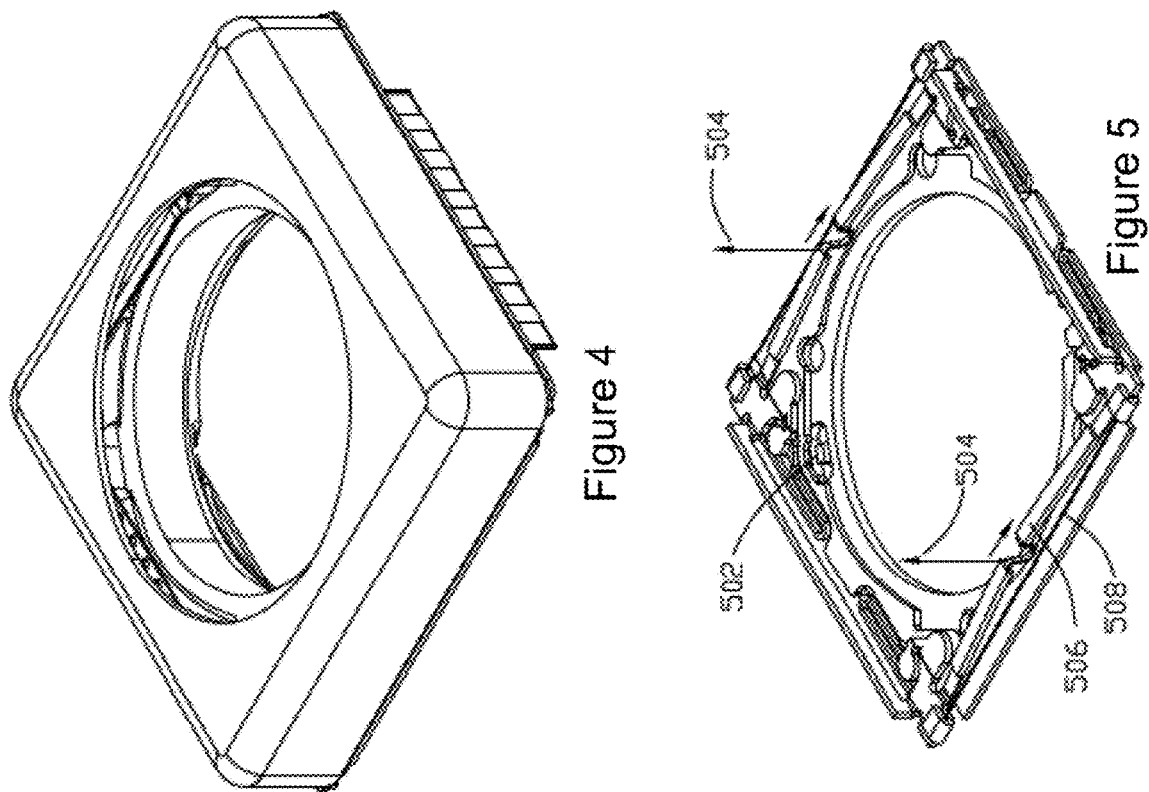
Figure 4
Figure 5

Static tail pads to bond to camera board below camera

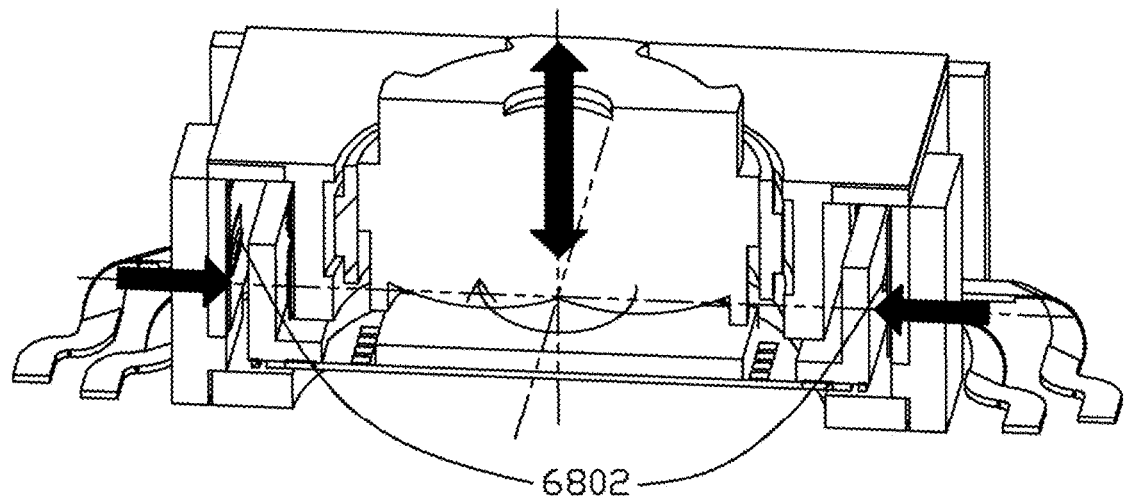
Figure 70
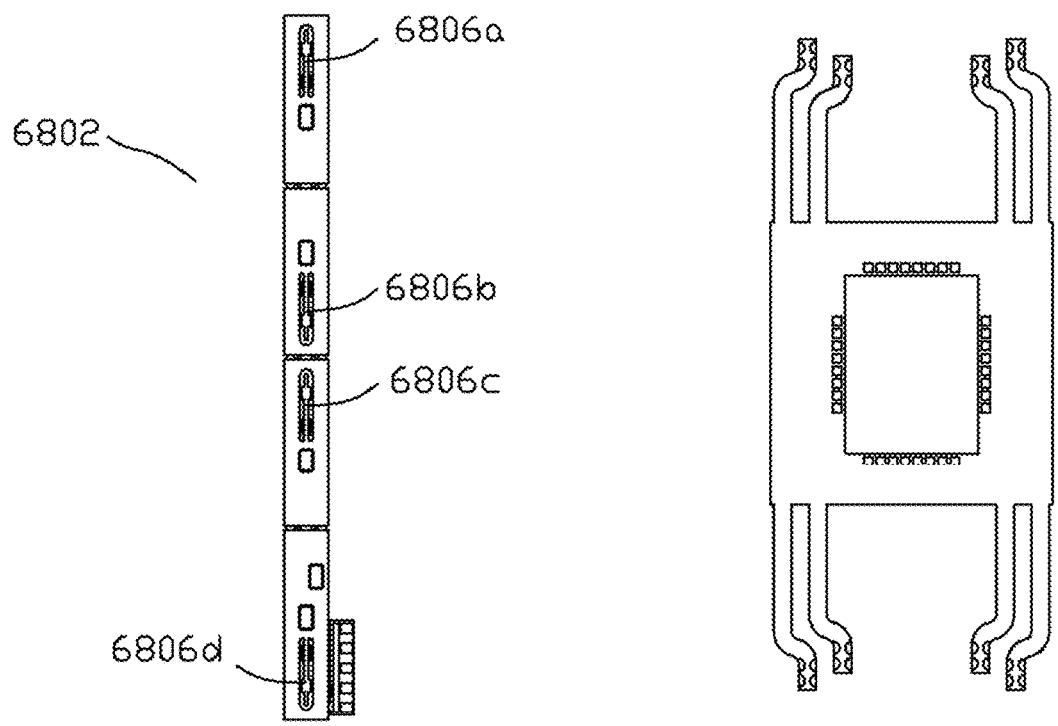
Figure 71
Figure 72

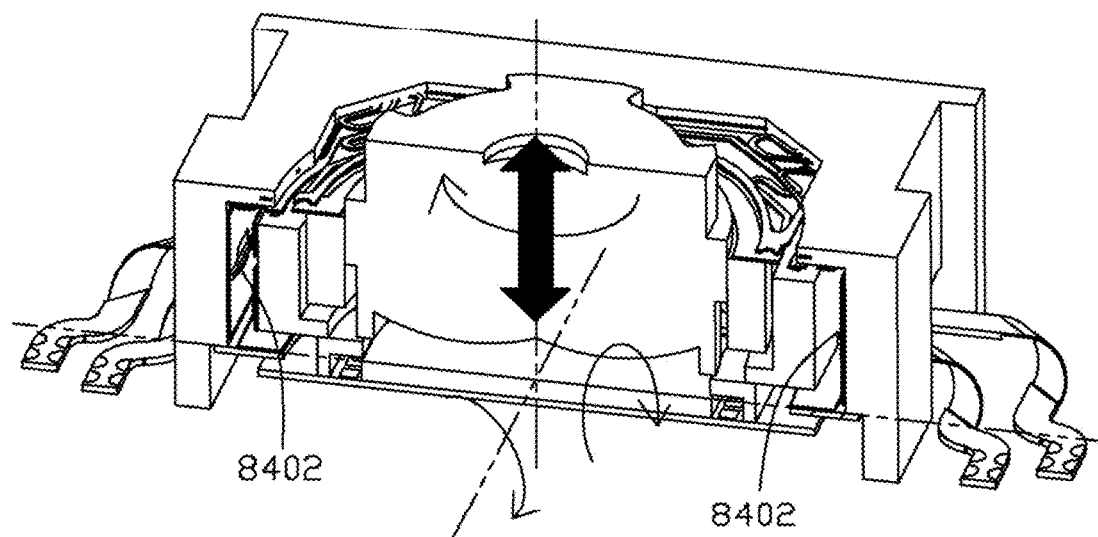
Figure 85
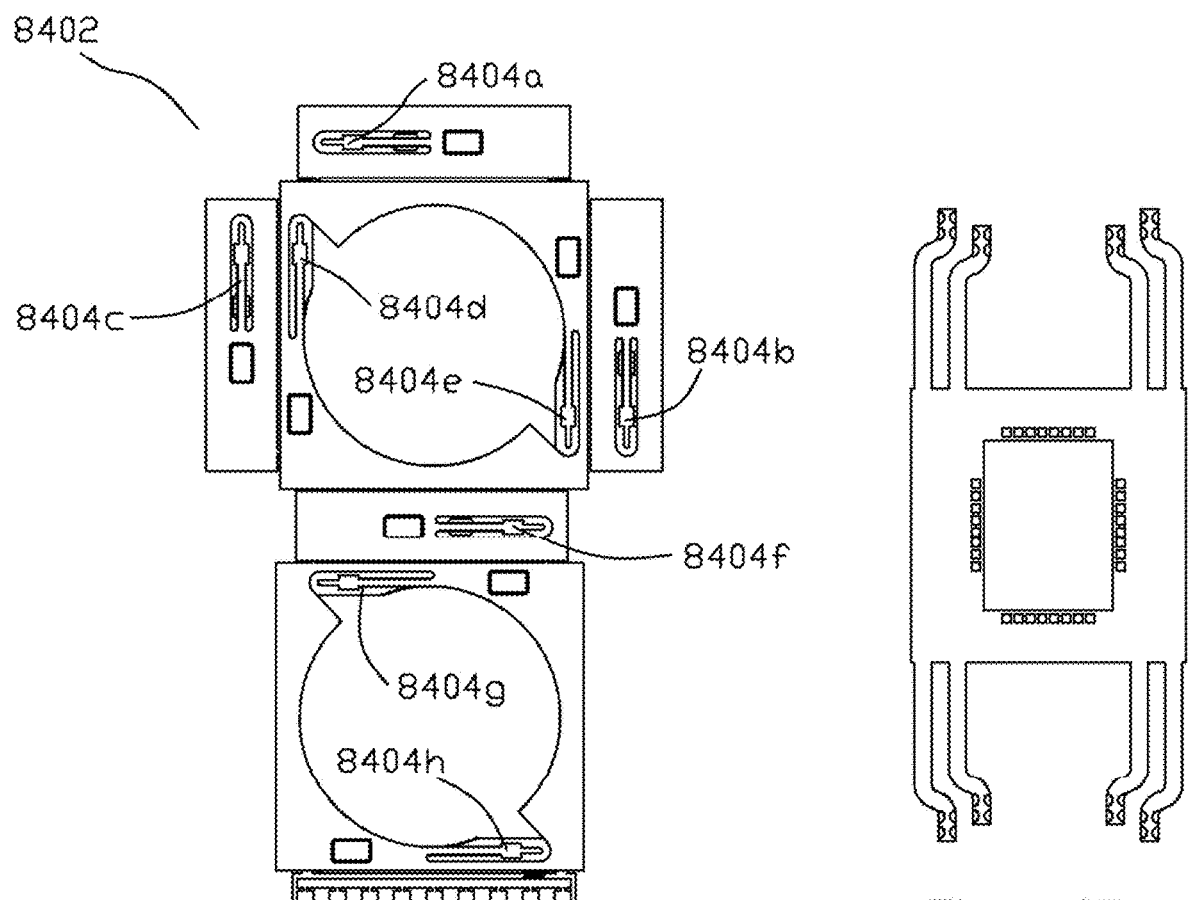
Figure 86
Figure 87

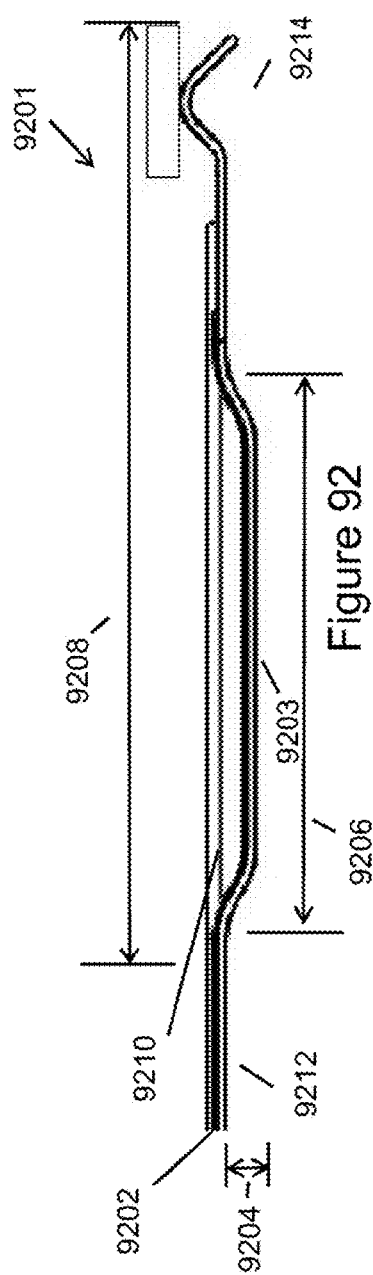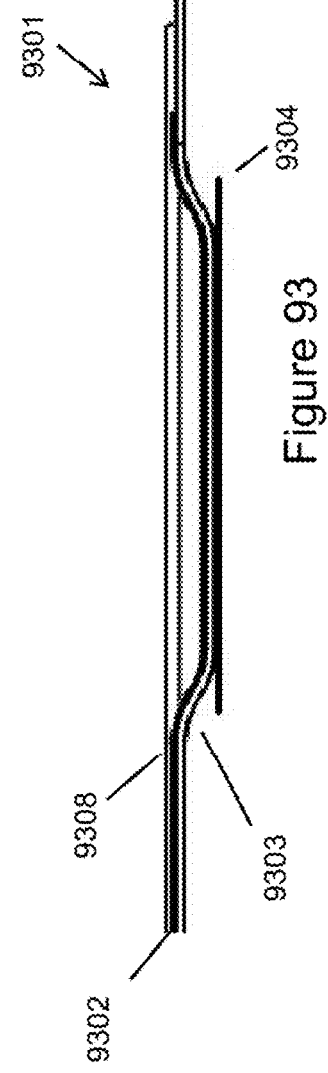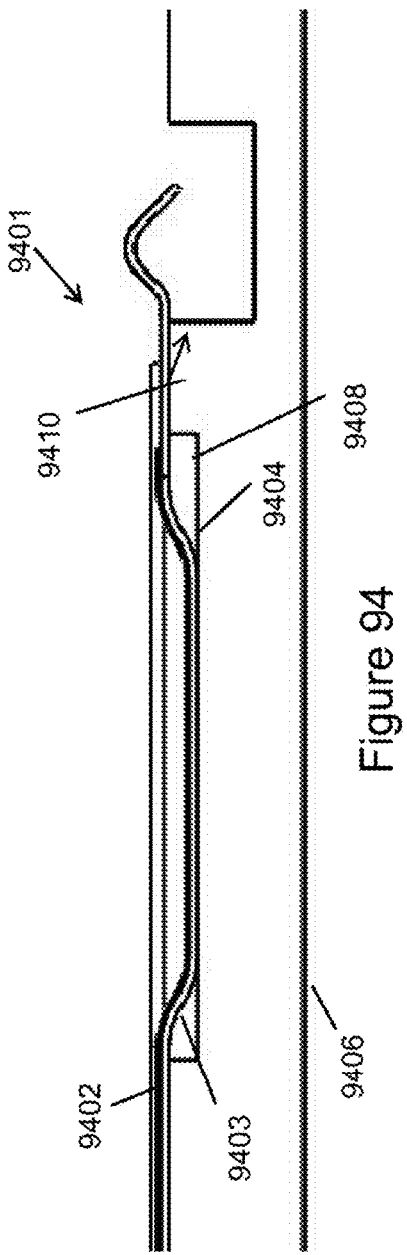

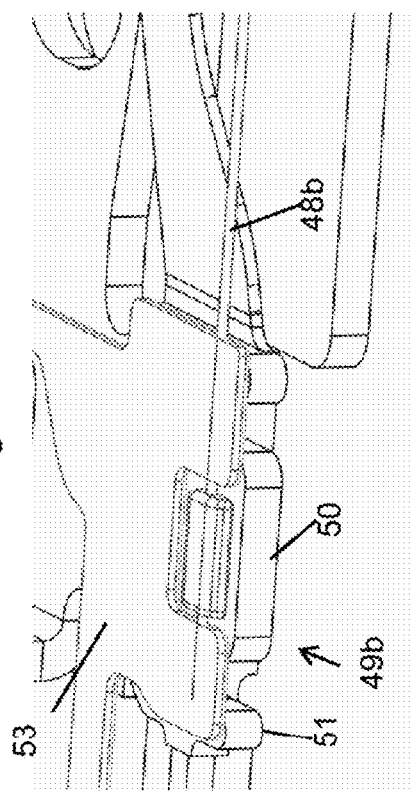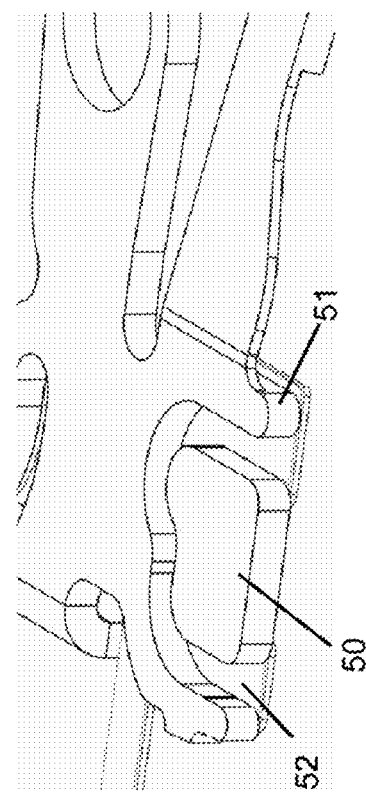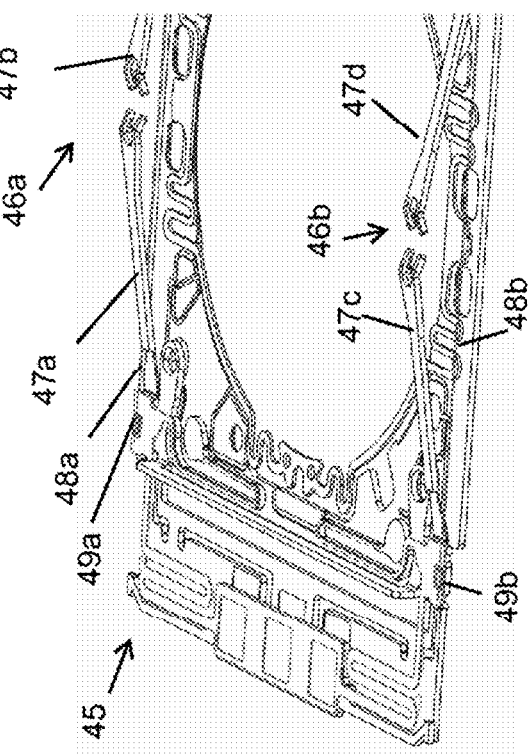

SHAPE MEMORY ALLOY ACTUATORS AND METHODS THEREOF

CROSS-REFERENCE TO RELATED APPLICATIONS

This application is a continuation of U.S. patent application Ser. No. 18/103,745, filed on Jan. 31, 2023, which is a divisional of U.S. patent application Ser. No. 17/569,268, filed on Jan. 5, 2022, now U.S. Pat. No. 11,815,794, which claims the benefit of U.S. Provisional Patent Application No. 63/152,299, filed on Feb. 22, 2021 and is a continuation-in-part of U.S. patent application Ser. No. 17/412,030, filed on Aug. 25, 2021, which is a divisional of U.S. patent application Ser. No. 16/775,207, filed on Jan. 28, 2020, now U.S. Pat. No. 11,105,319, which claims the benefit of U.S. Provisional Patent Application No. 62/826,106, filed on Mar. 29, 2019 and is a continuation-in-part of U.S. patent application Ser. No. 15/971,995, filed on May 4, 2018, now U.S. Pat. No. 10,920,755, which claims the benefit of U.S. Provisional Patent Application No. 62/502,568, filed on May 5, 2017 and U.S. Provisional Patent Application No. 62/650,991, filed on Mar. 30, 2018, all of which are hereby incorporated by reference in their entireties.

FIELD

Embodiments of the invention relate to the field of shape memory alloy systems. More particularly, embodiments of the invention relate to the field of shape memory alloy actuators and methods related thereto.

BACKGROUND

Shape memory alloy ("SMA") systems have a moving assembly or structure that for, example, can be used in conjunction with a camera lens element as an auto-focusing drive. These systems may be enclosed by a structure such as a screening can. The moving assembly is supported for movement on a support assembly by a bearing such as plural balls. The flexure element, which is formed from metal such as phosphor bronze or stainless steel, has a moving plate and flexures. The flexures extend between the moving plate and the stationary support assembly and function as springs to enable the movement of the moving assembly with respect to the stationary support assembly. The balls allow the moving assembly to move with little resistance. The moving assembly and support assembly are coupled by four shape memory alloy (SMA) wires extending between the assemblies. Each of the SMA wires has one end attached to the support assembly, and an opposite end attached to the moving assembly. The suspension is actuated by applying electrical drive signals to the SMA wires. However, these types of systems are plagued by the complexity of the systems that result in bulky systems that require a large foot print and a large height clearance. Further, the present systems fail to provide high Z-stroke range with a compact, low profile footprint.

SUMMARY

SMA actuators and related methods are described. One embodiment of an actuator includes a base; a plurality of buckle arms; and at least a first shape memory alloy wire coupled with a pair of buckle arms of the plurality of buckle arms. Another embodiment of an actuator includes a base and at least one bimorph actuator including a shape memory alloy material. The bimorph actuator attached to the base.

Other features and advantages of embodiments of the present invention will be apparent from the accompanying drawings and from the detailed description that follows.

BRIEF DESCRIPTION OF THE DRAWINGS

Embodiments of the present invention are illustrated by way of example and not limitation in the figures of the accompanying drawings, in which like references indicate similar elements and in which:

FIG. 3 illustrates an exploded view of an autofocus assembly including an SMA wire actuator according to an embodiment;

FIG. 4 illustrates the autofocus assembly including a SMA actuator according to an embodiment;

FIG. 5 illustrates an SMA actuator according to an embodiment including a sensor;

FIG. 70 illustrates a cross-section of SMA system including a SMA actuator according to an embodiment including bimorph actuators configured as a three axis sensor shift OIS;

FIG. 71 illustrates a box bimorph actuator component according to an embodiment;

FIG. 72 illustrates a flexible sensor circuit for use in a SMA system according to an embodiment;

FIG. 85 illustrates a cross-section of SMA system including a SMA actuator according to an embodiment including bimorph actuators;

FIG. 86 illustrates box bimorph actuator for use in a SMA system according to an embodiment;

FIG. 87 illustrates a flexible sensor circuit for use in a SMA system according to an embodiment;

FIG. 92 illustrates a bimorph arm with an offset according to an embodiment;

FIG. 93 illustrates a bimorph arm with an offset and a limiter according to an embodiment;

FIG. 94 illustrates a bimorph arm with an offset and a limiter according to an embodiment;

FIG. 104 illustrates an SMA actuator 45 including a buckle actuator according to an embodiment;

FIGS. 105a-b illustrate a resistance weld crimp including an island for an SMA actuator according to an embodiment;

FIG. 118 illustrates an unfixed, load point end of a bimorph arm according to an embodiment;

FIG. 119 illustrates an unfixed, load point end of a bimorph arm according to an alternative embodiment;

FIG. 120 illustrates an unfixed, load point end of a bimorph arm according to an alternative embodiment;

FIG. 121 illustrates an unfixed, load point end of a bimorph arm according to an alternative embodiment;

FIG. 122 illustrates an unfixed, load point end of a bimorph arm according to an alternative embodiment;

FIG. 123 illustrates a fixed end of a bimorph arm according to an embodiment;

FIG. 124 illustrates a fixed end of a bimorph arm according to an embodiment;

FIG. 125 illustrates a fixed end of a bimorph arm according to an embodiment;

FIG. 126 illustrates a balanced bimorph actuator according to an embodiment including two bimorph arms arranged in a staggered orientation;

FIG. 127 illustrates an optical image stabilization including balanced bimorph actuators according to an embodiment;

FIG. 128 illustrates a balanced bimorph actuator according to an embodiment including two bimorph arms arranged in an in-line orientation;

FIG. 129 illustrates a top view of a balanced bimorph actuator according to an embodiment including two bimorph arms arranged in an in-line orientation;

Figure 130:
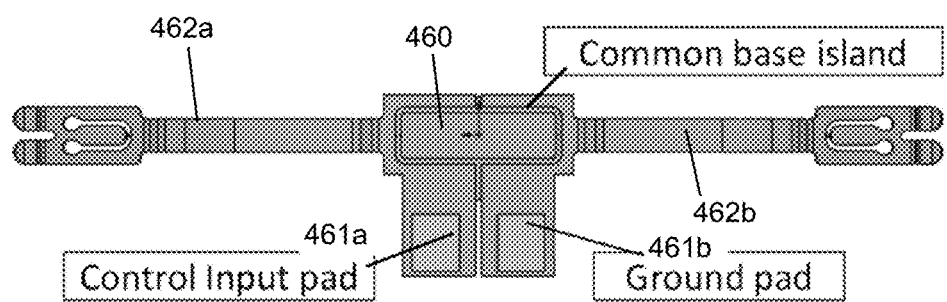
Figure 131:
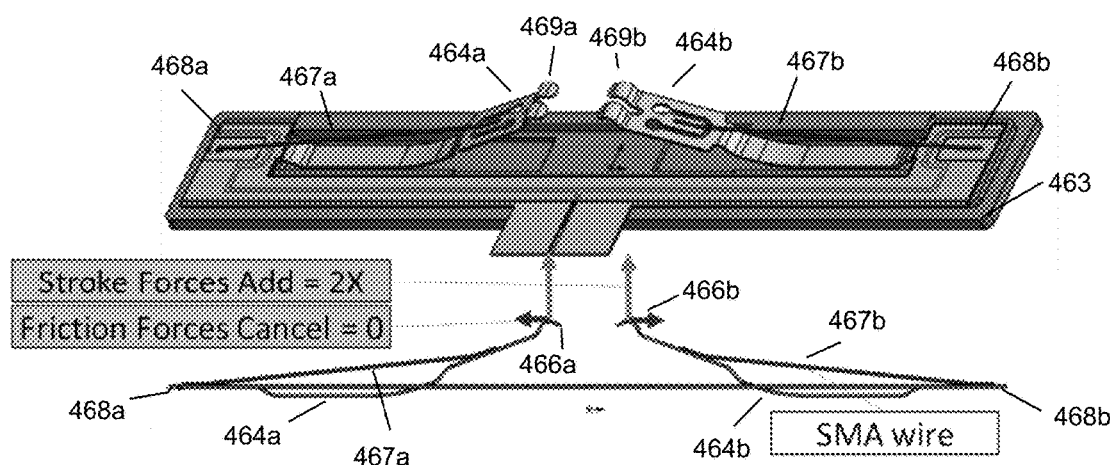
Figure 132:
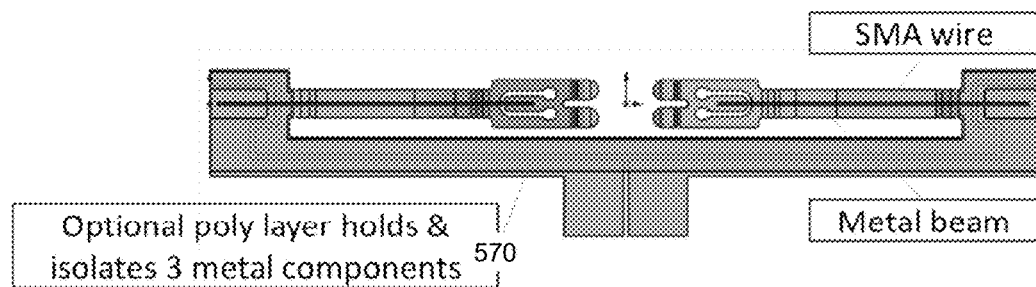
Figure 133:
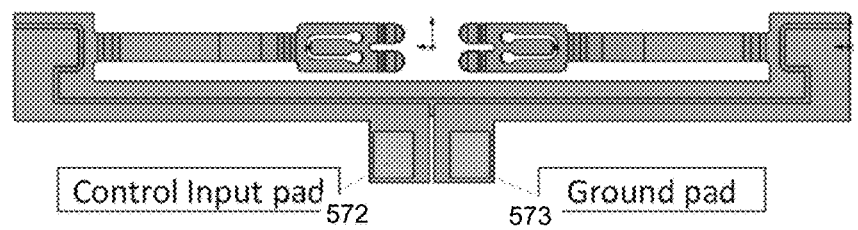
Figure 134:
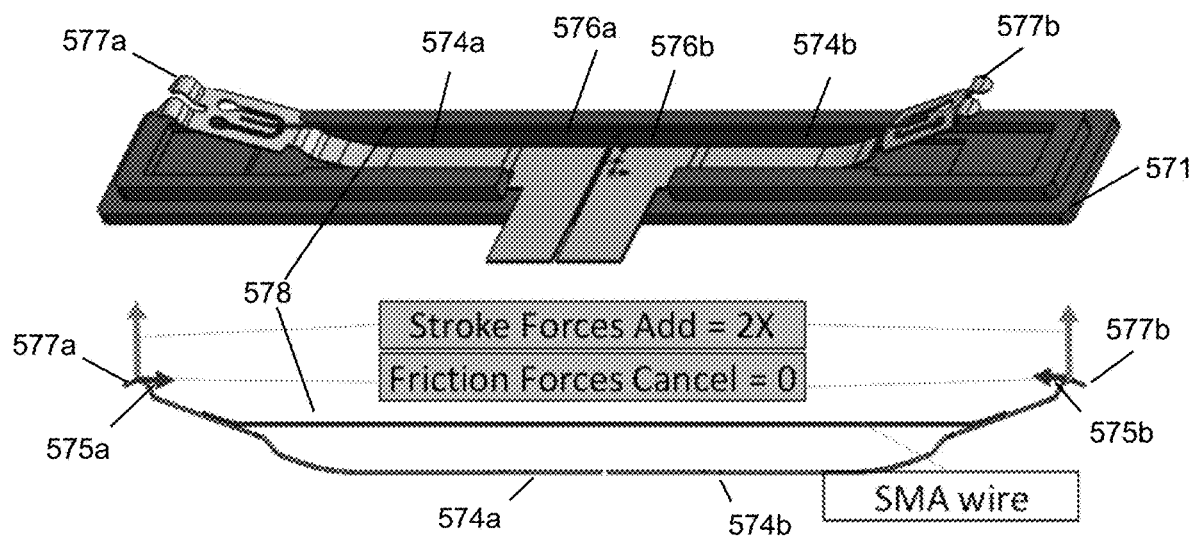
Figure 135:
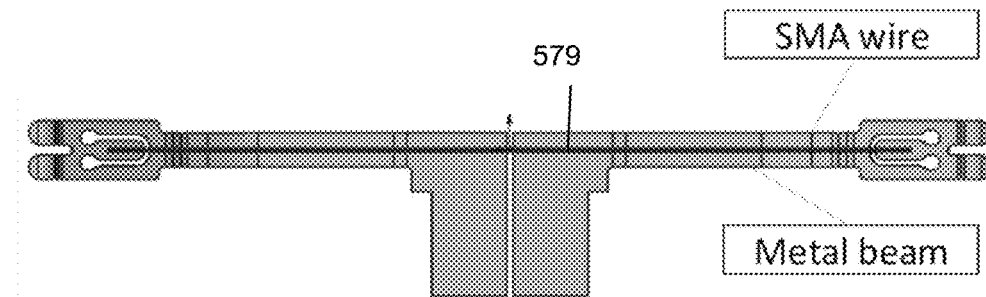
Figure 136:
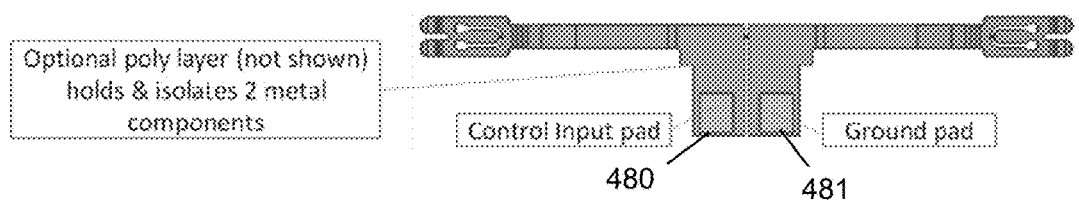
Figure 137:
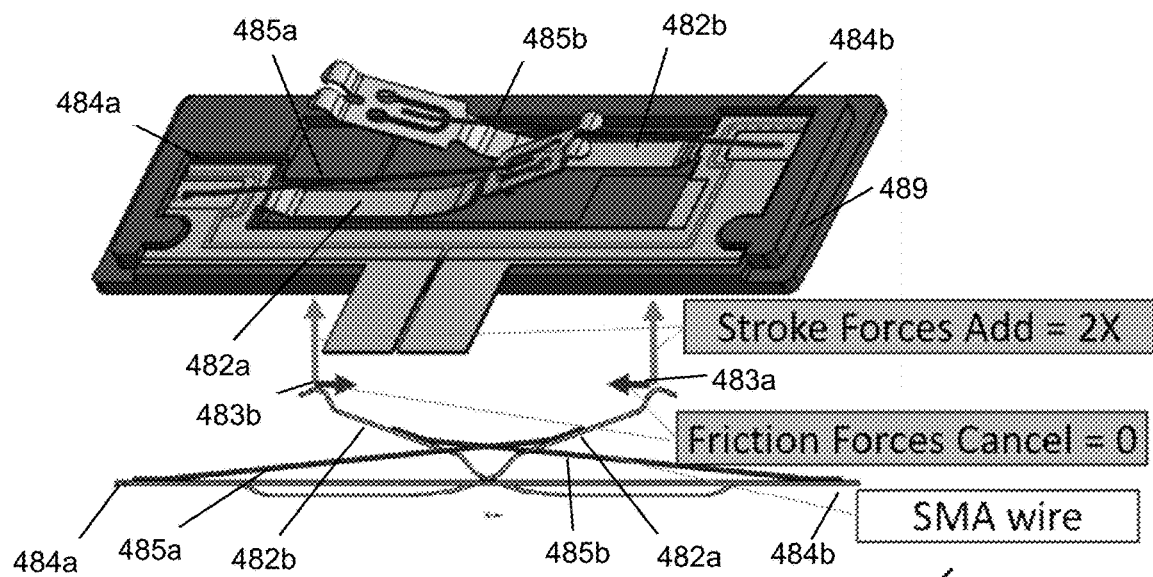
Figure 138:
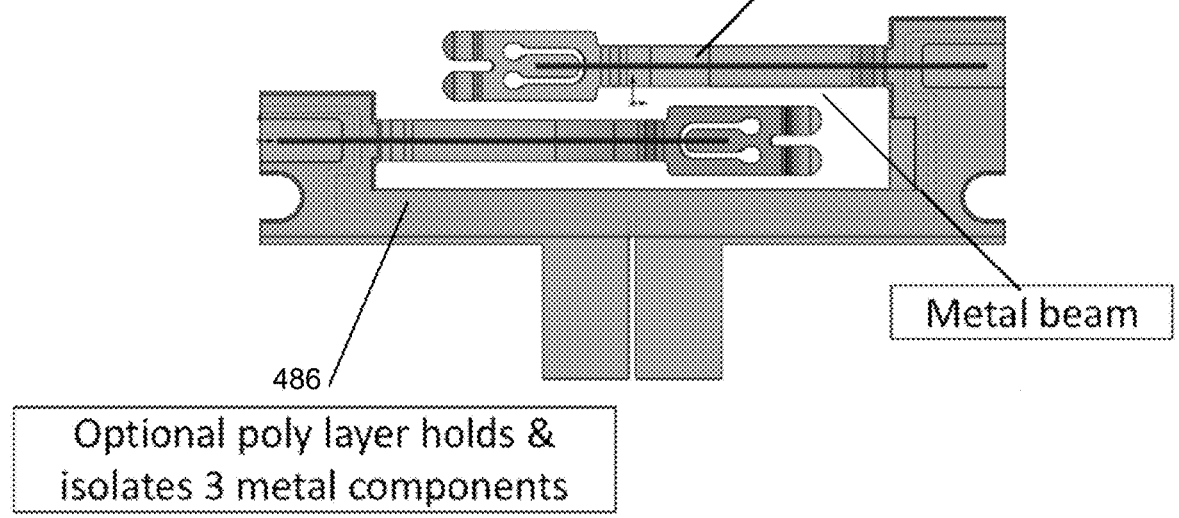
Figure 139:
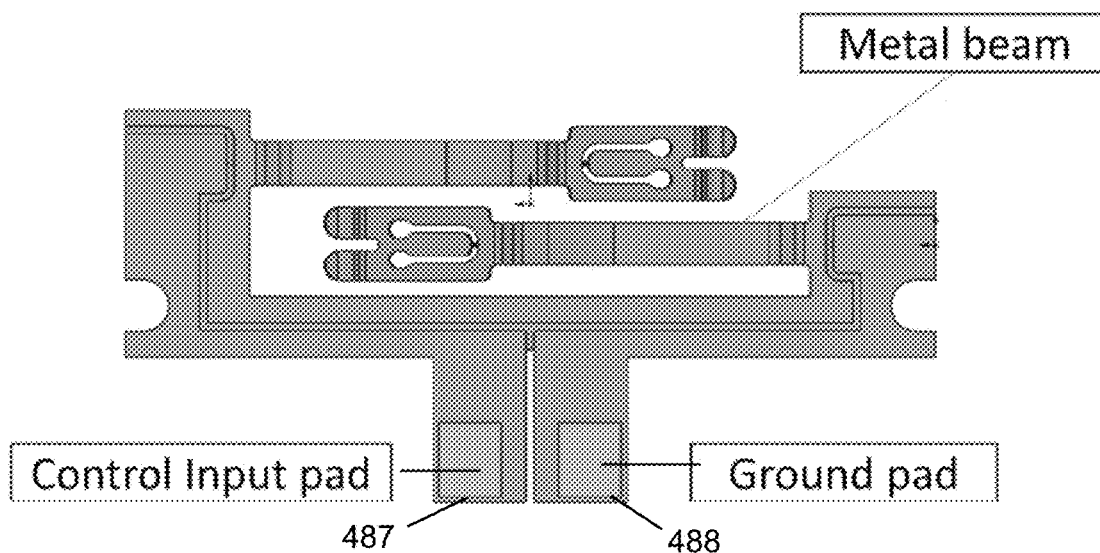
Figure 140:
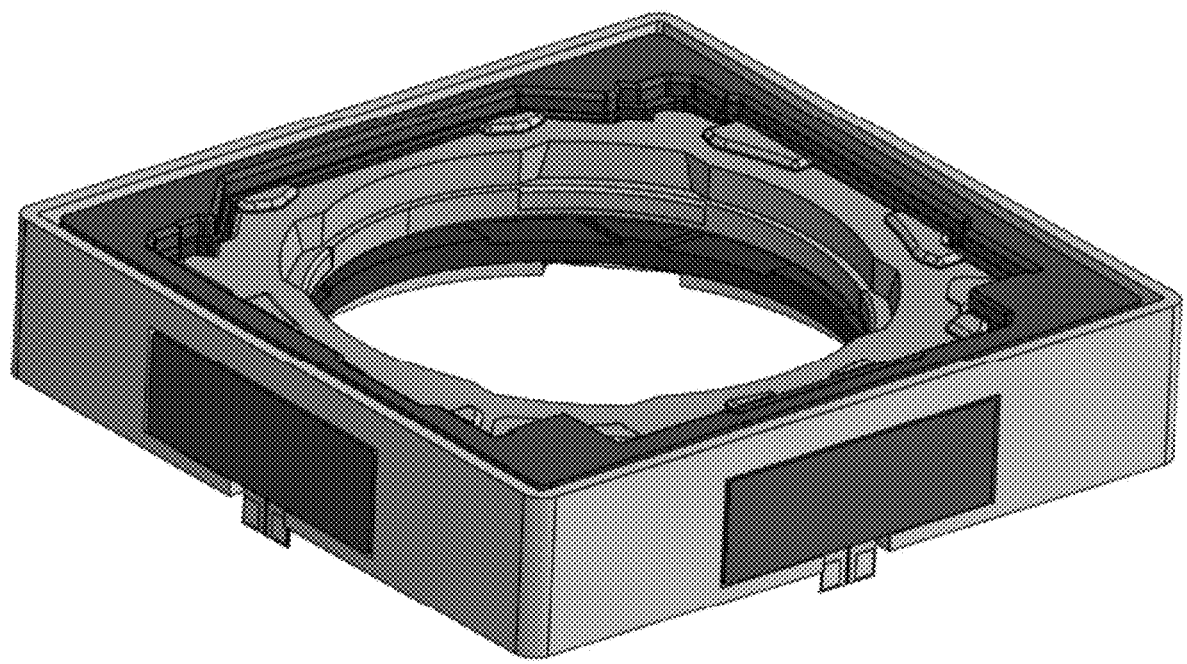
Figure 141:
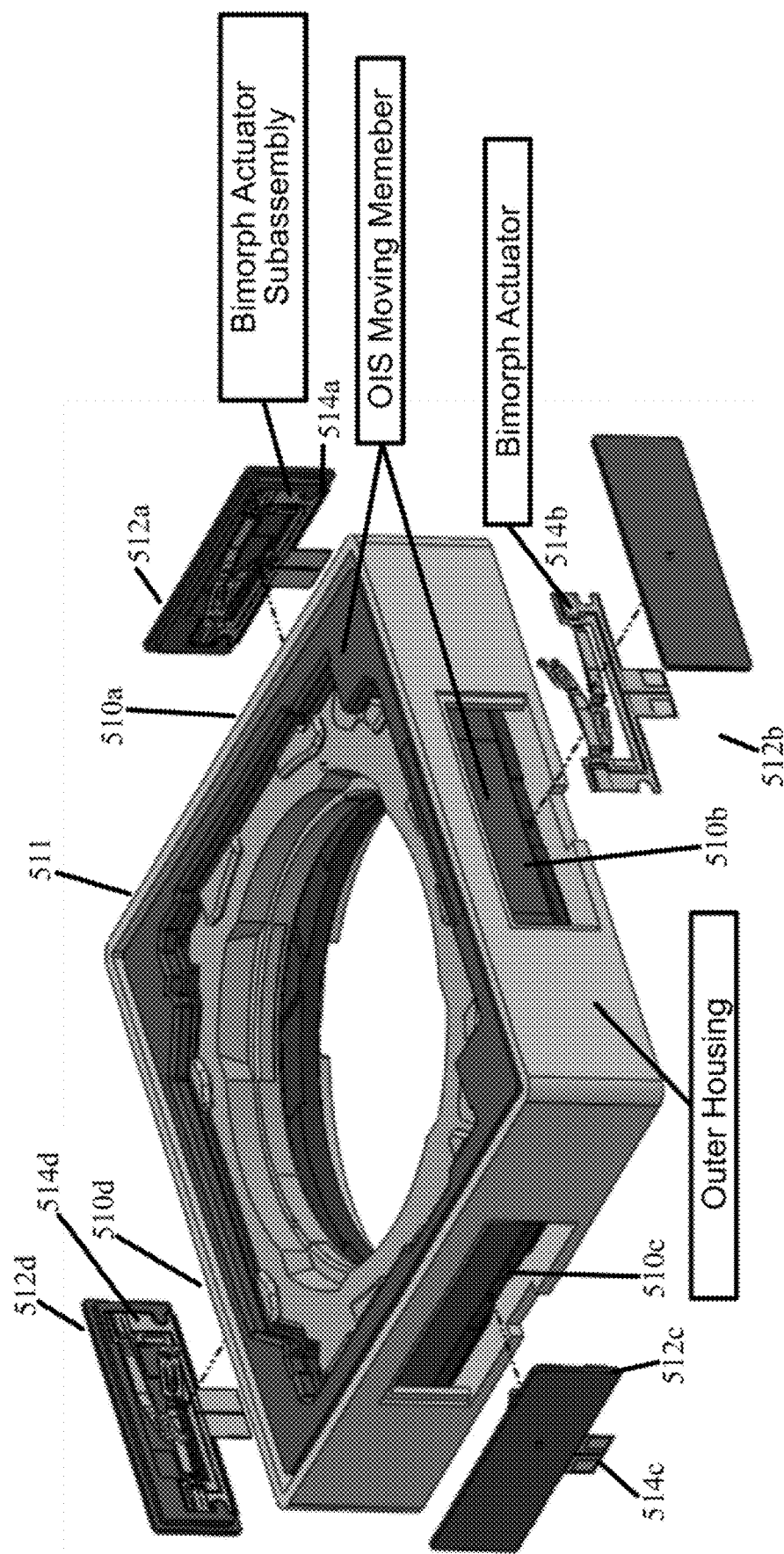
Figure 142:
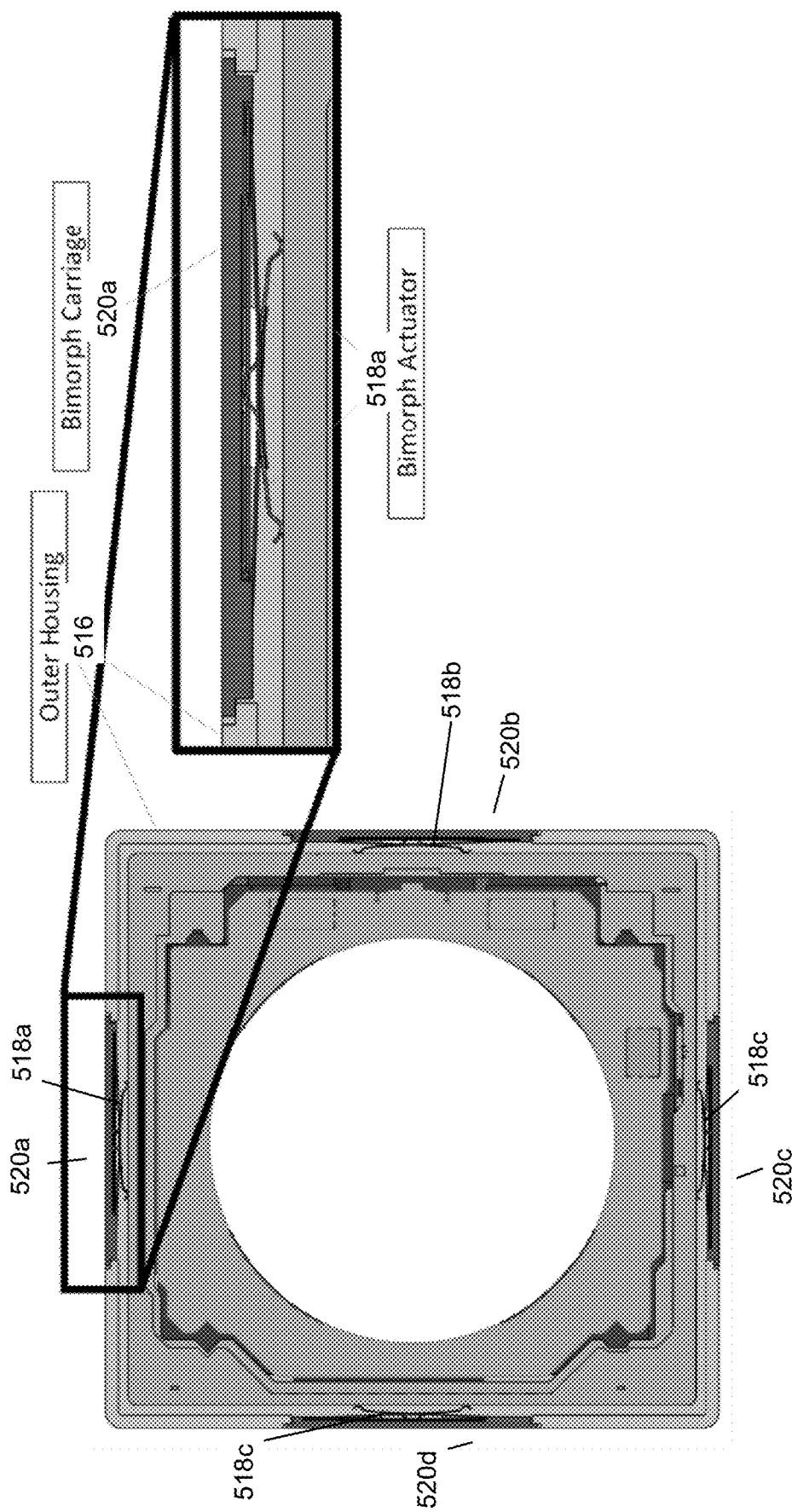
Figure 143:
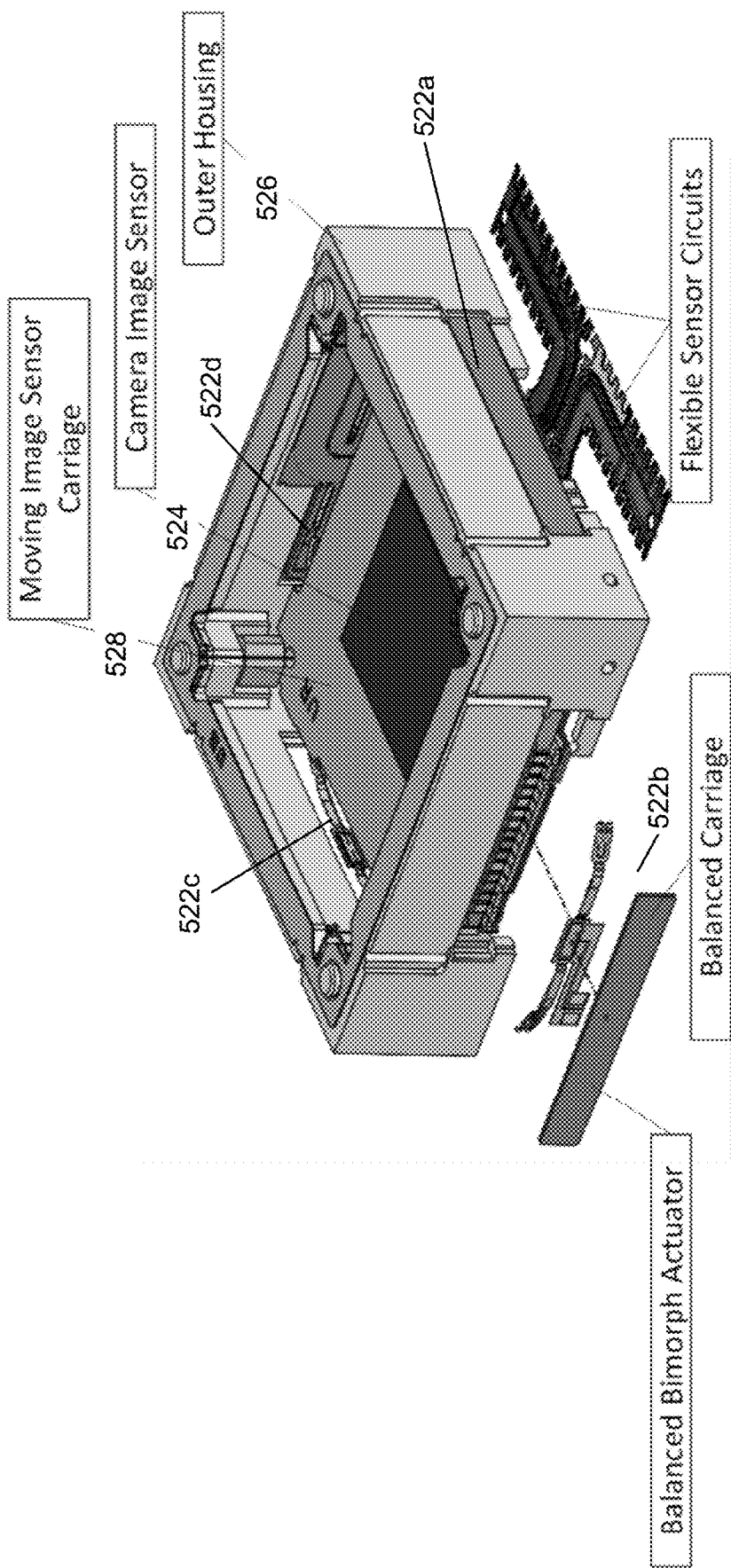
Figure 144:
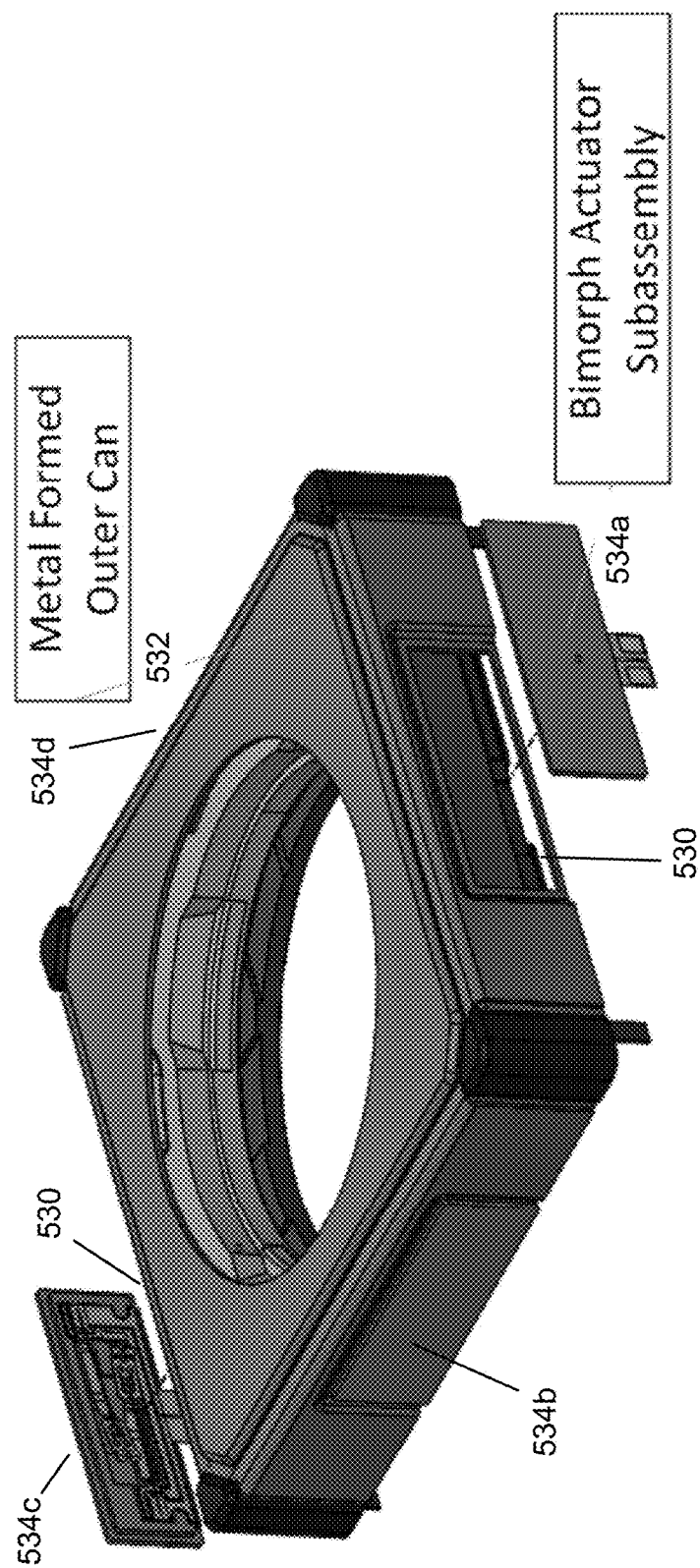
Figure 145:
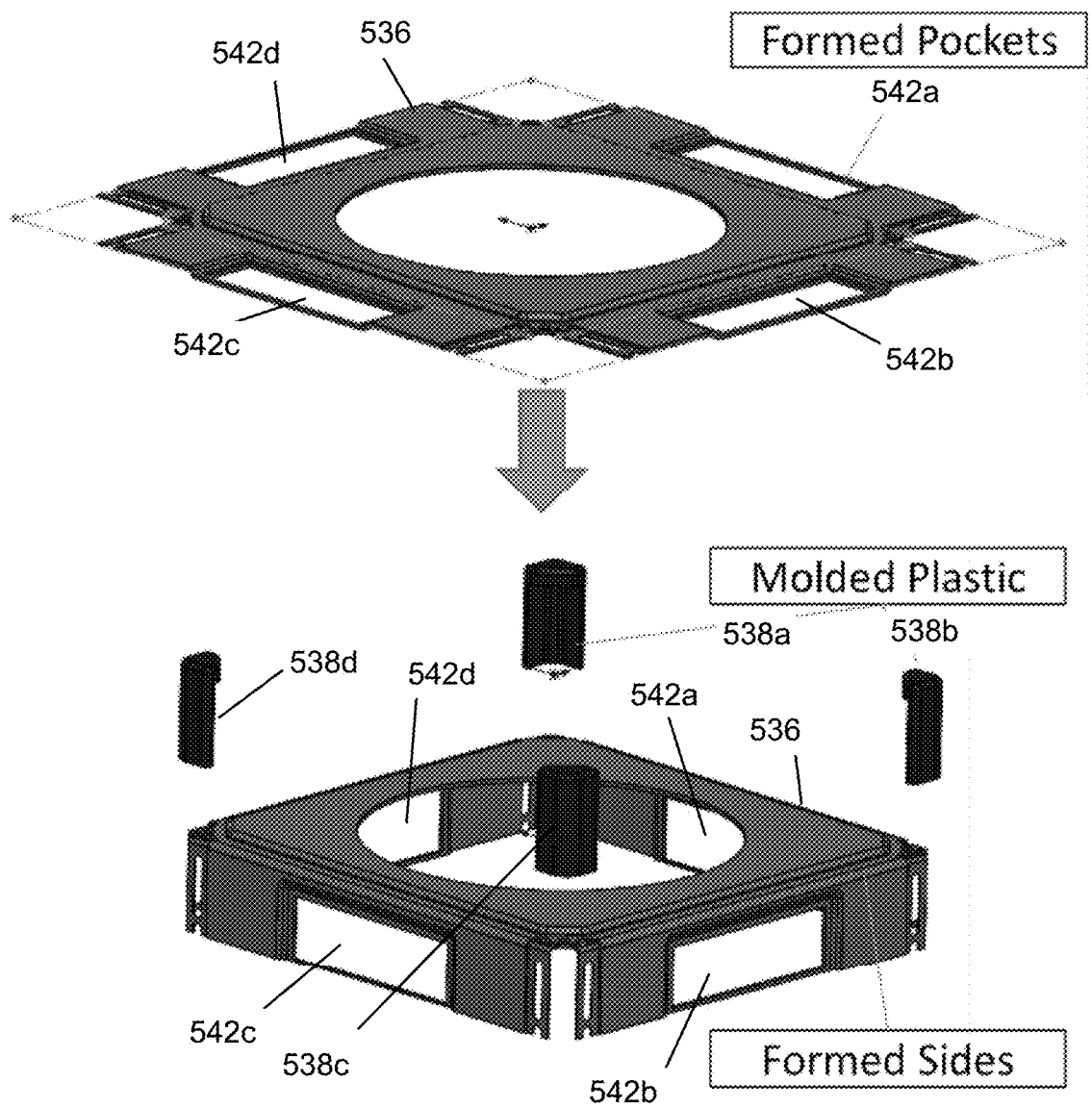
Figure 146:
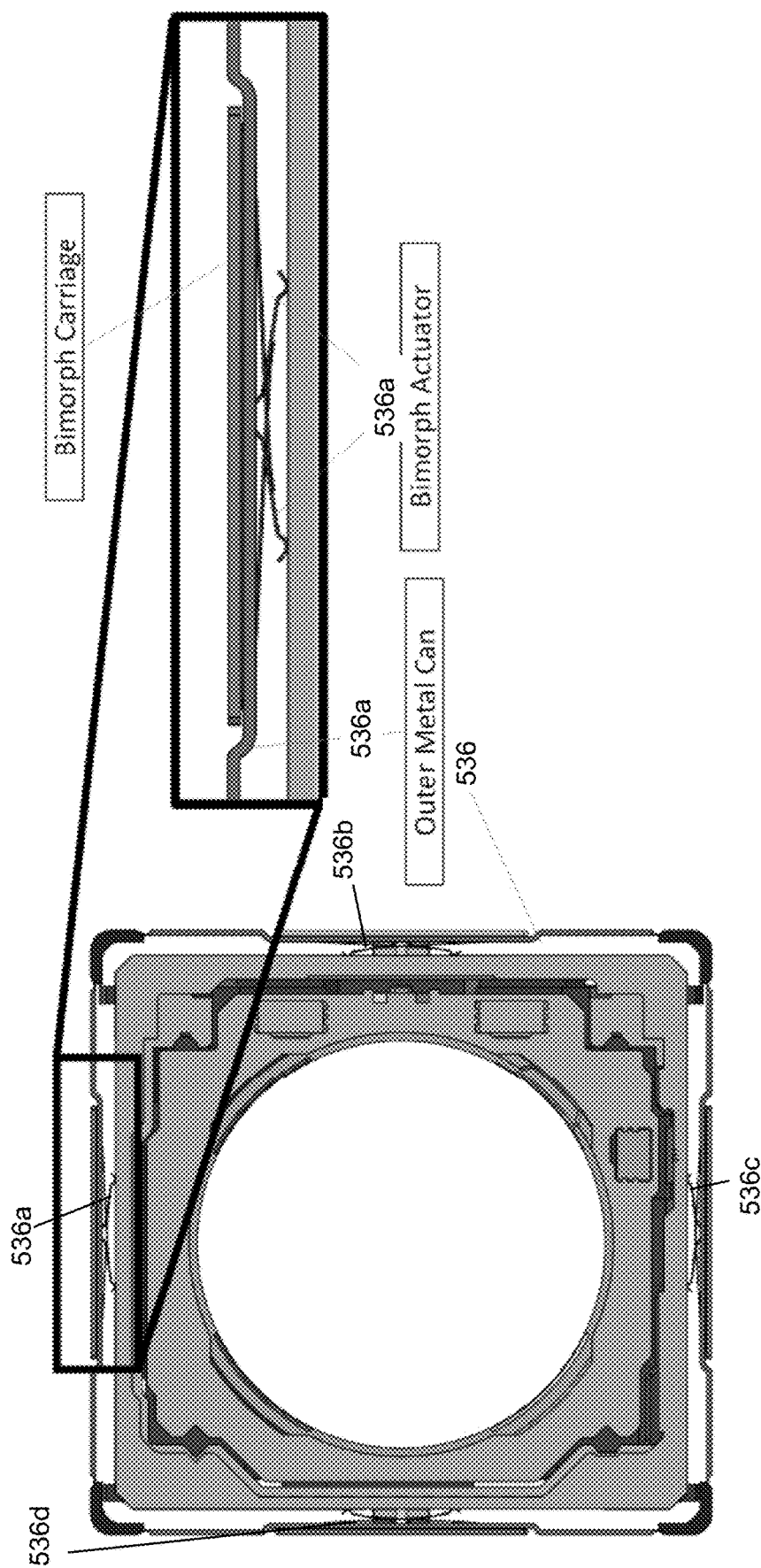
Figure 147:
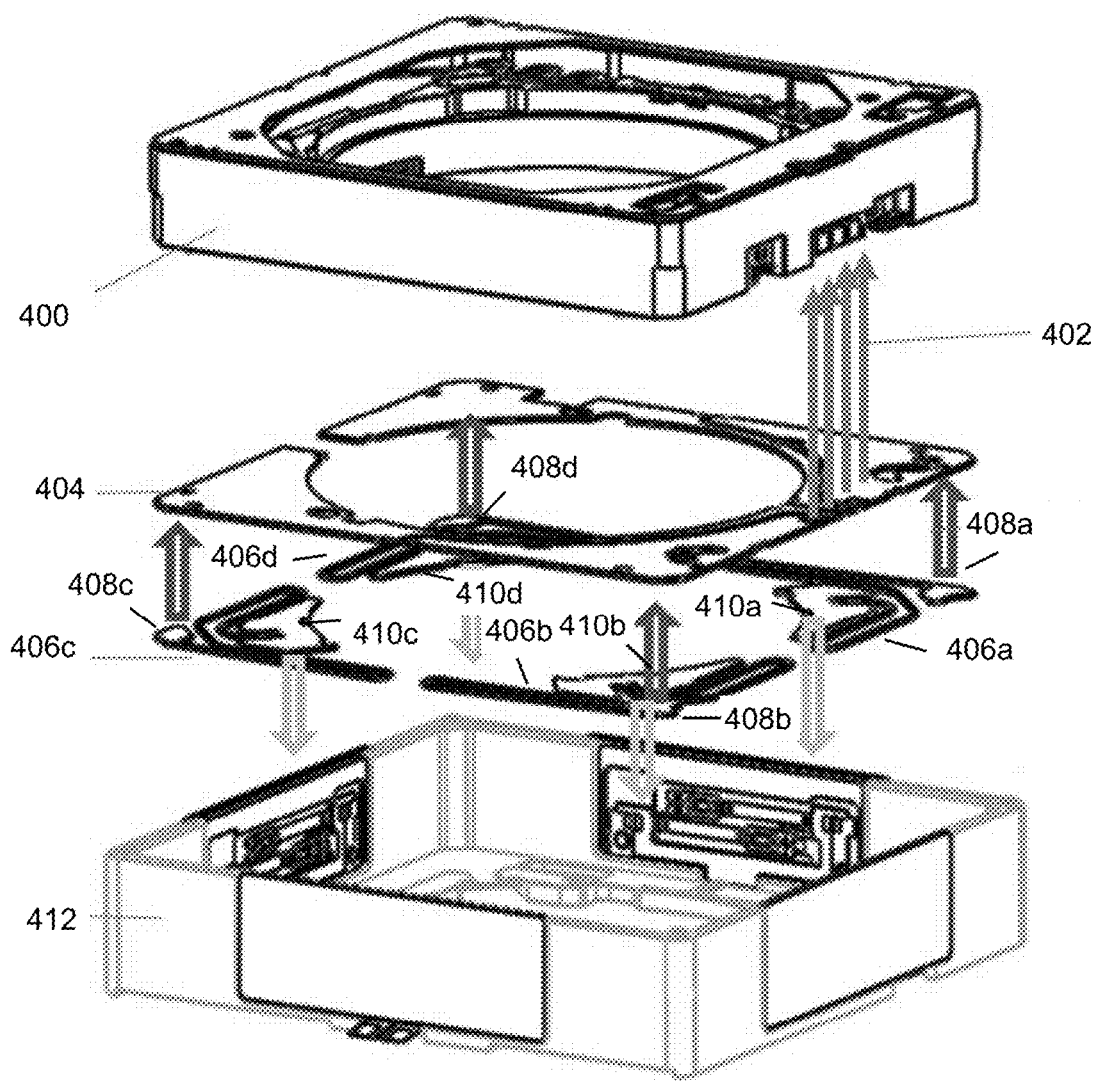
Figure 148:
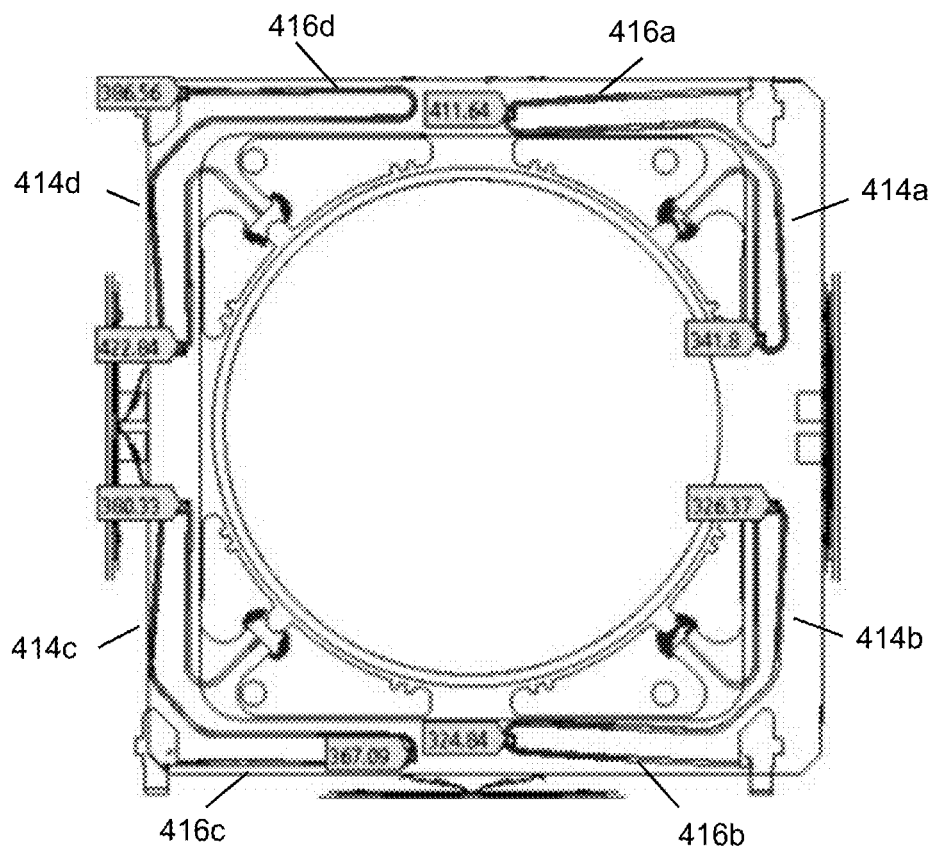
Figure 149:
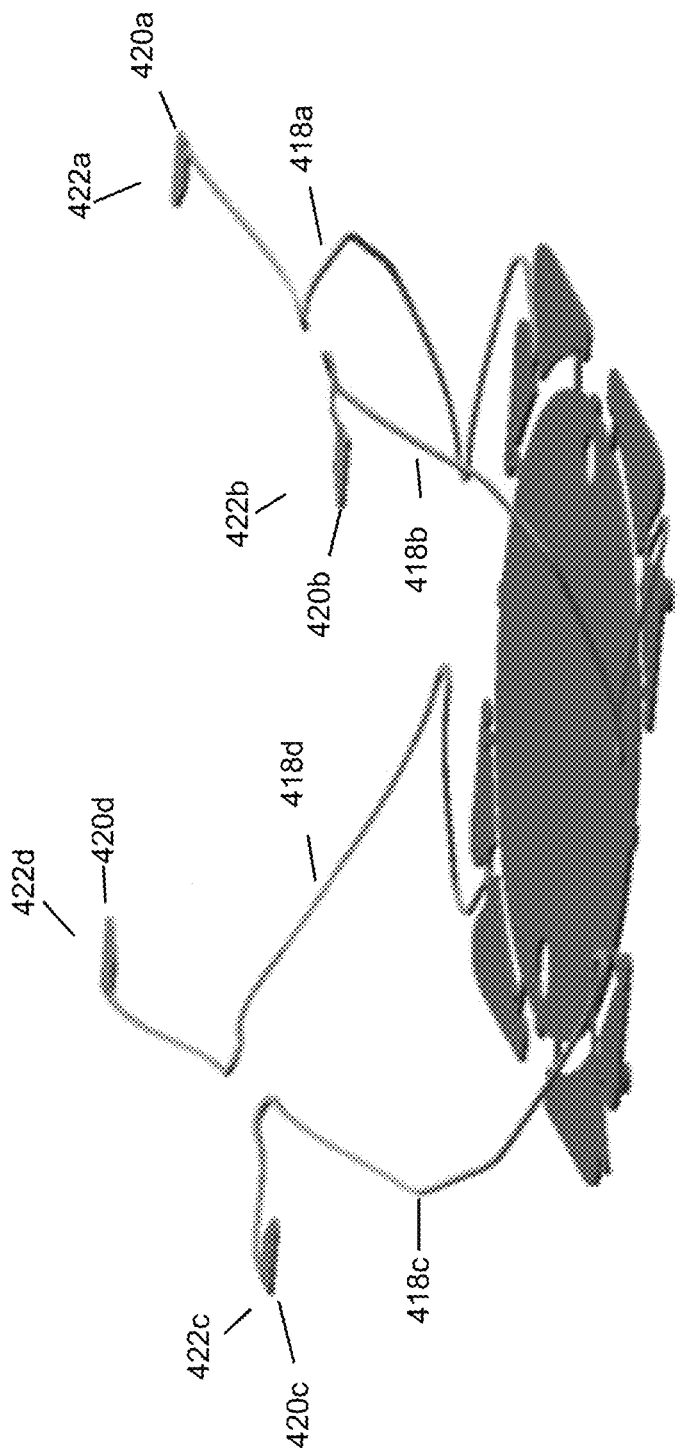
Figure 150:
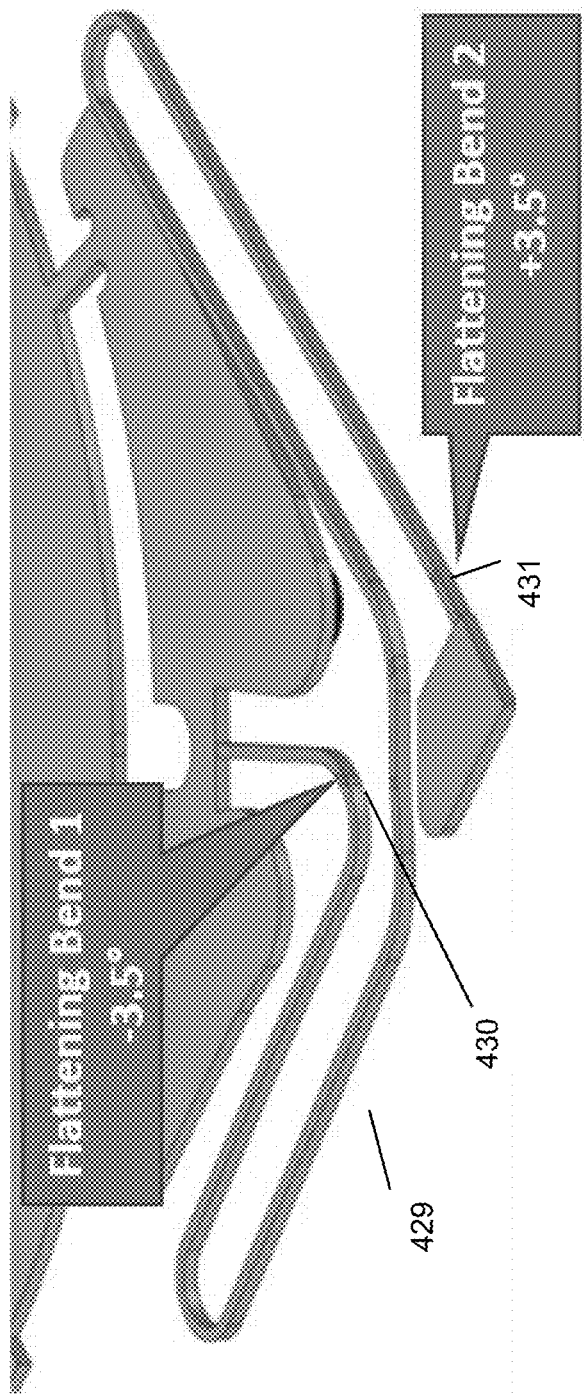

FIG. 130 illustrates a top view of a balanced bimorph actuator according to an embodiment including a common base island;

FIG. 131 illustrates a side view of a balanced bimorph actuator according to an embodiment including two bimorph arms arranged in a reversed in-line orientation;

FIG. 132 illustrates a top view of a balanced bimorph actuator according to an embodiment including two bimorph arms arranged in a reversed in-line orientation;

FIG. 133 illustrates a top view of a balanced bimorph actuator according to an embodiment including two bimorph arms arranged in a reversed in-line orientation;

FIG. 134 illustrates a balanced bimorph actuator according to an embodiment including two bimorph arms arranged in an inline orientation;

FIG. 135 illustrates a top view of a balanced bimorph actuator according to an embodiment including two bimorph arms arranged in an in-line orientation;

FIG. 136 illustrates a top view of a balanced bimorph actuator according to an embodiment including two bimorph arms arranged in an in-line orientation;

FIG. 137 illustrates a balanced bimorph actuator according to an embodiment including two bimorph arms arranged in a staggered orientation;

FIG. 138 illustrates a top view of a balanced bimorph actuator according to an embodiment including two bimorph arms arranged in a staggered orientation;

FIG. 139 illustrates a top view of a balanced bimorph actuator according to an embodiment including two bimorph arms arranged in a staggered orientation;

FIG. 140 illustrates an optical image stabilization system including balanced bimorph actuators according to an embodiment;

FIG. 141 illustrates an exploded view of an optical image stabilization system including balanced bimorph actuators according to an embodiment;

FIG. 142 illustrates an optical image stabilization system including balanced bimorph actuators according to an embodiment;

FIG. 143 illustrates a sensor shift optical image stabilization system including bimorph actuators according to an embodiment;

FIG. 144 illustrates an optical image stabilization system including balanced bimorph actuators according to an embodiment;

FIG. 145 illustrates an outer housing of an optical image stabilization system according to an embodiment;

FIG. 146 illustrates a cross section of an optical image stabilization system including an outer housing according to an embodiment;

FIG. 147 illustrates an exploded view of an optical image stabilization system including flat spring circuits according to an embodiment;

FIG. 148 illustrates a cross section on an optical image stabilization system including flat spring circuits according to an embodiment;

FIG. 149 illustrates a base including springs according to an embodiment;

FIG. 150 illustrates a flat spring circuit according to an embodiment; and

Figure 151:
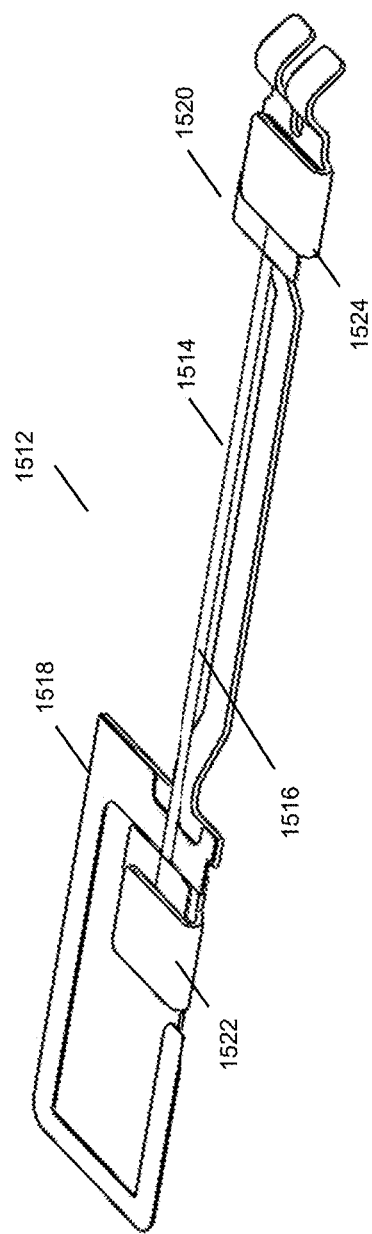

FIG. 151 illustrates a bimorph actuator including a crimp according to an embodiment.

DETAILED DESCRIPTION

Embodiments of an SMA actuator are described herein that include a compact footprint and providing a high actuation height, for example movement in the positive z-axis direction (z-direction), referred to herein as the z-stroke. Embodiments of the SMA actuator include an SMA buckle actuator and an SMA bimorph actuator. The SMA actuator may be used in many applications including, but not limited to, a lens assembly as an autofocus actuator, a micro-fluidic pump, a sensor shift, optical image stabilization, optical zoom assembly, to mechanically strike two surfaces to create vibration sensations typically found in haptic feedback sensors and devices, and other systems where an actuator is used. For example, embodiments of an actuator described herein could be used as a haptic feedback actuator for use in cellphones or wearable devices configured to provide the user an alarm, notification, alert, touched area or pressed button response. Further, more than one SMA actuator could be used in a system to achieve a larger stroke.

For various embodiments, the SMA actuator has a z-stroke that is greater than 0.4 millimeters. Further, the SMA actuator for various embodiments has a height in the z-direction of 2.2 millimeters or less, when the SMA actuator is in its initial, a de-actuated position. Various embodiments of the SMA actuator configured as an autofocus actuator in a lens assembly may have a footprint as small as 3 millimeters greater than the lens inner diameter ("ID"). According to various embodiments, the SMA actuator may have a footprint that is wider in one direction to accommodate components including, but not limited to, sensors, wires, traces, and connectors. According to some embodiments, the footprint of an SMA actuator is 0.5 millimeters greater in one direction, for example the length of the SMA actuator is 0.5 millimeters greater than the width.

Figure 1A:
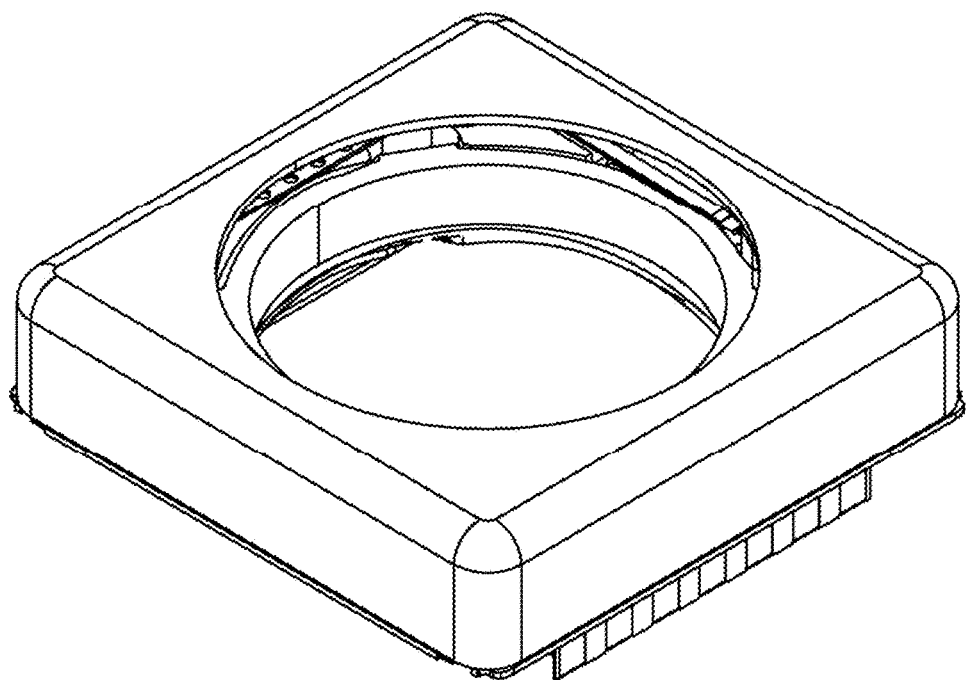
FIG. 1a illustrates a lens assembly including an SMA actuator configured as a buckle actuator according to an embodiment.
Figure 1B:
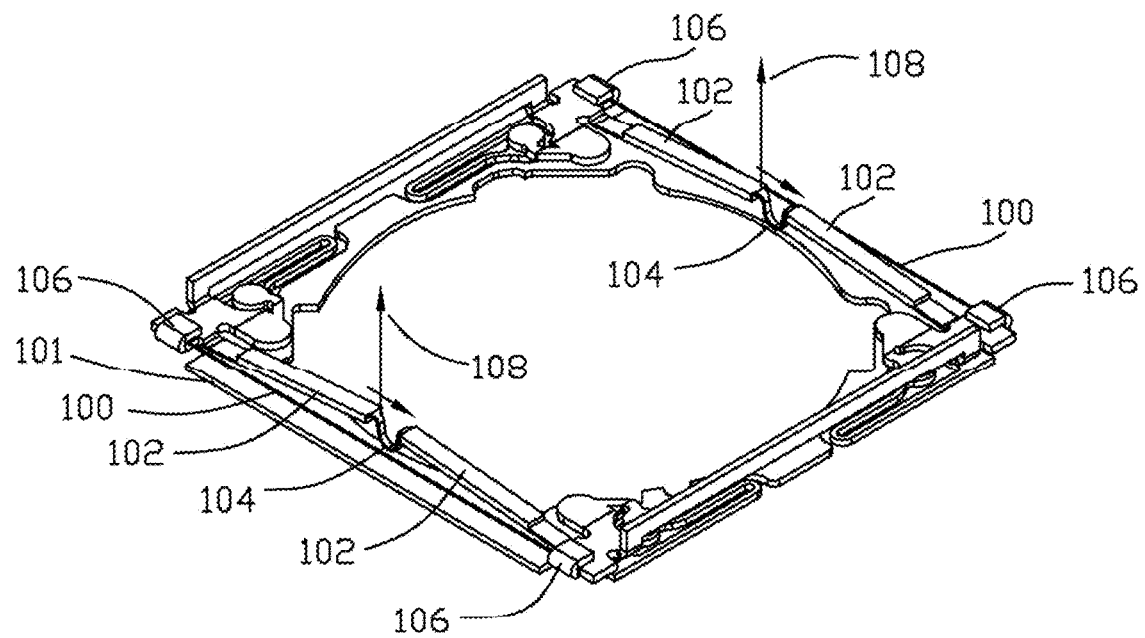
FIG. 1b illustrates an SMA actuator according to an embodiment.

FIG. 1a illustrates a lens assembly including an SMA actuator configured as a buckle actuator according to an embodiment. FIG. 1b illustrates an SMA actuator configured as a buckle actuator according to an embodiment. The buckle actuators 102 are coupled with a base 101. As illustrated in FIG. 1b, SMA wires 100 are attached to buckle actuators 102 such that when the SMA wires 100 are actuated and contract this causes the buckle actuators 102 to buckle, which results in at least the center portion 104 of each buckle actuator 102 to move in the 2-stroke direction, for example the positive z-direction, as indicated by the arrows 108. According to some embodiments, the SMA wires 100 are actuated when electrical current is supplied to one end of the wire through a wire retainer such as a crimp structure 106. The current flows through the SMA wire 100 heating it due to the resistance inherent in the SMA material of which the SMA wire 100 is made. The other side of the SMA wire 100 has a wire retainer such as a crimp structure 106 that connects the SMA wire 100 to complete the circuit to ground. Heating of the SMA wire 100 to a sufficient temperature causes the unique material properties to change from martensite to austenite crystalline structure, which causes a length change in the wire. Changing the electrical current changes the temperature and therefore changes the length of the wire, which is used to actuate and de-actuate the actuator to control the movement of the actuator in at least the z-direction. One skilled in the art would understand that other techniques could be used to provide electrical current to an SMA wire.

Figure 2:
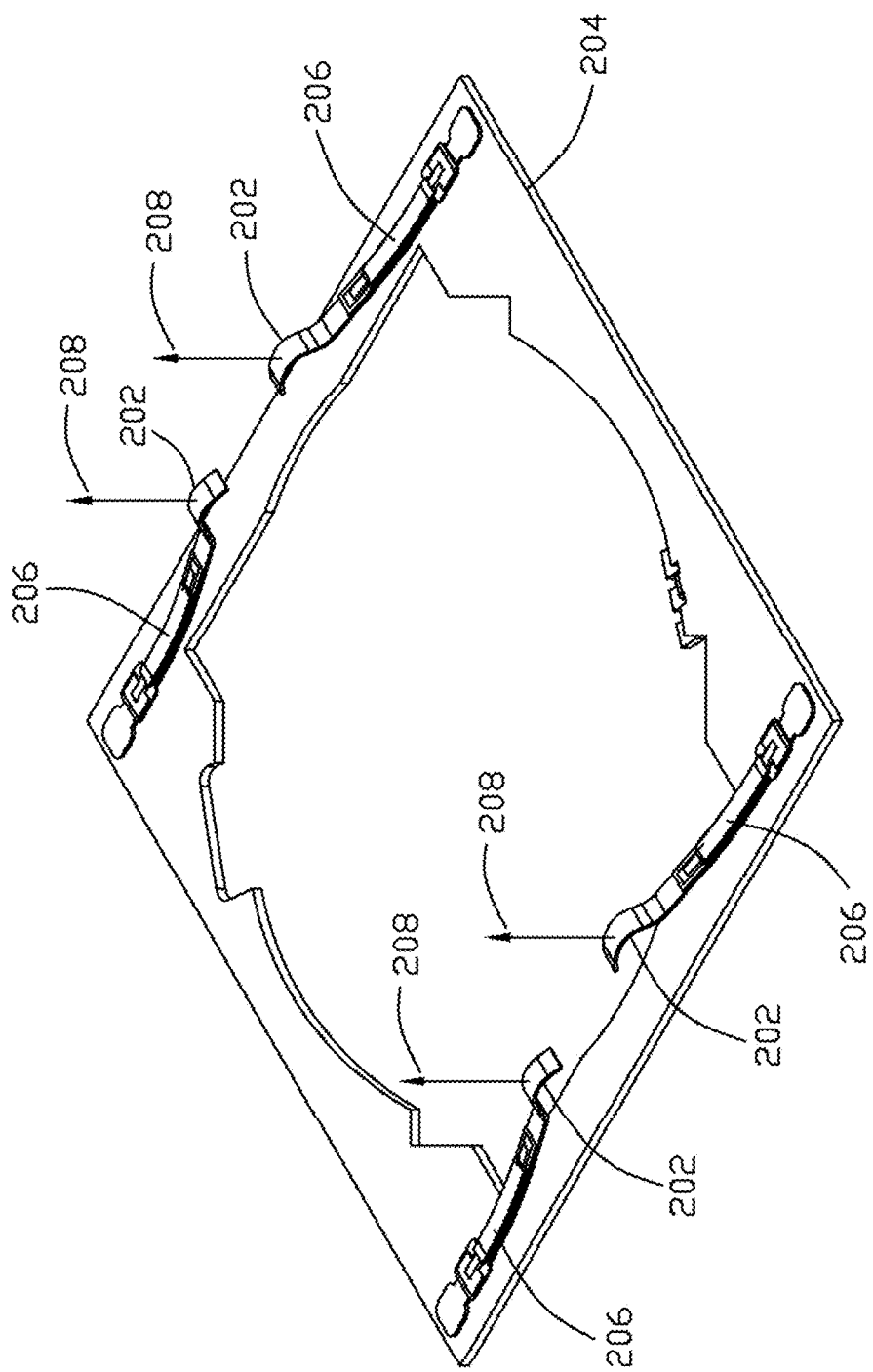
FIG. 2 illustrates an SMA actuator according to an embodiment.

FIG. 2 illustrates an SMA actuator configured as an SMA bimorph actuator according to an embodiment. As illustrated in FIG. 2, the SMA actuator includes bimorph actuators 202 coupled with a base 204. The bimorph actuators 202 include an SMA ribbon 206. The bimorph actuators 202 are configured to move at least the unfixed ends of the bimorph actuators 202 in the z-stroke direction 208 as the SMA ribbon 206 shrinks.

FIG. 3 illustrates an exploded view of an autofocus assembly including an SMA actuator according to an embodiment. As illustrated, an SMA actuator 302 is configured as a buckle actuator according to embodiments described herein. The autofocus assembly also includes optical image stabilization ("OIS") 304, a lens carriage 306 configured to hold one or more optical lens using techniques including those known in the art, a return spring 308, a vertical slide bearing 310, and a guide cover 312. The lens carriage 306 is configured to slide against the vertical slide bearing 310 as the SMA actuator 302 moves in the z-stroke direction, for example the positive z-direction, when the SMA wires are actuated and pull and buckle the buckle actuators 302 using techniques including those described herein. The return spring 308 is configured to apply a force in the opposite direction to the z-stroke direction on the lens carriage 306 using techniques including those known in the art. The return spring 308 is configured, according to various embodiments, to move the lens carriage 306 in the opposite direction of the z-stroke direction when the tension in the SMA wires is lowered as the SMA wire is de-actuated. When the tension in the SMA wires is lowered to the initial value, the lens carriage 306 moves to the lowest height in the z-stroke direction. FIG. 4 illustrates the autofocus assembly including an SMA wire actuator according to an embodiment illustrated in FIG. 3.

FIG. 5 illustrates an SMA wire actuator according to an embodiment including a sensor. For various embodiments, the sensor 502 is configured to measure the movement of the SMA actuator in the z-direction or the movement of a component that that SMA actuator is moving using techniques including those known in the art. The SMA actuator including one or more buckle actuators 506 configured to actuate using one or more SMA wires 508 similar to those described herein. For example, in the autofocus assembly described in reference to FIG. 4, the sensor is configured to determine the amount of movement the lens carriage 306 moves in the z-direction 504 from an initial position using techniques including those known in the art. According to some embodiments, the sensor is a tunnel magneto resistance ("TMR") sensor.

Figure 6:
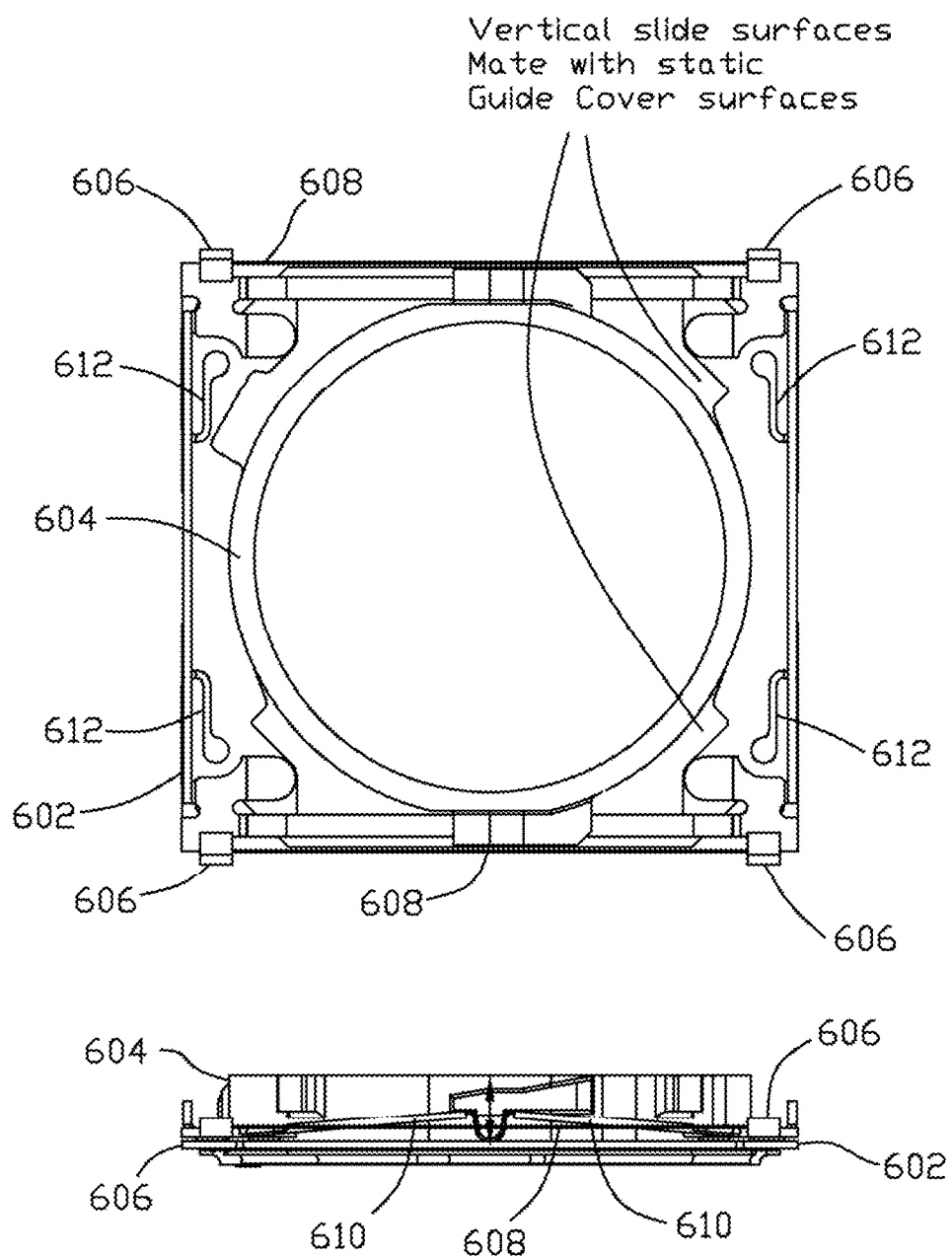
FIG. 6 illustrates a top view and a side view of an SMA actuator configured as a buckle actuator according to an embodiment fitted with a lens carriage.
Figure 7:
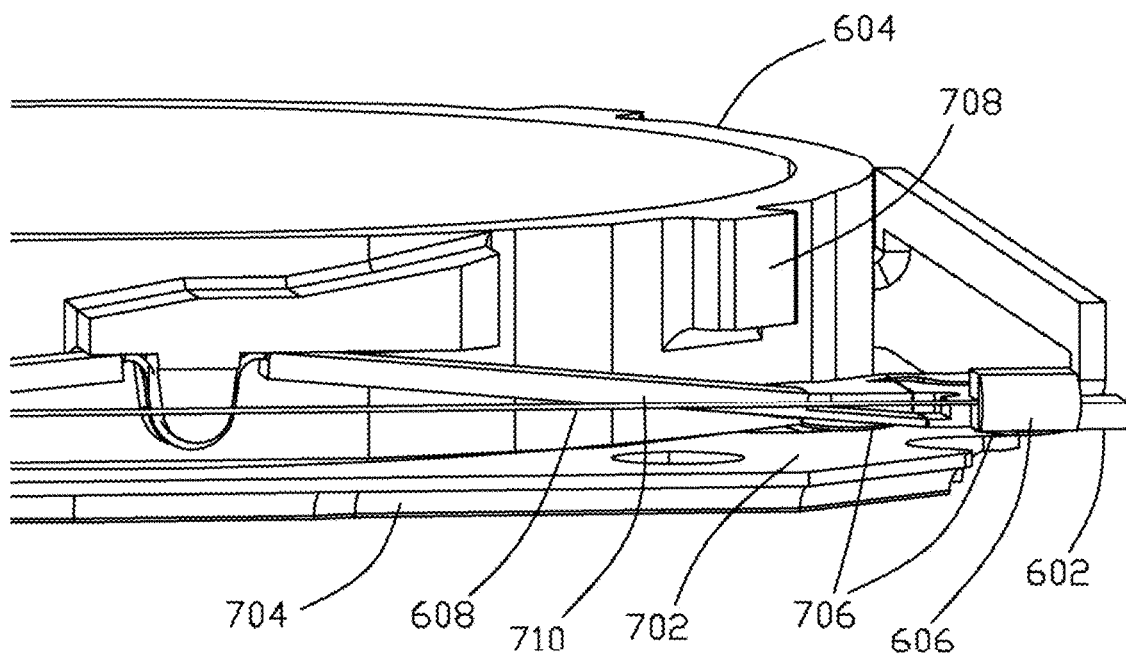
FIG. 7 illustrates a side-view of a section of the SMA actuator according to the embodiment.

FIG. 6 illustrates a top view and a side view of an SMA actuator 602 configured as a buckle actuator according to an embodiment fitted with a lens carriage 604. FIG. 7 illustrates a side-view of a section of the SMA actuator 602 according to the embodiment illustrated in FIG. 6. According to the embodiment illustrated in FIG. 7, the SMA actuator 602 includes a slide base 702. According to an embodiment, the slide base 702 is formed of metal, such as stainless steel, using techniques including those know in the art. However, one skilled in the art would understand that other materials could be used to form the slide base 702. Further, the slide base 702, according to some embodiments, has spring arms 612 coupled with the SMA actuator 602. According to various embodiments, spring arms 612 are configured to serve two functions. The first function is to help push on an object, for example a lens carriage 604, into a guide cover's vertical slide surface. For this example, the spring arms 612 preload the lens carriage 604 up against this surface ensuring that the lens will not tilt during actuation. For some embodiments, the vertical slide surfaces 708 are configured to mate with the guide cover. The second function of the spring arms 612 is to help pull the SMA actuator 602 back down, for example in the negative z-direction, after the SMA wires 608 move the SMA actuator 602 in the z-stroke direction, the positive z-direction. Thus, when the SMA wires 608 are actuated they contract to move the SMA actuator 602 in the z-stroke direction and the spring arms 612 are configured to move the SMA actuator 602 in the opposite direction of the z-stroke direction when the SMA wires 608 are de-actuated.

The SMA actuator 602 also includes a buckle actuator 710. For various embodiments, the buckle actuator 710 is formed of metal, such as stainless steel. Further, the buckle actuator 710 includes buckle arms 610 and one or more wire retainers 606. According to the embodiment illustrated in FIGS. 6 and 7, the buckle actuator 710 includes four wire retainers 606. The four wire retainers 606 are each configured to receive an end of an SMA wire 608 and retain the end of the SMA wire 608, such that the SMA wire 608 is affixed to the buckle actuator 710. For various embodiments, the four wire retainers 606 are crimps that are configured to clamp down on a portion of the SMA wire 608 to affix the wire to the crimp. One skilled in the art would understand that an SMA wire 608 may be affixed to a wire retainer 606 using techniques known in the art including, but not limited to, adhesive, solder, and mechanically affixed. The smart memory alloy ("SMA") wires 608 extend between a pair of wire retainers 606 such that the buckle arms 610 of the buckle actuator 710 are configured to move when the SMA wires 608 are actuated which results in the pair of wire retainers 606 being pulled closer together. According to various embodiments, the SMA wires 608 are electrically actuated to move and control the position of the buckle arms 610 when a current is applied to the SMA wire 608. The SMA wire 608 is de-actuated when the electrical current is removed or below a threshold. This moves the pair of wire retainers 606 apart and the buckle arms 610 move in the opposite direction of that when the SMA wire 608 is actuated. According to various embodiments, the buckle arms 610 are configured to have an initial angle of 5 degrees with respect to the slide base 702 when the SMA wire is de-actuated in its initial position. And, at full stroke or when the SMA wire is fully actuated the buckle arms 610 are configured to have an angle of 10 to 12 degrees with respect to the slide base 702 according to various embodiments.

According to the embodiment illustrated in FIGS. 6 and 7, the SMA actuator 602 also includes slide bearings 706 configured between the slide base 702 and the wire retainers 606. The slide bearings 706 are configured to minimize any friction between the slide base 702 and a buckle arm 610 and/or a wire retainer 606. The slide bearings for some embodiments are affixed to the wire retainer 606. According to various embodiments the slide bearings are formed of polyoxymethylene ("POM"). One skilled in the art would understand that other structures could be used to lower any friction between the buckle actuator and the base.

According to various embodiments, the slide base 702 is configured to couple with an assembly base 704 such as an autofocus base for an autofocus assembly. The actuator base 704, according to some embodiments, includes an etched shim. Such an etched shim may be used to provide clearance for wires and crimps when the SMA actuator 602 is part of an assembly, such as an autofocus assembly.

Figure 8:
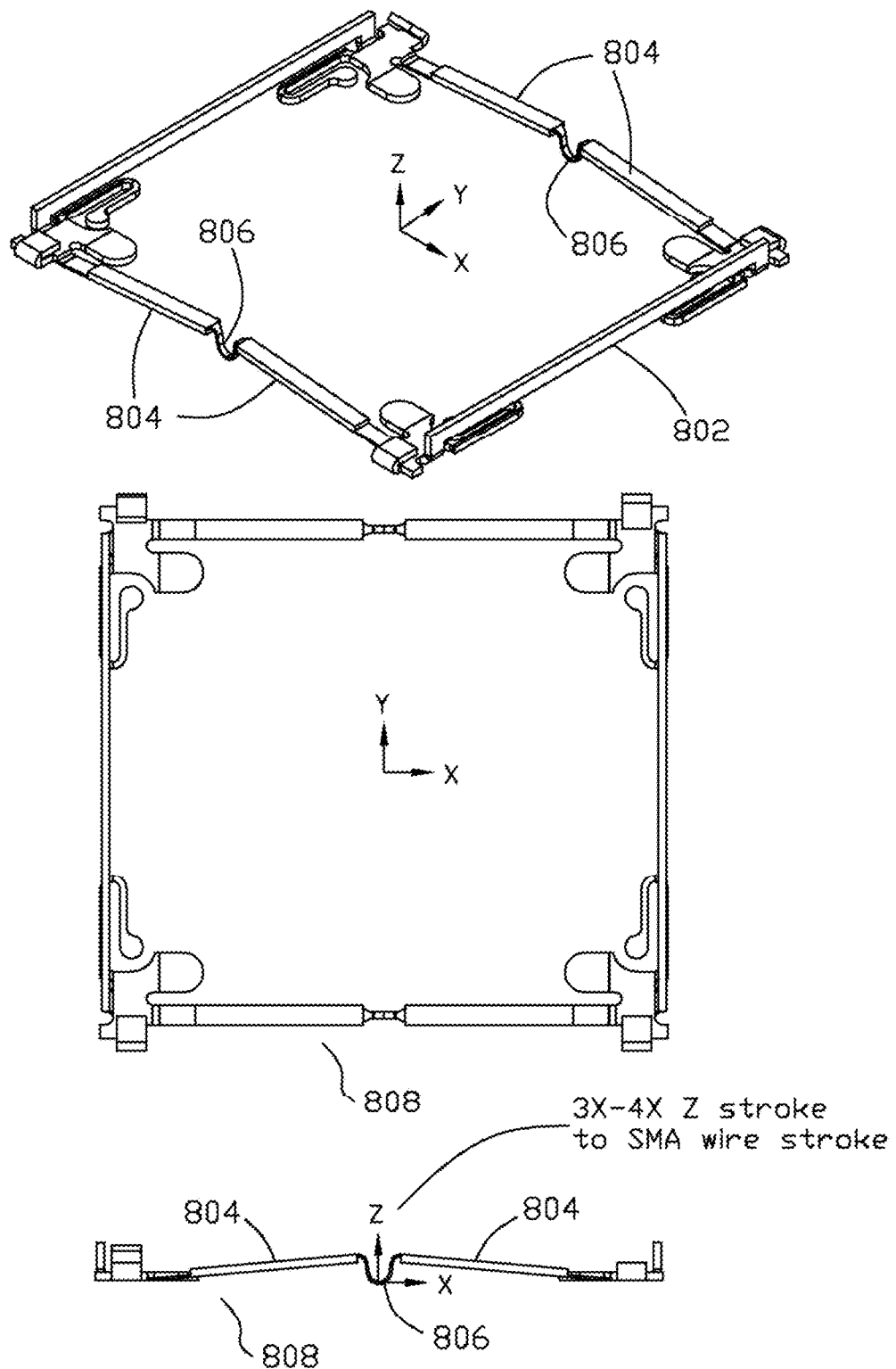
FIG. 8 illustrates multiple views of an embodiment of a buckle actuator.

FIG. 8 illustrates multiple views of an embodiment of a buckle actuator 802 with respect to an x-axis, a y-axis, and a z-axis. As oriented in FIG. 8, the buckle arms 804 are configured to move in the z-axis when the SMA wires are actuated and de-actuated as described herein. According to the embodiment illustrated in FIG. 8, the buckle arms 804 are coupled with each other through a center portion such as a hammock portion 806. A hammock portion 806, according to various embodiments, is configured to cradle a portion of an object that is acted upon by the buckle actuator, for example a lens carriage that is moved by the buckle actuator using techniques including those described herein. A hammock portion 806 is configured to provide lateral stiffness to the buckle actuator during actuation according to some embodiments. For other embodiments, a buckle actuator does not include a hammock portion 806. According to these embodiments, the buckle arms are configured to act on an object to move it. For example, the buckle arms are configured to act directly on features of a lens carriage to push it upward.

Figure 9:
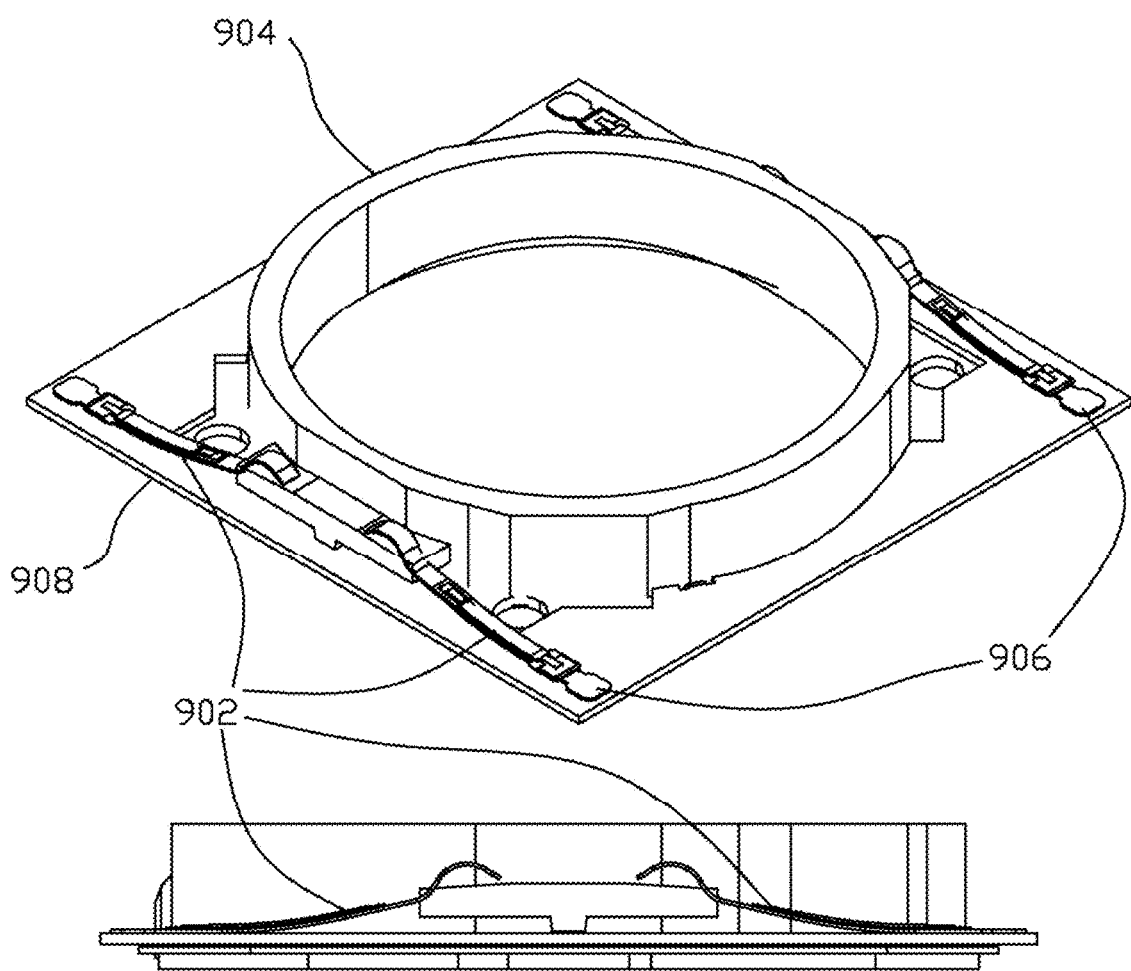
FIG. 9 illustrates a bimorph actuator according to an embodiment with a lens carriage.

FIG. 9 illustrates an SMA actuator configured as an SMA bimorph actuator according to an embodiment. The SMA bimorph actuator includes bimorph actuators 902 including those described herein. According to the embodiment illustrated in FIG. 9, one end 906 of each of bimorph actuators 902 is affixed to a base 908. According to some embodiments, the one end 906 is welded to base 908. However, one skilled in the art would understand other techniques could be used to affix the one end 906 to the base 908. FIG. 9 also illustrates a lens carriage 904 arranged such that the bimorph actuators 902 are configured to curl in the z-direction when actuated and lift the carriage 904 in the z-direction. For some embodiments, a return spring is used to push the bimorph actuators 902 back to an initial position. A return spring may be configured as described herein to aide in pushing the bimorph actuator down to their initial, de-actuated positions. Because of the small footprint of the bimorph actuators, SMA actuators can be made that have a reduced footprint over current actuator technologies.

Figure 10:
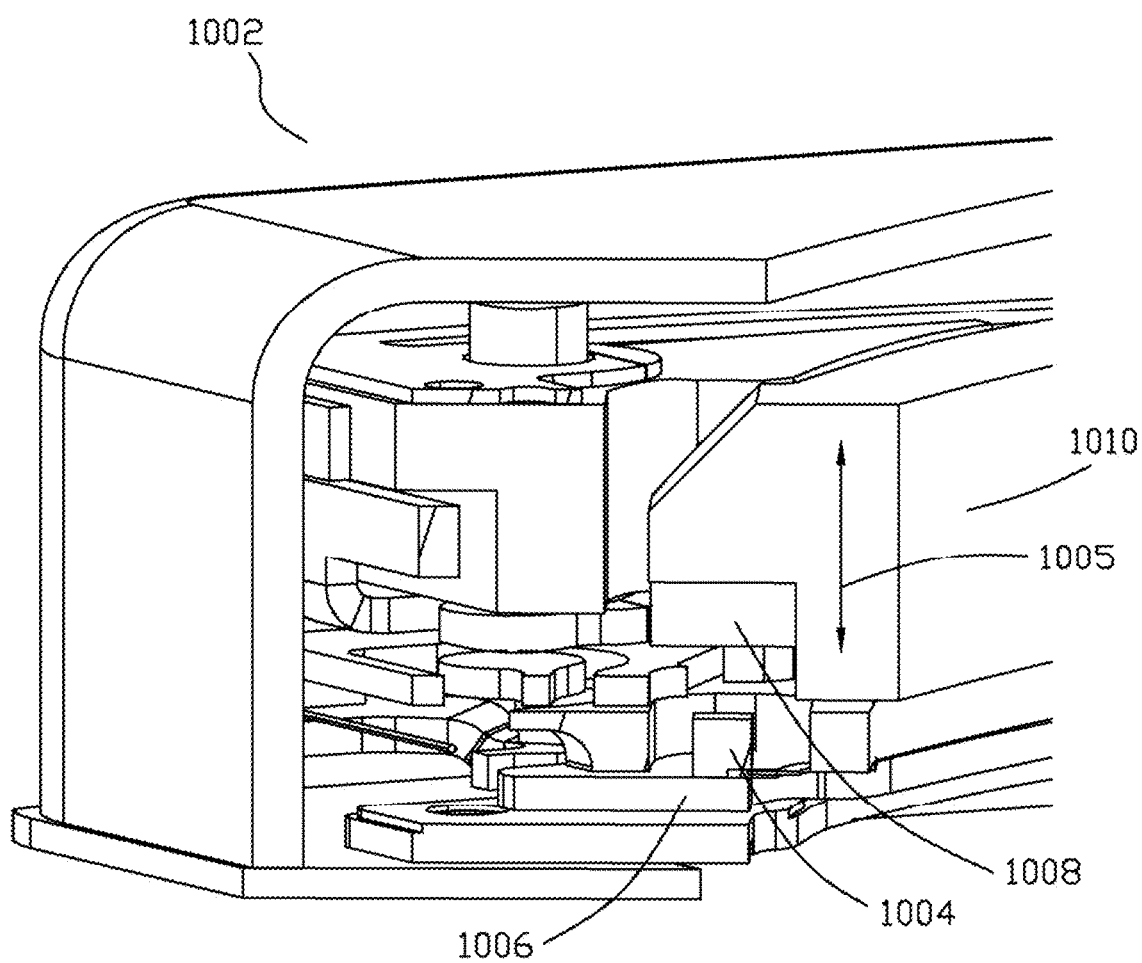
FIG. 10 illustrates a cutaway view of an autofocus assembly including an SMA actuator according to an embodiment.

FIG. 10 illustrates a cutaway view of an autofocus assembly including an SMA actuator according to an embodiment that includes a position sensor, such as a TMR sensor. The autofocus assembly 1002 includes a position sensor 1004 attached to a moving spring 1006, and a magnet 1008 attached to a lens carriage 1010 of an autofocus assembly including an SMA actuator, such as those described herein. The position sensor 1004 is configured to determine the amount of movement the lens carriage 1010 moves in the z-direction 1005 from an initial position based on a distance that the magnet 1008 is from the position sensor 1004 using techniques including those known in the art. According to some embodiments, the position sensor 1004 is electrically coupled with a controller or a processor, such as a central processing unit, using a plurality of electrical traces on a spring arm of a moving spring 1006 of an optical image stabilization assembly.

Figure 11A:
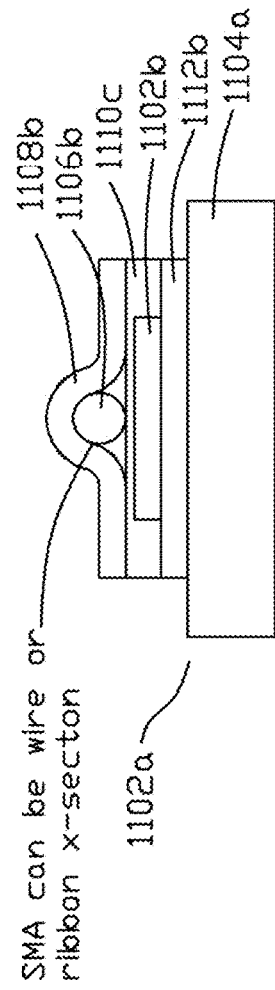
FIGS. 11a-c illustrates views of bimorph actuators according to some embodiments.
Figure 11B:
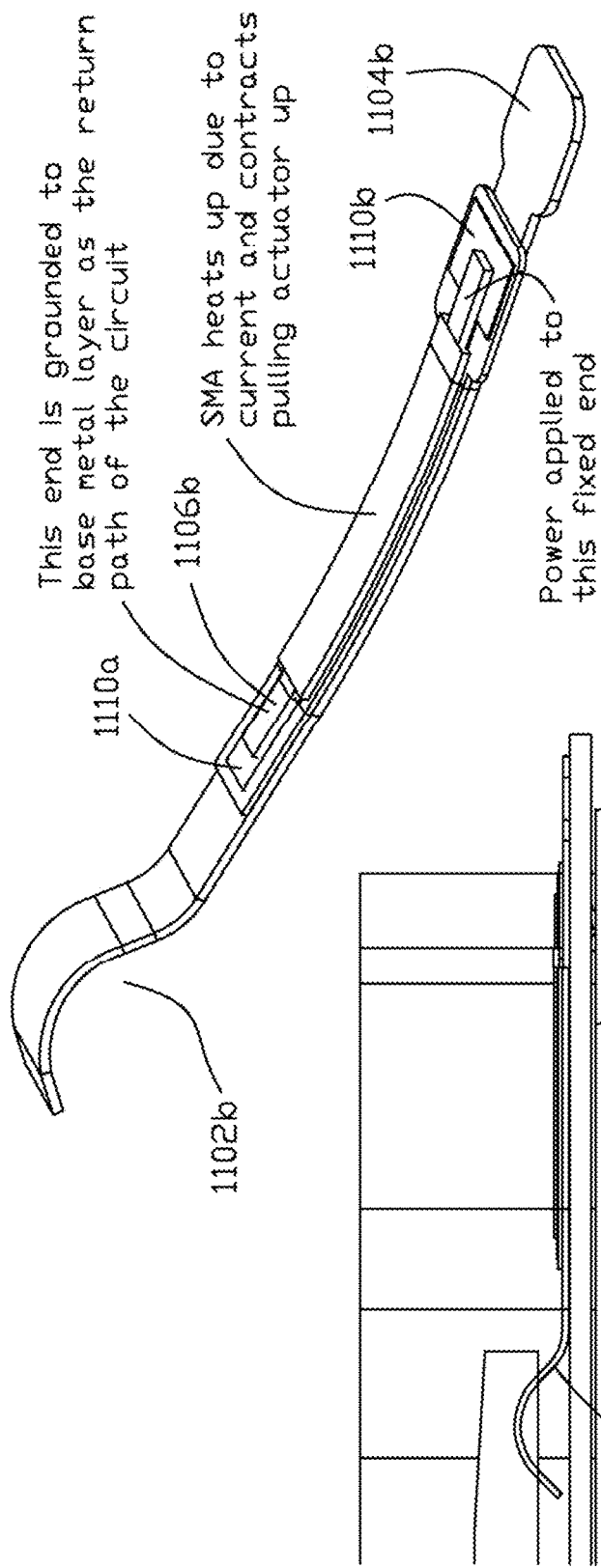
Figure 11C:
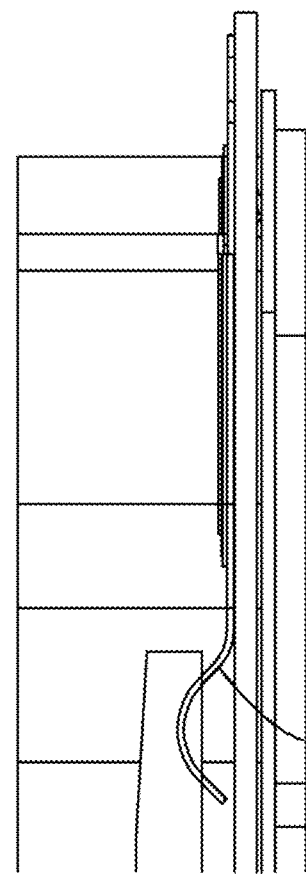

FIGS. 11a-c illustrates views of bimorph actuators according to some embodiments. According to various embodiments, a bimorph actuator 1102 includes a beam 1104 and one or more SMA materials 1106 such as an SMA ribbon 1106b (e.g., as illustrated in a perspective view of a bimorph actuator including an SMA ribbon according to the embodiment of FIG. 11b) or SMA wire 1106a (e.g., as illustrated in a cross-section of a bimorph actuator including an SMA wire according to the embodiment of FIG. 11a). The SMA material 1106 is affixed to the beam 1104 using techniques including those describe herein. According to some embodiments, the SMA material 1106 is affixed to a beam 1104 using adhesive film material 1108. Ends of the SMA material 1106, for various embodiments, are electrically and mechanically coupled with contacts 1110 configured to supply current to the SMA material 1106 using techniques including those known in the art. The contacts 1110 (e.g., as illustrated in FIGS. 11a and 11b), according to various embodiments, are gold plated copper pads. According to embodiments, a bimorph actuator 1102 having a length of approximately 1 millimeter are configured to generate a large stroke and push forces of 50 millinewtons ("mN") is used as part of a lens assembly, for example as illustrated in FIG. 11c. According to some embodiments, the use of a bimorph actuator 1102 having a length greater than 1 millimeter will generate more stroke but less force than that having a length of 1 millimeter. For an embodiment, a bimorph actuator 1102 includes a 20 micrometer thick SMA material 1106, a 20 micrometer thick insulator 1112, such as a polyimide insulator, and a 30 micrometer thick stainless steel beam 1104 or base metal. Various embodiments include a second insulator disposed between a contact layer including the contacts 1110 and the SMA material 1106. The second insulator is configured, according to some embodiments, to insulate the SMA material 1106 from portions of the contact layer not used as the contacts 1110. For some embodiments, the second insulator is a covercoat layer, such a polyimide insulator. One skilled in the art would understand that other dimensions and materials could be used to meet desired design characteristics.

Figure 12:
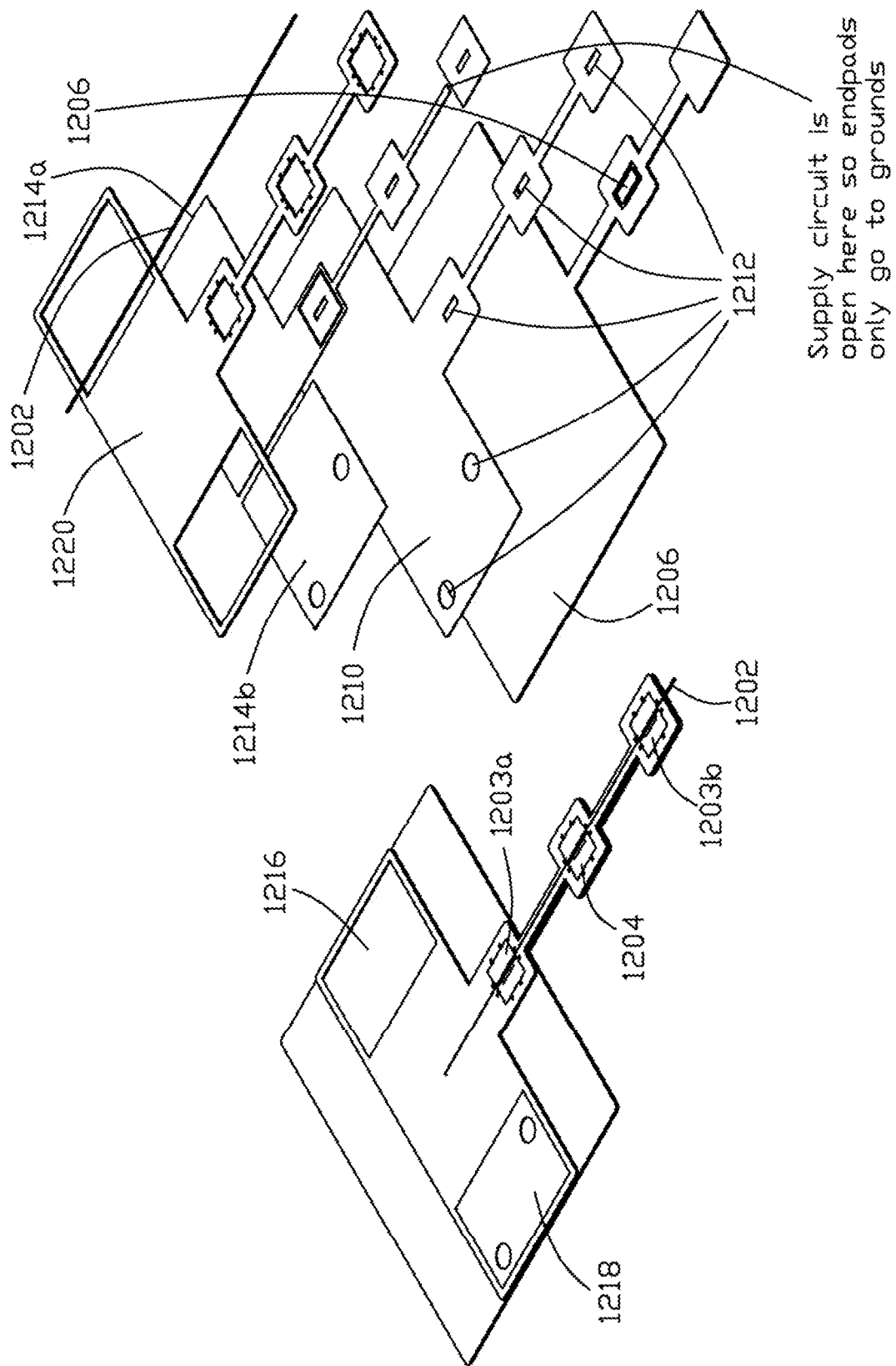
FIG. 12 illustrates views of an embodiment of a bimorph actuator according to an embodiment.

FIG. 12 illustrates views of an embodiment of a bimorph actuator according to an embodiment. The embodiment as illustrated in FIG. 12 includes a center feed 1204 for applying power. Power is supplied at the center of the SMA material 1202 (wire or ribbon), such as that described herein. Ends of the SMA material 1202 are grounded to the beam 1206 or base metal as a return path at the end pads 1203. The end pads 1203 are electrically isolated from the rest of the contact layer 1214. According to embodiments, the close proximity of a beam 1206 or base metal to the SMA material 1202, such as an SMA wire, along the entire length of the SMA material 1202 provides faster cooling of the wire when current is turned off, that is the bimorph actuator is de-actuated. The result is a faster wire deactivation and actuator response time. The thermal profile of the SMA wire or ribbon is improved. For example, the thermal profile is more uniform such that a higher total current can be reliably delivered to the wire. Without a uniform heat sink, portions of the wire, such as a center region, may overheated and be damaged thus requiring a reduced current and reduced motion to reliably operate. The center feed 1204 provides the benefits of quicker wire activation/actuation (faster heating) and reduced power consumption (lower resistance path length) of the SMA material 1202 for faster response time. This allows a faster actuator motion and capability to operate at a higher movement frequency.

As illustrated in FIG. 12, the beam 1206 includes a center metal 1208 that is isolated from the rest of the beam 1206 to form the center feed 1204. An insulator 1210, such as those described herein, is disposed over the beam 1206. The insulator 1210 is configured to have one or more openings or vias 1212 to provide electrical access to the beam 1206, for example to couple a ground section 1214b of the contact layer, and to provide contact to the center metal 1208 to form the center feed 1204. A contact layer 1214, such as those described herein, includes a power section 1214a and a ground section 1214b, according to some embodiments, to provide actuation/control signals to the bimorph actuator by way of a power supply contact 1216 and a ground contact 1218. A covercoat layer 1220, such as those described herein, is disposed over the contact layer 1214 to electrically isolate the contact layer except at portions of the contact layer 1214 where electrical coupling is desired (e.g., one or more contacts).

Figure 13:
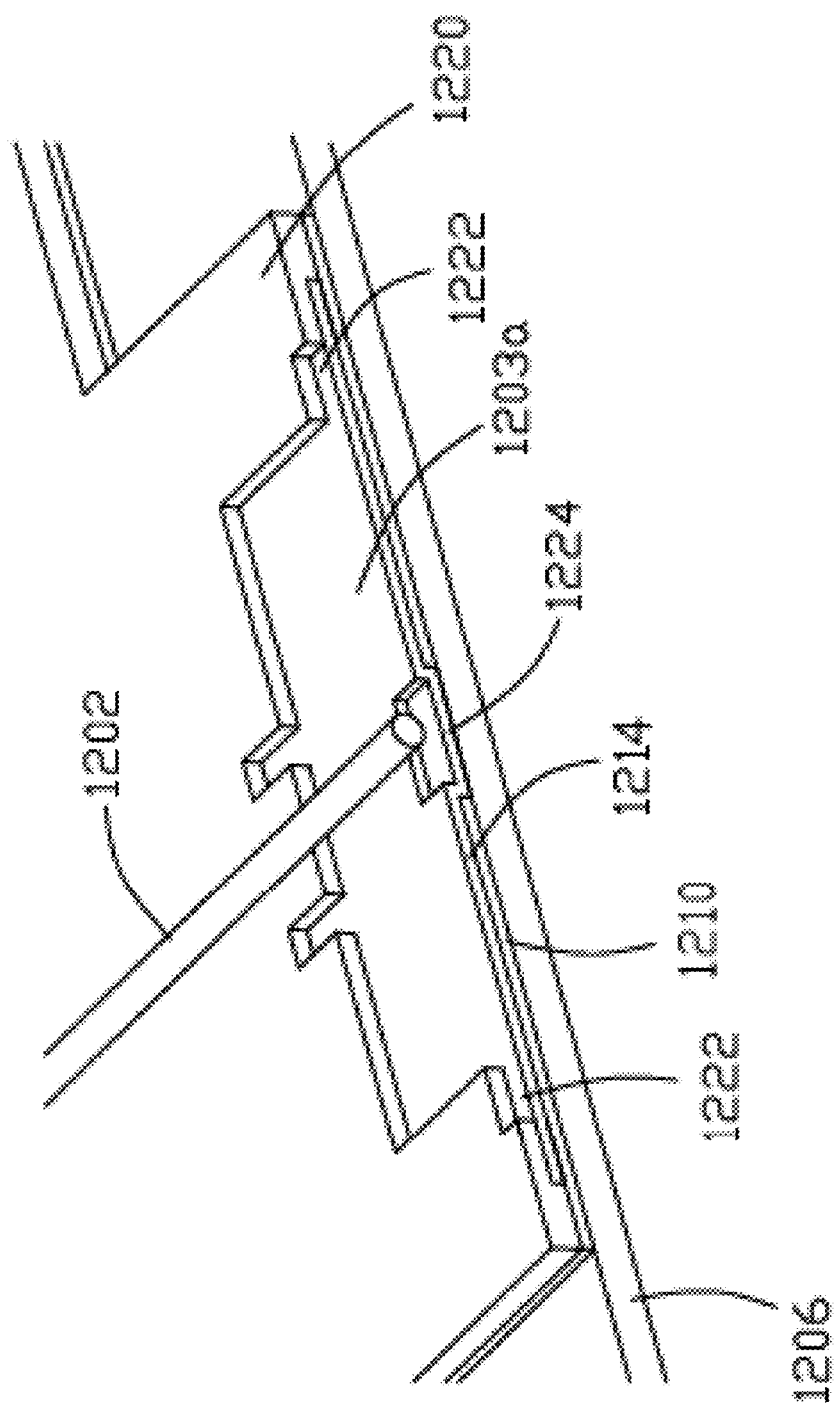
FIG. 13 illustrates an end pad cross-section of a bimorph actuator according to an embodiment.

FIG. 13 illustrates an end pad cross-section of a bimorph actuator according to an embodiment as illustrated in FIG. 12. As described above, the end pad 1203 electrically isolated from the rest of the contact layer 1214 by way of a gap 1222 formed between the end pad 1203 and the contact layer 1214. The gap is formed, according to some embodiments, using etching techniques including those known in the art. The end pad 1203 includes a via section 1224 configured to electrically couple the end pad 1203 with the beam 1206. The via section 1224 formed in a via 1212 formed in the insulator 1210. The SMA material 1202 is electrically coupled to the end pad 1203. The SMA material 1202 can be electrically coupled to the end pad 1203 using technique including, but not limited to, solder, resistance welding, laser welding, and direct plating.

Figure 14:
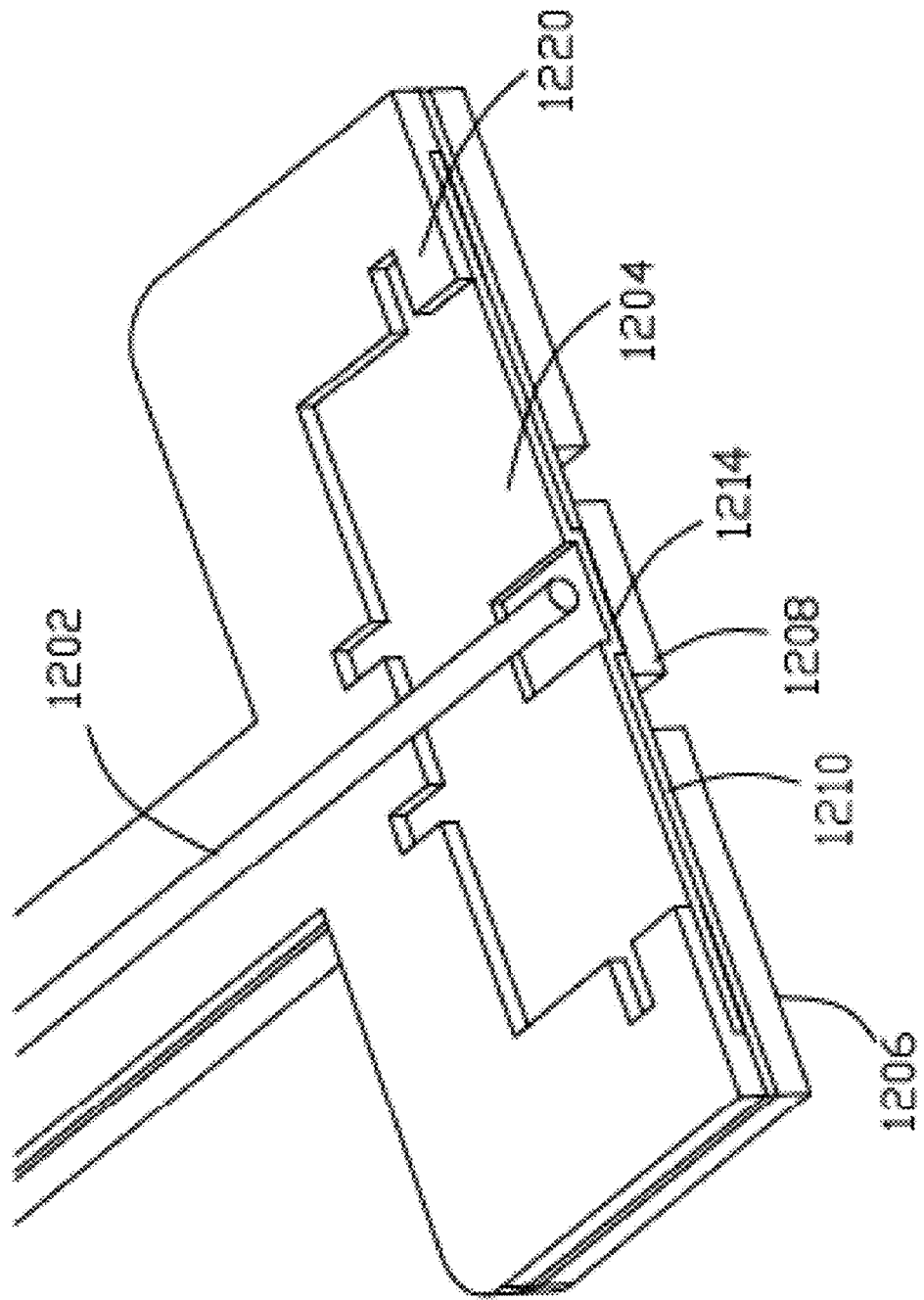
FIG. 14 illustrates a center supply pad cross-section of a bimorph actuator according to an embodiment.

FIG. 14 illustrates a center feed cross-section of a bimorph actuator according to an embodiment as illustrated in FIG. 12. The center feed 1204 is electrically coupled with to a power supply through the contact layer 1214 and electrically and thermally coupled with the center metal 1208 by way of a via section 1224 in the center feed 1204 formed in a via 1212 formed in the insulator 1210.

The actuators described herein could be used to form an actuator assembly that uses multiple buckle and or multiple bimorph actuators. According to an embodiment, the actuators may be stacked on top of each other in order to increase a stroke distance that can be achieved.

Figure 15:
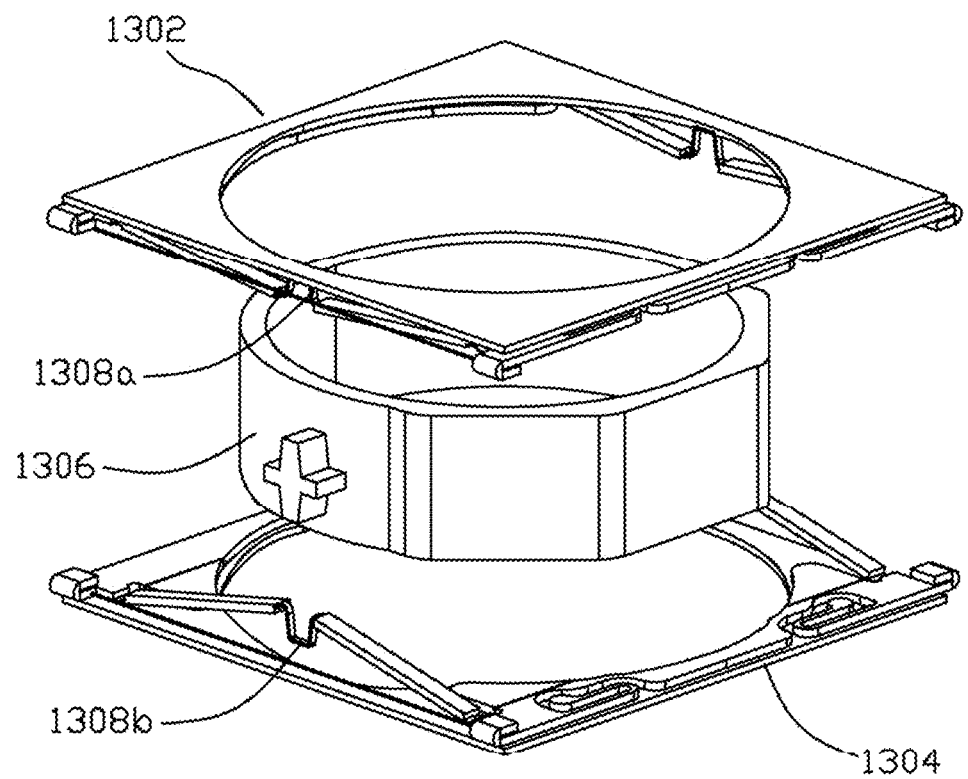
FIG. 15 illustrates an exploded view of an SMA actuator including two buckle actuators according to an embodiment.

FIG. 15 illustrates an exploded view of an SMA actuator including two buckle actuators according to an embodiment. Two buckle actuators 1302, 1304, according to embodiments described herein, are arranged with respect to each other to use their motion to oppose each other. For various embodiments, the two buckle actuators 1302, 1304 are configured to move in an inverse relation to each other to position a lens carriage 1306. For example, the first buckle actuator 1302 is configured to receive an inverse power signal of the power signal sent to the second buckle actuator 1304.

Figure 16:
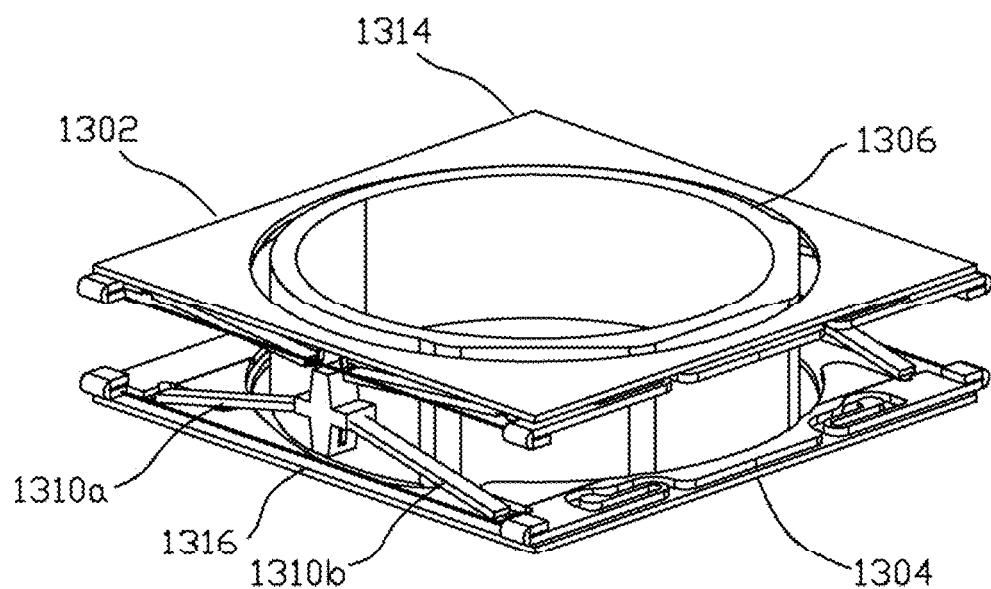
FIG. 16 illustrates an SMA actuator including two buckle actuators according to an embodiment.

FIG. 16 illustrates an SMA actuator including two buckle actuators according to an embodiment. The buckle actuators 1302, 1304 are configured such that the buckle arms 1310, 1312 of each buckle actuator 1302, 1304 face each other and the slide base 1314, 1316 of each buckle actuator 1302, 1304 are an outer surface of the two buckle actuators. A hammock portion 1308 of each SMA actuators 1302, 1304, according to various embodiments, is configured to cradle a portion of an object that is acted upon by the one or more buckle actuators 1302, 1304, for example a lens carriage 1306 that is moved by the buckle actuators using techniques including those described herein.

Figure 17:
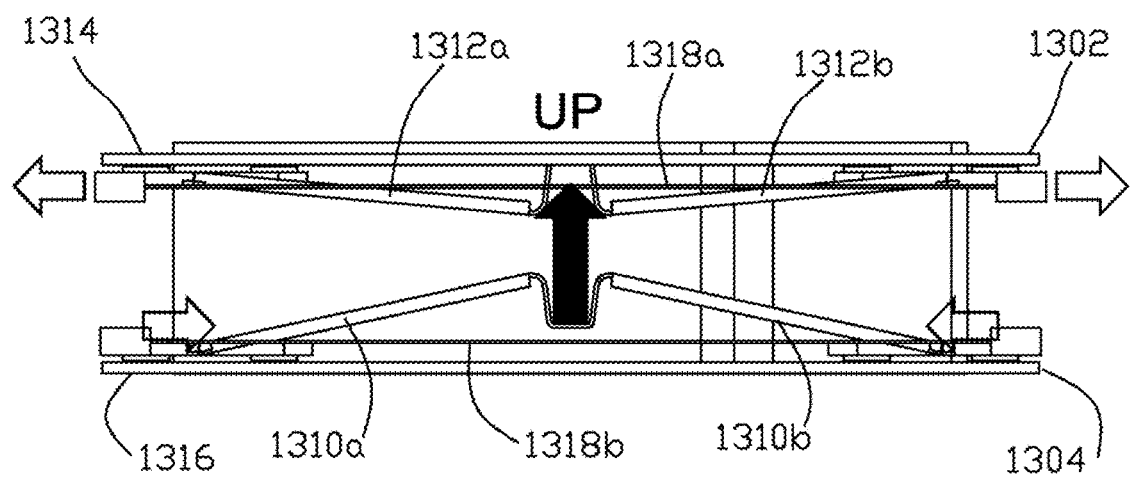
FIG. 17 illustrates a side view of an SMA actuator including two buckle actuators according to an embodiment.

FIG. 17 illustrates a side view of an SMA actuator including two buckle actuators according to an embodiment that illustrates the direction of the SMA wires 1318 that result in moving an object such as a lens carriage in a positive z direction or in an upwardly direction.

Figure 18:
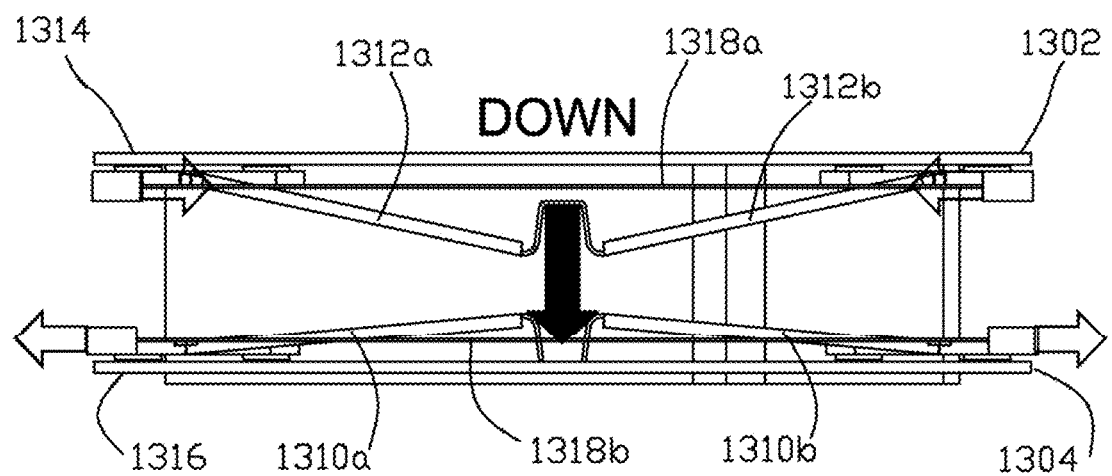
FIG. 18 illustrates a side view of an SMA actuator including two buckle actuators according to an embodiment.

FIG. 18 illustrates a side view of an SMA actuator including two buckle actuators according to an embodiment that illustrates the direction of the SMA wires 1318 that result in moving an object such as a lens carriage in a negative z direction or in a downwardly direction.

Figure 19:
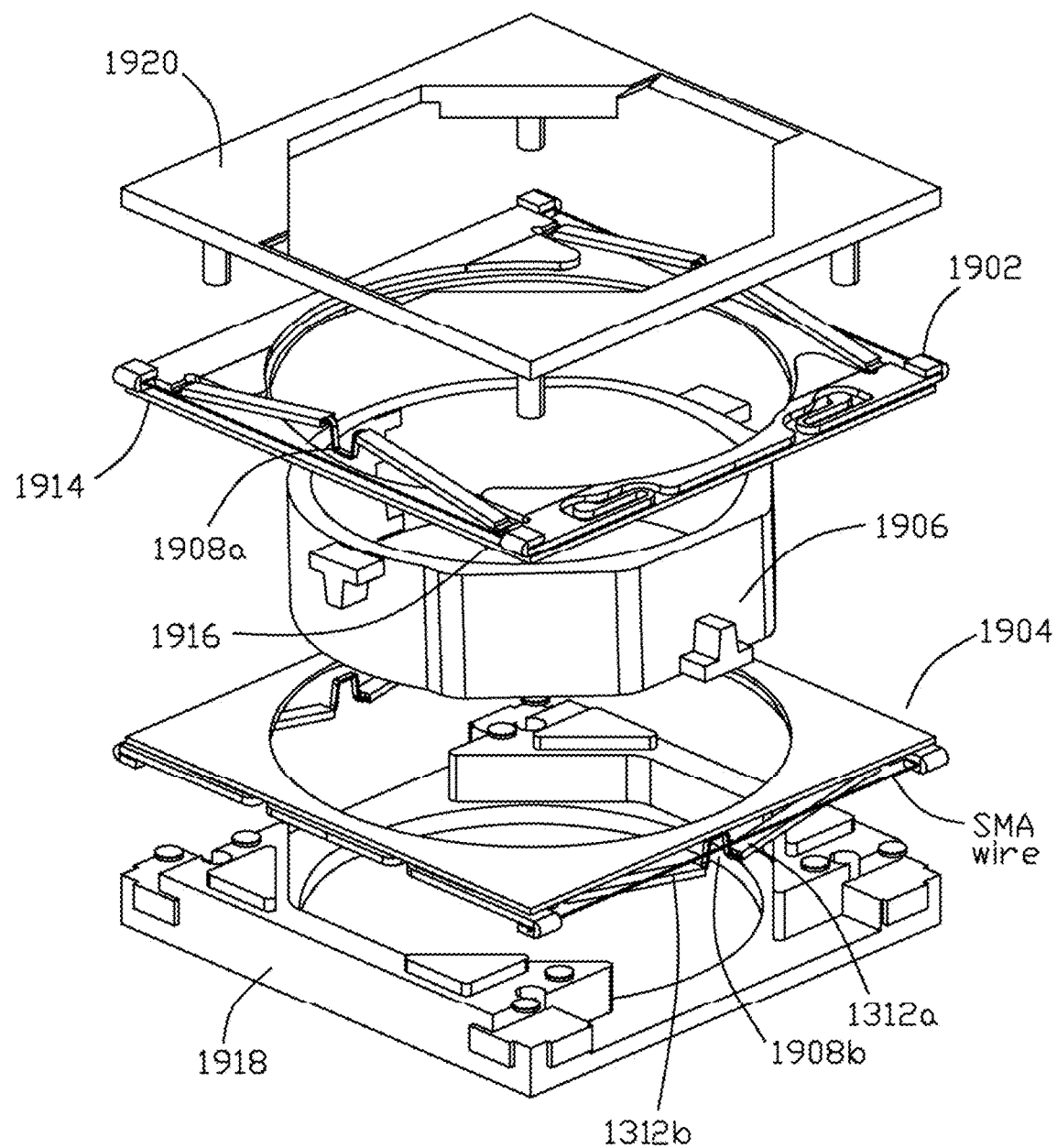
FIG. 19 illustrates an exploded view of an assembly including an SMA actuator including two buckle actuator according to an embodiment.
Figure 20:
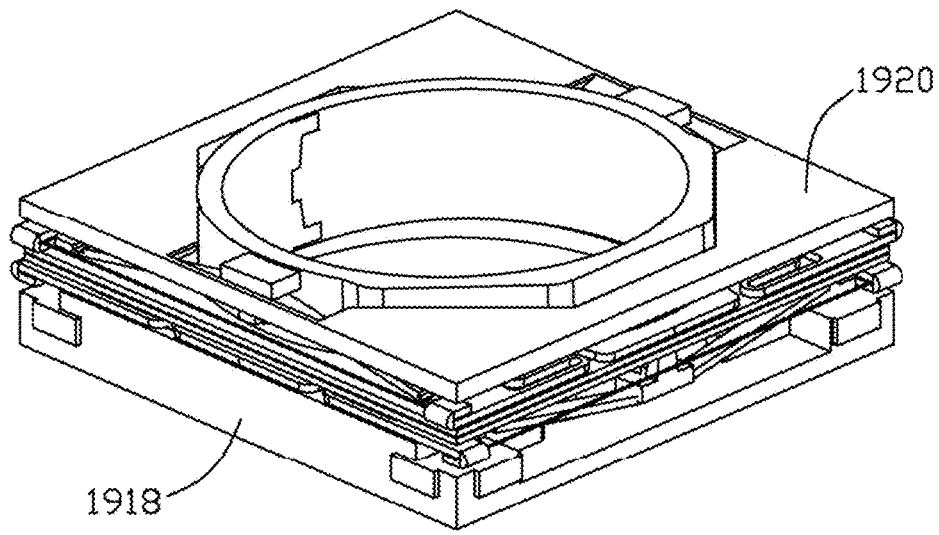
FIG. 20 illustrates an SMA actuator including two buckle actuators according to an embodiment.

FIG. 19 illustrates an exploded view of an assembly including an SMA actuator including two buckle actuators according to an embodiment. The buckle actuators 1902, 1904 are configured such that the buckle arms 1910, 1912 of each buckle actuator 1902, 1904 are an outer surface of the two buckle actuators and the slide base 1914, 1916 of each buckle actuator 1902, 1904 face each other. A hammock portion 1908 of each SMA actuators 1902, 1904, according to various embodiments, is configured to cradle a portion of an object that is acted upon by the one or more buckle actuators 1902, 1904, for example a lens carriage 1906 that is moved by the buckle actuators using techniques including those described herein. For some embodiments, the SMA actuator includes a base portion 1918 configured to receive the second buckle actuator 1904. The SMA actuator may also include a cover portion 1920. FIG. 20 illustrates an SMA actuator including two buckle actuators according to an embodiment including a base portion and a cover portion.

Figure 21:
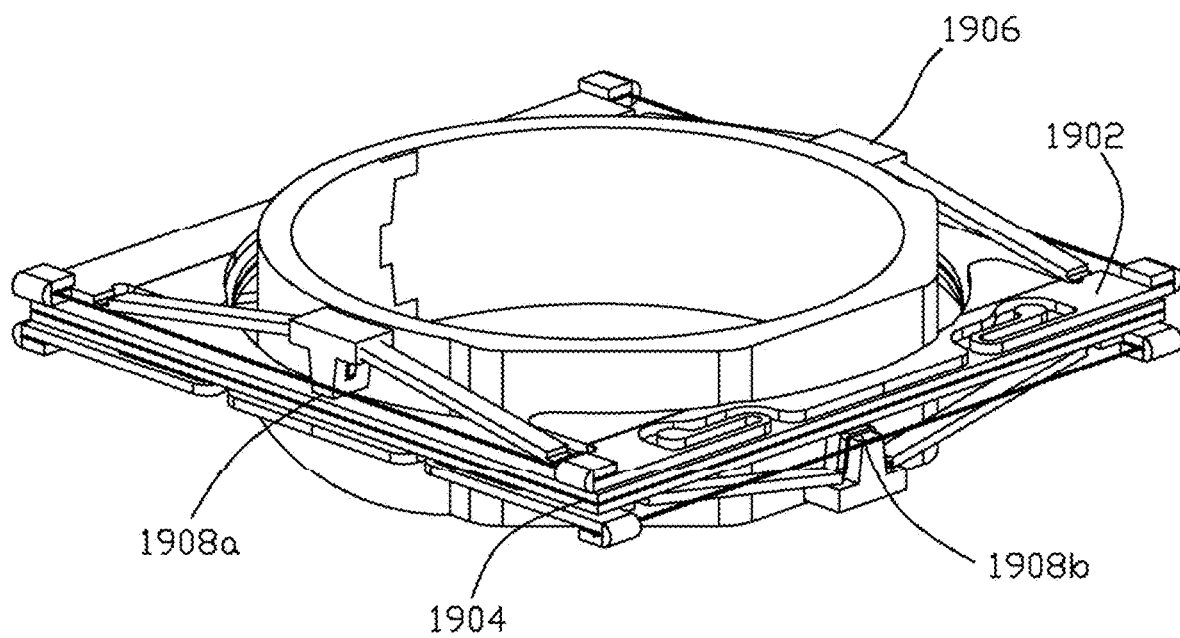
FIG. 21 illustrates an SMA actuator including two buckle actuators according to an embodiment.

FIG. 21 illustrates an SMA actuator including two buckle actuators according to an embodiment. For some embodiments, the buckle actuators 1902, 1904 are arranged with respect to each other such that the hammock portions 1908 of the first buckle actuator 1902 are rotated about 90 degrees from the hammock portions of the second buckle actuator 1904. The 90 degrees configuration enables pitch and roll rotation of an object, such as a lens carriage 1906. This provides better control over the movement of the lens carriage 1906. For various embodiments, differential power signals are applied to the SMA wires of each buckle actuator pair, which provides for pitch and roll rotation of the lens carriage for tilt OIS motion.

Figure 22:
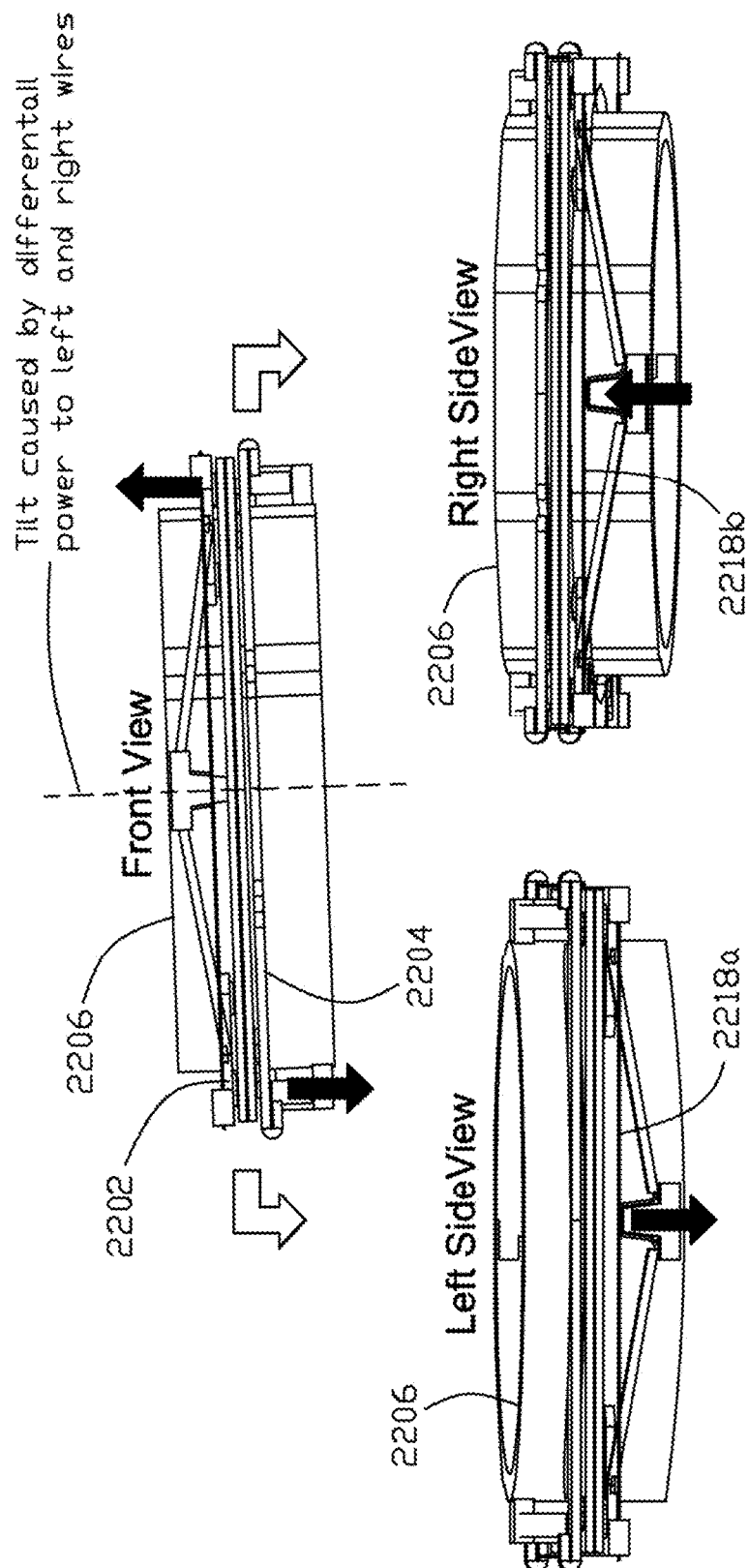
FIG. 22 illustrates an SMA actuator including two buckle actuators according to an embodiment.

Embodiments of the SMA actuators including two buckle actuators remove the need to have a return spring. The use of two buckle actuators can improve/reduce hysteresis when using SMA wire resistance for positional feedback. The opposing force SMA actuators including two buckle actuators aid in more accurate position control due to lower hysteresis than those including a return spring. For some embodiments, such as the embodiment illustrated in FIG. 22, the SMA actuator including two buckle actuators 2202, 2204 provide 2-axis tilt using differential power to the left and right SMA wires 2218a, 2218b of each buckle actuator 2202, 2204. For example, a left SMA wire 2218a is actuated with higher power than a right SMA wire 2218b. This causes the left side of the lens carriage 2206 to move down and right side to move up (tilt). The SMA wires of the first buckle actuator 2202 are held at equal power, for some embodiments, to act as a fulcrum for the SMA wires 2218a, 2218b to differentially push against to cause tilt motion. Reversing the power signals applied to the SMA wires, for example applying equal power to the SMA wires of the second buckle actuator 2204 and using differential power to the left and right SMA wires 2218a, 2218b of the second buckle actuator 2204 results in a tilt of the lens carriage 2206 in the other direction. This provides the ability to tilt an object, such as a lens carrier, in either axis of motion or can tune out any tilt between the lens and sensor for good dynamic tilt, which leads to better picture quality across all pixels.

Figure 23:
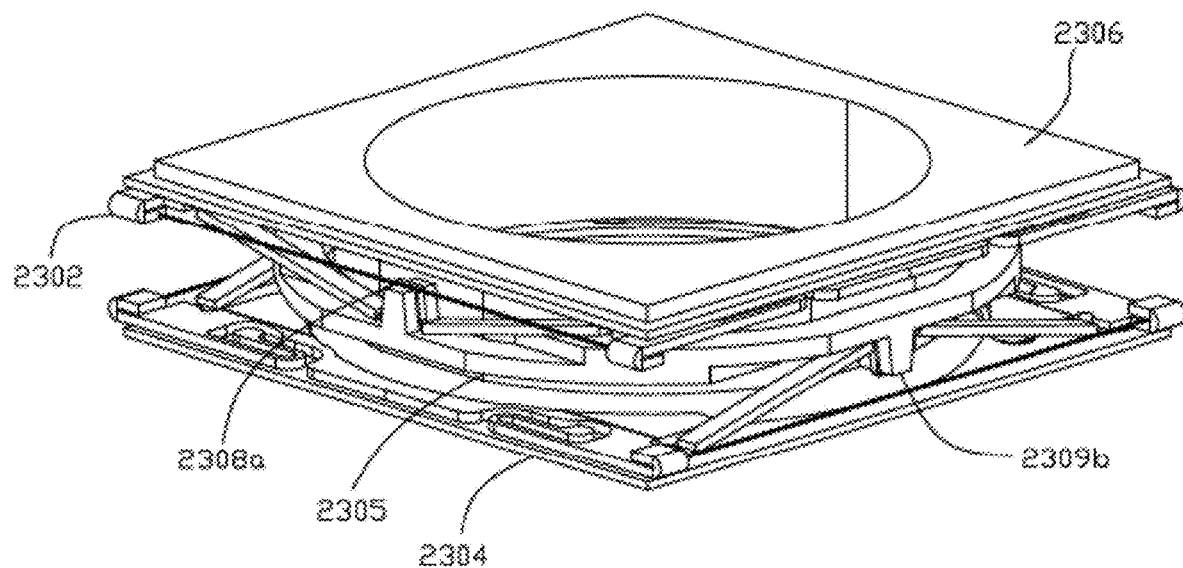
FIG. 23 illustrates a SMA actuator including two buckle actuators and a coupler according to an embodiment.

FIG. 23 illustrates a SMA actuator including two buckle actuators and a coupler according to an embodiment. The SMA actuator includes two buckle actuators such as those described herein. A first buckle actuator 2302 is configured to couple with a second buckle actuator 2304 using a coupler, such as a coupler ring 2305. The buckle actuators 2302, 2304 are arranged with respect to each other such that the hammock portions 2308 of the first buckle actuator 2302 are rotated about 90 degrees from the hammock portions 2309 of the second buckle actuator 2304. A payload for moving, such as a lens or lens assembly, is attached to a lens carriage 2306 configured to be disposed on a slide base of first buckle actuator 2302.

For various embodiments, equal power can be applied to the SMA wires of the first buckle actuator 2302 and the second buckle actuator 2304. This can result in maximizing the z stroke of the SMA actuator in the positive z-direction. For some embodiments, the stroke of the SMA actuator can have a z stroke equal to or greater than two times the stroke of other SMA actuators including two buckle actuators. For some embodiments, an additional spring can be added to the two buckle actuators to push against to aid in pushing the actuator assembly and the payload back down when the power signals are removed from the SMA actuator. Equal and opposite power signals can be applied to the SMA wires of the first buckle actuator 2302 and the second buckle actuator 2304. This enables the SMA actuator to be moved in the positive z-direction by a buckle actuator and to be moved in the negative z-direction by a buckle actuator, which enables accurate control of the position of the SMA actuator. Further, equal and opposite power signals (differential power signals) can be applied to the left and right SMA wire of the first buckle actuator 2302 and the second buckle actuator 2304 to tilt an object, such as a lens carriage 2306 in the direction of at least one of two axis.

Embodiments of SMA actuator including the two buckle actuators and a coupler, such as that illustrated in FIG. 23, can be coupled with an additional buckle actuator and pairs of buckle actuators to achieve a desired stroke greater than that of the single SMA actuator.

Figure 24:
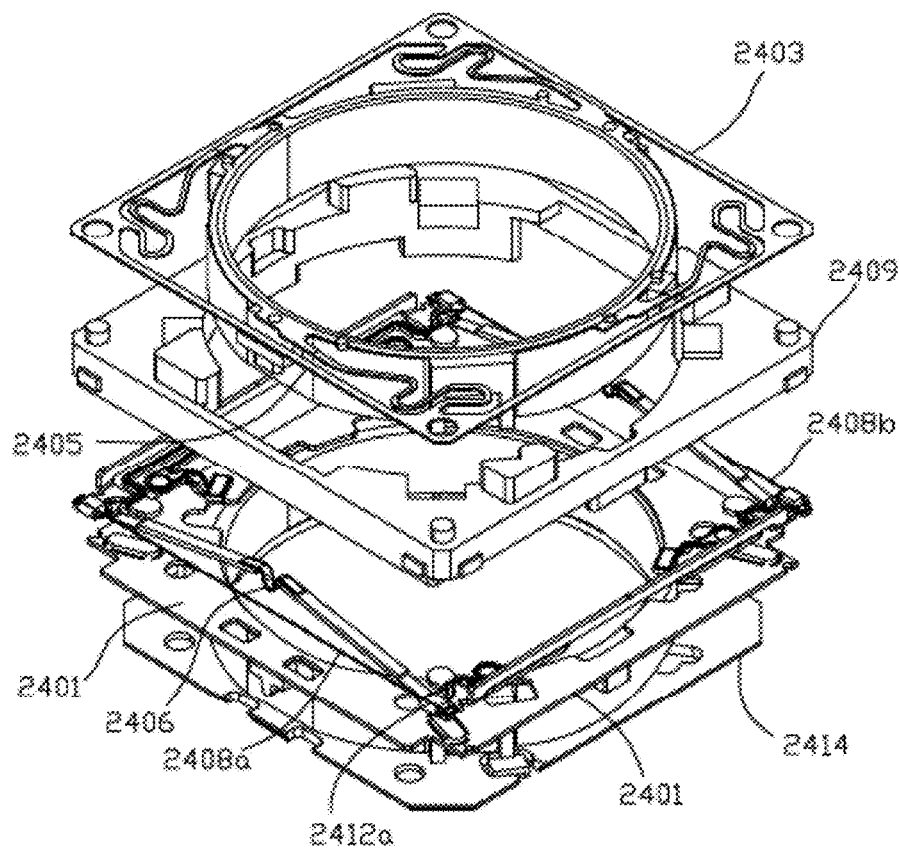
FIG. 24 illustrates an exploded view of an SMA system including an SMA actuator including a buckle actuator with a laminate hammock according to an embodiment.

FIG. 24 illustrates an exploded view of an SMA system including an SMA actuator including a buckle actuator with a laminate hammock according to an embodiment. As described herein, SMA systems, for some embodiments, are configured to be used in conjunction with one or more camera lens elements as an auto-focusing drive. As illustrated in FIG. 24, the SMA system includes a return spring 2403 configured, according to various embodiments, to move a lens carriage 2405 in the opposite direction of the z-stroke direction when the tension in the SMA wires 2408 is lowered as the SMA wire is de-actuated. The SMA system for some embodiments includes a housing 2409 configured to receive the return spring 2403 and to act a slide bearing to guide the lens carriage in the z-stroke direction. The housing 2409 is also configured to be disposed on the buckle actuator 2402. The buckle actuator 2402 includes a slide base 2401 similar to those described herein. The buckle actuator 2402 includes buckle arms 2404 coupled with a hammock portion, such as a laminated hammock 2406 formed of a laminate. The buckle actuator 2402 also includes a SMA wire attach structures such as a laminate formed crimp connection 2412.

Figure 25:
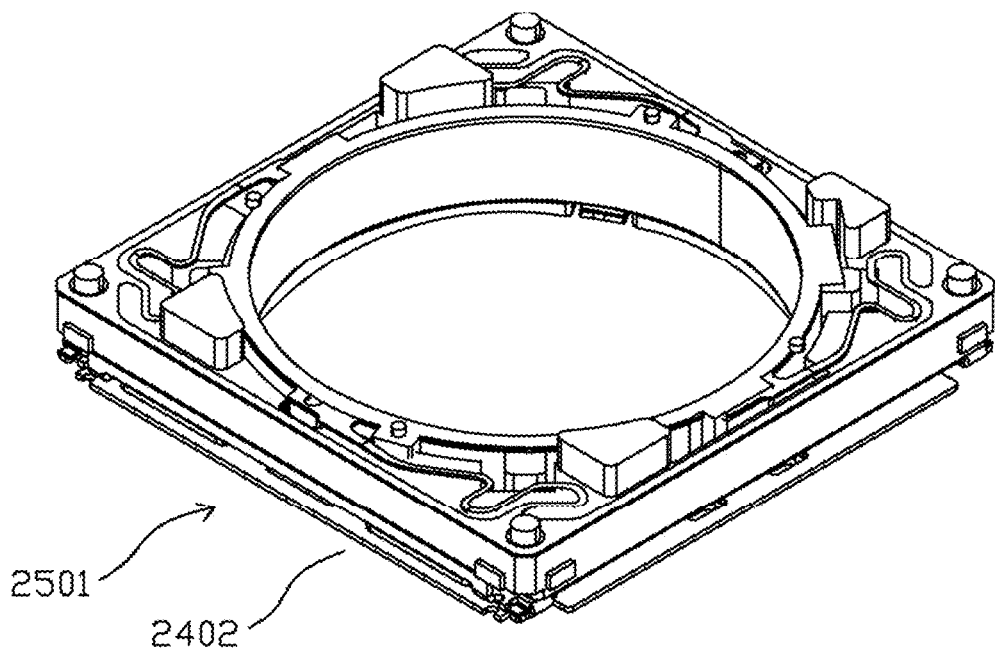
FIG. 25 illustrates an SMA system including an SMA actuator including a buckle actuator 2402 with a laminate hammock according to an embodiment.

As illustrated in FIG. 24, the slide base 2401 is disposed on an optional adaptor plate 2414. The adaptor plate is configured to mate the SMA system or the buckle actuator 2402 to another system, such as an OIS, additional SMA systems, or other components. FIG. 25 illustrates an SMA system 2501 including an SMA actuator including a buckle actuator 2402 with a laminate hammock according to an embodiment.

Figure 26:
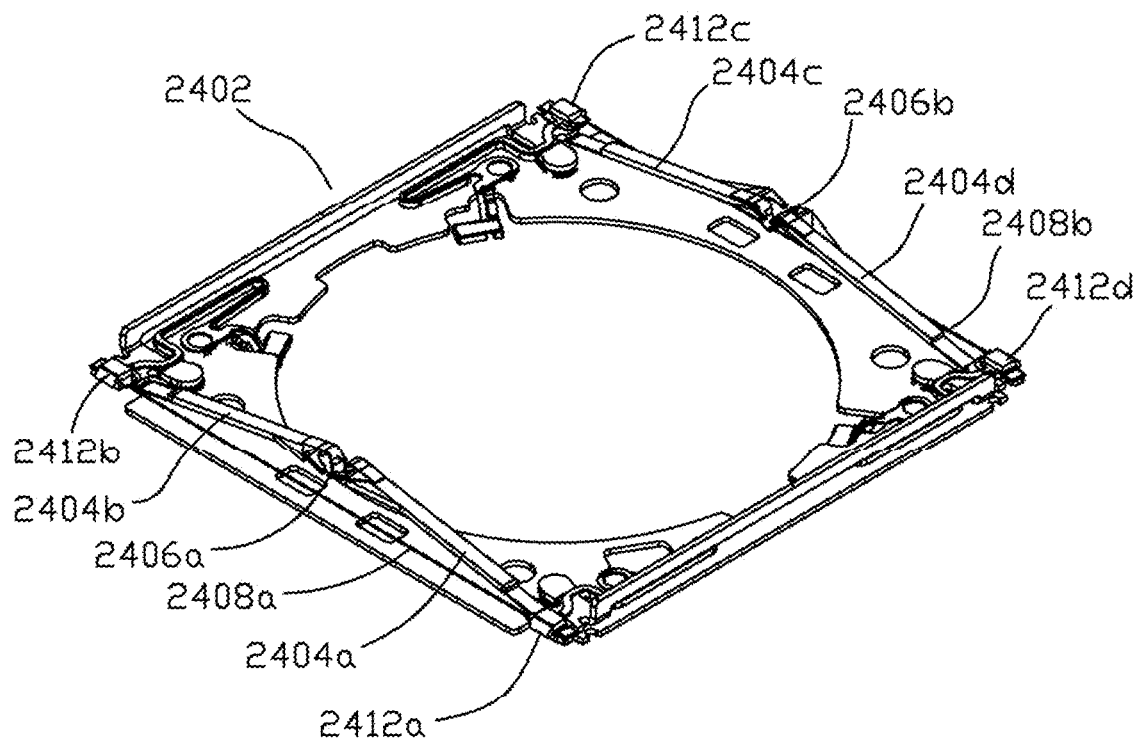
FIG. 26 illustrates a buckle actuator including a laminate hammock according to an embodiment.

FIG. 26 illustrates a buckle actuator including a laminate hammock according to an embodiment. The buckle actuator 2402 includes buckle arms 2404. The buckle arms 2404 are configured to move in the z-axis when the SMA wires 2408 are actuated and de-actuated as described herein. The SMA wires 2408 are attached to the buckle actuator using laminate formed crimp connections 2412. According to the embodiment illustrated in FIG. 26, the buckle arms 2404 are coupled with each other through a center portion such as a laminate hammock 2406. A laminate hammock 2406, according to various embodiments, is configured to cradle a portion of an object that is acted upon by the buckle actuator, for example a lens carriage that is moved by the buckle actuator using techniques including those described herein.

Figure 27:
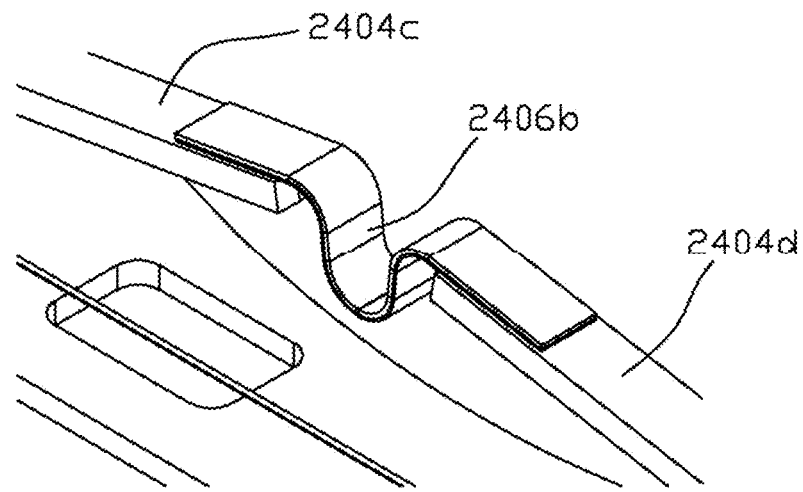
FIG. 27 illustrates a laminate hammock of an SMA actuator according to an embodiment.

FIG. 27 illustrates a laminate hammock of an SMA actuator according to an embodiment. For some embodiments, the laminate hammock 2406 material is a low stiffness material so it does not resist the actuation motion. For example, the laminate hammock 2406 is formed using a copper layer disposed on a first polyimide layer with a second polyimide layer disposed on the copper. For some embodiments, the laminate hammock 2406 is formed on buckle arms 2404 using deposition and etching techniques including those known in the art. For other embodiments, the laminate hammock 2406 is formed separately from the buckle arms 2404 and attached to the buckle arms 2404 using techniques including welding, adhesive, and other techniques known in the art. For various embodiments, glue or other adhesive is used on the laminate hammock 2406 to ensure the buckle arms 2404 stay in a position relative to a lens carriage.

Figure 28:
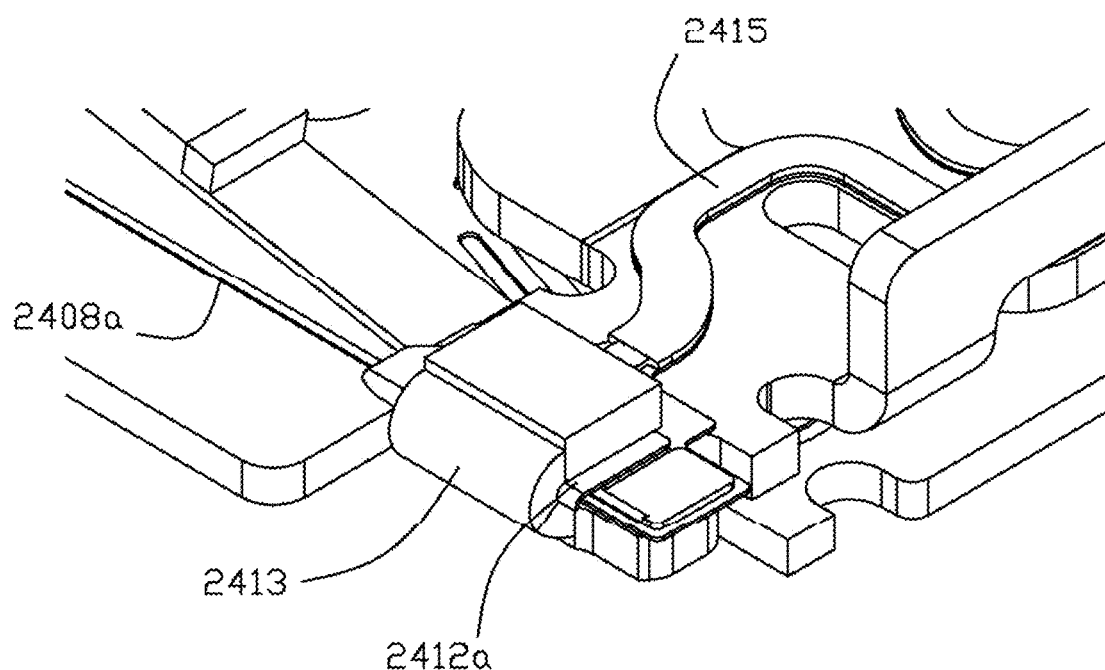
FIG. 28 illustrates a laminate formed crimp connection of an SMA actuator according to an embodiment.

FIG. 28 illustrates a laminate formed crimp connection of an SMA actuator according to an embodiment. The laminate formed crimp connection 2412 is configured to attach an SMA wire 2408 to the buckle actuator and to create an electrical circuit joint with the SMA wire 2408. For various embodiments, the laminated formed crimp connection 2412 includes a laminate formed of one or more layers of an insulator and one or more layers of a conductive layer formed on a crimp.

For example, a polyimide layer is disposed on at least a portion of the stainless steel portion forming a crimp 2413. A conductive layer, such as copper, is then disposed on the polyimide layer, which is electrically coupled with one or more signal traces 2415 disposed on the buckle actuator. Deforming the crimp to come in to contact with the SMA wire therein also puts the SMA wire in electrical contact with the conductive layer. Thus, the conductive layer coupled with the one or more signal traces is used to apply power signals to the SMA wire using techniques including those described herein. For some embodiments, a second polyimide layer is formed over the conductive layer in areas where the conductive layer will not come into contact with the SMA wire. For some embodiments, the laminated formed crimp connection 2412 is formed on a crimp 2413 using deposition and etching techniques including those known in the art. For other embodiments, laminated formed crimp connection 2412 and the one or more electrical traces are formed separately from the crimp 2413 and the buckle actuator and attached to the crimp 2413 and the buckle actuator using techniques including welding, adhesive, and other techniques known in the art.

Figure 29:
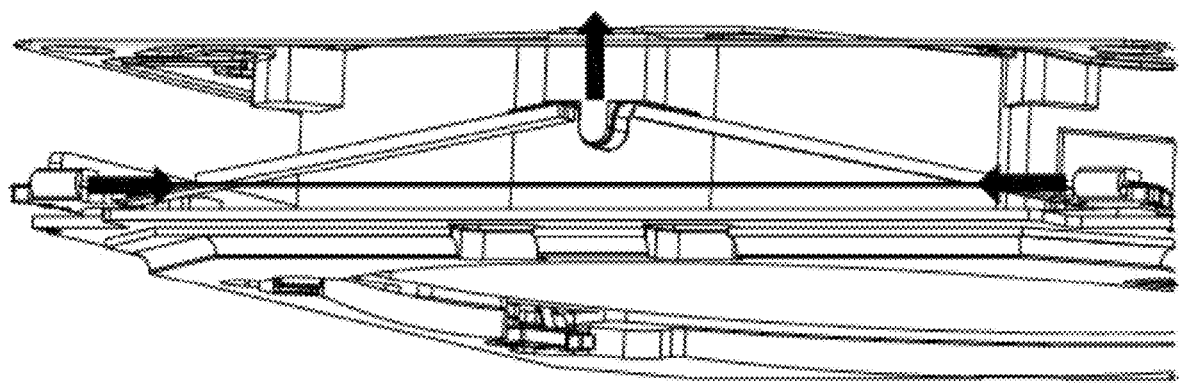
FIG. 29 illustrates an SMA actuator including a buckle actuator with a laminate hammock.

FIG. 29 illustrates an SMA actuator including a buckle actuator with a laminate hammock. As illustrated in FIG. 29, when a power signal is applied the SMA wire contracts or shortens to move the buckle arms and the laminate hammock in the positive z-direction. The laminate hammock that is in contact with an object in turn moves that object, such as a lens carriage in the positive z-direction. When the power signal is decreased or removed the SMA wire lengthens and moving the buckle arms and the laminate hammock in a negative z-direction.

Figure 30:
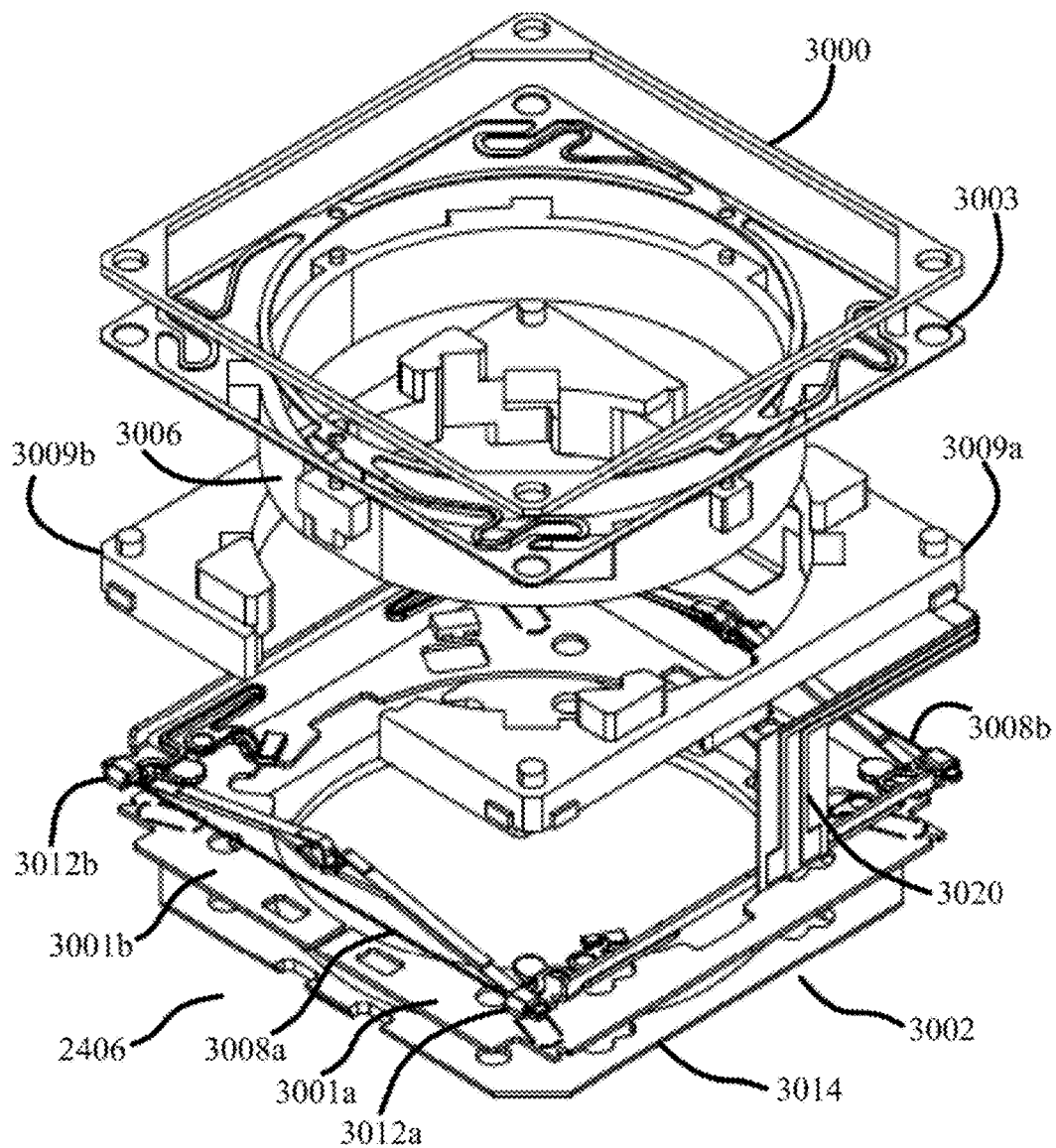
FIG. 30 illustrates an exploded view of an SMA system including an SMA actuator including a buckle actuator according to an embodiment.

FIG. 30 illustrates an exploded view of an SMA system including an SMA actuator including a buckle actuator according to an embodiment. As described herein, SMA systems, for some embodiments, are configured to be used in conjunction with one or more camera lens elements as an auto-focusing drive. As illustrated in FIG. 30, the SMA system includes a return spring 3003 configured, according to various embodiments, to move a lens carriage 3006 in the opposite direction of the z-stroke direction when the tension in the SMA wires 3008 is lowered as the SMA wire is de-actuated. The SMA system, for some embodiments, includes a stiffner 3000 disposed on the return spring 3003. The SMA system for some embodiments includes a housing 3009 formed of two portions configured to receive the return spring 3003 and to act a slide bearing to guide the lens carriage in the z-stroke direction. The housing 3009 is also configured to be disposed on the buckle actuator 3002. The buckle actuator 3002 includes a slide base 3001 similar to those described herein is formed of two portions. The slide base 3001 is split to electrically isolate the 2 sides (for example 1 side is ground, other side is power) because, according to some embodiments, current flows to the wire through the slide base 3001 portions.

The buckle actuator 3002 includes buckle arms 3004. Each pair of buckle actuators 3002 are formed on a separate portion of the buckle actuator 3002. The buckle actuator 3002 also includes a SMA wire attach structures such as a resistance weld wire crimp 3012. The SMA system optionally includes a flex circuit 3020 for electrically coupling the SMA wires 3008 to one or more control circuits.

Figure 31:
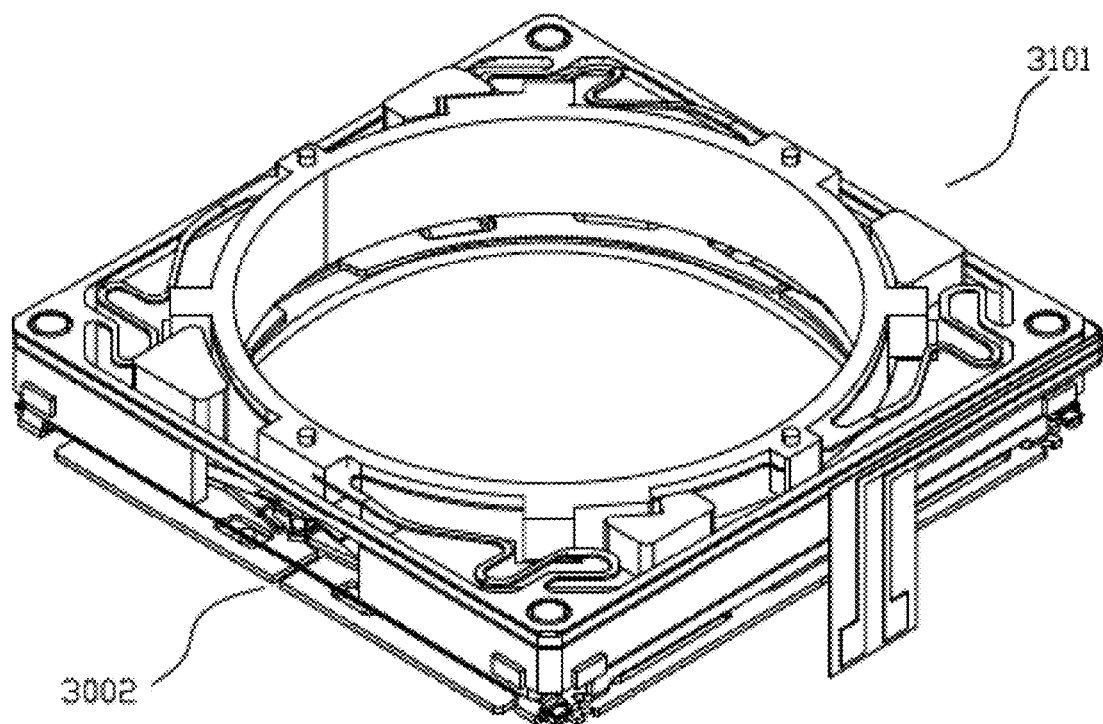
FIG. 31 illustrates an SMA system including an SMA actuator including a buckle actuator according to an embodiment.

As illustrated in FIG. 30, the slide base 3001 is disposed on an optional adaptor plate 3014. The adaptor plate is configured to mate the SMA system or the buckle actuator 3002 to another system, such as an OIS, additional SMA systems, or other components. FIG. 31 illustrates an SMA system 3101 including an SMA actuator including a buckle actuator 3002 according to an embodiment.

Figure 32:
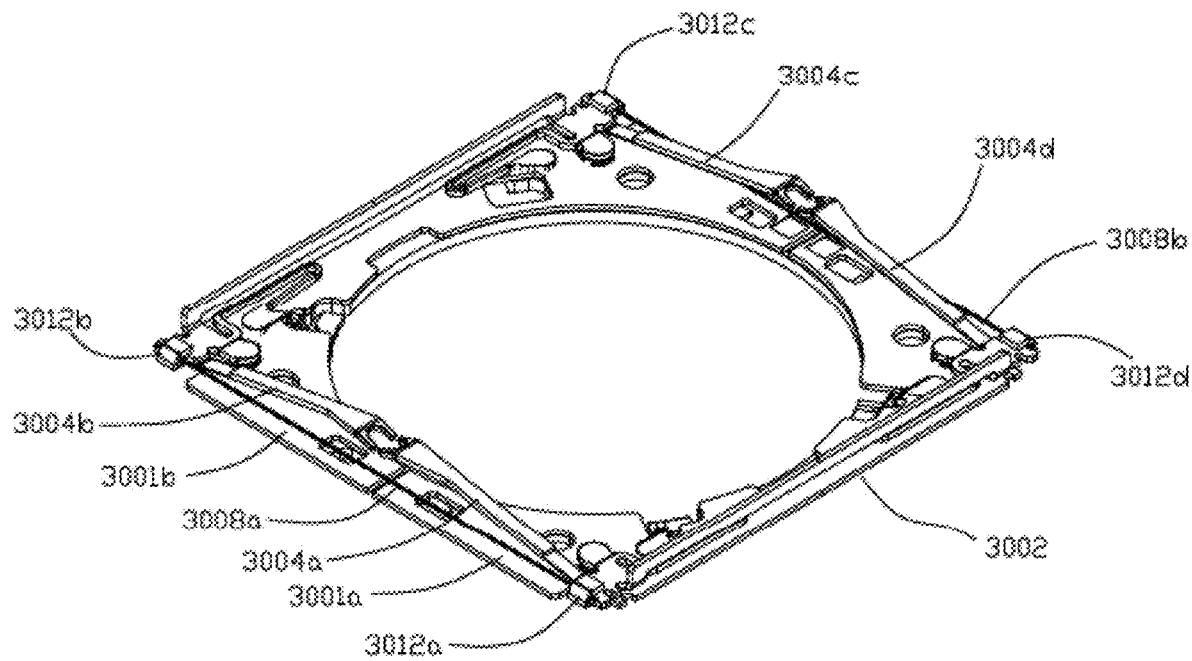
FIG. 32 illustrates an SMA actuator including a buckle actuator according to an embodiment.

FIG. 32 includes an SMA actuator including a buckle actuator according to an embodiment. The buckle actuator 3002 includes buckle arms 3004. The buckle arms 3004 are configured to move in the z-axis when the SMA wires 3008 are actuated and de-actuated as described herein. The SMA wires 3008 are attached to the resistance weld wire crimps 3012. According to the embodiment illustrated in FIG. 32, the buckle arms 3004 are configured to mate with an object, such as a lens carriage, without a center portion using a two yoke capture joint.

Figure 33:
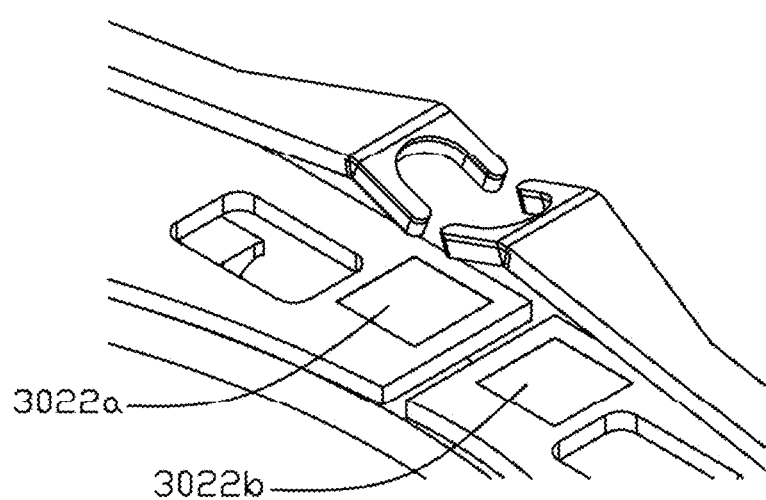
FIG. 33 illustrates a two yoke capture joint of a pair of buckle arms of an SMA actuator according to an embodiment.
Figure 34:
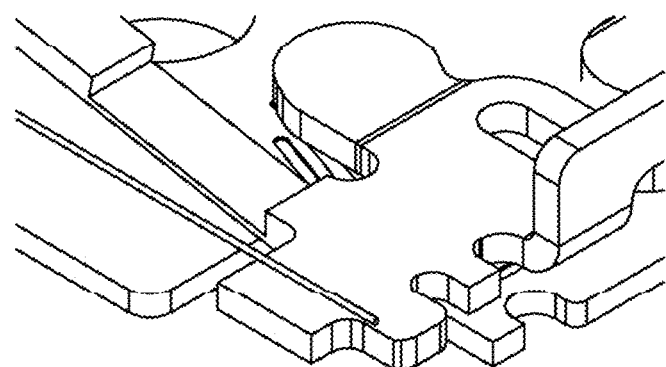
FIG. 34 illustrates a resistance weld crimp for an SMA actuator according to an embodiment used to attach an SMA wire to the buckle actuator.

FIG. 33 illustrates a two yoke capture joint of a pair of buckle arms of an SMA actuator according to an embodiment. FIG. 33 also illustrates plating pads 3022 used to attached the optional flex circuit to the sliding base. For some embodiments, the plating pads 3022 are formed using gold. FIG. 34 illustrates a resistance weld crimp for an SMA actuator according to an embodiment used to attach an SMA wire to the buckle actuator. For some embodiments, glue or adhesive can also be placed on top of the weld to aid in mechanical strength and work as a fatigue strain relief during operation and shock loading.

Figure 35:
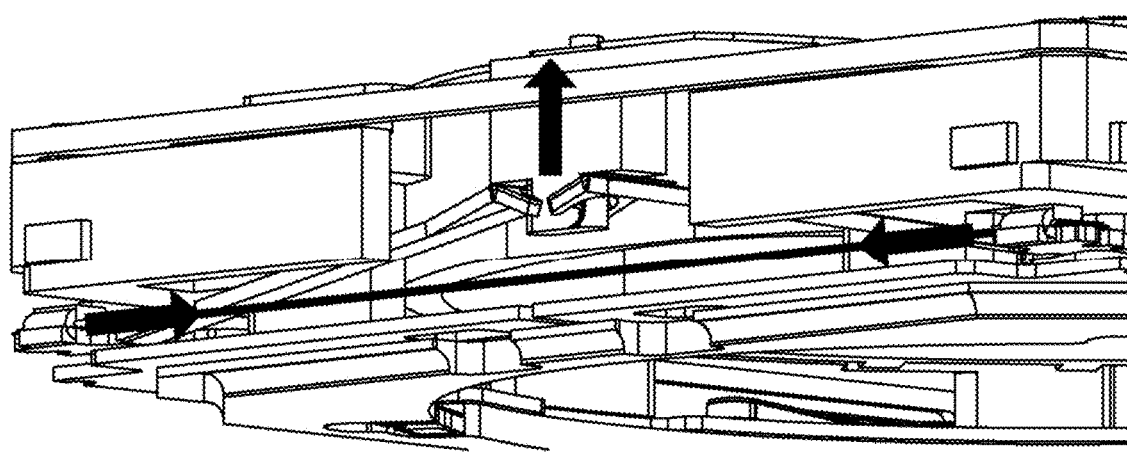
FIG. 35 illustrates an SMA actuator including a buckle actuator with a two yoke capture joint.

FIG. 35 illustrates an SMA actuator including a buckle actuator with a two yoke capture joint. As illustrated in FIG. 35, when a power signal is applied the SMA wire contracts or shortens to move the buckle arms in the positive z-direction. The two yoke capture joint is in contact with an object in turn moves that object, such as a lens carriage in the positive z-direction. When the power signal is decreased or removed the SMA wire lengthens and moving the buckle arms in a negative z-direction. The yoke capture feature ensures buckle arms stay in correct position relative to the lens carriage.

Figure 36:
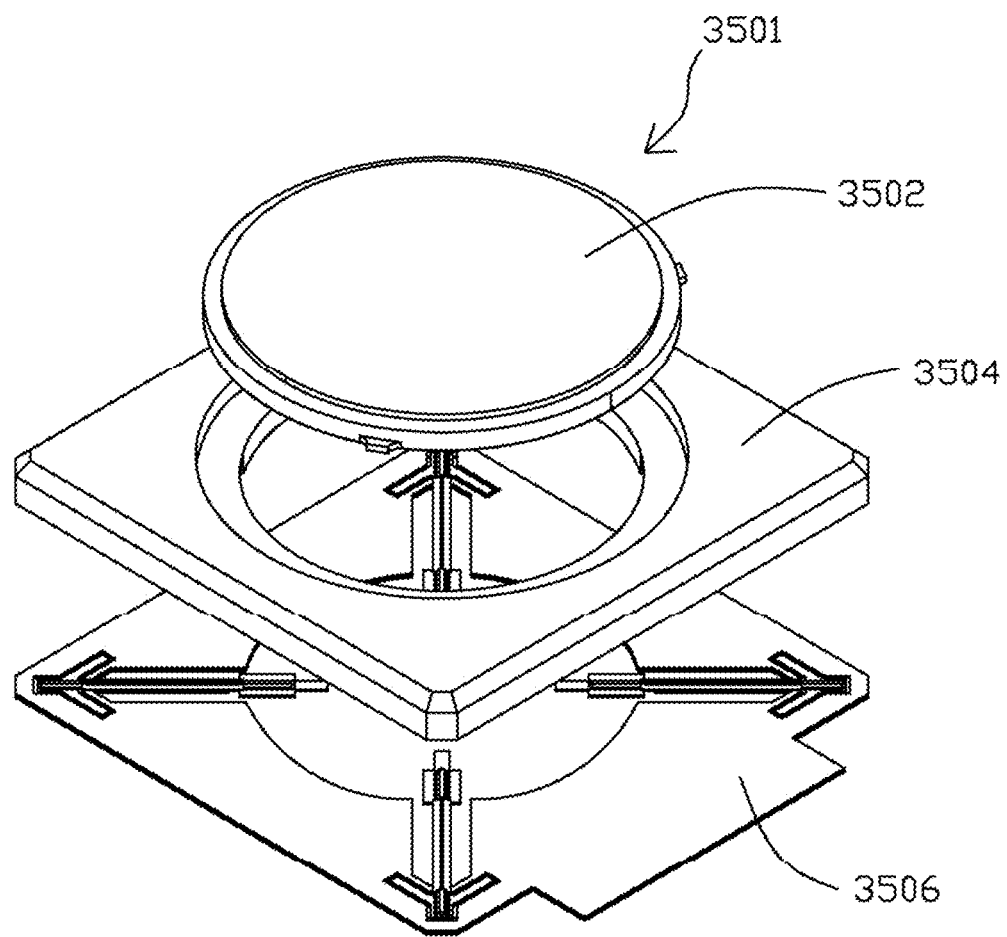
FIG. 36 illustrates a SMA bimorph liquid lens according to an embodiment.

FIG. 36 illustrates a SMA bimorph liquid lens according to an embodiment. The SMA bimorph liquid lens 3501 includes a liquid lens subassembly 3502, a housing 3504, and a circuit with SMA actuators 3506. For various embodiments, the SMA actuators include 4 bimorph actuators 3508, such as embodiments described herein. The bimorph actuators 3508 are configured to push on a shaping ring 3510 located on a flexible membrane 3512. The ring warps the membrane 3512/liquid 3514 changing the light path through the membrane 3512/liquid 3514. A liquid contain ring 3516 is used to contain the liquid 3514 between the membrane 3512 and the lens 3518. Equal force from Bimorph actuators changes the focus point of the image in the Z direction (normal to lens) which allows it to work as an auto focus. Differential force from Bimorph actuators 3508 can move light rays in the X, Y axes directions which allows it to work as an optical image stabilizer according to some embodiments. Both OIS and AF functions could be achieved at the same time with proper controls to each actuator. For some embodiments, 3 actuators are used. The circuit with SMA actuators 3506 includes one or more contacts 3520 for control signals to actuate the SMA actuators. According to some embodiments including 4 SMA actuators the circuit with SMA actuators 3506 includes 4 power circuit control contact for each SMA actuator and a common return contact.

Figure 37:
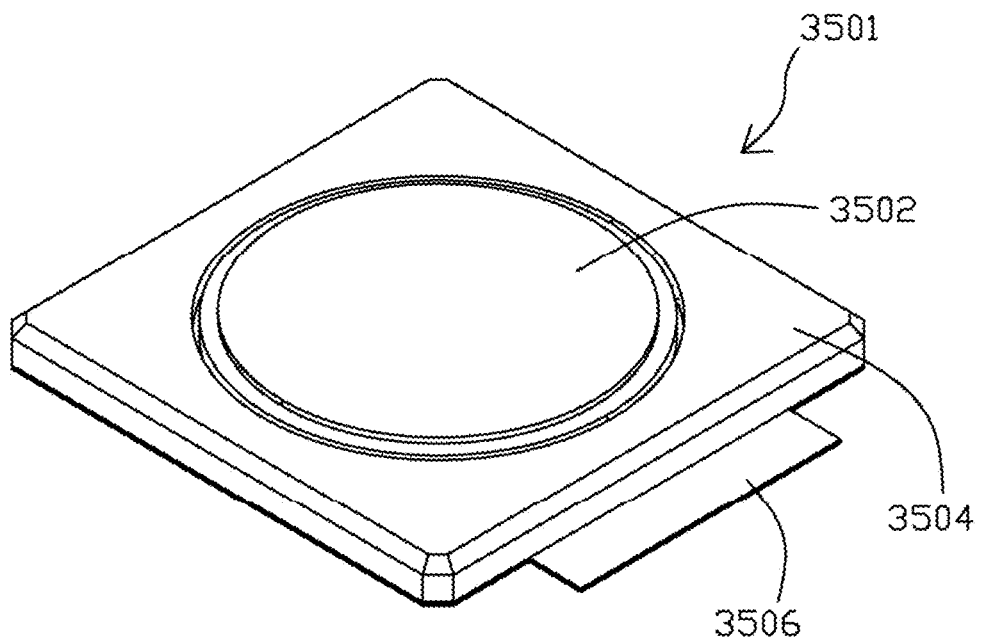
FIG. 37 illustrates a perspective SMA bimorph liquid lens according to an embodiment.
Figure 38:
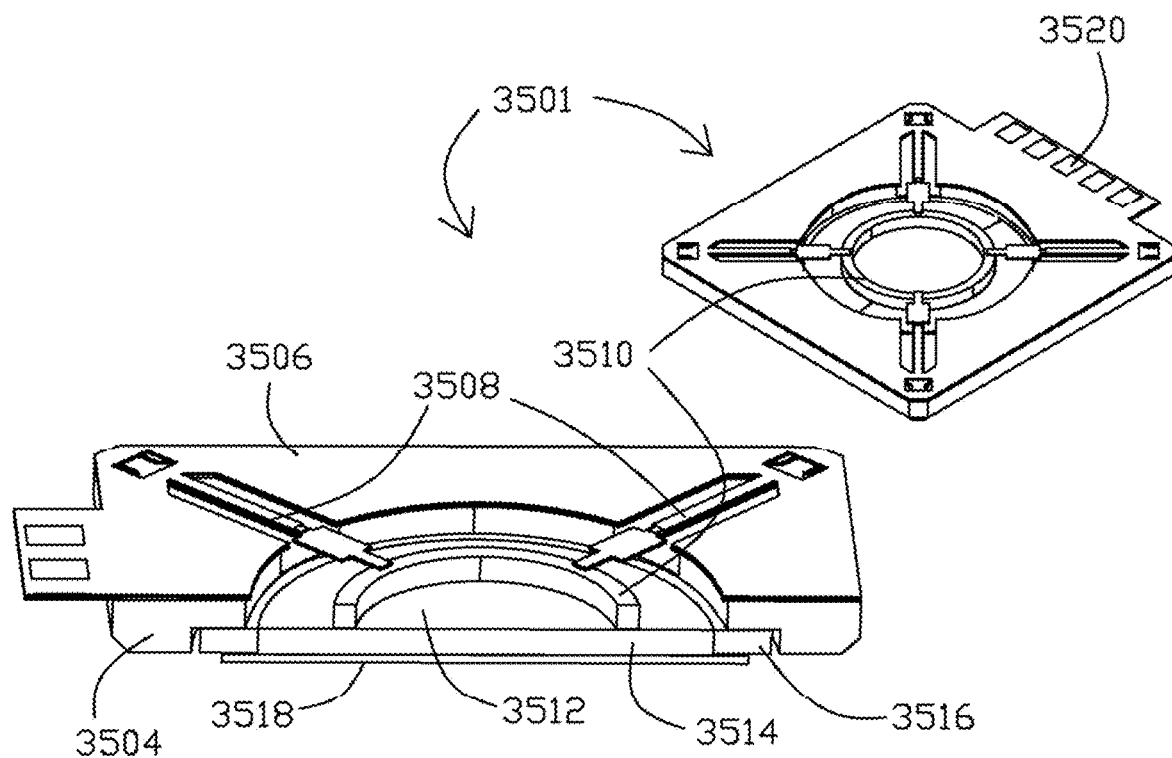
FIG. 38 illustrates a cross-section and a bottom view of SMA bimorph liquid lens according to an embodiment.

FIG. 37 illustrates a perspective SMA bimorph liquid lens according to an embodiment. FIG. 38 illustrates a cross-section and a bottom view of SMA bimorph liquid lens according to an embodiment.

Figure 39:
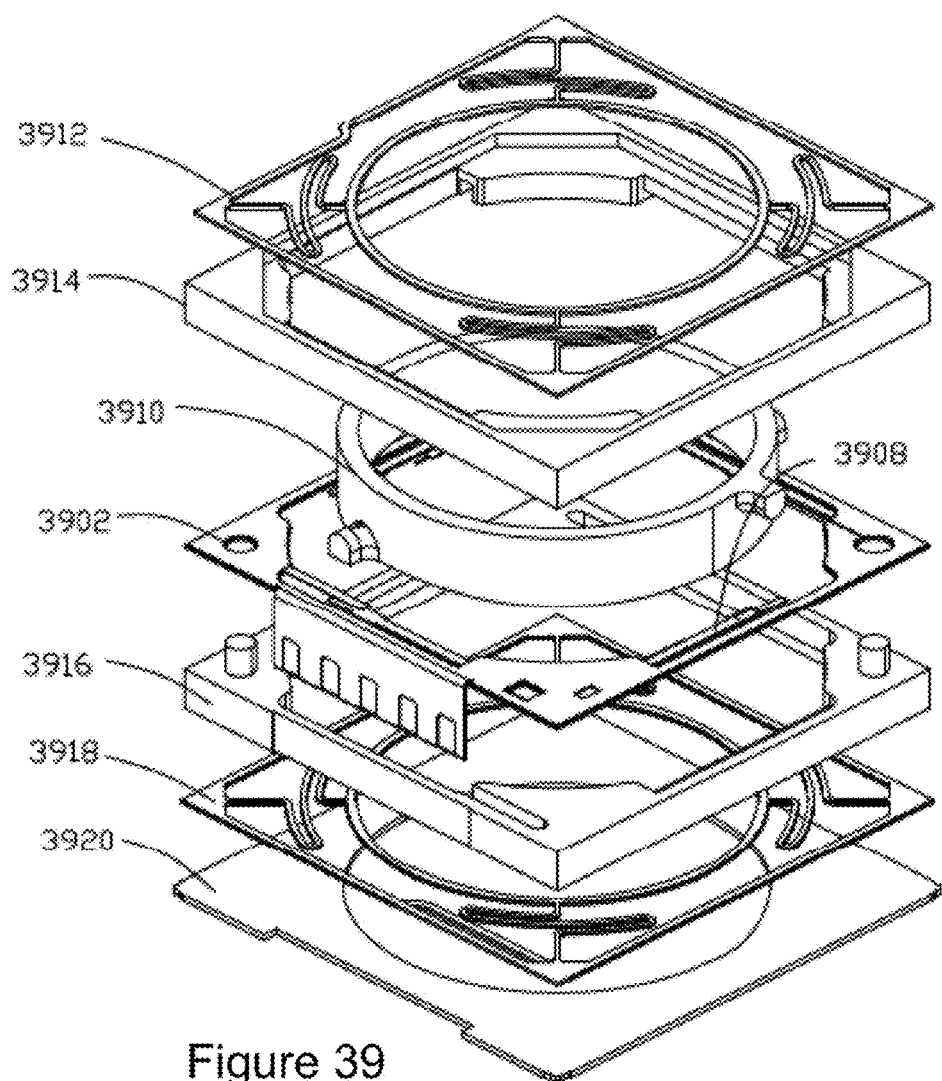
FIG. 39 illustrates an SMA system including an SMA actuator with bimorph actuators according to an embodiment.
Figure 40:
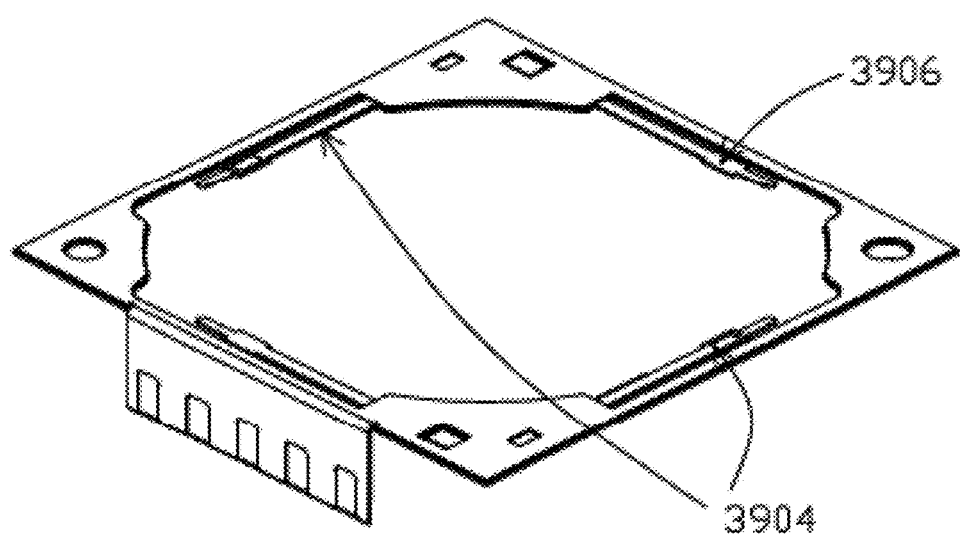
FIG. 40 illustrates the SMA actuator with bimorph actuators according to an embodiment.

FIG. 39 illustrates an SMA system including an SMA actuator 3902 with bimorph actuators according to an embodiment. The SMA actuator 3902 includes 4 bimorph actuators using techniques described herein. Two of the bimorph actuators are configured as positive z-stroke actuators 3904 and two are configured as negative z-stroke actuators 3906 as illustrated in FIG. 40, which illustrates the SMA actuator 3902 with bimorph actuators according to an embodiment. The opposing actuators 3906, 3904 are configured to control motion in both directions over the entire stroke range. This provides the ability to tune control code to compensate for tilt. For various embodiments, two SMA wires 3908 attached to top of component enable the positive z-stroke displacement. Two SMA wires attached to a bottom of component enable the negative z-stroke displacement. For some embodiments, each bimorph actuators are attached to an object, such as a lens carriage 3910, using tabs to engage the object. The SMA system includes a top spring 3912 configured to provide stability of the lens carriage 3910 in axes perpendicular to the z-stroke axis, for example in the direction of the x axis and the y axis. Further, a top spacer 3914 is configured to be arranged between the top spring 3912 and the SMA actuator 3902. A bottom spacer 3916 is arranged between the SMA actuator 3902 and a bottom spring 3918. The bottom spring 3918 is configured to provide stability of the lens carriage 3910 in axes perpendicular to the z-stroke axis, for example in the direction of the x axis and the y axis. The bottom spring 3918 is configured to be disposed on a base 3920, such as those described herein.

Figure 41:
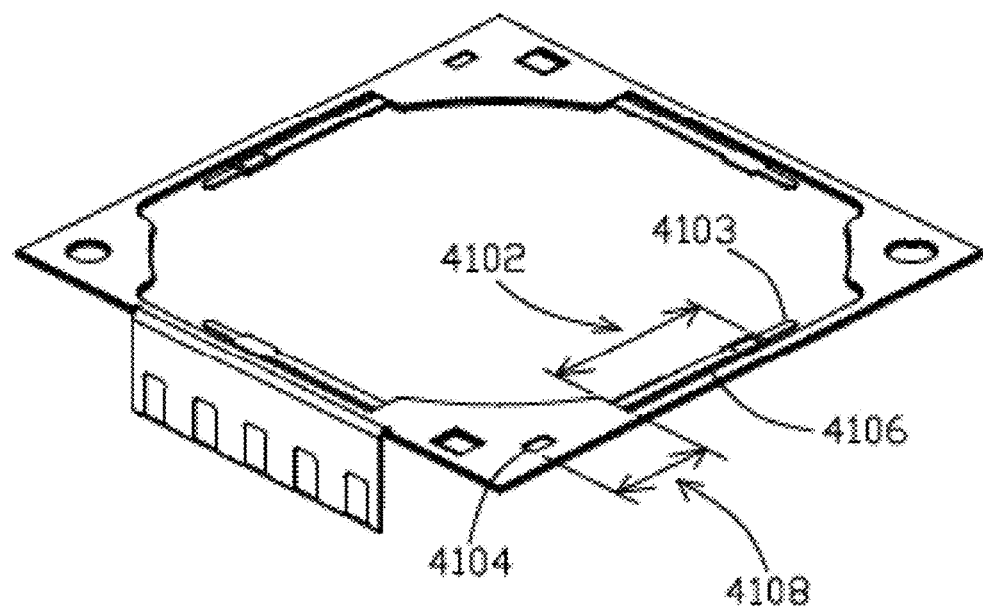
FIG. 41 illustrates the length of a bimorph actuator and the location of a bonding pad for an SMA wire to extend the wire length beyond the bimorph actuator.

FIG. 41 illustrates the length 4102 of a bimorph actuator 4103 and the location of a bonding pad 4104 for an SMA wire 4106 to extend the wire length beyond the bimorph actuator. Longer wire than bimorph actuator is used to increased stroke & force. Thus, the extension length 4108 of that the SMA wire 4106 beyond the bimorph actuator 4103 is used to set the stroke and force for the bimorph actuator 4103.

Figure 42:
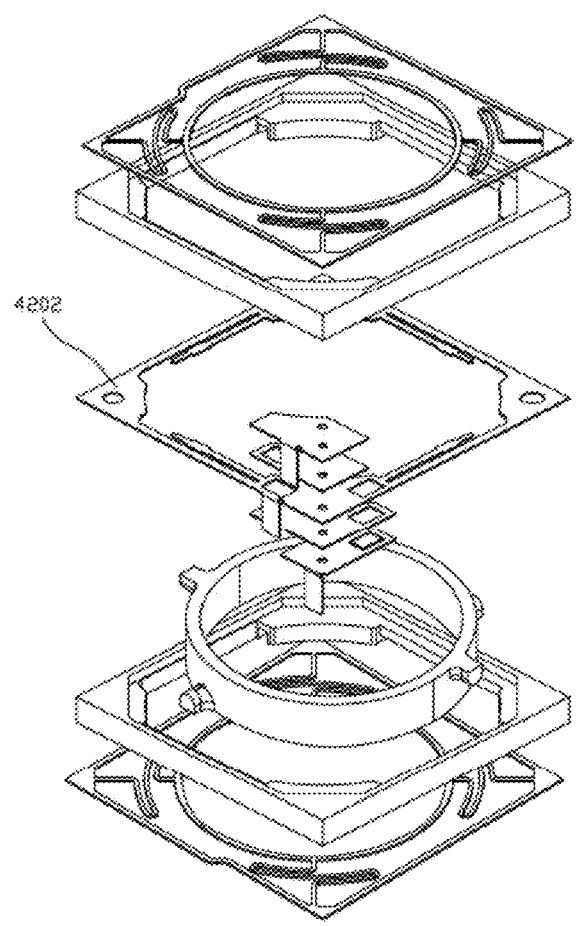
FIG. 42 illustrates an exploded view of an SMA system including a bimorph actuator according to an embodiment.
Figure 43:
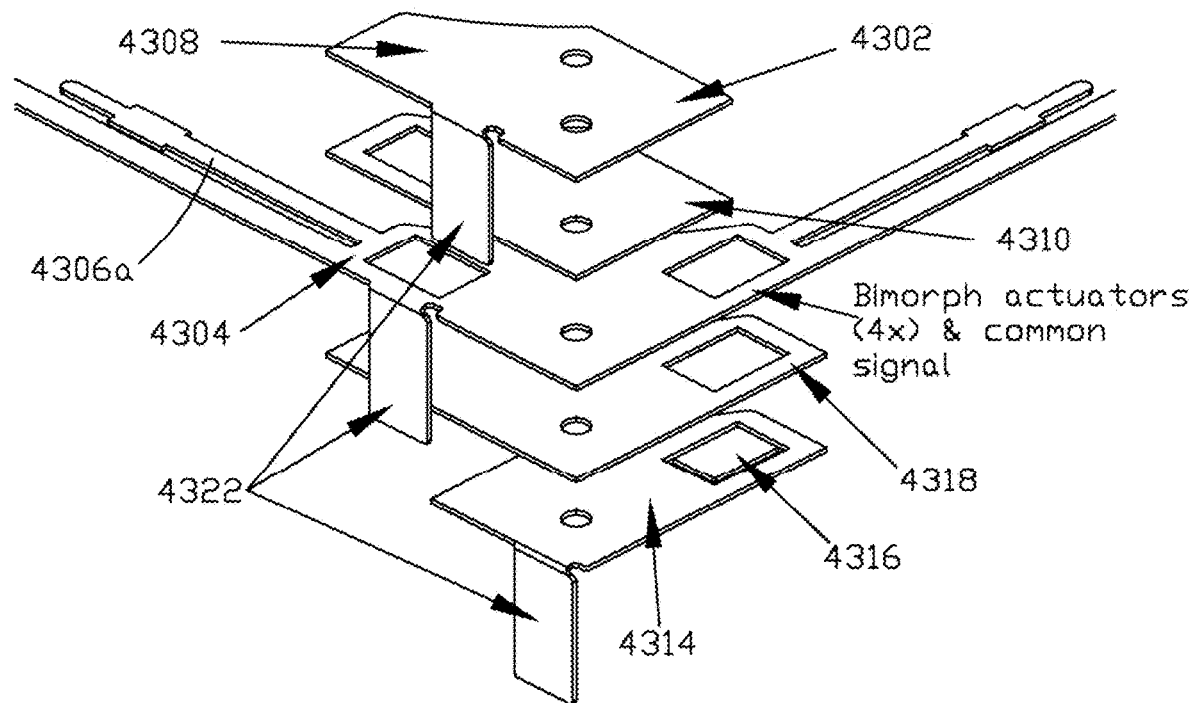
FIG. 43 illustrates an exploded view of a subsection of the SMA actuator according to an embodiment.

FIG. 42 illustrates an exploded view of an SMA system including a SMA bimorph actuator 4202 according to an embodiment. The SMA system, according to various embodiments, is configured to use separate metal materials and non-conductive adhesives to create one or more electrical circuits to power the SMA wires independently. Some embodiments have no AF size impact and include 4 bimorph actuators, such as those described herein. Two of the bimorph actuators are configured as positive z stroke actuators and two negative z stroke actuators. FIG. 43 illustrates an exploded view of a subsection of the SMA actuator according to an embodiment. The subsection includes a negative actuator signal connection 4302, a base 4304 with bimorph actuators 4306. The negative actuator signal connection 4302 includes a wire bond pad 4308 for connecting an SMA wire of a bimorph actuator 4306 using techniques including those described herein. The negative actuator signal connection 4302 is affixed to the base 4304 using an adhesive layer 4310. The subsection also includes a positive actuator signal connection 4314 with a wire bond pad 4316 for connecting an SMA wire 4312 of a bimorph actuator

Figure 44:
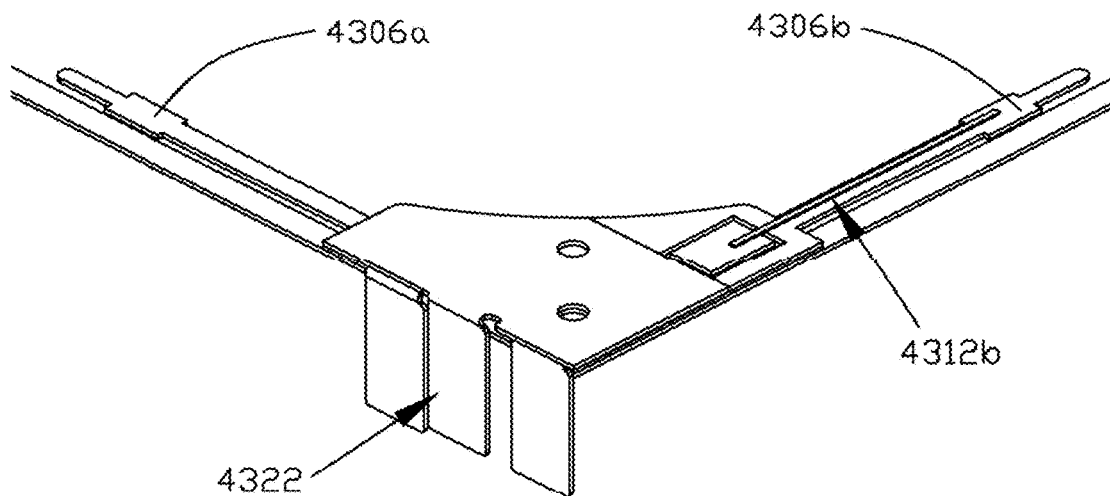
FIG. 44 illustrates a subsection of the SMA actuator according to an embodiment.

4306 using techniques including those described herein. The positive actuator signal connection 4314 is affixed to the base 4304 using an adhesive layer 4318. Each of the base 4304, the negative actuator signal connection 4302, and the positive actuator signal connection 4314 are formed of metal, for example stainless steel. Connection pads 4322 on each of the base 4304, the negative actuator signal connection 4302, and the positive actuator signal connection 4314 are configured to electrically couple control signals and ground for actuating the bimorph actuator 4306 using techniques including those described herein. For some embodiments, the connection pads 4322 are gold plated. FIG. 44 illustrates a subsection of the SMA actuator according to an embodiment. For some embodiments, gold platted pads are formed on the stainless steel layer for solder bonding or other known electrical termination methods. Further, formed wire bond pads are used for signal joints to electrically couple the SMA wires for power signals.

Figure 45:
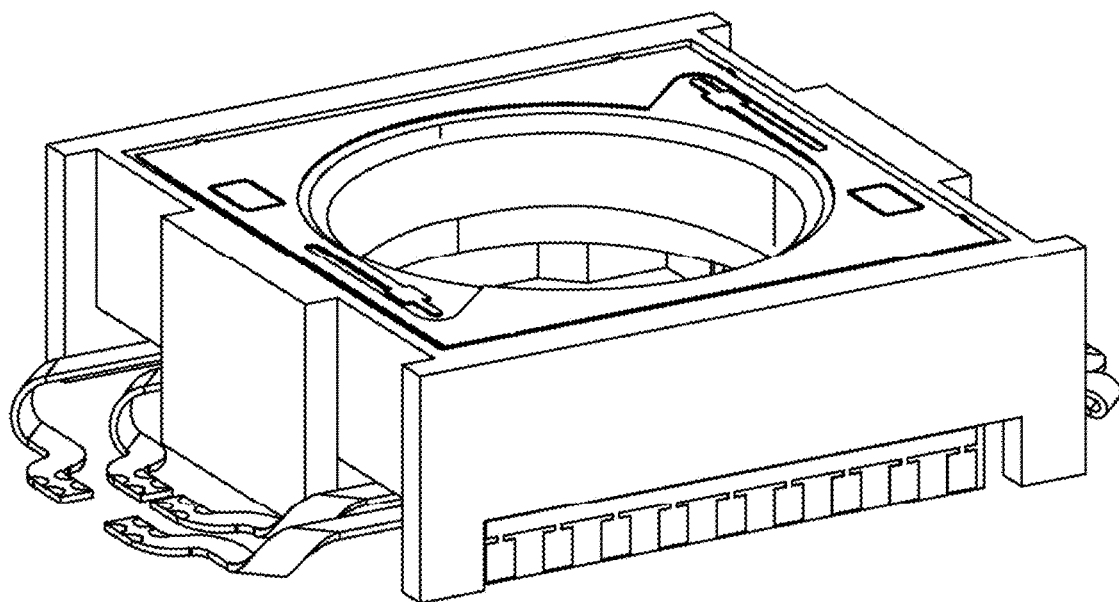
FIG. 45 illustrates a 5 axis sensor shift system according to an embodiment.

FIG. 45 illustrates a 5 axis sensor shift system according to an embodiment. The 5 axis sensor shift system is configured to move an object, such as an image sensor in 5 axis relative to one or more lens. This includes X/Y/Z axis translation and pitch/roll tilt. Optionally the system is configured to use only 4 axis with X/Y axis translation and pitch/roll tilt together with a separate AF on top to do Z motion. Other embodiments include the 5 axis sensor shift system configured to move one or more lens relative to an image sensor. Static lens stack mounted on top cover and inserts inside the ID (not touching the orange moving carriage inside) for some embodiments.

Figure 46:
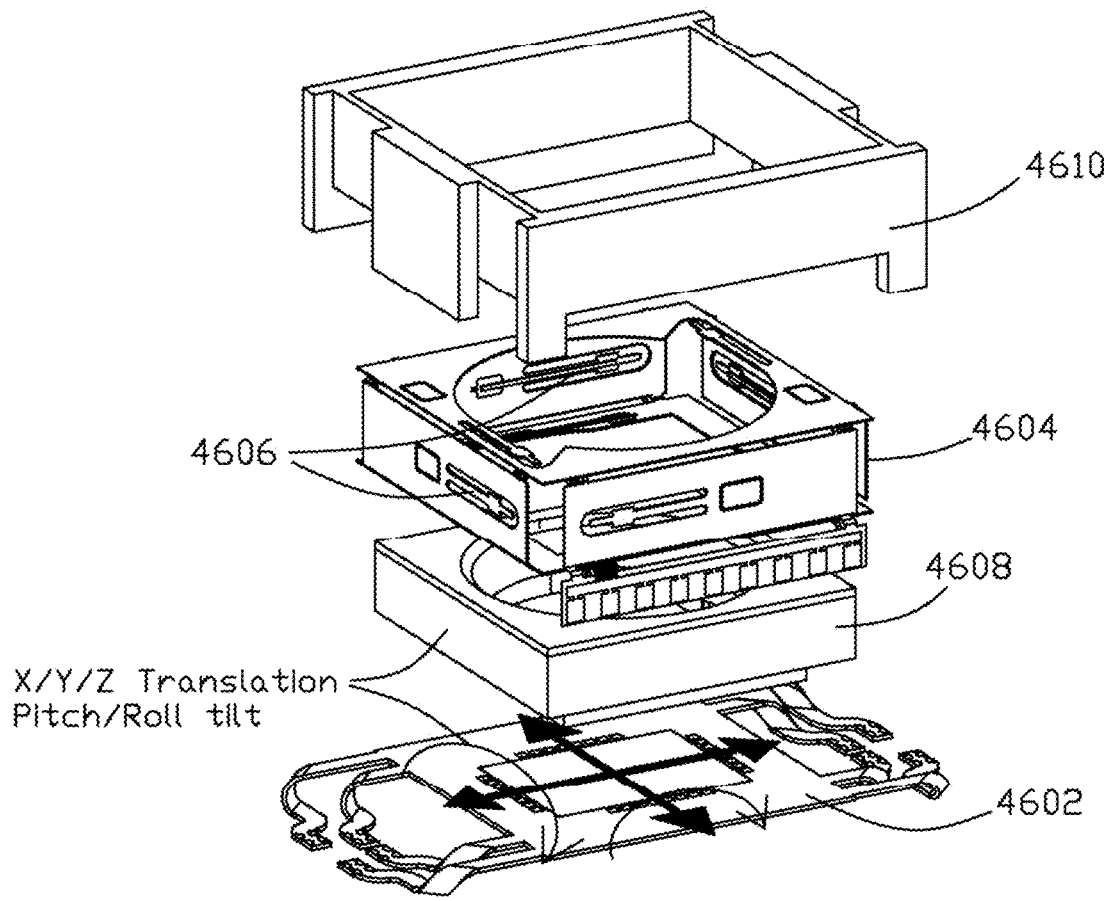
FIG. 46 illustrates an exploded view of a 5 axis sensor shift system according to an embodiment.

FIG. 46 illustrates an exploded view of a 5 axis sensor shift system according to an embodiment. The 5 axis sensor shift system includes 2 circuit components: a flexible sensor circuit 4602, bimorph actuator circuit 4604; and 8-12 bimorph actuators 4606 built on to the bimorph circuit component using techniques including those described herein. The 5 axis sensor shift system includes a moving carriage 4608 configured to hold one or more lenses and an outer housing 4610. The bimorph actuator circuit 4604 includes, according to an embodiment, 8-12 SMA actuators such as those described herein. The SMA actuators are configured to move the moving carriage 4608 in 5 axis, such as in an x-direction, a y-direction, a z-direction, pitch, and roll similar to other 5 axis systems described herein.

Figure 47:
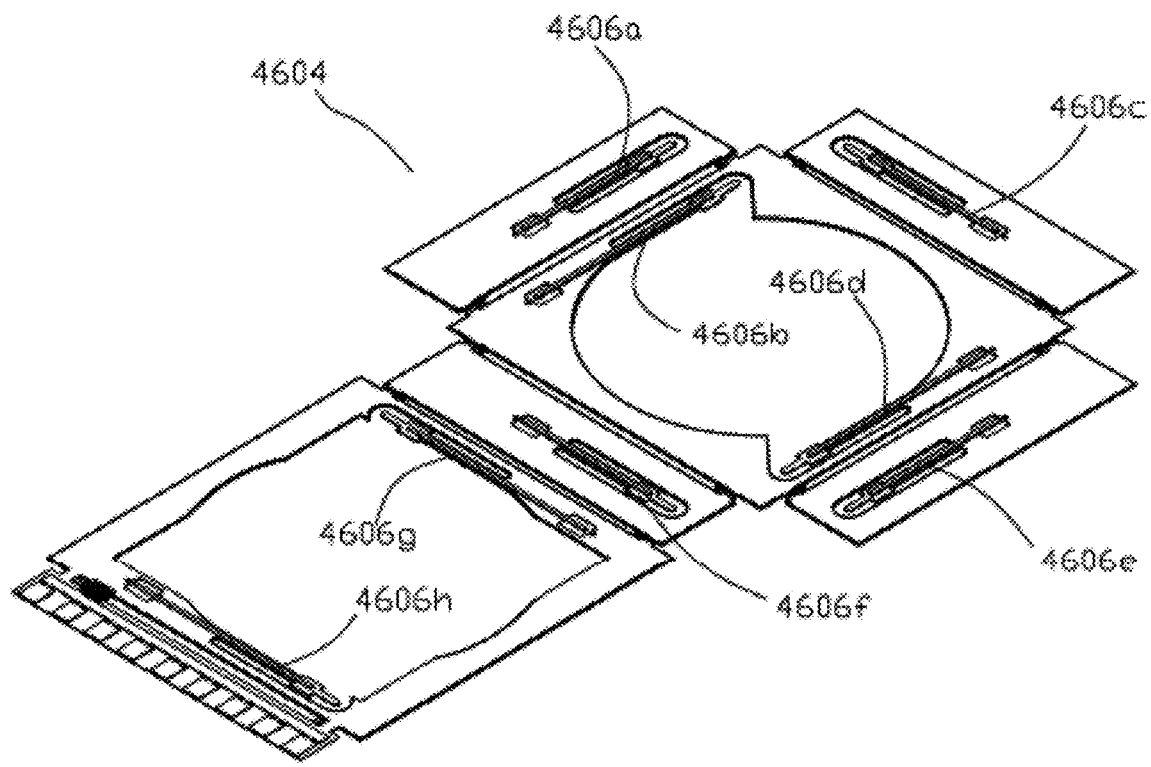
FIG. 47 illustrates an SMA actuator including bimorph actuators integrated into this circuit for all motion according to an embodiment.
Figure 48:
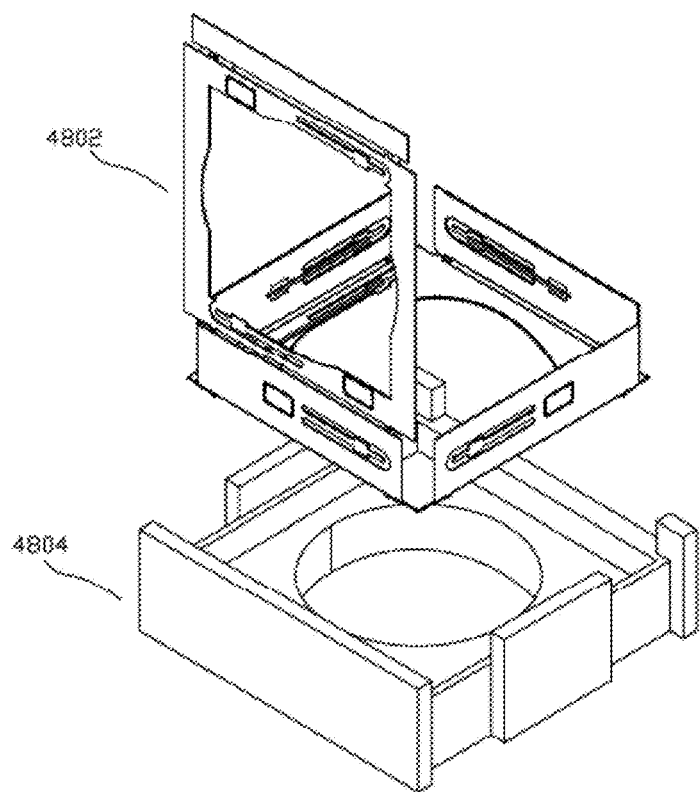
FIG. 48 illustrates an SMA actuator including bimorph actuators integrated into this circuit for all motion according to an embodiment.
Figure 49:
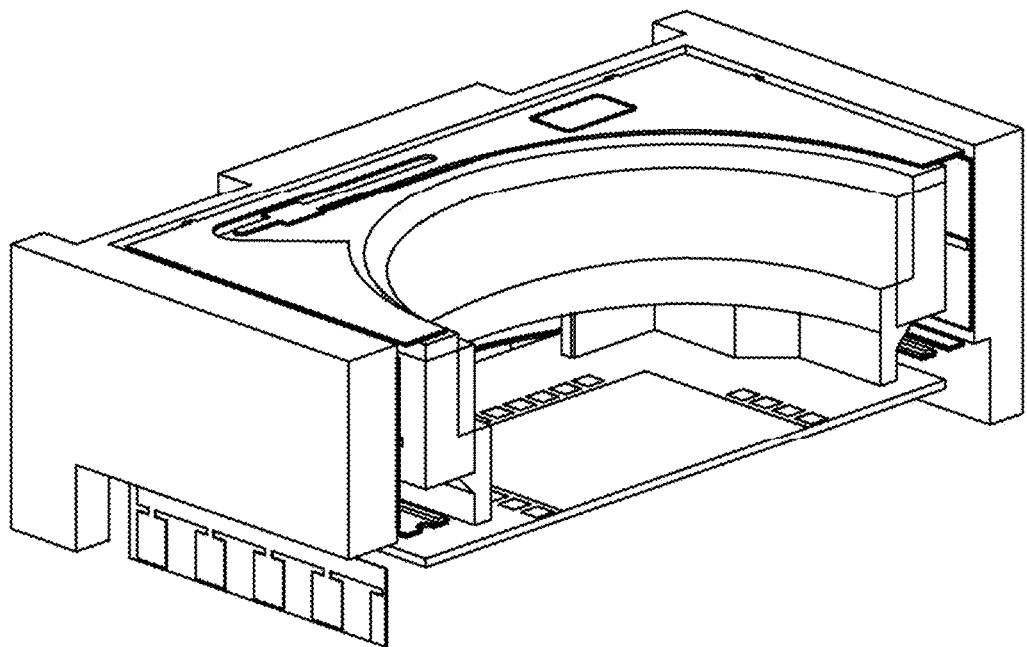
FIG. 49 illustrates a cross section of a 5 axis sensor shift system according to an embodiment.

FIG. 47 illustrates an SMA actuator including bimorph actuators integrated into this circuit for all motion according to an embodiment. Embodiment of a SMA actuator can including 8-12 bimorph actuators 4606. However, other embodiments could include more or less. FIG. 48 illustrates an SMA actuator 4802 including bimorph actuators integrated into this circuit for all motion according to an embodiment partially formed to fit inside a corresponding outer housing 4804. FIG. 49 illustrates a cross section of a 5 axis sensor shift system according to an embodiment.

Figure 50:
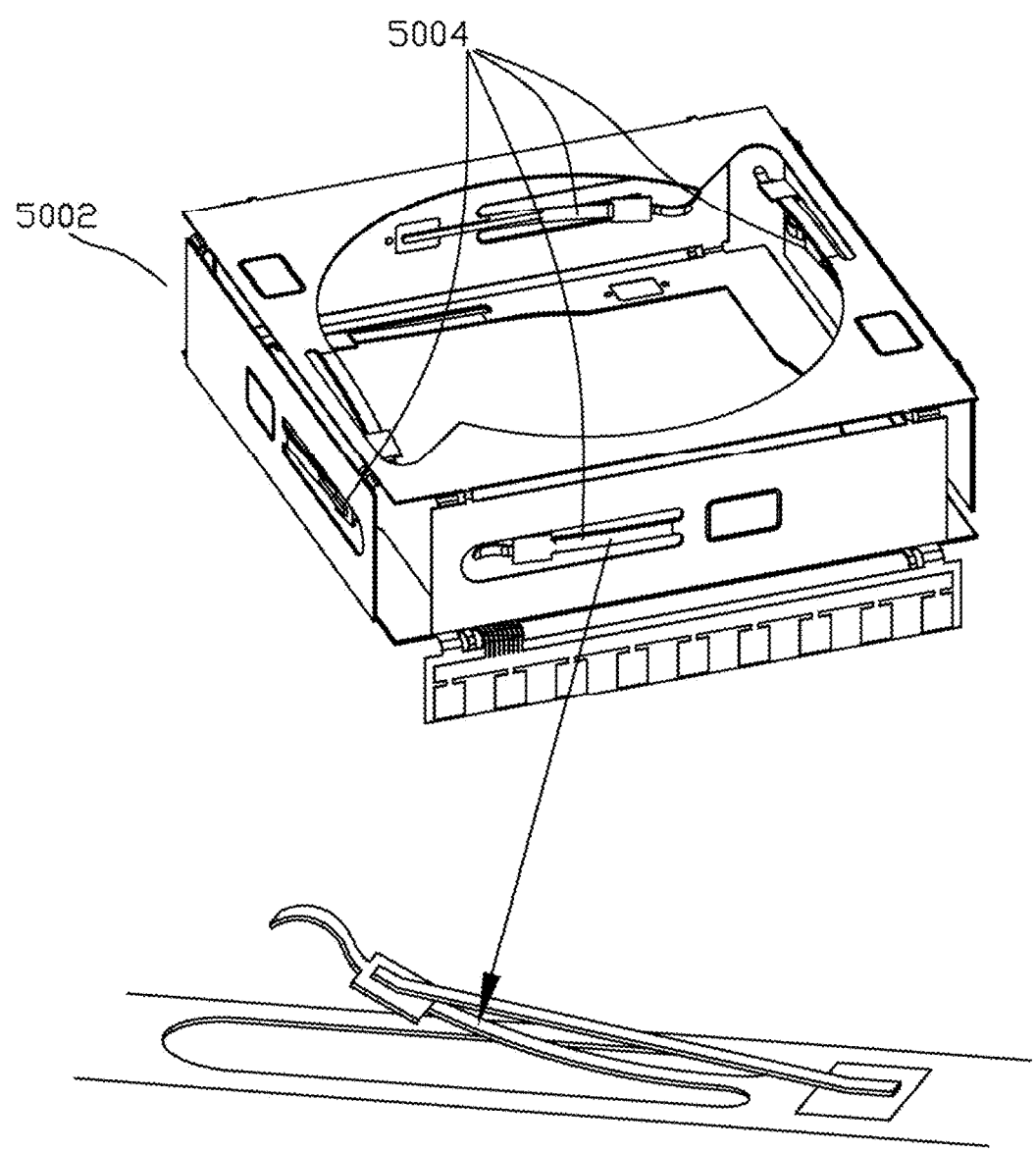
FIG. 50 illustrates an SMA actuator according to an embodiment including bimorph actuators.
Figure 51:
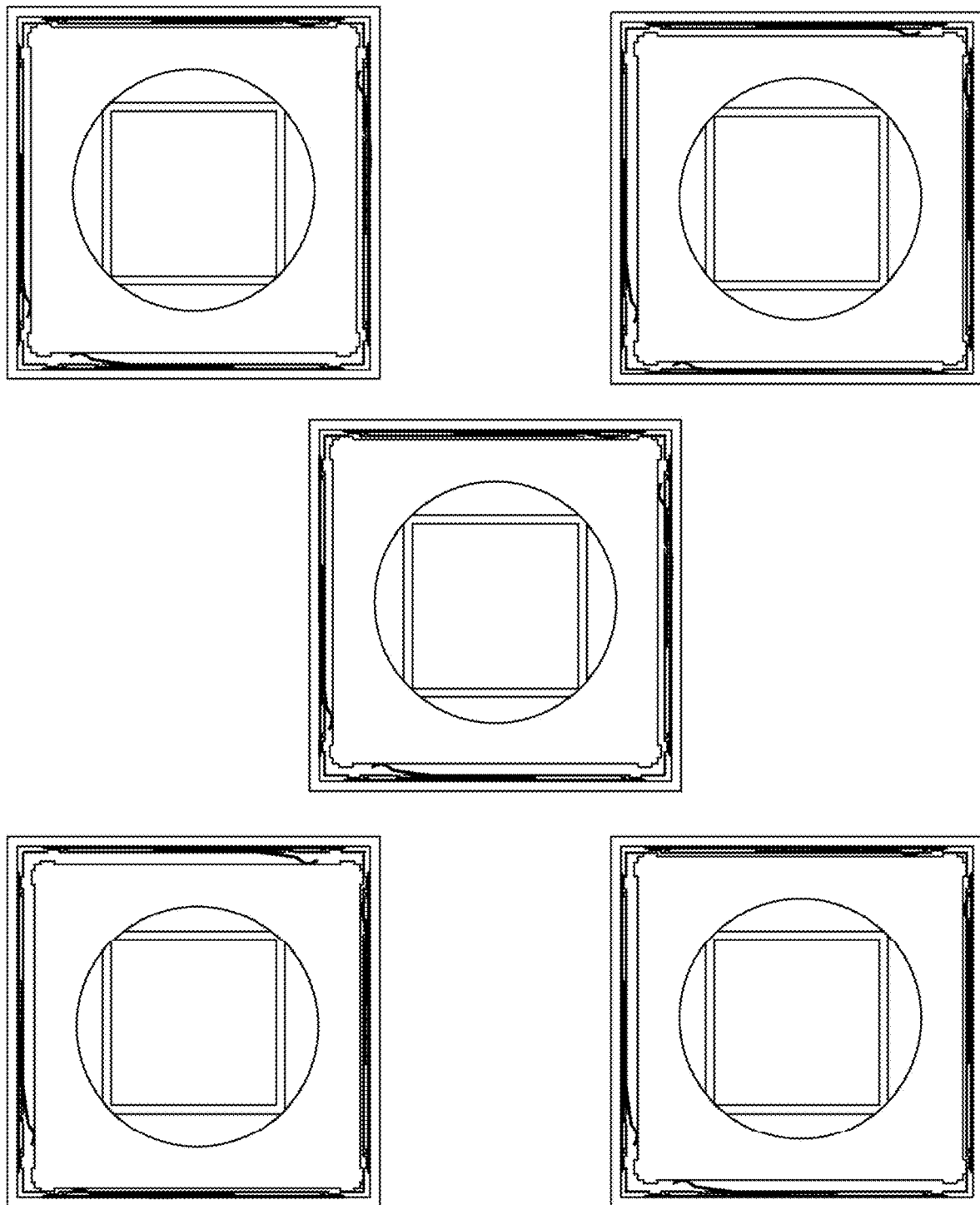
FIG. 51 illustrates a top view of an SMA actuator according to an embodiment including bimorph actuators that moved an image sensor in different x and y positions.

FIG. 50 illustrates an SMA actuator 5002 according to an embodiment including bimorph actuators. The SMA actuator 5002 is configured to use 4 side mounted SMA bimorph actuators 5004 to move an image sensor, lens, or other various payloads in the x and y direction. FIG. 51 illustrates a top view of an SMA actuator including bimorph actuators that moved an image sensor, lens, or other various payloads in different x and y positions.

Figure 52:
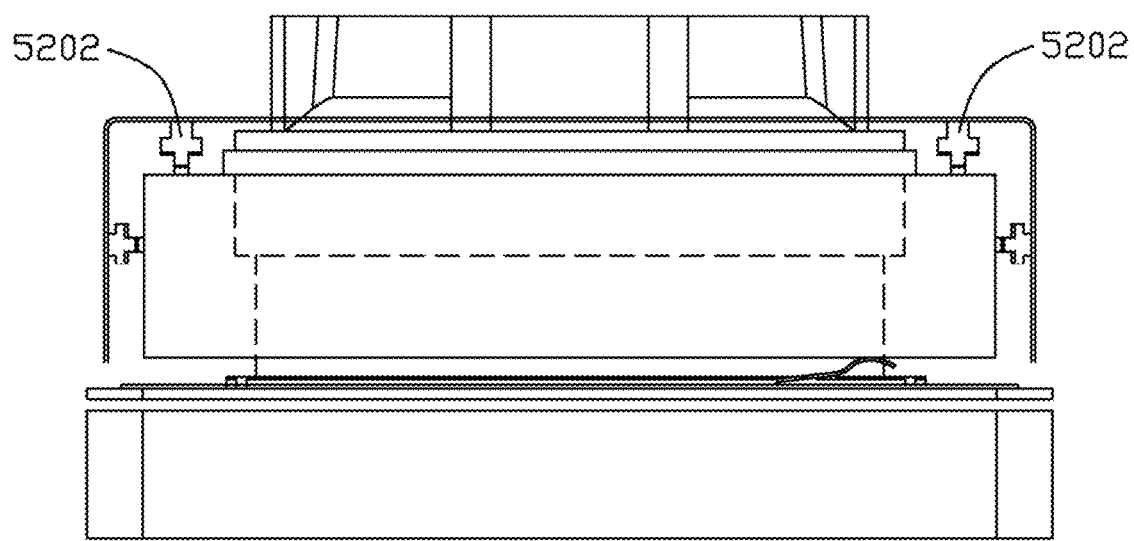
FIG. 52 illustrates an SMA actuator including bimorph actuators according to an embodiment configured as a box bimorph autofocus.
Figure 53:
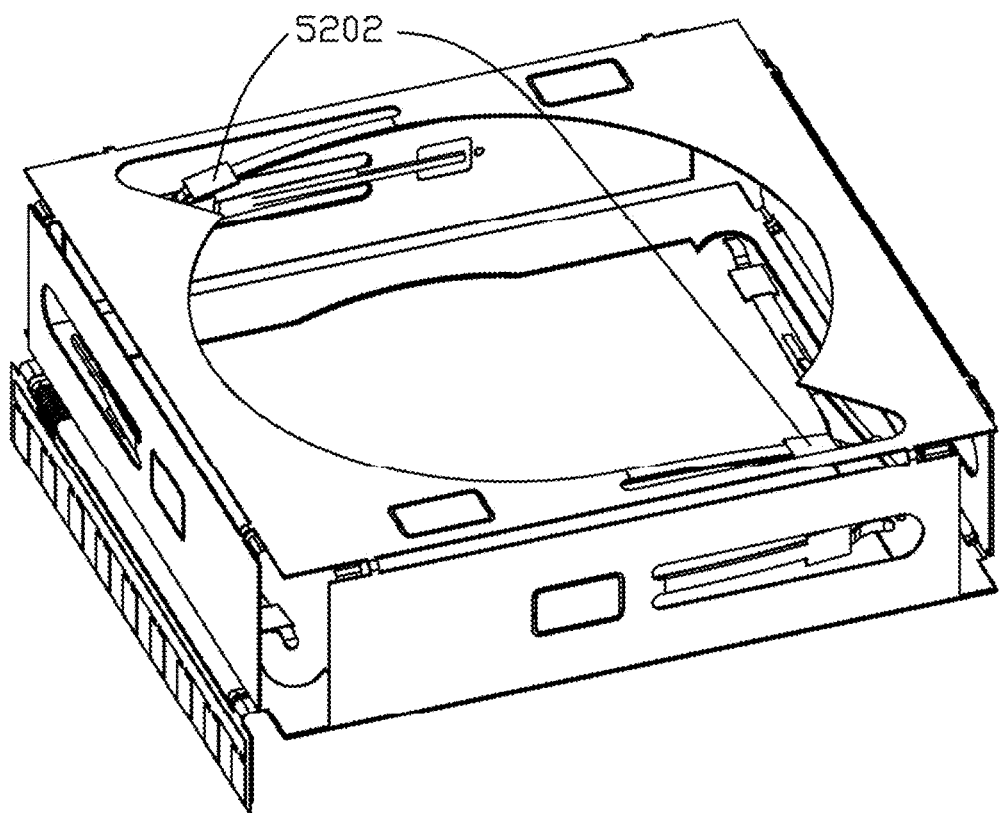
FIG. 53 illustrates an SMA actuator including bimorph actuators according to an embodiment.
Figure 54:
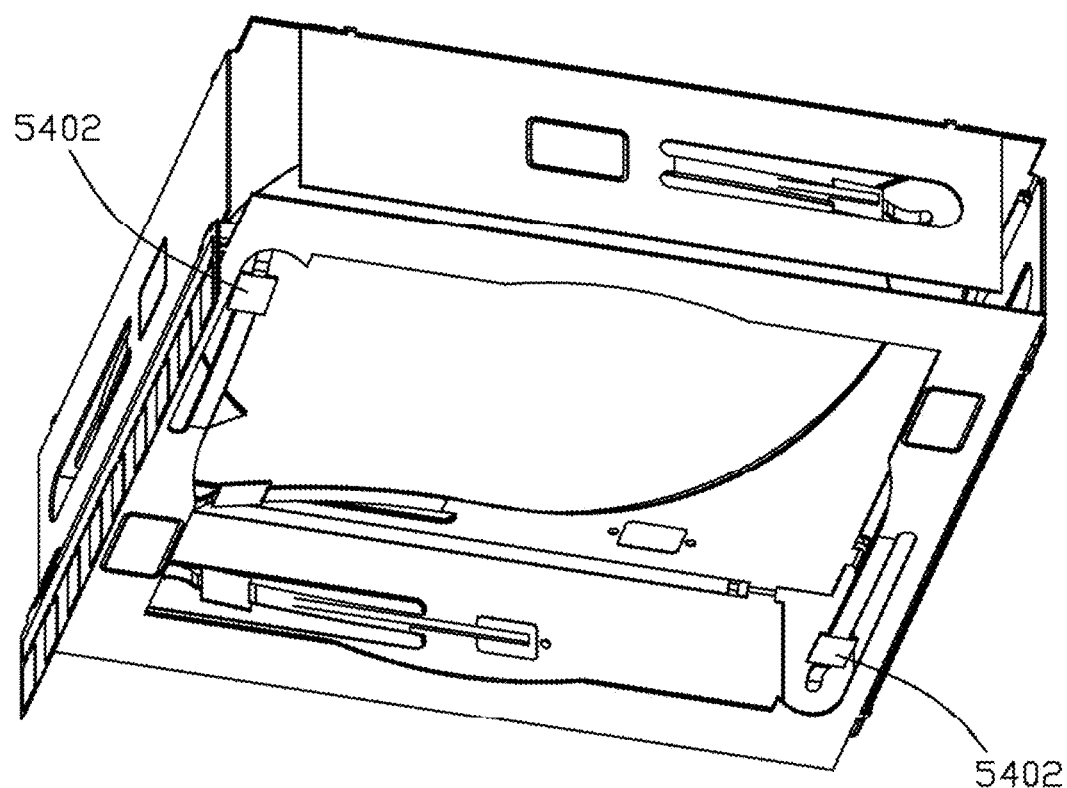
FIG. 54 illustrates an SMA actuator including bimorph actuators according to an embodiment.
Figure 55:
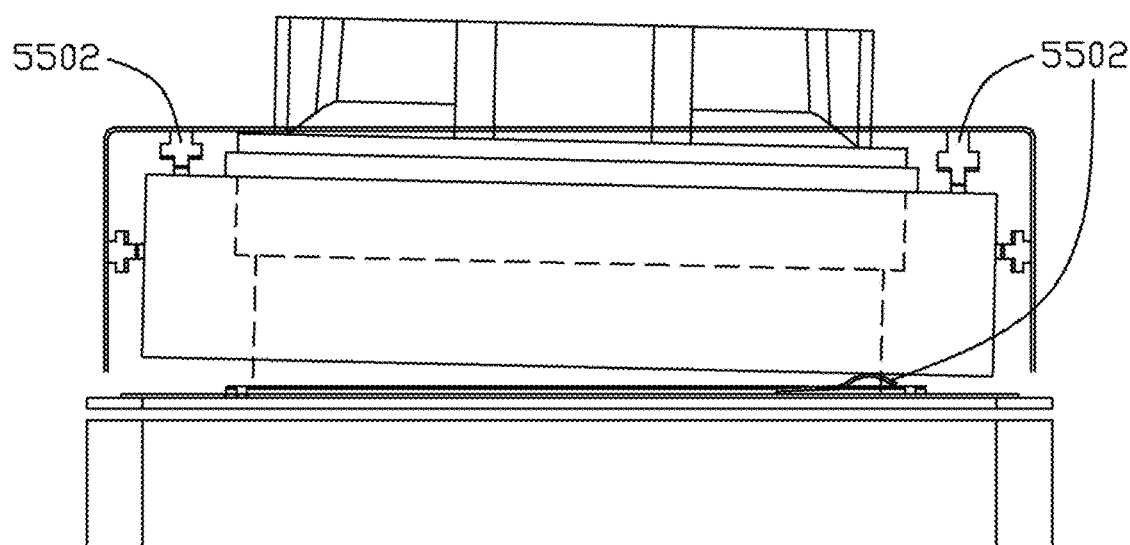
FIG. 55 illustrates an SMA actuator including bimorph actuators according to an embodiment.

FIG. 52 illustrates an SMA actuator including bimorph actuators 5202 according to an embodiment configured as a box bimorph autofocus. Four top and bottom mounted SMA bimorph actuators, such as those described herein, are configured to move together to create movement in the z-stroke direction for autofocus motion. FIG. 53 illustrates an SMA actuator including bimorph actuators according to an embodiment and which two top mounted bimorph actuators 5302 are configured to push down on one or more lens. FIG. 54 illustrates an SMA actuator including bimorph actuators according to an embodiment and which two bottom mounted bimorph actuators 5402 are configured to push up on one or more lens. FIG. 55 illustrates an SMA actuator including bimorph actuators according to an embodiment to show the four top and bottom mounted SMA bimorph actuators 5502, such as those described herein, are used to move the one or more lens to create tilt motion.

Figure 56:
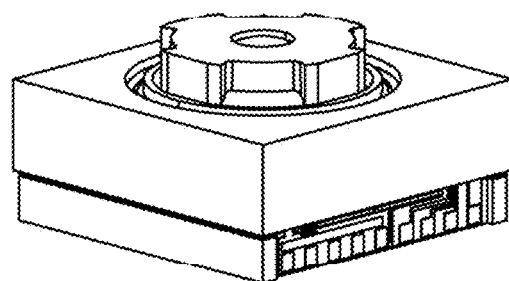
FIG. 56 illustrates a SMA system including a SMA actuator according to an embodiment including bimorph actuators.
Figure 57:
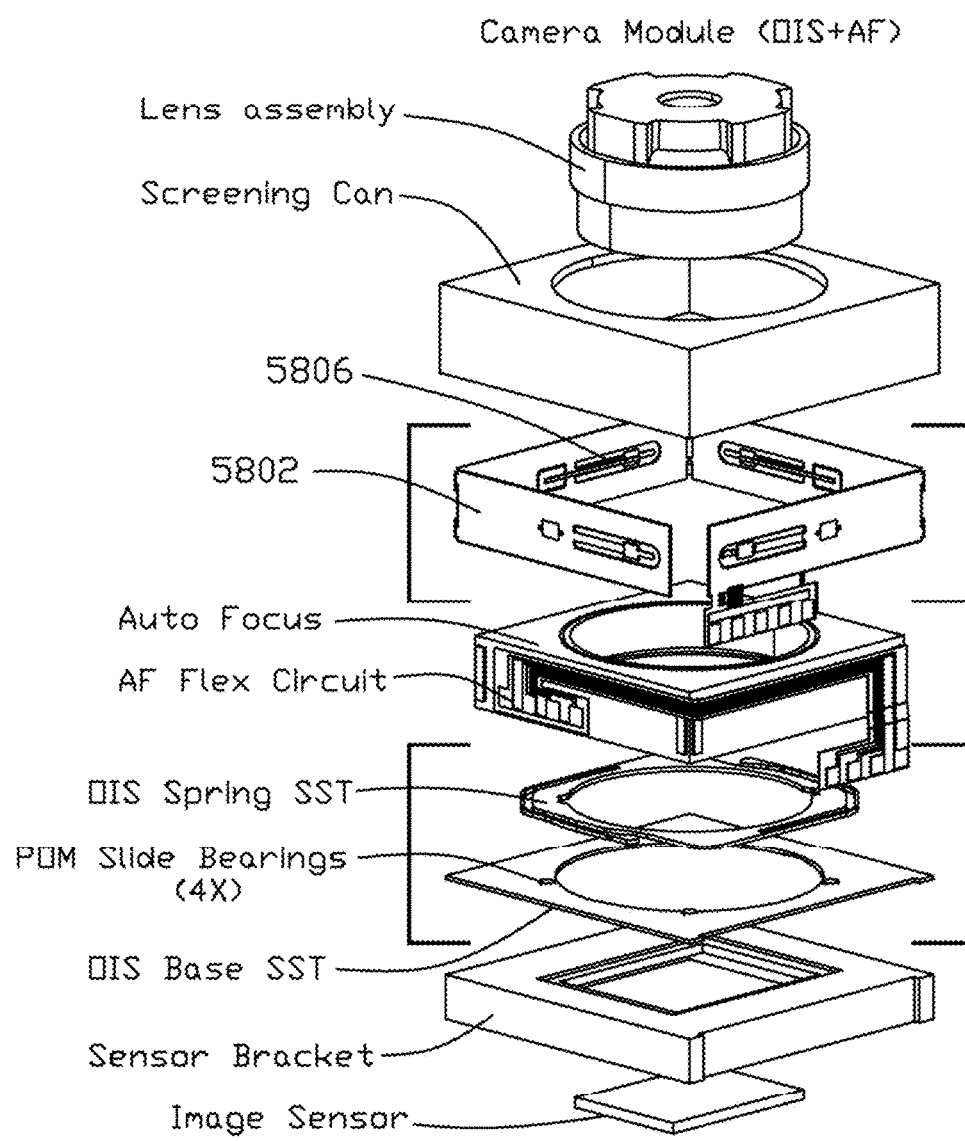
FIG. 57 illustrates an exploded view of SMA system including a SMA actuator according to an embodiment including bimorph actuators configured as a two axis lens shift OIS.
Figure 58:
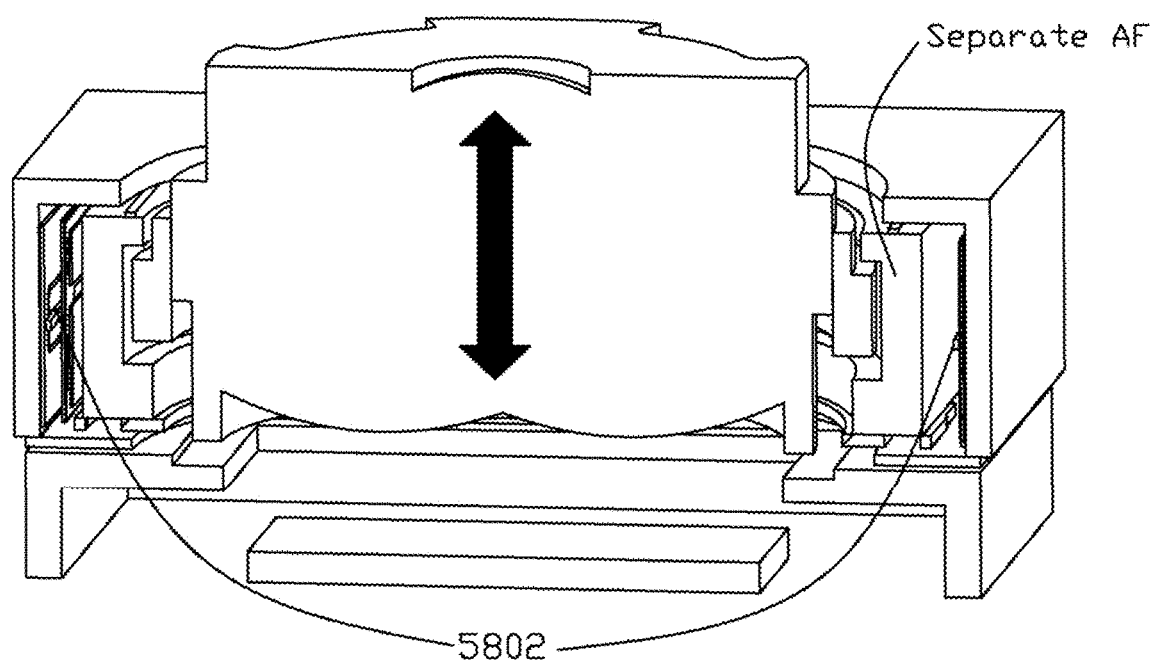
FIG. 58 illustrates a cross-section of SMA system including a SMA actuator according to an embodiment including bimorph actuators configured as a two axis lens shift OIS.
Figure 59:
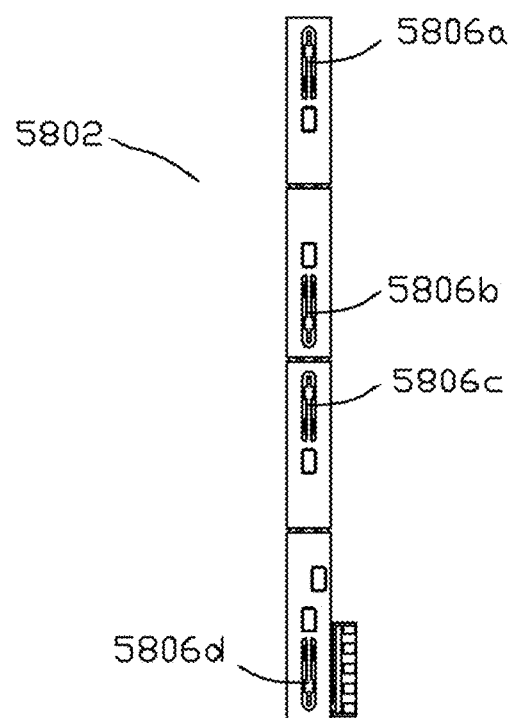
FIG. 59 illustrates a box bimorph actuator according to an embodiment.

FIG. 56 illustrates a SMA system including a SMA actuator according to an embodiment including bimorph actuators configured as a two axis lens shift OIS. For some embodiments, the two axis lens shift OIS is configured to move a lens in the X/Y axis. For some embodiments, Z axis movement comes from a separate AF, such as those described herein. 4 bimorph actuators push on sides of auto focus for OIS motion. FIG. 57 illustrates an exploded view of SMA system including a SMA actuator 5802 according to an embodiment including bimorph actuators 5806 configured as a two axis lens shift OIS. FIG. 58 illustrates a cross-section of SMA system including a SMA actuator 5802 according to an embodiment including bimorph actuators 5806 configured as a two axis lens shift OIS. FIG. 59 illustrates box bimorph actuator 5802 according to an embodiment for use in a SMA system configured as a two axis lens shift OIS as manufactured before it is shaped to fit in the system. Such a system can be configured to have high OIS stroke OIS (e.g., +/−200 µm or more). Further, such embodiments are configured to have a broad range of motion and good OIS dynamic tilt using 4 slide bearings, such as POM slide bearings. The embodiments are configured to integrate easily with AF designs (e.g., VCM or SMA).

Figure 60:
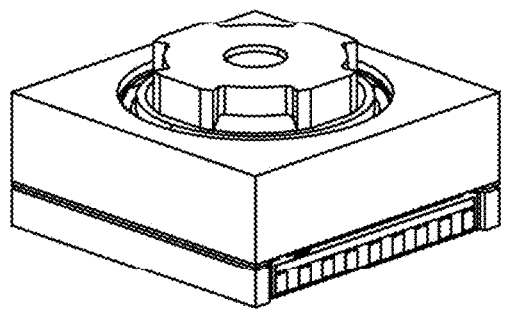
FIG. 60 illustrates a SMA system including a SMA actuator according to an embodiment including bimorph actuators.
Figure 61:
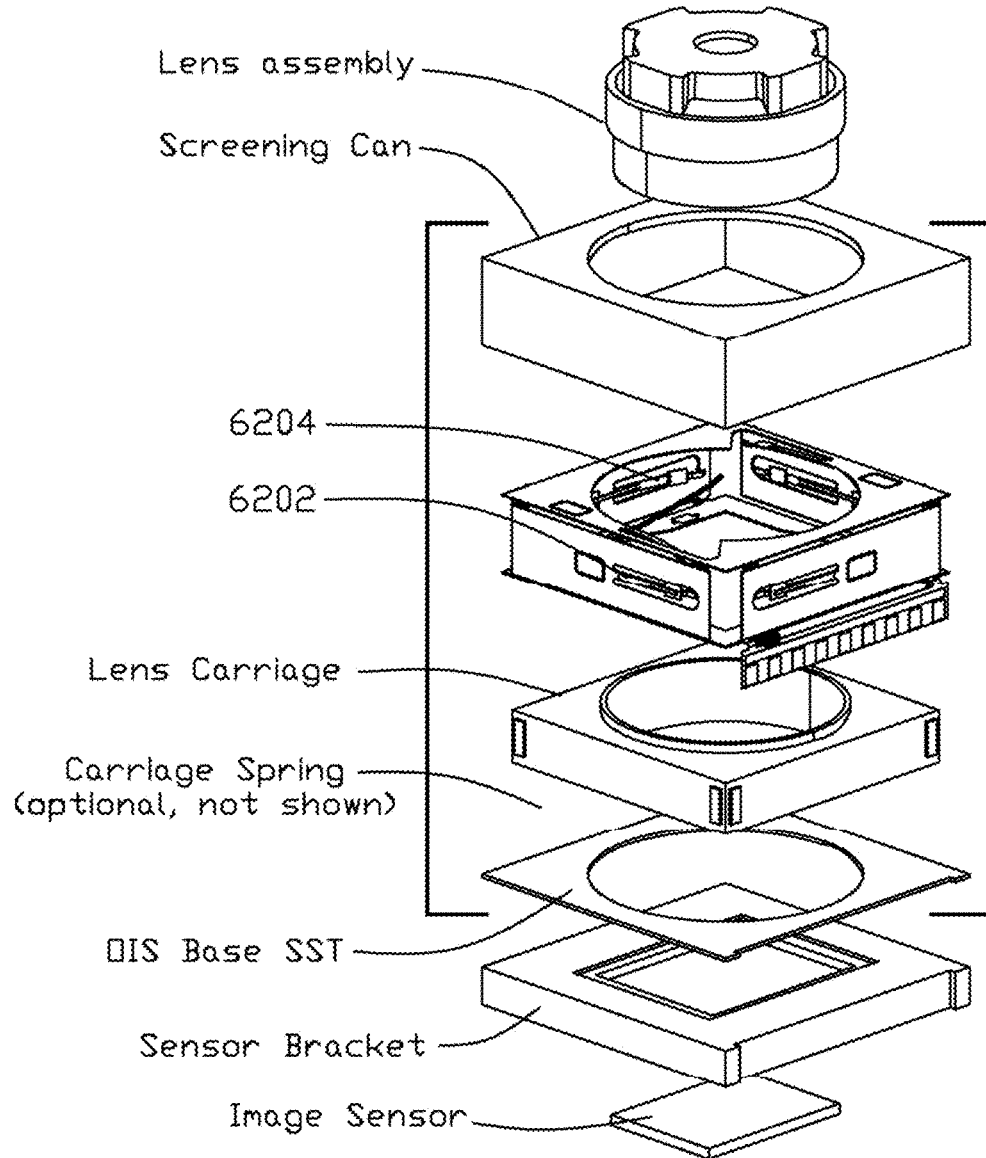
FIG. 61 illustrates an exploded view of SMA system including a SMA actuator according to an embodiment including bimorph actuators.
Figure 62:
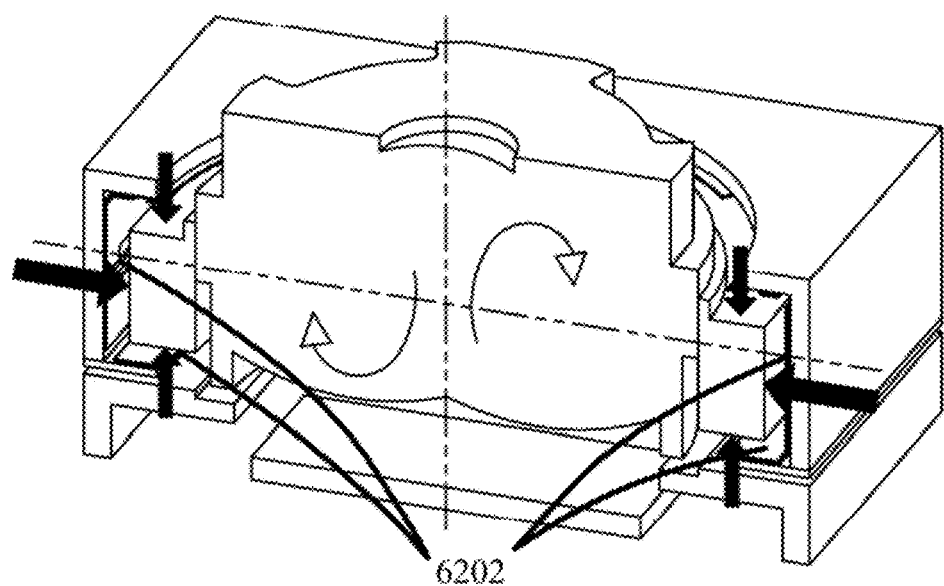
FIG. 62 illustrates a cross-section of SMA system including a SMA actuator according to an embodiment including bimorph actuators.
Figure 63:
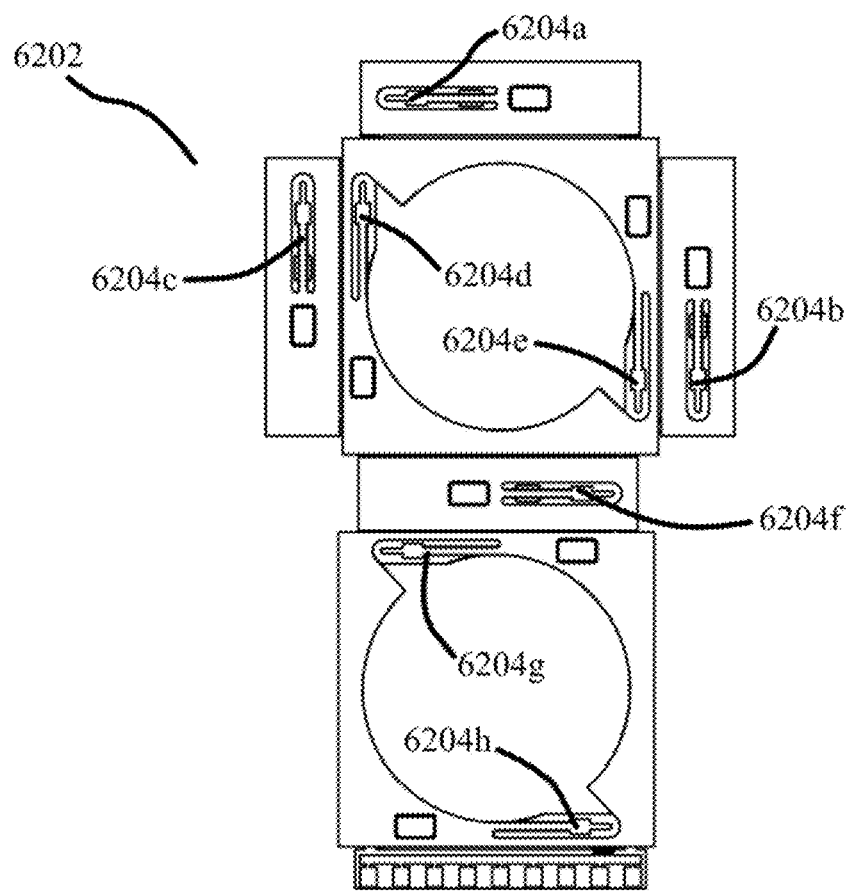
FIG. 63 illustrates box bimorph actuator according to an embodiment.

FIG. 60 illustrates a SMA system including a SMA actuator according to an embodiment including bimorph actuators configured as a five axis lens shift OIS and autofocus. For some embodiments, the five axis lens shift OIS and autofocus is configured to move a lens in the X/Y/Z axis. For some embodiments, pitch and yaw axis motion are for dynamic tilt tuning capability. 8 bimorph actuators are used to provide the motion for the auto focus and OIS using techniques described herein. FIG. 61 illustrates an exploded view of SMA system including a SMA actuator 6202 according to an embodiment including bimorph actuators 6204 according to an embodiment configured as a five axis lens shift OIS and autofocus. FIG. 62 illustrates a cross-section of SMA system including a SMA actuator 6202 according to an embodiment including bimorph actuators 6204 configured as a five axis lens shift OIS and autofocus. FIG. 63 illustrates box bimorph actuator 6202 according to an embodiment for use in a SMA system configured as a five axis lens shift OIS and autofocus as manufactured before it is shaped to fit in the system. Such a system can be configured to have high OIS stroke OIS (e.g., +/−200 um or more) and a high autofocus stroke (e.g., 400 µm or more). Further, such embodiments enable to tune out any tilt and remove the need for a separate autofocus assembly.

Figure 64:
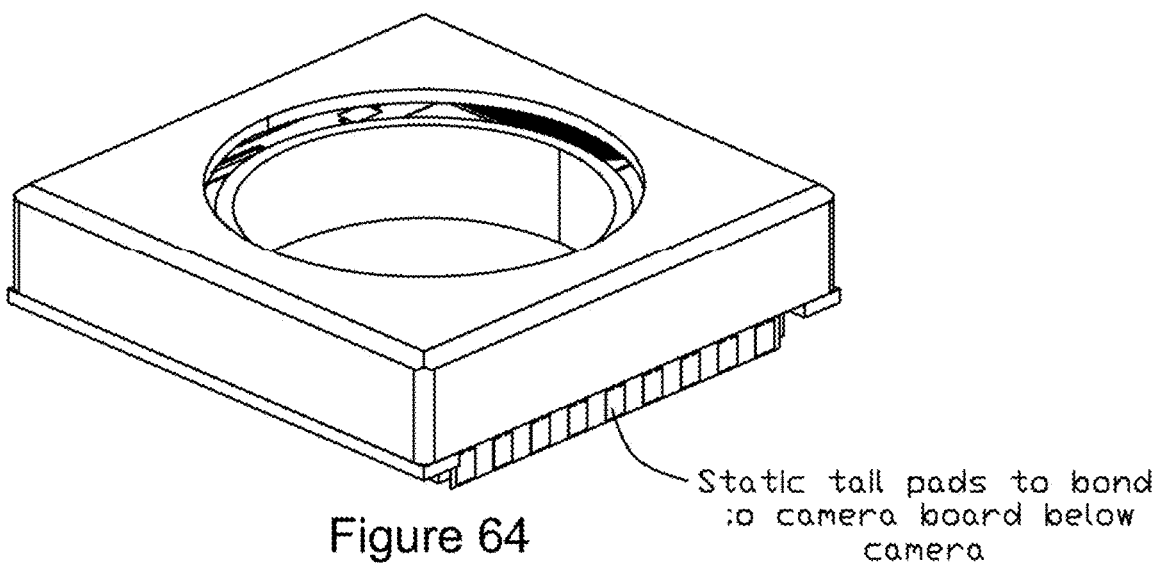
FIG. 64 illustrates a SMA system including a SMA actuator according to an embodiment including bimorph actuators.
Figure 65:
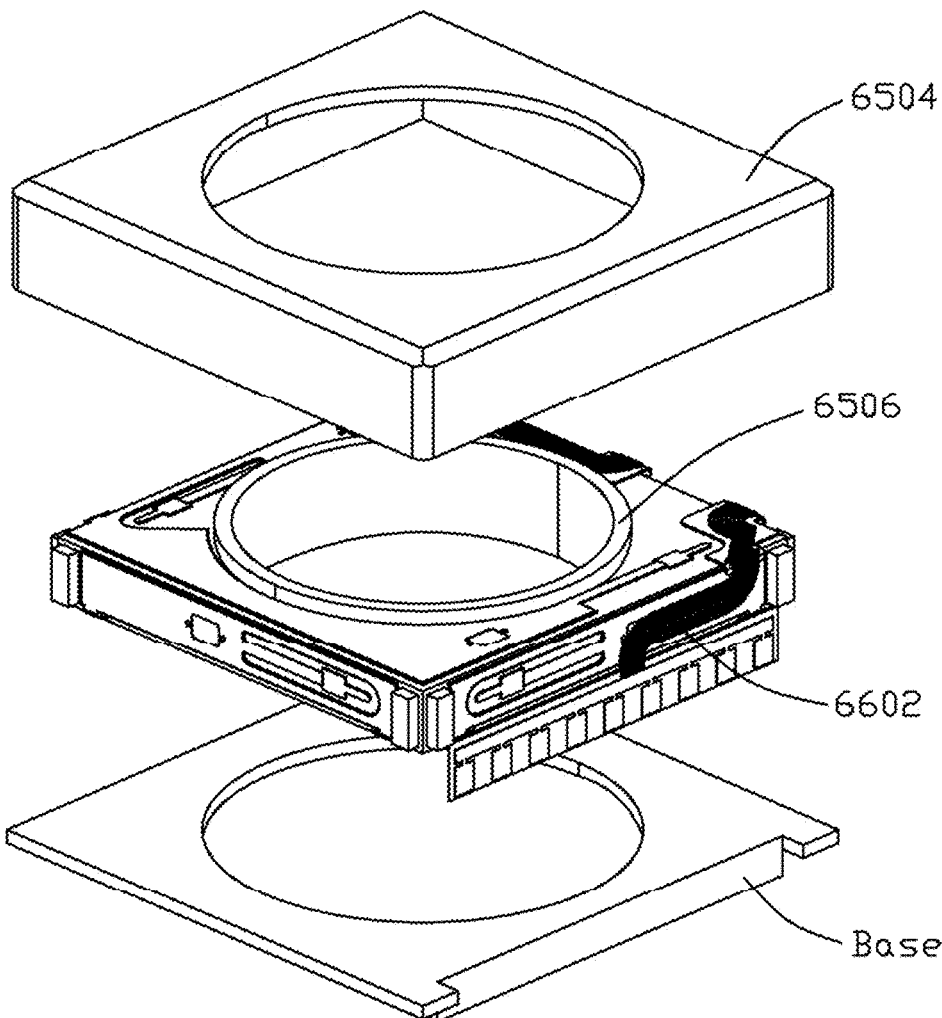
FIG. 65 illustrates an exploded view of a SMA system including a SMA actuator according to an embodiment including bimorph actuators.
Figure 66:
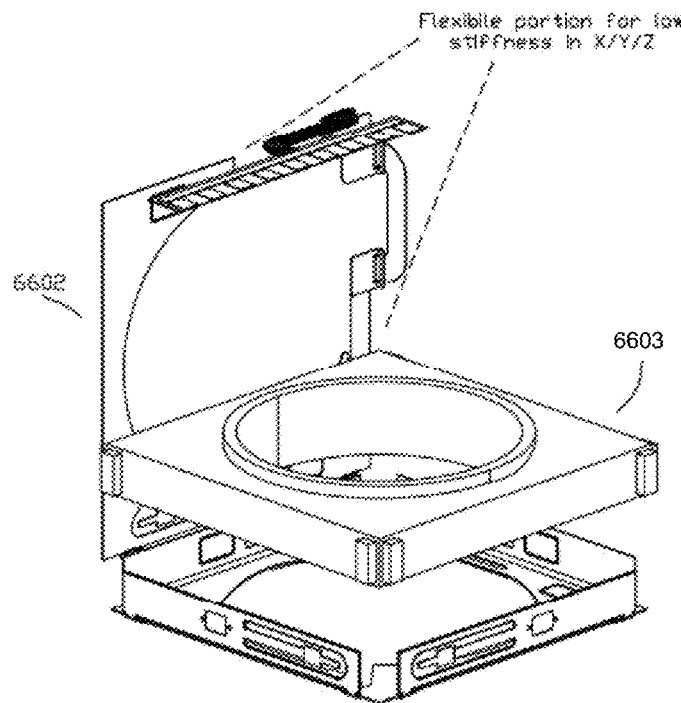
FIG. 66 illustrates a SMA system including a SMA actuator according to an embodiment including bimorph actuators.
Figure 67:
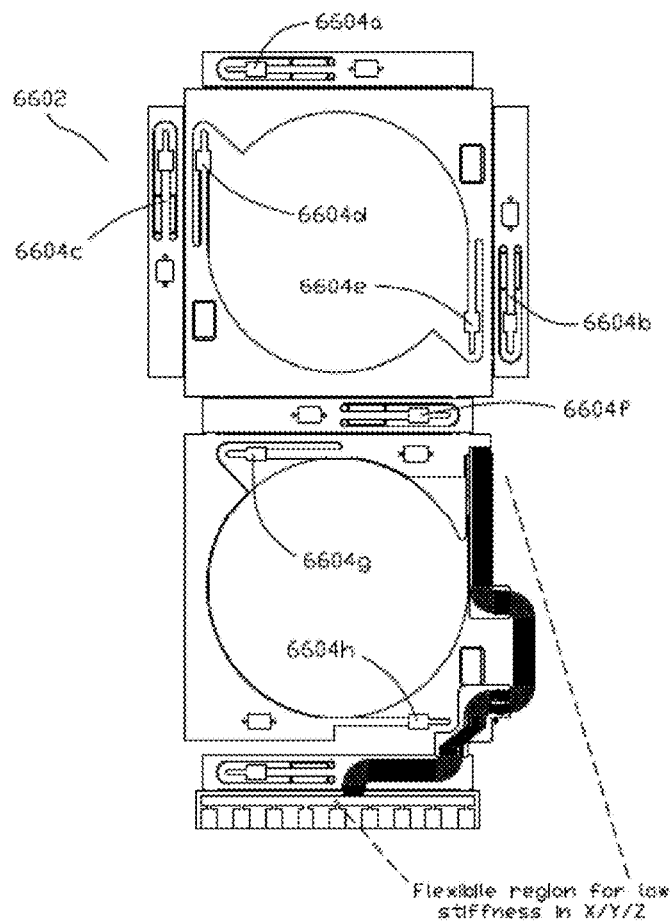
FIG. 67 illustrates a SMA system including a SMA actuator according to an embodiment including bimorph actuators.

FIG. 64 illustrates a SMA system including a SMA actuator according to an embodiment including bimorph actuators configured as an outward pushing box. For some embodiments, the bimorph actuators assembly is configured to wrap around an object, such as a lens carriage. Since the circuit assembly is moving with the lens carriage, a flexible portion is configured for low X/Y/Z stiffness. Tail pads of the circuit are static. The outward pushing box can be configured for both 4 or 8 bimorph actuators. So, the outward pushing box can be configured as a 4 bimorph actuator on the sides for OIS with movement in X and Y axis. The outward pushing box can be configured as a 4 bimorph actuator on the top and bottom for autofocus with movement in z axis. The outward pushing box can be configured as an 8 bimorph actuator on the top, bottom, and sides for OIS and autofocus with movement in x, y, and z axis and capable of 3-axis tilt (pitch/roll/yaw). FIG. 65 illustrates an exploded view of a SMA system including a SMA actuator 6602 according to an embodiment including bimorph actuators 6604 configured as an outward pushing box. Thus, the SMA actuator is configured such that the bimorph actuators act on the outer housing 6504 to move the lens carriage 6506 using techniques described herein. FIG. 66 illustrates a SMA system including a SMA actuator 6602 according to an embodiment including bimorph actuators configured as an outward pushing box partially shaped to receive a lens carriage 6603. FIG. 67 illustrates a SMA system including a SMA actuator 6602 including bimorph actuators 6604 according to an embodiment configured as an outward pushing box as manufactured before it is shaped to fit in the system.

Figure 68:
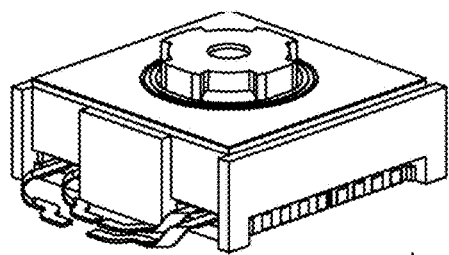
FIG. 68 illustrates a SMA system including a SMA actuator according to an embodiment including bimorph actuators.
Figure 69:
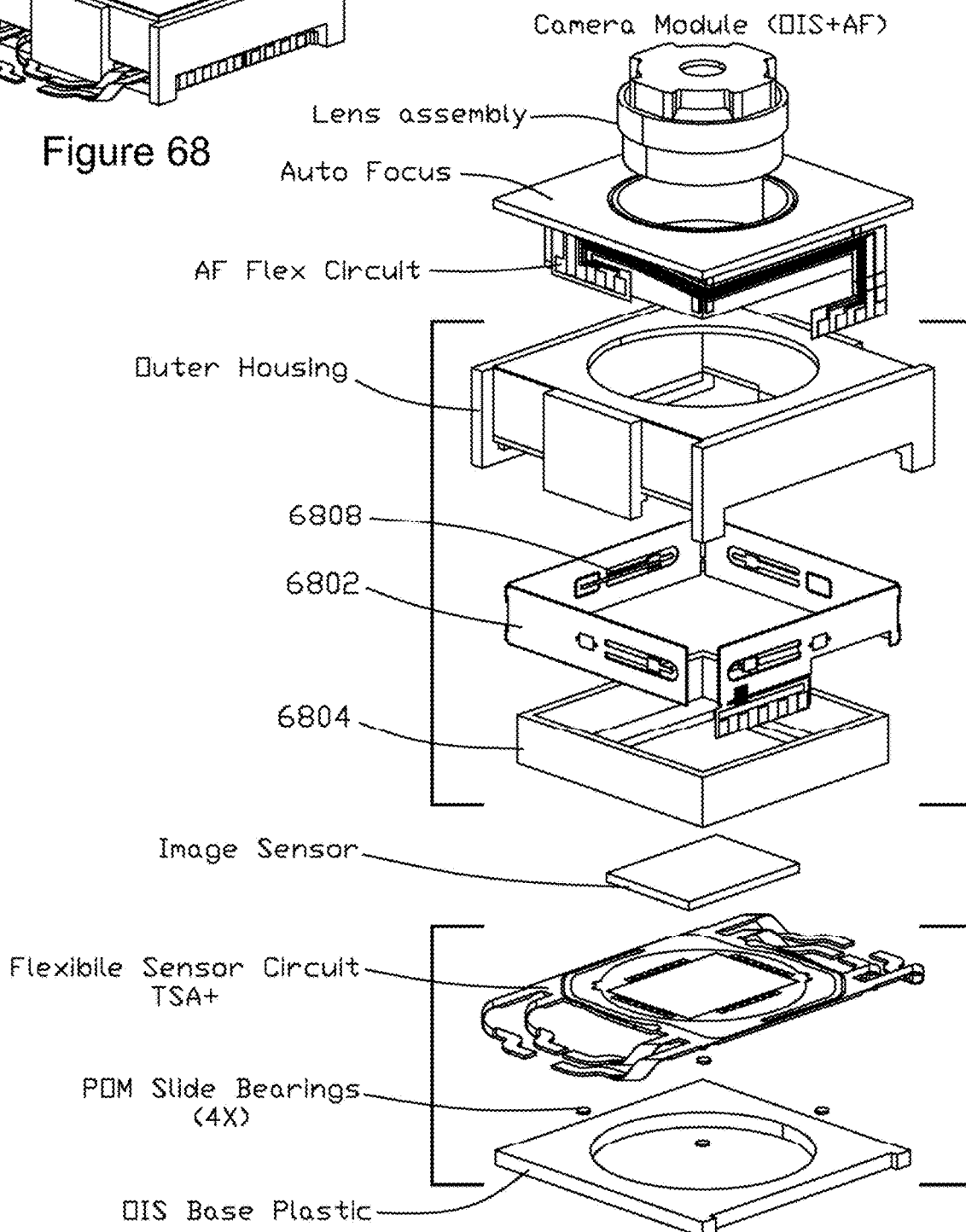
FIG. 69 illustrates an exploded view of SMA including a SMA actuator according to an embodiment including bimorph actuators.

FIG. 68 illustrates a SMA system including a SMA actuator 6802 according to an embodiment including bimorph actuators 6806 configured as a three axis sensor shift OIS. For some embodiments, z axis movement comes from a separate autofocus system. 4 bimorph actuators configured to push on sides of a sensor carriage 6804 to provide the motion for the OIS using techniques described herein. FIG. 69 illustrates an exploded view of SMA including a SMA actuator 6802 according to an embodiment including bimorph actuators 6806 configured as a three axis sensor shift OIS. FIG. 70 illustrates a cross-section of SMA system including a SMA actuator 6802 according to an embodiment including bimorph actuators 6806 configured as a three axis sensor shift OIS. FIG. 71 illustrates a box bimorph actuator 6802 component according to an embodiment for use in a SMA system configured as a three axis sensor shift OIS as manufactured before it is shaped to fit in the system. FIG. 72 illustrates a flexible sensor circuit for use in a SMA system according to an embodiment configured as a three axis sensor shift OIS. Such a system can be configured to have high OIS stroke OIS (e.g., +/−200 um or more) and a high autofocus stroke (e.g., 400 µm or more). Further, such embodiments are configured to have a broad range of two axis motion and good OIS dynamic tilt using 4 slide bearings, such as POM slide bearings. The embodiments are configured to integrate easily with AF designs (e.g., VCM or SMA).

Figure 73:
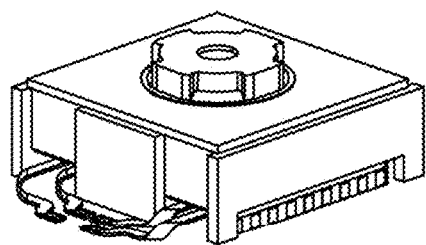
FIG. 73 illustrates a SMA system including a SMA actuator according to an embodiment including bimorph actuators.
Figure 74:
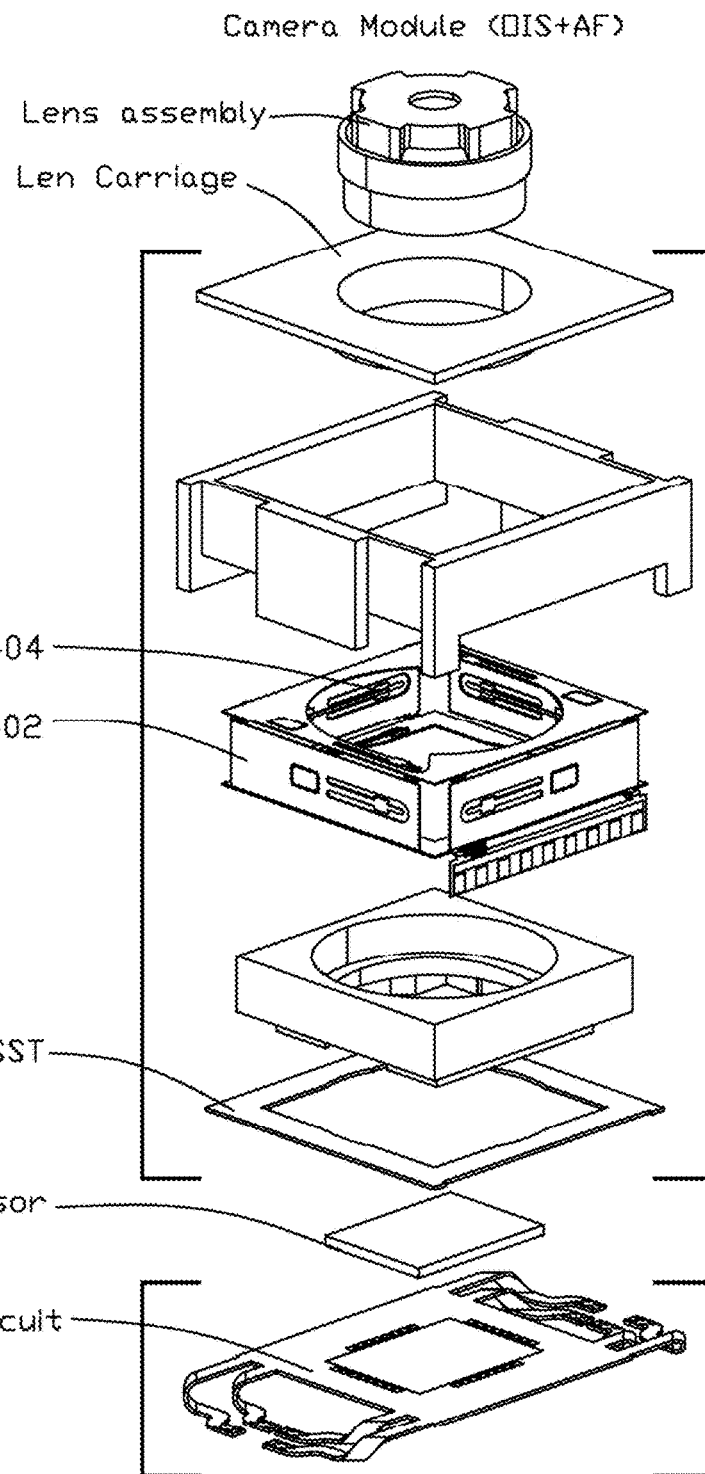
FIG. 74 illustrates an exploded view of SMA system including a SMA actuator according to an embodiment including bimorph actuators.
Figure 75:
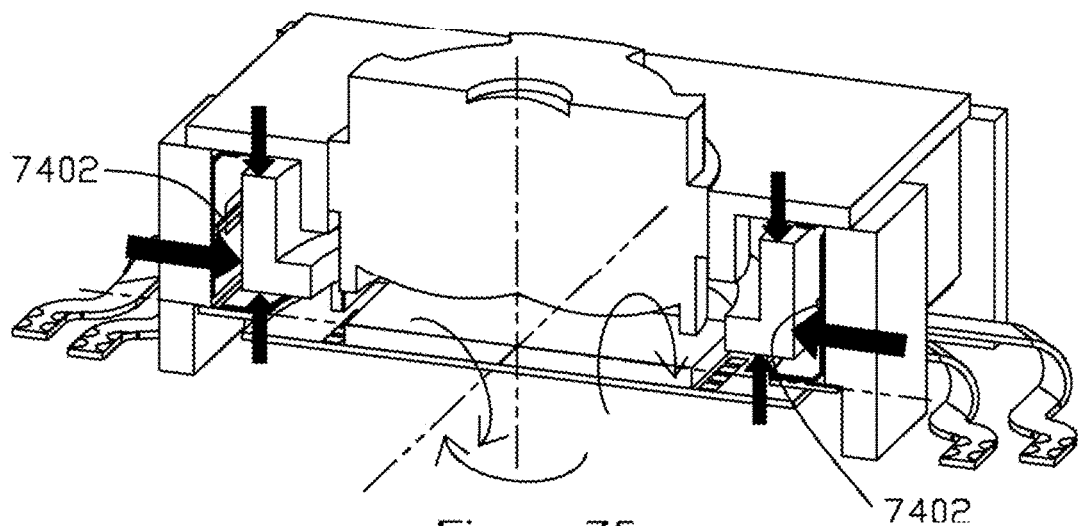
FIG. 75 illustrates a cross-section of SMA system including a SMA actuator according to an embodiment.
Figure 76:
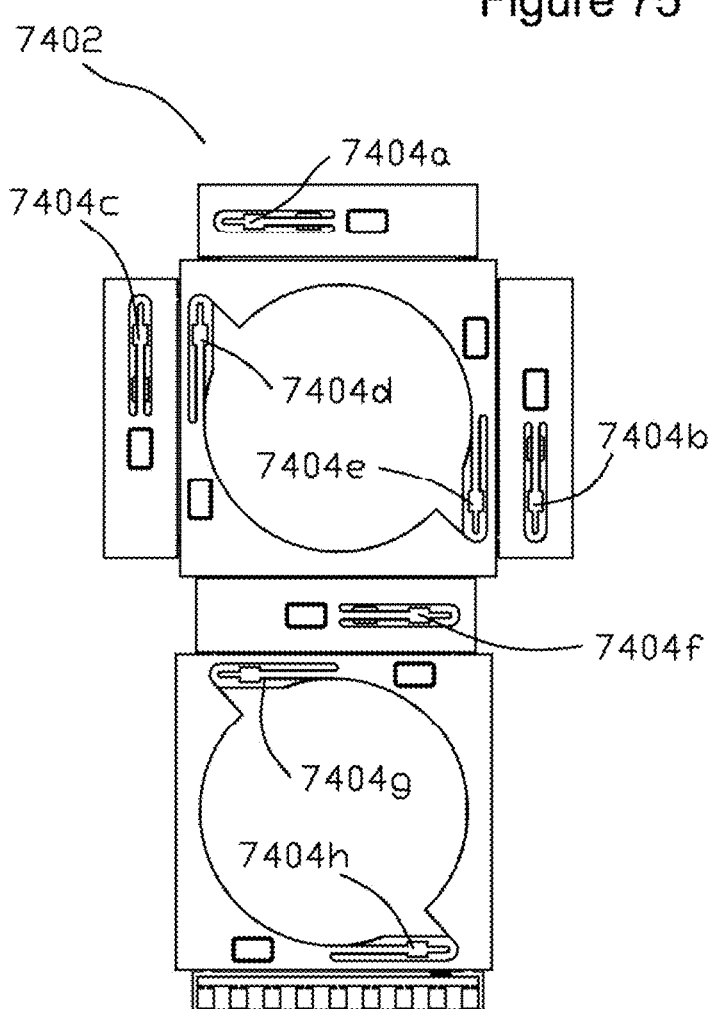
FIG. 76 illustrates box bimorph actuator according to an embodiment.
Figure 77:
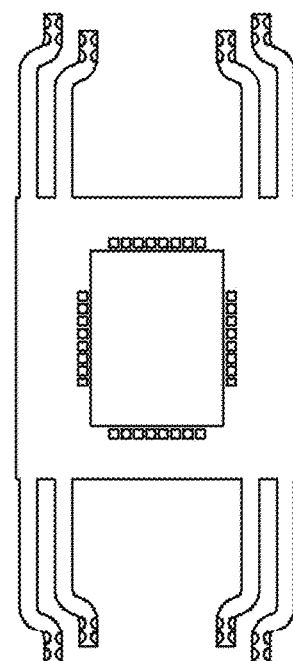
FIG. 77 illustrates a flexible sensor circuit for use in a SMA system according to an embodiment.

FIG. 73 illustrates a SMA system including a SMA actuator according to an embodiment including bimorph actuators 7404 configured as a six axis sensor shift OIS and autofocus. For some embodiments, the six axis sensor shift OIS and autofocus is configured to move a lens in the X/Y/Z/Pitch/Yaw/Roll axis. For some embodiments, pitch and yaw axis motion are for dynamic tilt tuning capability. 8 bimorph actuators are used to provide the motion for the auto focus and OIS using techniques described herein. FIG. 74 illustrates an exploded view of SMA system including a SMA actuator 7402 according to an embodiment including bimorph actuators 7404 configured as a six axis sensor shift OIS and autofocus. FIG. 75 illustrates a cross-section of SMA system including a SMA actuator 7402 according to an embodiment including bimorph actuators configured as a six axis sensor shift OIS and autofocus. FIG. 76 illustrates box bimorph actuator 7402 according to an embodiment for use in a SMA system configured as a six axis sensor shift OIS and autofocus as manufactured before it is shaped to fit in the system. FIG. 77 illustrates a flexible sensor circuit for use in a SMA system according to an embodiment configured as a three axis sensor shift OIS. Such a system can be configured to have high OIS stroke OIS (e.g., +/−200 µm or more) and a high autofocus stroke (e.g., 400 µm or more). Further, such embodiments enable to tune out any tilt and remove the need for a separate autofocus assembly.

Figure 78:
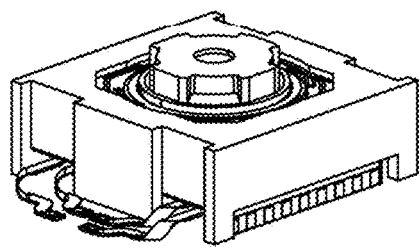
FIG. 78 illustrates a SMA system including a SMA actuator according to an embodiment including bimorph actuators.
Figure 79:
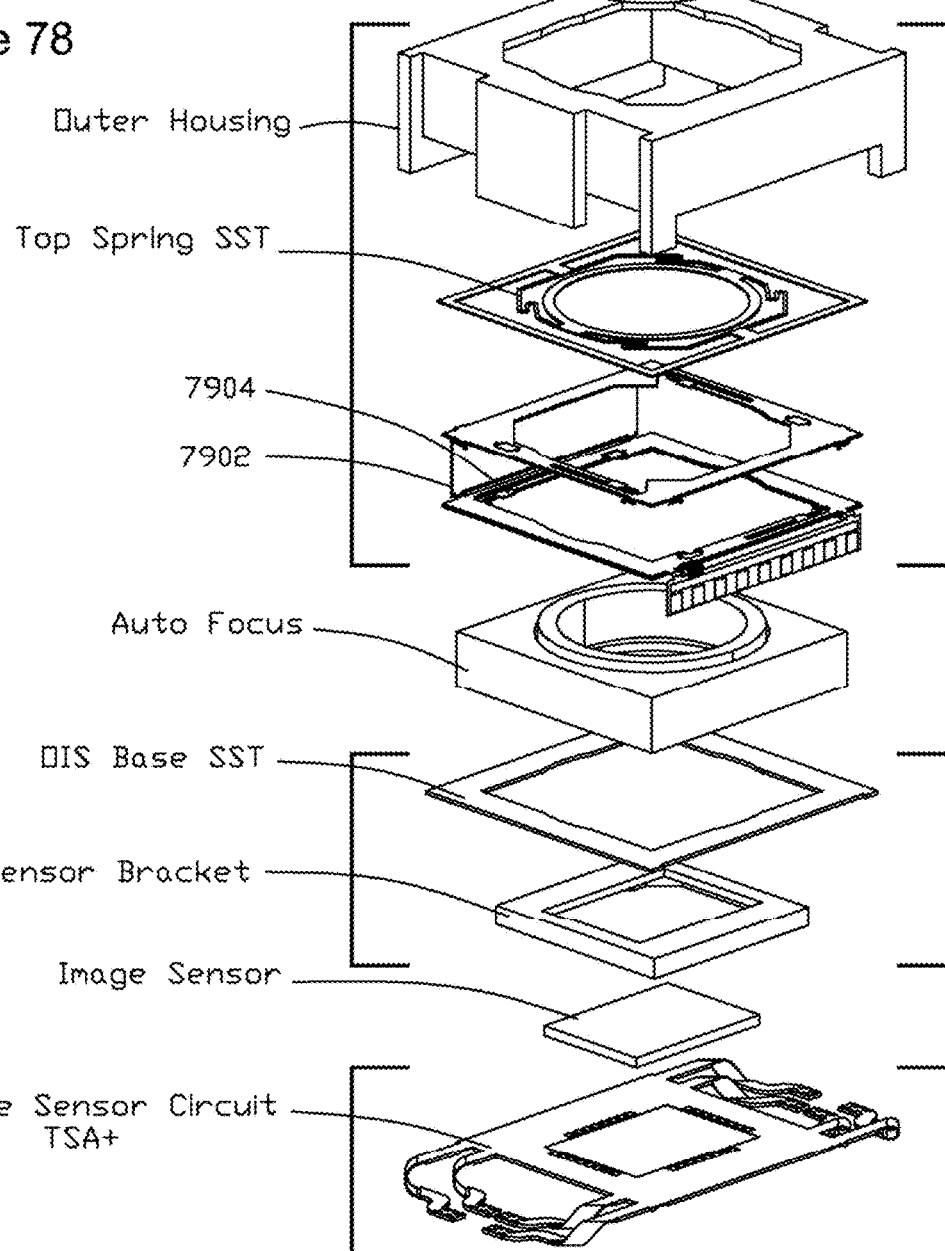
FIG. 79 illustrates an exploded view of SMA system including a SMA actuator according to an embodiment including bimorph actuators.
Figure 80:
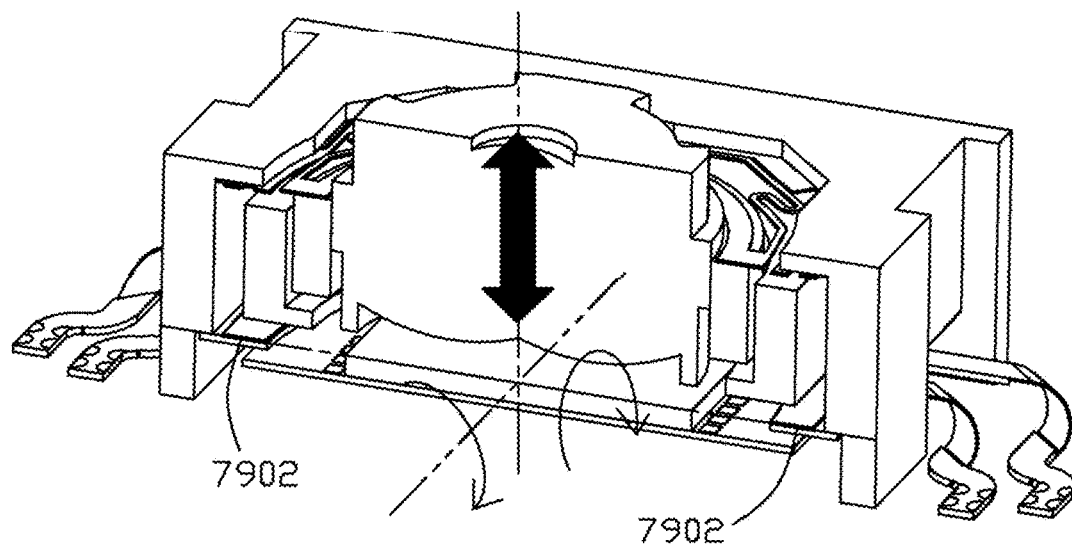
FIG. 80 illustrates a cross-section of SMA system including a SMA actuator according to an embodiment.
Figure 81:
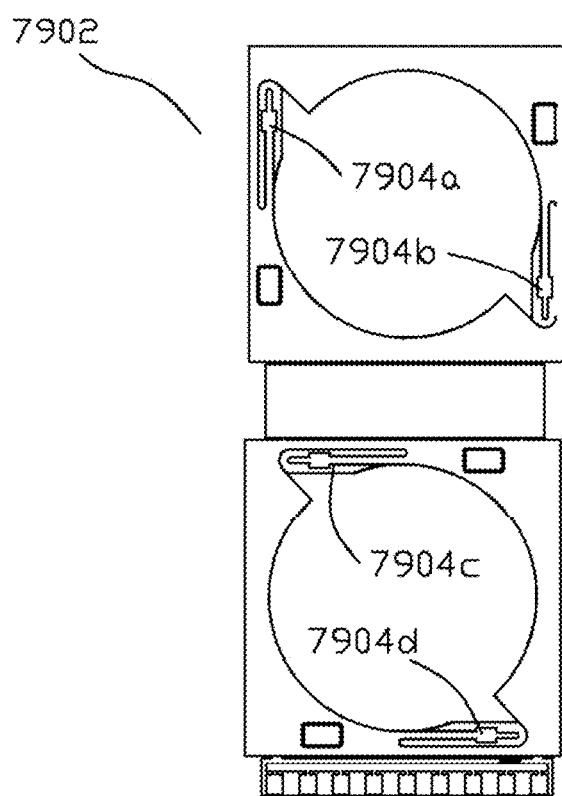
FIG. 81 illustrates box bimorph actuator according to an embodiment.
Figure 82:
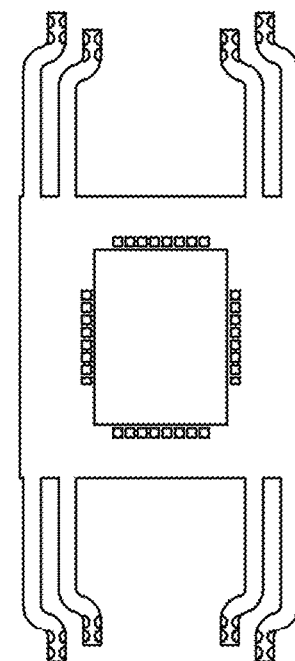
FIG. 82 illustrates a flexible sensor circuit for use in a SMA system according to an embodiment.

FIG. 78 illustrates a SMA system including a SMA actuator according to an embodiment including bimorph actuators configured as a two axis camera tilt OIS. For some embodiments, the two axis camera tilt OIS is configured to move a camera in the Pitch/Yaw axis. 4 bimorph actuators are used to push on top and bottom of autofocus for entire camera motion for the OIS pitch and yaw motion using techniques described herein. FIG. 79 illustrates an exploded view of SMA system including a SMA actuator 7902 according to an embodiment including bimorph actuators 7904 configured as two axis camera tilt OIS. FIG. 80 illustrates a cross-section of SMA system including a SMA actuator according to an embodiment including bimorph actuators configured as a two axis camera tilt OIS. FIG. 81 illustrates box bimorph actuator according to an embodiment for use in a SMA system configured as a two axis camera tilt OIS as manufactured before it is shaped to fit in the system. FIG. 82 illustrates a flexible sensor circuit for use in a SMA system according to an embodiment configured as a two axis camera tilt OIS. Such a system can be configured to have high OIS stroke OIS (e.g., plus/minus 3 degrees or more). The embodiments are configured to integrate easily with autofocus ("AF") designs (e.g., VCM or SMA).

Figure 83:
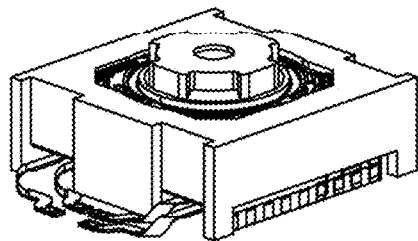
FIG. 83 illustrates a SMA system including a SMA actuator according to an embodiment including bimorph actuators.
Figure 84:
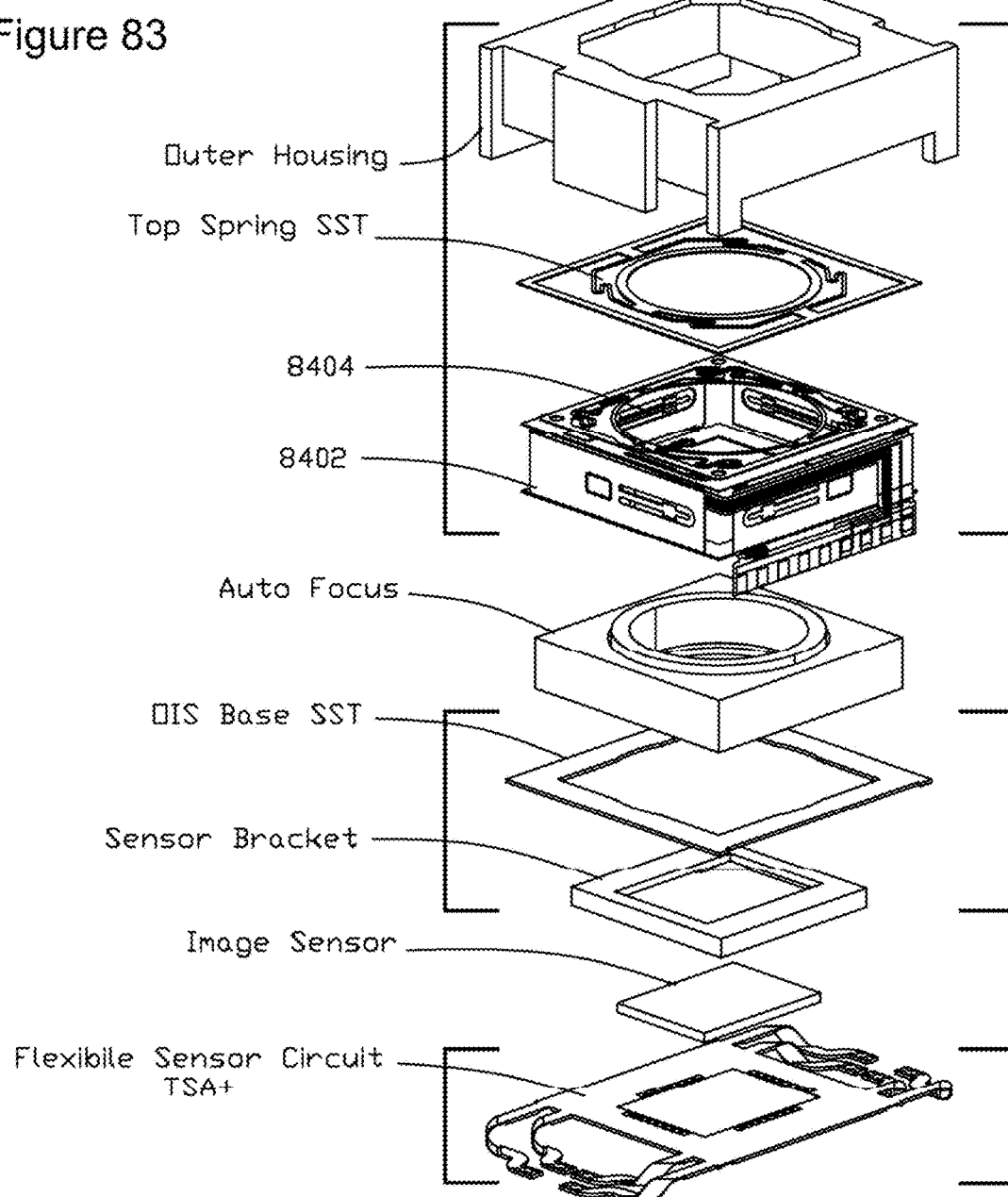
FIG. 84 illustrates an exploded view of SMA system including a SMA actuator according to an embodiment.

FIG. 83 illustrates a SMA system including a SMA actuator according to an embodiment including bimorph actuators configured as a three axis camera tilt OIS. For some embodiments, the three axis camera tilt OIS is configured to move a camera in the Pitch/Yaw/Roll axis. 4 bimorph actuators are used to push on top and bottom of autofocus for entire camera motion for the OIS pitch and yaw motion using techniques described herein and 4 bimorph actuators are used to push on sides of autofocus for entire camera motion for the OIS roll motion using techniques described herein. FIG. 84 illustrates an exploded view of SMA system including a SMA actuator 8402 according to an embodiment including bimorph actuators 8404 configured as three axis camera tilt OIS. FIG. 85 illustrates a cross-section of SMA system including a SMA actuator according to an embodiment including bimorph actuators configured as a three axis camera tilt OIS. FIG. 86 illustrates box bimorph actuator for use in a SMA system according to an embodiment configured as a three axis camera tilt OIS as manufactured before it is shaped to fit in the system. FIG. 87 illustrates a flexible sensor circuit for use in a SMA system according to an embodiment configured as a three axis camera tilt OIS. Such a system can be configured to have high OIS stroke OIS (e.g., plus/minus 3 degrees or more). The embodiments are configured to integrate easily with AF designs (e.g., VCM or SMA).

Figure 88:
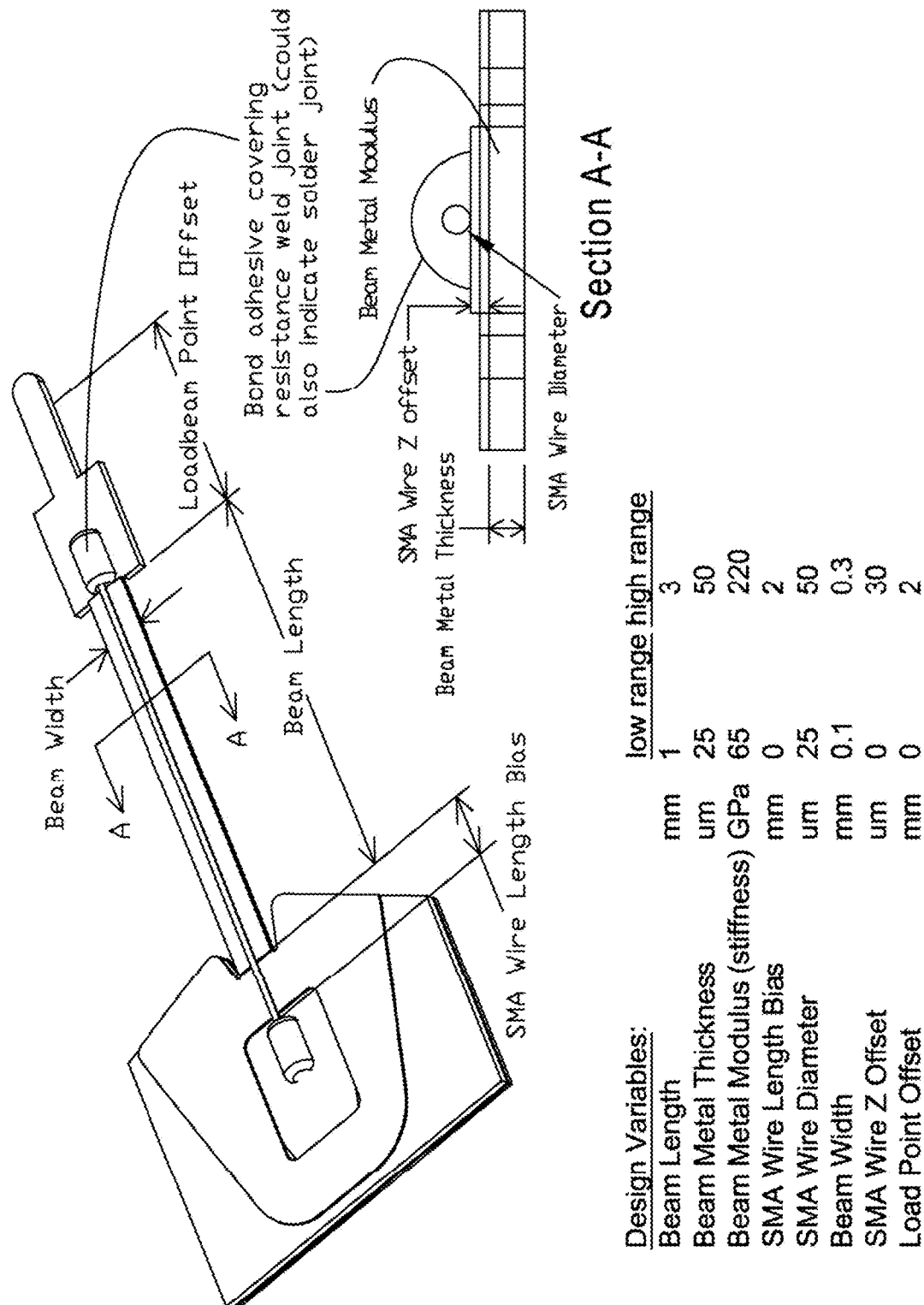
FIG. 88 illustrates exemplary dimensions for a bimorph actuator of an SMA actuator according to embodiments.

FIG. 88 illustrates exemplary dimensions for a bimorph actuator of an SMA actuator according to embodiments. The dimensions are preferred embodiments but one skilled in the art would understand that other dimensions could be used based on desired characteristics for an SMA actuator.

Figure 89:
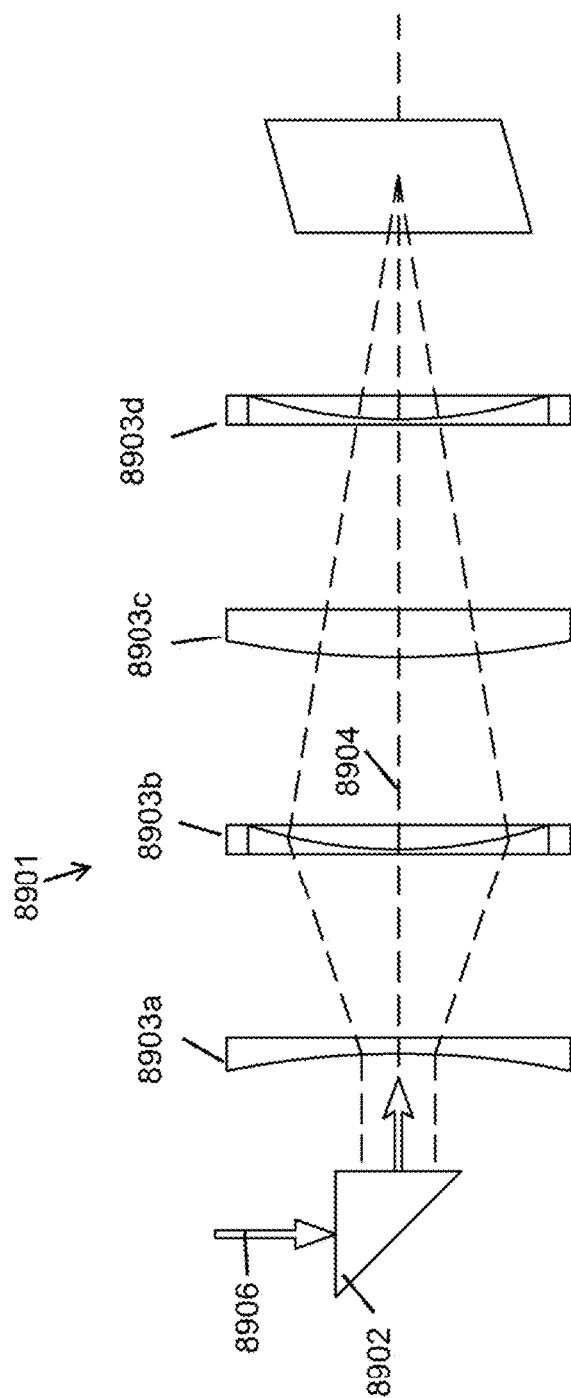
FIG. 89 illustrates a lens system for a folded camera according to an embodiment.

FIG. 89 illustrates a lens system for a folded camera according to an embodiment. The folded camera includes a folding lens 8902 configured to bend light to a lens system

8901 including one or more lens 8903 *a-d*. For some embodiments, the folding lens is one or more of any of a prism and lens. The lens system 8901 is configured to have a principal axis 8904 that is at an angel to a transmission axis 8906 that is parallel to the direction of travel of the light prior to the light reaching the folding lens 8902. For example, a folded camera is used in a camera phone system to reduce the height of a lens system 8901 in the direction of a transmission axis 8906.

Figure 108:
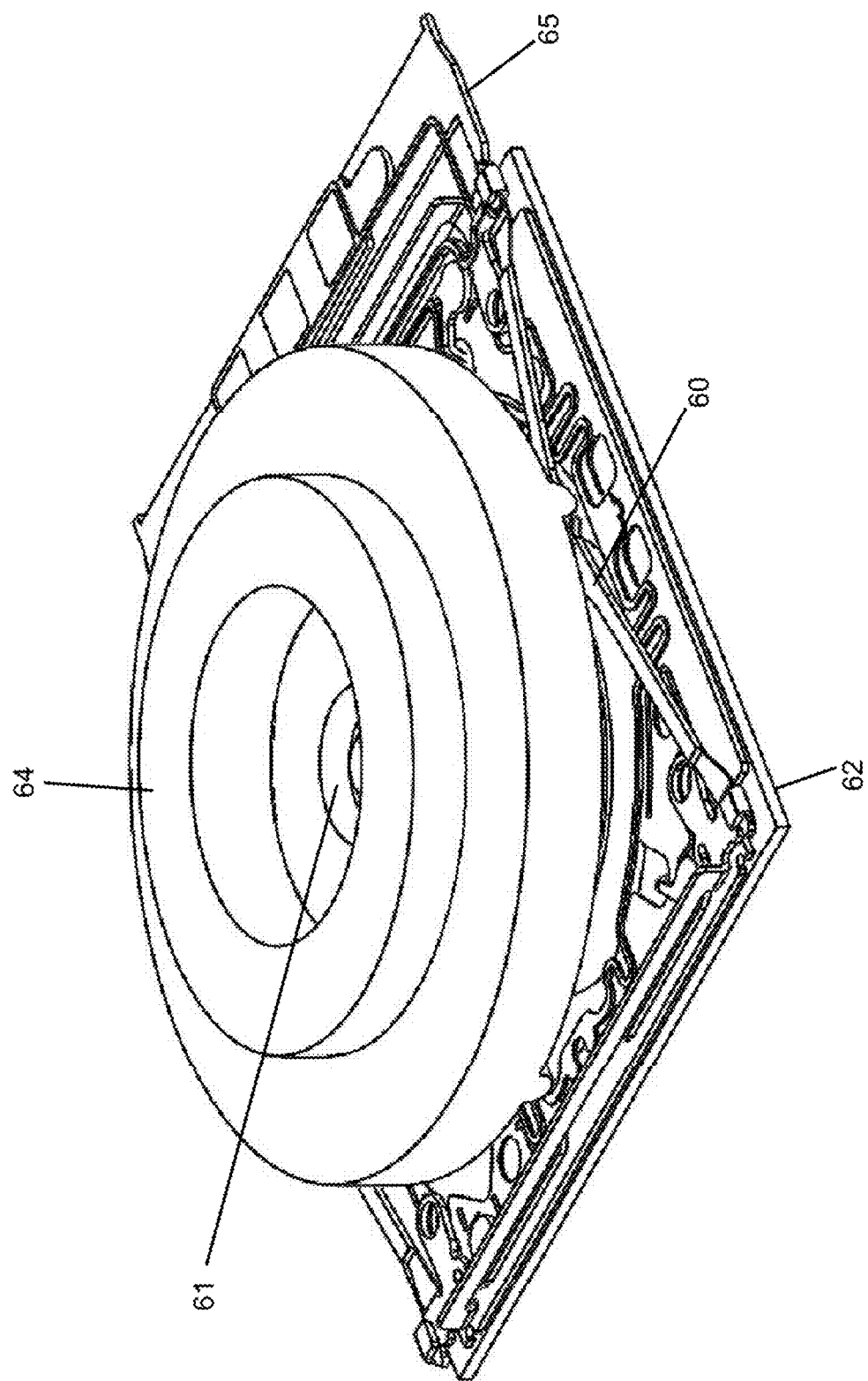
FIG. 108 illustrates a liquid lens actuated using buckler actuators according to an embodiment.

Embodiments of the lens system include one or more liquid lens, such as those described herein. The embodiment illustrated in FIG. 89 includes two liquid lenses 8903*b,d*, such as those described herein. The one or more liquid lens 8903*b,d* are configured to be actuated using techniques including those describe herein. A liquid lens is actuated using actuators, including but not limited to, buckle actuators, bimorph actuators, and other SMA actuators. FIG. 108 illustrates a liquid lens actuated using buckle actuators 60 according to an embodiment. The liquid lens includes a shaping ring coupler 64, a liquid lens assembly 61, one or more buckle actuators 60, such as those described herein, a slide base 65, and a base 62. The one or more buckle actuators 60 are configured to move the shaping ring/coupler 64 to change the shape of a flexible membrane of the liquid lens assembly 61 to move or shape the light rays, for example as described herein. For some embodiments, 3 or 4 actuators are used. A liquid lens can be configured alone or in combination with other lenses to act as an auto focus or optical image stabilizer. A liquid lens can also be configured to otherwise direct an image onto an image sensor.

Figure 90:
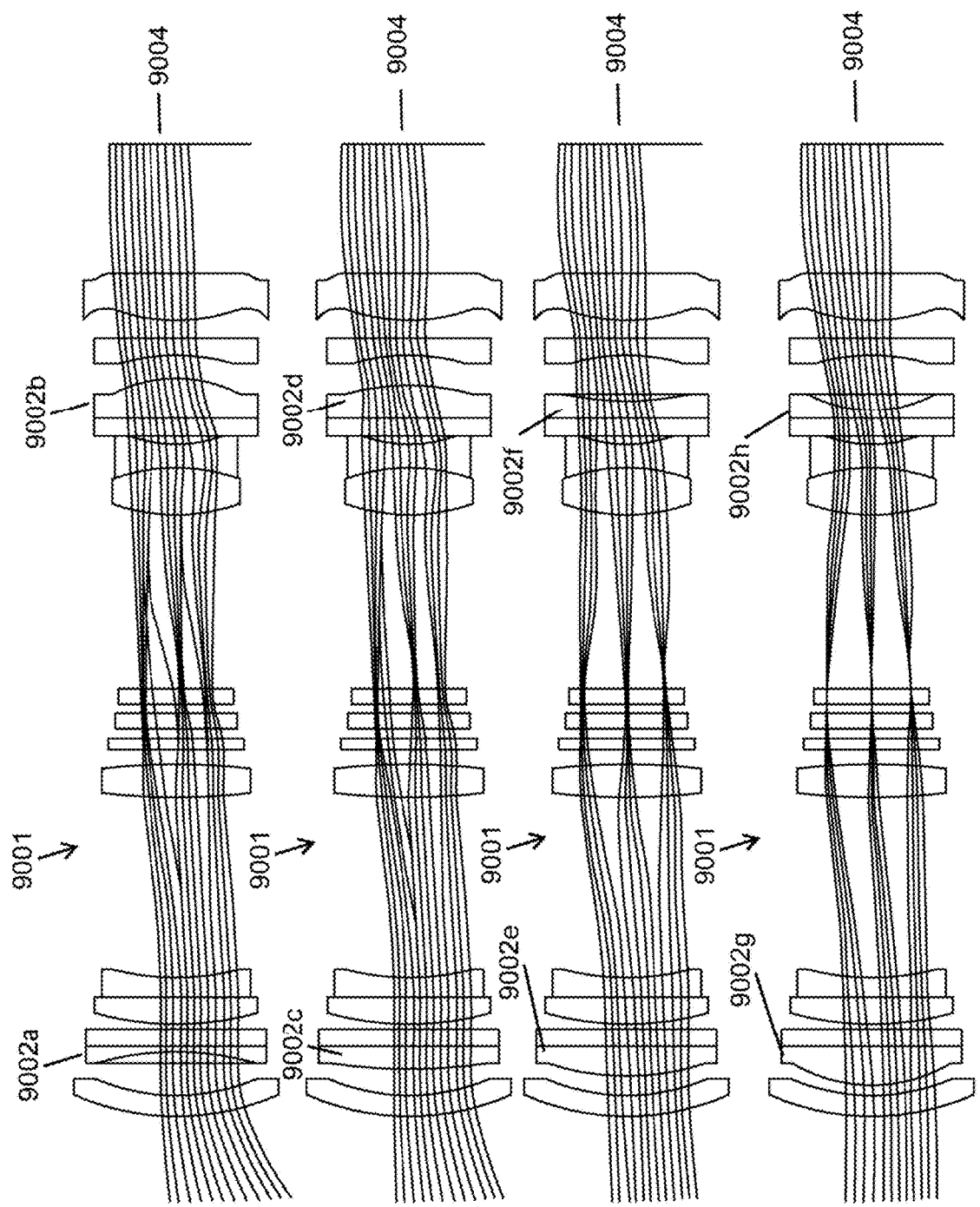
FIG. 90 illustrates several embodiments of a lens system including liquid lenses according to an embodiment.

FIG. 90 illustrates several embodiments of a lens system 9001 including liquid lenses 9002 *a-h* to focus an image on an image sensor 9004. As illustrated, the liquid lens 9002 *a-h* may include any lens shape and be configured to be dynamically configured to adjust the light path through the lens using techniques including those describe herein.

Figure 91:
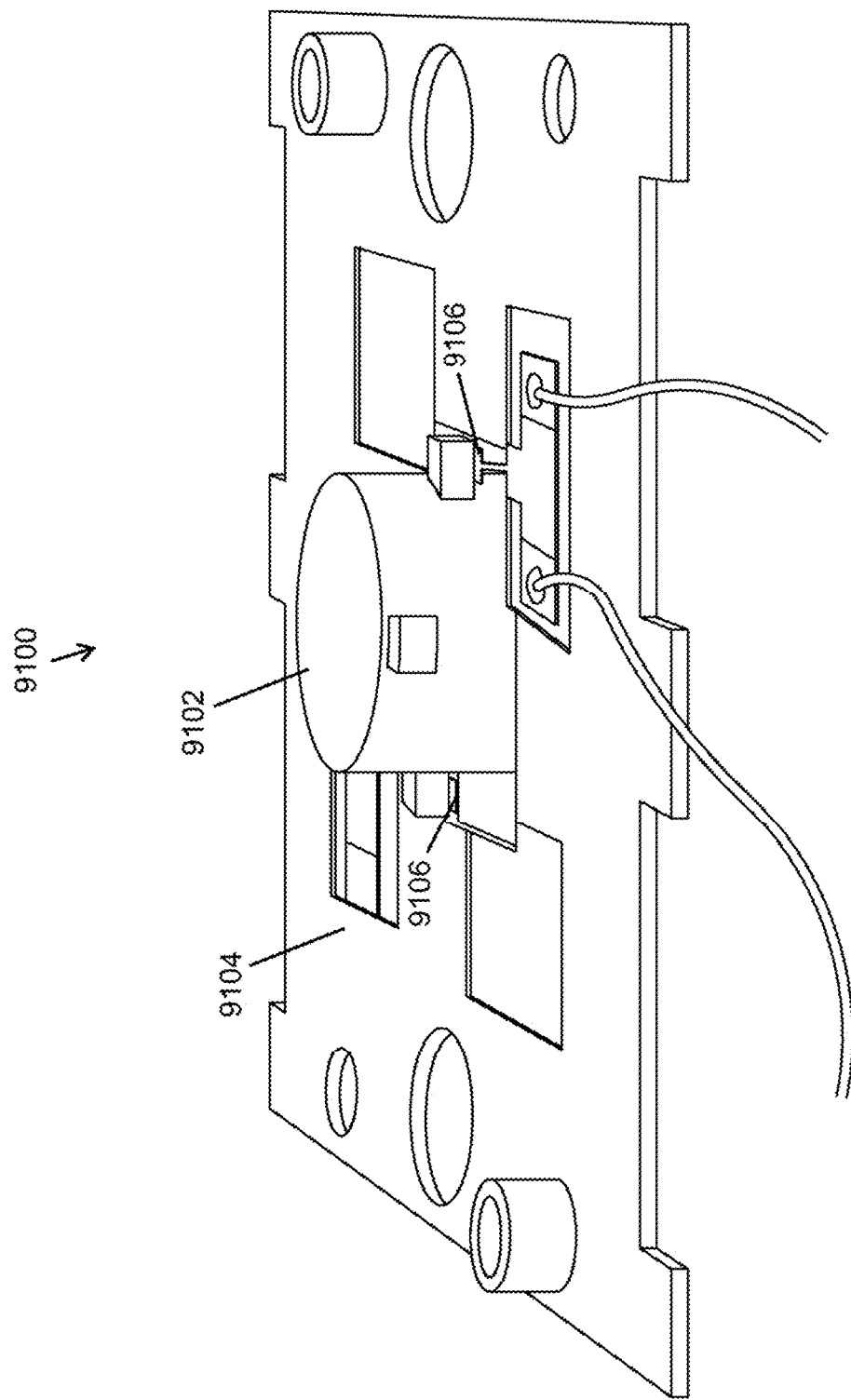
FIG. 91 illustrates a folding lens that is a prism, which is disposed on an actuator, according to an embodiment.

A lens system for a folded camera is configured to include an actuated folding lens 9100. An example of an actuated folding lens is a prism tilt, such as that illustrated in FIG. 91. In the example illustrated in FIG. 91, the folding lens is a prism 9102 disposed on an actuator 9104. The actuator includes, but is not limited to, an SMA actuator including those described herein. For some embodiments, the prism tilt is disposed on an SMA actuator including 4 bimorph actuators 9106, such as those described herein. The actuated folding lens 9100, according to some embodiments, is configured as an optical image stabilizer using techniques including those described herein. For example, an actuated folding lens is configured to include an SMA system such as that illustrated in FIG. 39. Another example of an actuated folding lens can include an SMA actuator such as that illustrated in FIG. 21. However, the folding lens may also include other actuators.

Figure 106:
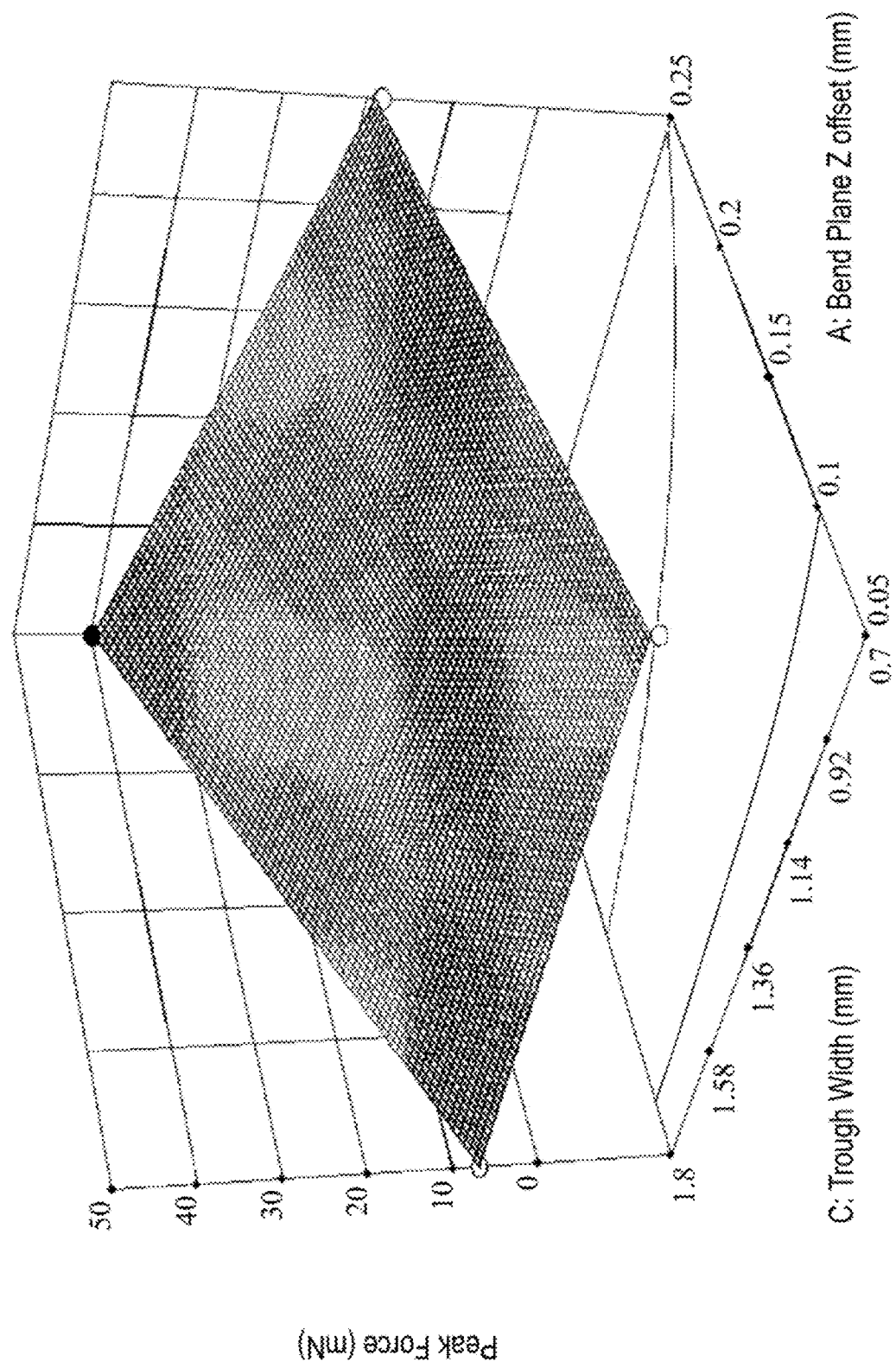
FIG. 106 illustrates the relationship between the bend plane z offset, the trough width, and the peak force of a bimorph beam according to an embodiment.

FIG. 92 illustrates a bimorph arm with an offset according to an embodiment. The bimorph arm 9201 includes a bimorph beam 9202 having a length 9208 and a formed offset 9203. The formed offset 9203 increases the mechanical advantage to generate a higher force than a bimorph arm without an offset. According to some embodiments, the depth of the offset 9204 (also referred herein as bend plane z offset 9204) and the length of the offset 9206 (also referred herein as trough width 9206) are configured to define characteristics of the bimorph arm, such as the peak force. For example, the graph in FIG. 106 illustrates the relationship between the bend plane z offset 9204, the trough width 9206, and the peak force of a bimorph beam 9202 according to an embodiment.

The bimorph arm includes one or more SMA materials such as an SMA ribbon or SMA wire 9210, such as those described herein. The SMA material is affixed to the beam using techniques including those describe herein. For some embodiments, the SMA material, such as an SMA wire 9210, is affixed to a fixed end 9212 of the bimorph arm and to a load point end 9214 of the bimorph arm so that the formed offset 9203 is between both ends where the SMA material is affixed. Ends of the SMA material, for various embodiments, are electrically and mechanically coupled with contacts configured to supply current to the SMA material using techniques including those known in the art. The bimorph arm with an offset can be included in SMA actuators and systems such as those described herein.

FIG. 93 illustrates a bimorph arm with an offset and a limiter according to an embodiment. The bimorph arm 9301 includes a bimorph beam 9302 having a formed offset 9303 and a limiter 9304 adjacent to the formed offset 9303. The offset 9303 increases the mechanical advantage to generate a higher force than a bimorph arm 9301 without an offset and the limiter 9304 prevents motion of the arm in direction away from the unfixed, load point end 9306 of the bimorph actuator. The bimorph arm 9301 with a formed offset 9303 and limiter 9304 can be included in SMA actuators and systems such as those described herein. The bimorph arm 9301 includes one or more SMA materials such as an SMA ribbon or SMA wire 9308, such as those described herein affixed to the bimorph arm 9301 using techniques including those described herein.

FIG. 94 illustrates a bimorph arm with an offset and a limiter according to an embodiment. The bimorph arm 9401 includes a bimorph beam 9402 having a formed offset 9403 and a limiter 9404 adjacent to the formed offset 9403. The limiter 9404 is formed as part of a base 9406 for the bimorph arm 9401. The base 9406 is configured to receive a bimorph arm 9401 and includes a recess 9408 configured to receive the offset portion of the bimorph beam. The bottom of the recess configured as a limiter 9404 to be adjacent to the formed offset 9403. The base 9406 may also include one or more portions 9410 configured to support portions of the bimorph arm when it is not actuated. The bimorph arm 9401 with a formed offset 9403 and limiter 9404 can be included in SMA actuators and systems such as those described herein. The bimorph arm 9401 includes one or more SMA materials such as an SMA ribbon or SMA wire, such as those described herein affixed to the bimorph arm 9401 using techniques including those described herein.

Figure 95:
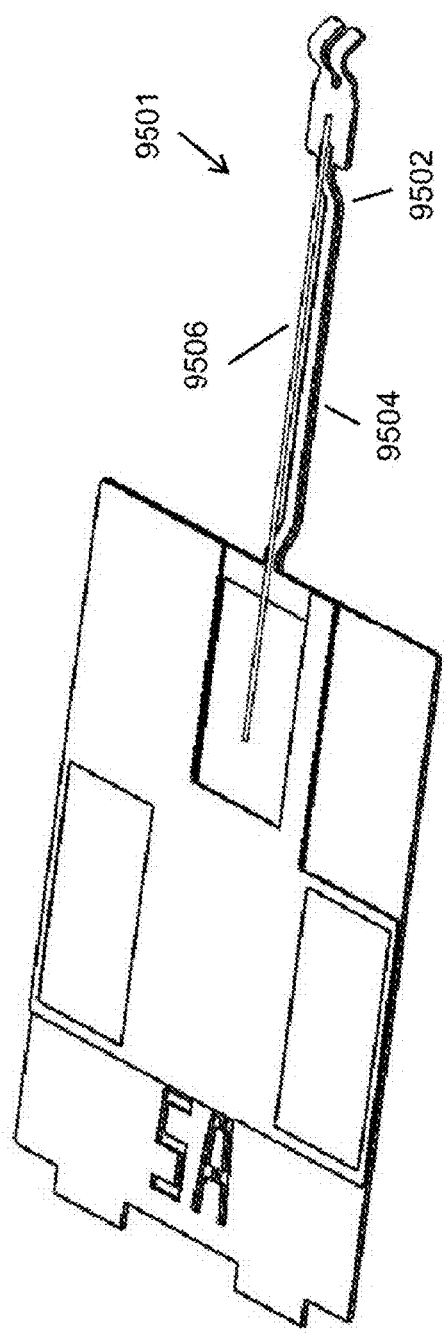
FIG. 95 illustrates an embodiment of a base including a bimorph arm with an offset according to an embodiment.

FIG. 95 illustrates an embodiment of a base including a bimorph arm with an offset according to an embodiment. The bimorph arm 9501 includes a bimorph beam 9502 having a formed offset 9504. The bimorph arm could also include a limiter using techniques including those described herein. The bimorph arm 9501 includes one or more SMA materials such as an SMA ribbon or SMA wire 9506, such as those described herein affixed to the bimorph arm 9501 using techniques including those described herein.

Figure 96:
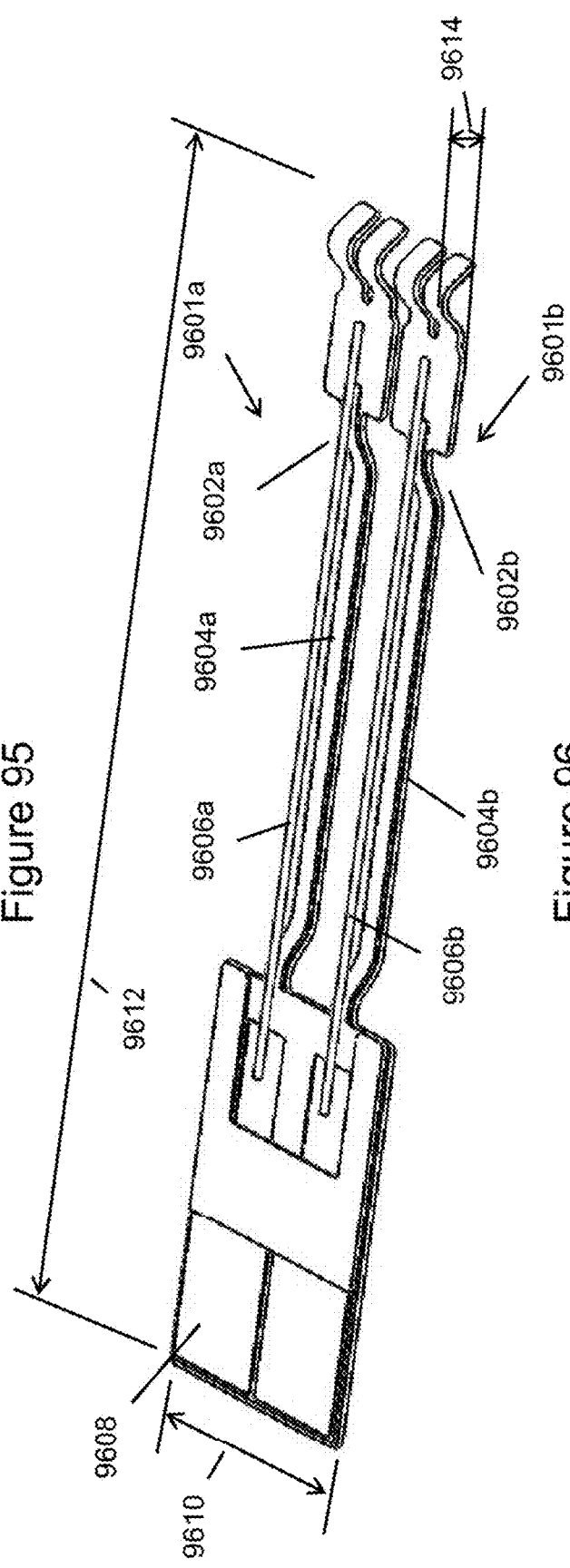
FIG. 96 illustrates an embodiment of a base including two bimorph arms with an offset according to an embodiment.
Figure 107:
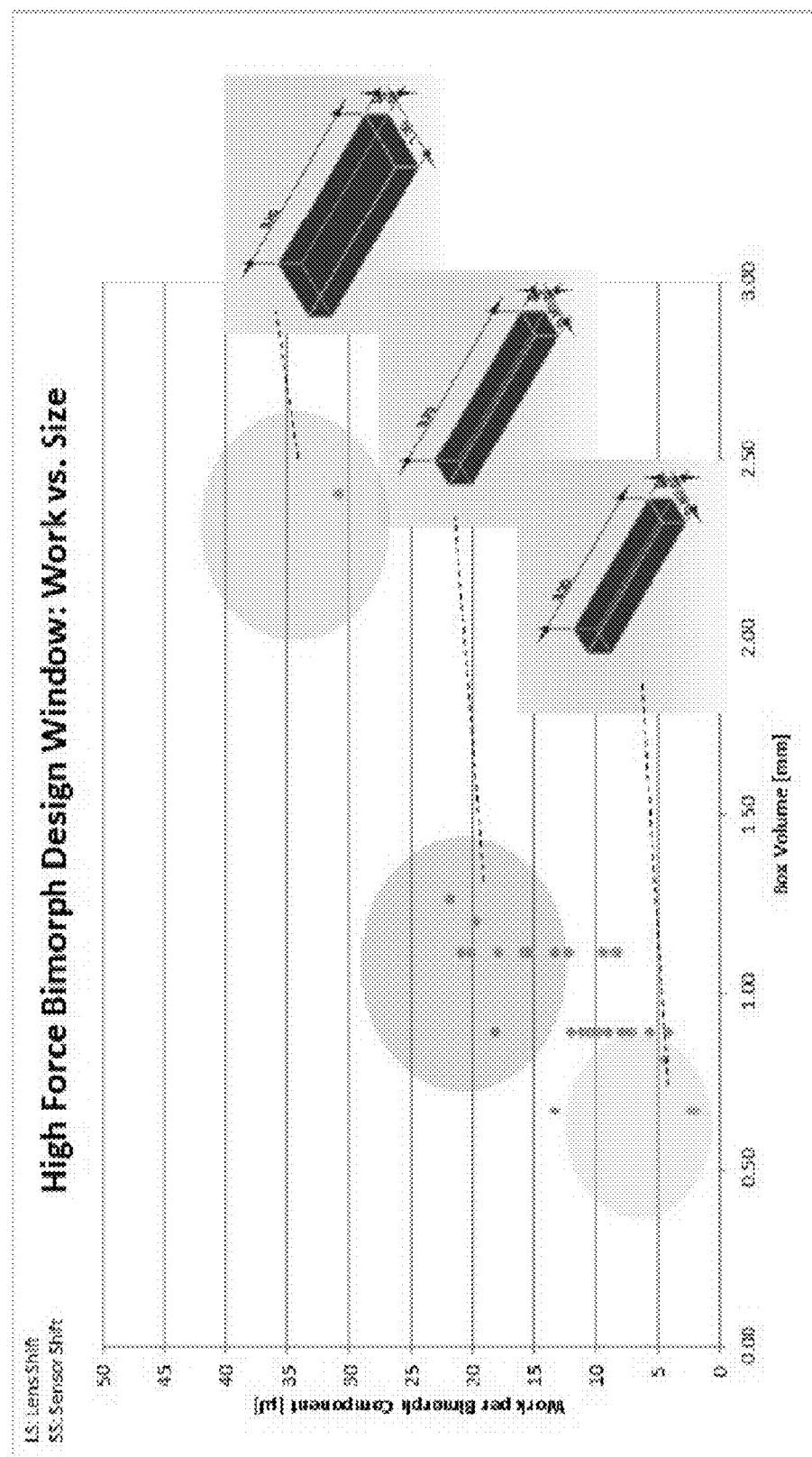
FIG. 107 illustrates examples of how a box volume which is an approximation of a box that encompasses the entire bimorph actuator according to an embodiment is related to the work per bimorph component.

FIG. 96 illustrates an embodiment of a base 9608 including two bimorph arms with an offset according to an embodiment. Each bimorph arm 9601 *a,b* includes a bimorph beam 9602 *a,b* having a formed offset 9604 *a,b*. Each bimorph arm 9601 *a,b* includes one or more SMA materials such as an SMA ribbon or SMA wire 9606 *a,b*, such as those described herein affixed to the bimorph arm 9501 using techniques including those described herein. Each bimorph arm 9601 *a,b* could also include a limiter using techniques including those described herein. Some embodiments include a base including more than two bimorph arms formed using techniques including those described herein. According to some embodiments, the bimorph arms 9601 are integrally formed with the base 9608. For other embodiments, one or more of the bimorph arms 9601 *a,b* formed separately from the base 9608 and affixed to the base 9608, using techniques including, but not limited to, solder, resistance welding, laser welding, and adhesive. For some embodiments, two or more bimorph arms 9601 *a,b* are configured to act on a single object. This enables the ability to increase the force applied to an object. The following graph in FIG. 107 illustrates examples of how a box volume which is an approximation of a box that encompasses the entire bimorph actuator is related to the work per bimorph component. The box volume is approximated using a length of the bimorph actuator 9612, a width of the bimorph actuator 9610, and height of bimorph actuator 9614 (referred collectively as "Box Volume").

Figure 97:
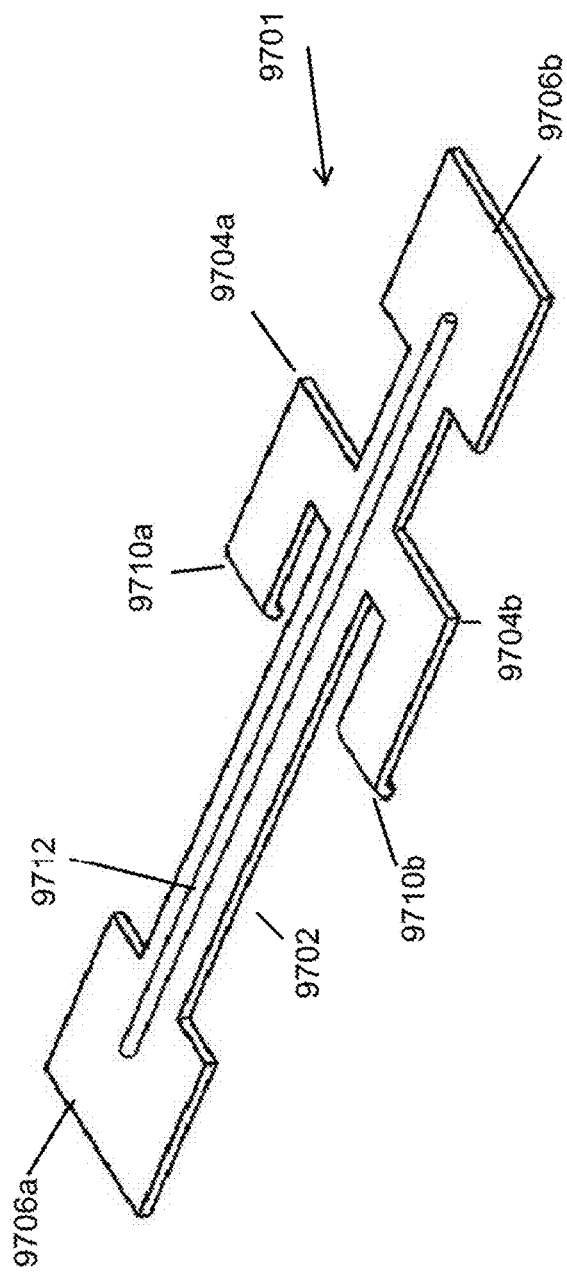
FIG. 97 illustrates a buckler arm including load point extensions according to an embodiment.

FIG. 97 illustrates a buckler arm including load point extensions according to an embodiment. The buckler arm 9701 includes a beam portion 9702 and one or more load point extensions 9704 *a,b* extending from the beam portion 9702. Each end 9706 *a,b* of the buckler arm 9701 is configured to be affixed to or integrally formed to a plate or other base using techniques including those described herein. The one or more load point extensions 9704 *a,b*, according to some embodiments, are affixed or integrally formed with the beam portion 9702 at an offset from a load point 9710 *a,b* of the beam portion 9702. The load point 9710 *a,b* is the portion of the beam portion 9702 that is configured to transfer the force of the buckler arm 9701 to another object. For some embodiments, the load point 9710 *a,b* is the center of the beam portion 9702. For other embodiments, the load point 9710 *a,b* is at a position other than the center of the beam portion 9702. A load point extension 9704 *a,b* is configured to extend from the point it is joined to the beam portion 9702 toward the load point 9710 *a,b* of the beam portion 9702 in the direction of the longitudinal axis of the beam portion 9702. For some embodiments, the end of the load point extension 9704 *a,b* extends to at least the load point 9710 *a,b* of the beam portion 9702. The buckler arm 9701 includes one or more SMA materials such as an SMA ribbon or SMA wire 9712, such as those described herein. The SMA material, such as an SMA wire 9712, is affixed at opposing ends of the beam portion 9702. The SMA material is affixed to opposing ends of the beam portion using techniques including those described herein. For some embodiments, the length of the load point extensions 9704 *a,b* can be configured to any length contained within the longitudinal length of the associated flat (un-actuated) beam portion 9702 of the buckler arm 9701.

Figure 98:
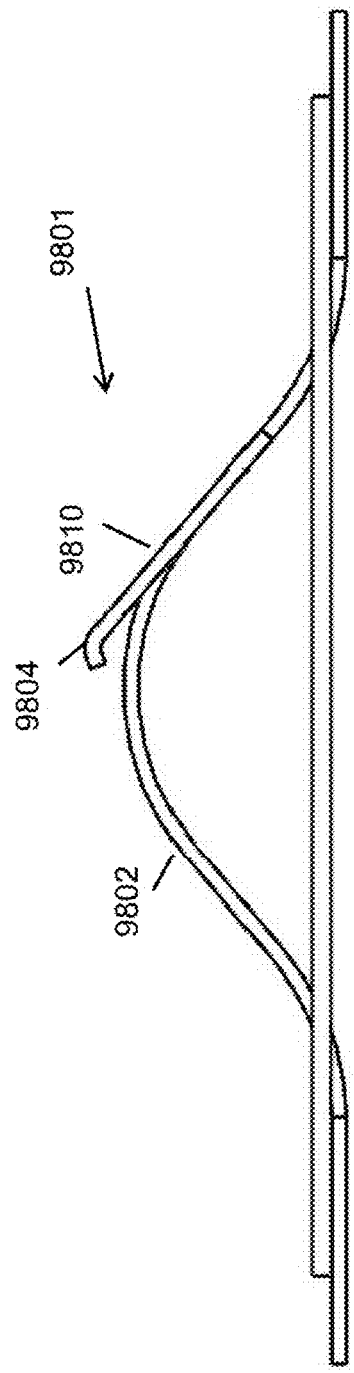
FIG. 98 illustrates a buckler arm 9801 including load point extensions 9810 according to an embodiment.

FIG. 98 illustrates a buckler arm 9801 including load point extensions 9810 according to an embodiment in an actuated position. The SMA material affixed to opposing ends of the beam portion 9802 is actuated using techniques including those described herein. The load point 9804 enables the buckler arm 9801 to increase the stroke range over buckler arms without the extensions. Thus, buckler arms including load point extensions enable a greater maximum vertical stroke. The buckler arm with load point extensions can be included in SMA actuators and systems such as those described herein.

Figure 99:
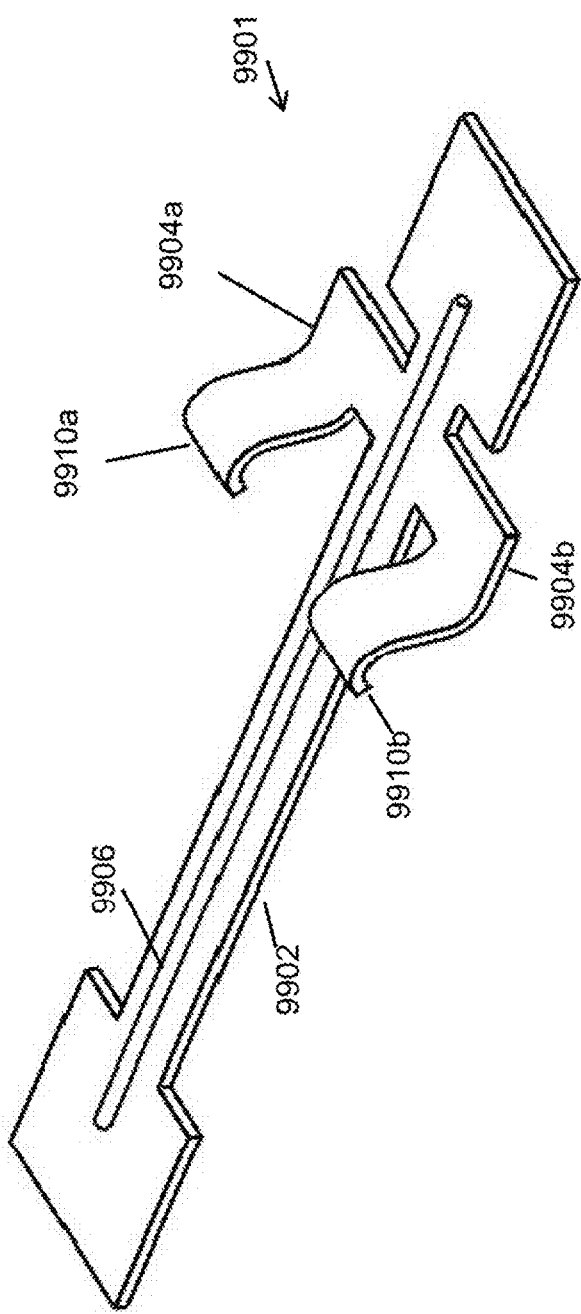
FIG. 99 illustrates a bimorph arm including load point extensions according to an embodiment.

FIG. 99 illustrates a bimorph arm including load point extensions according to an embodiment. The bimorph arm 9901 includes a beam portion 9902 and one or more load point extensions 9904 *a,b* extending from the beam portion. One end of the bimorph arm 9901 is configured to be affixed to or integrally formed to a plate or other base using techniques including those described herein. The end of the beam portion 9902 opposite the affixed or integrally formed end is not fixed and is free to move. The one or more load point extensions 9904 *a,b*, according to some embodiments, are affixed or integrally formed with the beam portion 9902 at an offset from the free end of the beam portion 9902. The load point extension 9904 *a,b* is configured to extend from the point it is joined to the beam portion 9902 in a direction away from a plane including the longitudinal axis of the beam portion 9902. For example, the one or more load point extensions 9904 *a,b* extend in the direction that the free end of the beam portion extends when actuated. Some embodiments of a bimorph arm 9901 include one or more load point extensions 9904 *a,b* having a longitudinal axis that forms an angle including 1 degree to 90 degrees with a plane including the longitudinal axis of the beam portion. For some embodiments, the end 9910 *a,b* of the load point extension 9904 *a,b* is configured to engage an object configured to be moved.

The bimorph arm 9901 includes one or more SMA materials such as an SMA ribbon or SMA wire 9906, such as those described herein. The SMA material, such as an SMA wire 9906, is affixed at opposing ends of the beam portion 9902. The SMA material is affixed to opposing ends of the beam portion 9902 using techniques including those described herein. For some embodiments, the length of the load point extensions 9904 *a,b* can be configured to any length. The location of the point of engagement of an object by an end 9910 *a,b* of the load point extension 9904 *a,b*, according to some embodiments, can be configured to be at any point along the longitudinal length of the beam portion 9902. The height above the beam portion of the end of a load point extension when the beam portion is flat (un-actuated) can be configured to be any height. For some embodiments, the load point extension can be configured to be at least above other portions of the bimorph arm when the bimorph arm is actuated.

Figure 100:
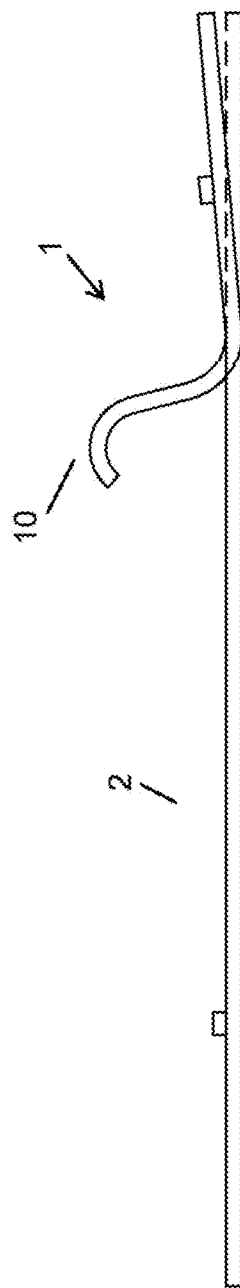
FIG. 100 illustrates a bimorph arm including load point extensions according to an embodiment.

FIG. 100 illustrates a bimorph arm including load point extensions according to an embodiment in an actuated position. The SMA material affixed to opposing ends of the beam portion 2 is actuated using techniques including those described herein. The load point extensions 10 enable the bimorph arm 1 to increase the stroke force over bimorph arms without the extensions. Thus, bimorph arms 1 including load point extensions 10 enable a greater force applied by the bimorph arm 1. The bimorph arm 1 with load point extensions 10 can be included in SMA actuators and systems such as those described herein.

Figure 101:
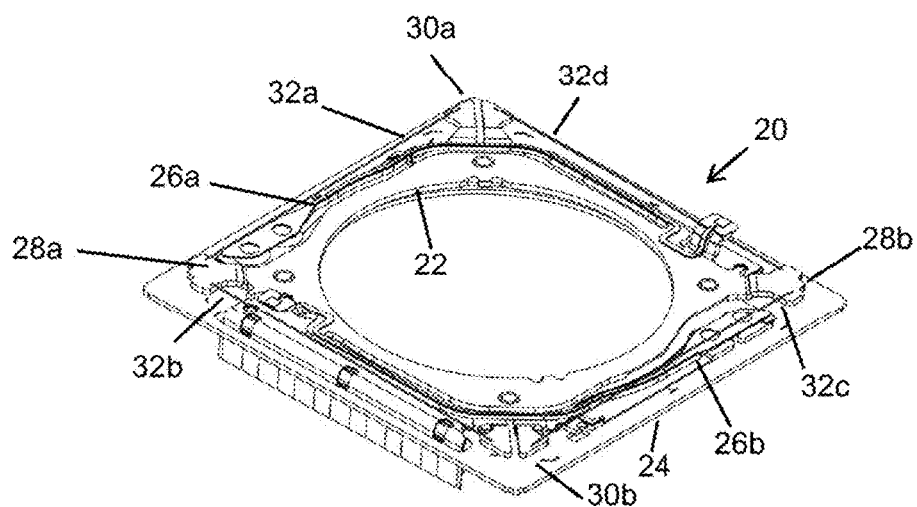
FIG. 101 illustrates an SMA optical image stabilizer according to an embodiment.

FIG. 101 illustrates an SMA optical image stabilizer according to an embodiment. The SMA optical image stabilizer 20 includes a moving plate 22 and a static plate 24. The moving plate 22 includes spring arms 26 integrally formed with the moving plate 22. For some embodiments, the moving plate 22 and the static plate 24 are each formed to be a unitary, one-piece plate. The moving plate 22 includes a first SMA material attach portion 28*a* and a second SMA material attach portion 28*b*. The static plate 24 includes a first SMA material attach portion 30*a* and a second SMA material attach portion 30*b*. Each SMA material attach portion 28, 30 is configured to fix an SMA material, such as an SMA wire, to a plate using resistance weld joints. The first SMA material attach portion 28*a* of the moving plate 22 includes a first SMA wire 32*a* disposed between it and a first SMA material attach portion 30*a* of the static plate and a second SMA wire 32*b* disposed between it and the second SMA attach portion 30*b* of the static plate 24.

Figure 102:
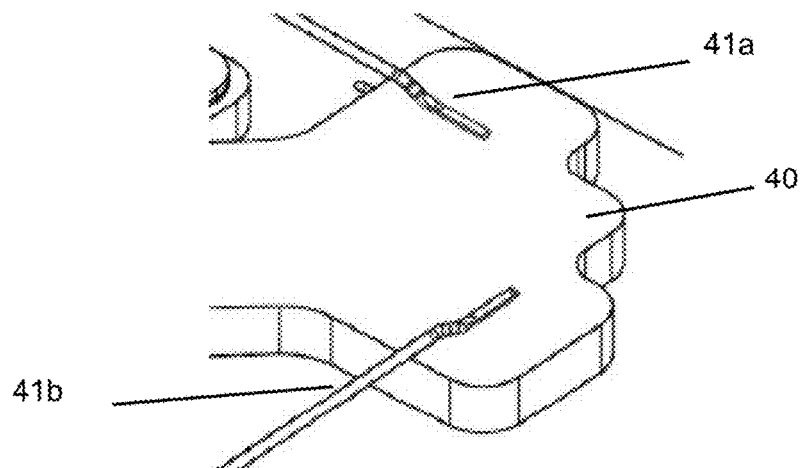
FIG. 102 illustrates an SMA material attach portion 40 of a moving portion according to an embodiment.
Figure 103:
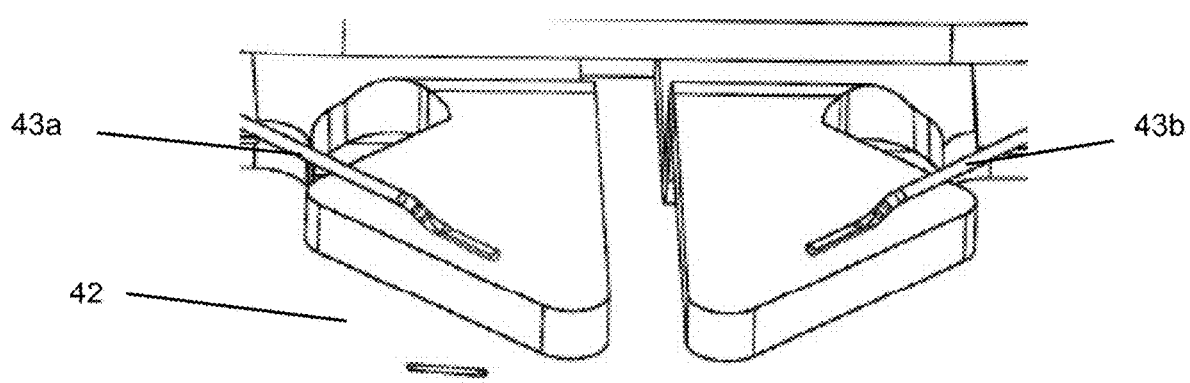
FIG. 103 illustrates an SMA attach portion of a static plate with resistance welded SMA wires attached thereto according to an embodiment.

The second SMA material attach portion 28b of the moving plate 22 includes a third SMA wire 32c disposed between it and a second SMA material attach portion 30b of the static plate and a fourth SMA wire 32d disposed between it and the first SMA attach portion 30a of the static plate 24. Actuating each SMA wire, using techniques including those described herein move the moving plate 22 away from the static plate 24. FIG. 102 illustrates an SMA material attach portion 40 of a moving portion according to an embodiment. The SMA material attached portion is configured to have SMA material, such as an SMA wire 41, resistance welded to the SMA material attach portion 40. FIG. 103 illustrates an SMA attach portion 42 of a static plate with resistance welded SMA wires 43 attached thereto according to an embodiment.

FIG. 104 illustrates an SMA actuator 45 including a buckle actuator according to an embodiment. The buckle actuator 46 includes buckle arms 47, such as those describe herein. The buckle arms 47 are configured to move in the z-axis when the SMA wires 48 are actuated and de-actuated using techniques including those described herein. Each SMA wire 48 is attached to a respective resistance weld wire crimps 49 using resistance welding. Each resistance weld wire crimp 49 includes an island 50 isolated from the metal forming the buckle arms 47 on at least one side of the SMA wire 48. The island structure can be used in other actuators, optical image stabilizer, and auto focus systems to connect at least one side of an SMA wire to an isolated island structure formed in the base metal layer, such as the OIS application shown in FIG. 101.

FIG. 105 illustrates a resistance weld crimp including an island for an SMA actuator according to an embodiment used to attach an SMA wire 48 to a buckle actuator 46 using techniques including those describe here. FIG. 105a illustrates a bottom portion of the SMA actuator 45. The SMA actuator 45, according to some embodiments, is formed from a stainless steel base layer 51. A dielectric layer 52, such as a polyimide layer, is disposed on the bottom portion of the stainless steel base layer 51. A conductor layer 53, according to some embodiments, is electrically connected to the stainless steel island 50 through a via in the dielectric layer 52 enabling an electrical connection to be made between the wire welded to the stainless steel island 50 and the conductor circuit attached to the stainless steel island. An island 50, according to some embodiments, is etch from the stainless steel base layer. The dielectric layer 52 maintains the position of the island 50 within the stainless steel base layer 51. The island 50 is configured to attached an SMA wire thereto using techniques including those described herein, such as resistance welding. FIG. 105b illustrates a top portion of the SMA actuator 45 including an island 50. For some embodiments, glue or adhesive can also be placed on top of the weld to aid in mechanical strength and work as a fatigue strain relief during operation and shock loading.

FIG. 108 includes a lens system including an SMA actuator with buckle actuators according to an embodiment. The lens system includes a liquid lens assembly 61 disposed on a base 62. The lens system also includes a shaping ring/coupler 64 that is mechanically coupled with the buckle actuators 60. The SMA actuator including the buckle actuators 60, such as those described herein, is disposed a slide base 65 which is disposed on the base 62. The SMA actuator is configured to move the shaping ring/coupler 64 along the optical axis of the liquid lens assembly 61 by actuating the buckle actuators 60 using techniques including those described herein. This moves the shaping ring/coupler 64 to change the focus of the liquid lens in the liquid lens assembly.

Figure 109:
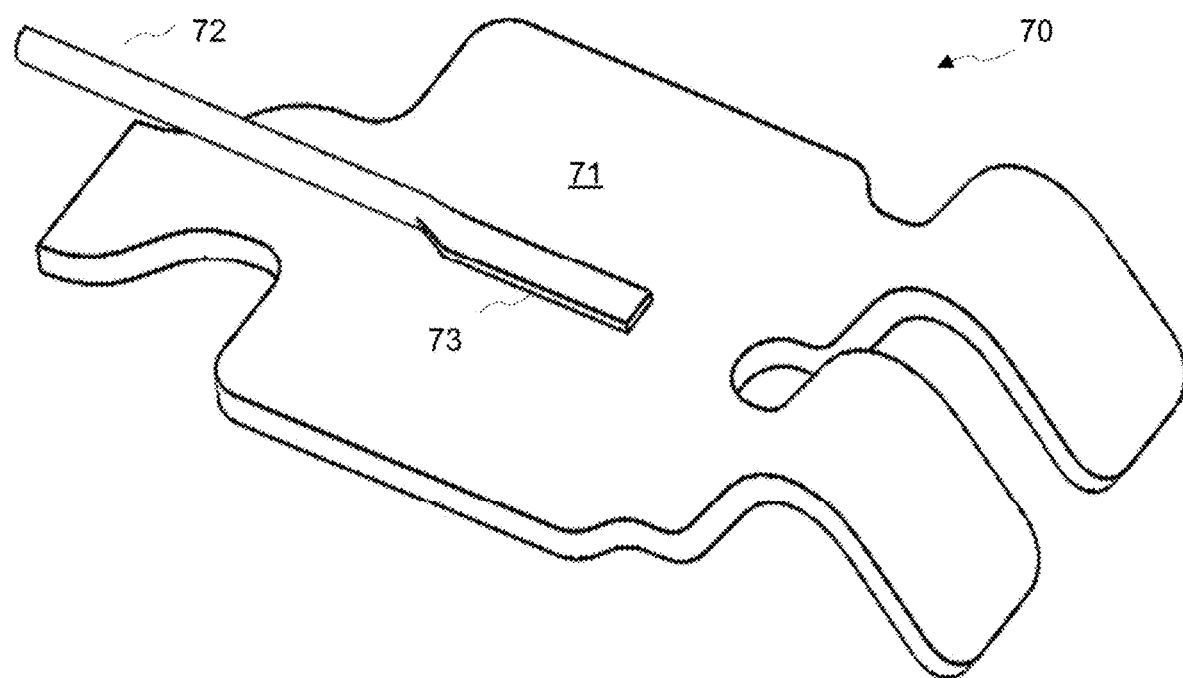
FIG. 109 illustrates an unfixed, load point end of a bimorph arm according to an embodiment.

FIG. 109 illustrates an unfixed, load point end of a bimorph arm according to an embodiment. The unfixed, load point end 70 of a bimorph arm includes a flat surface 71 to affix SMA material, such as an SMA wire 72. The SMA wire 72 is affixed to the flat surface 71 by a resistance weld 73. The resistance weld 73 is formed using techniques including those known in the art.

Figure 110:
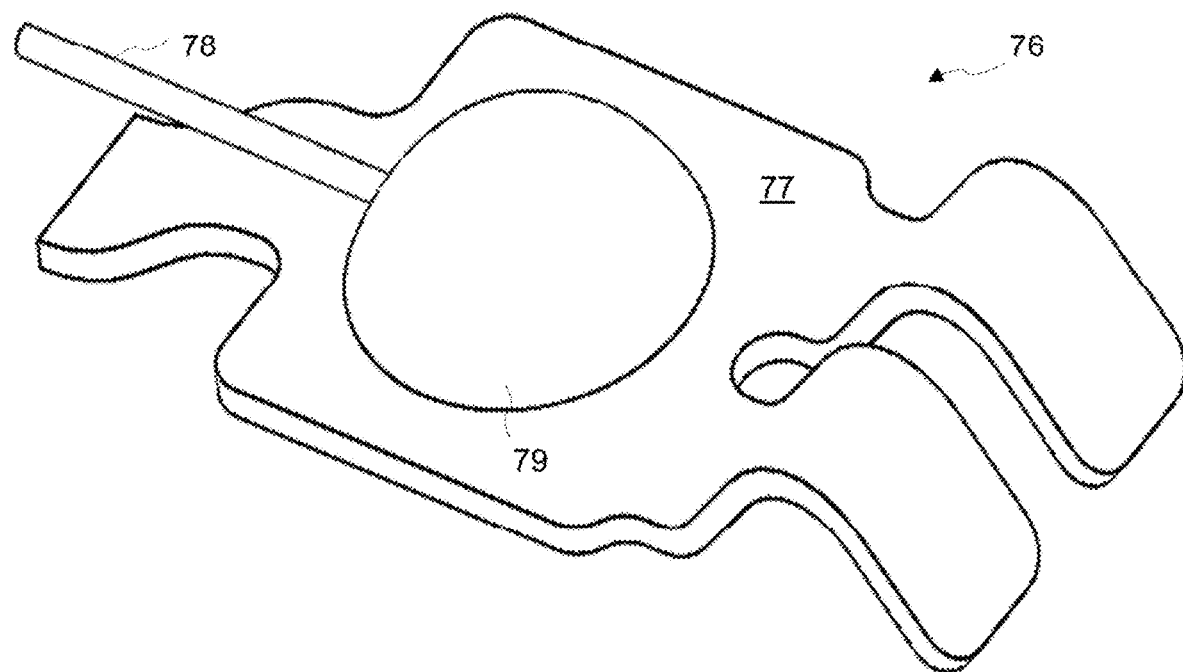
FIG. 110 illustrates an unfixed, load point end of a bimorph arm according to an embodiment.

FIG. 110 illustrates an unfixed, load point end of a bimorph arm according to an embodiment. The unfixed, load point end 76 of a bimorph arm includes a flat surface 77 to affix SMA material, such as an SMA wire 78. The SMA wire 78 is affixed to the flat surface 77 by a resistance weld, similar to that illustrated in FIG. 109. An adhesive 79 is disposed on the resistance weld. This enables a more reliable joint between the SMA wire 78 and the unfixed, load point end 76. The adhesive 79 includes, but is not limited to, conductive adhesive, non-conductive adhesive, and other adhesives known in the art.

Figure 111:
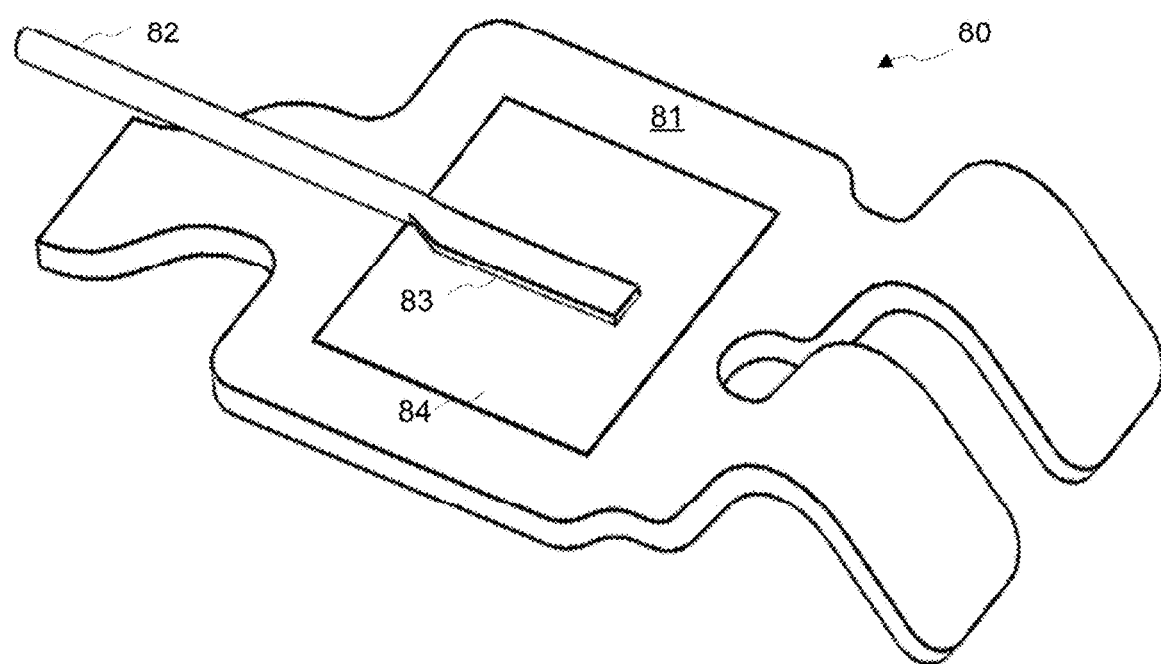
FIG. 111 illustrates an unfixed, load point end of a bimorph arm according to an embodiment.

FIG. 111 illustrates an unfixed, load point end of a bimorph arm according to an embodiment. The unfixed, load point end 80 of a bimorph arm includes a flat surface 81 to affix SMA material, such as an SMA wire 82. A metallic interlayer 84 is disposed on the flat surface 81. The metallic interlayer 84 includes, but is not limited to, a gold layer, a nickel layer, or alloy layer. The SMA wire 82 is affixed to the metallic interlayer 84 disposed on the flat surface 81 by a resistance weld 83. The resistance weld 83 is formed using techniques including those known in the art. The metallic interlayer 84 enables better adhesion with the unfixed, load point end 80.

Figure 112:
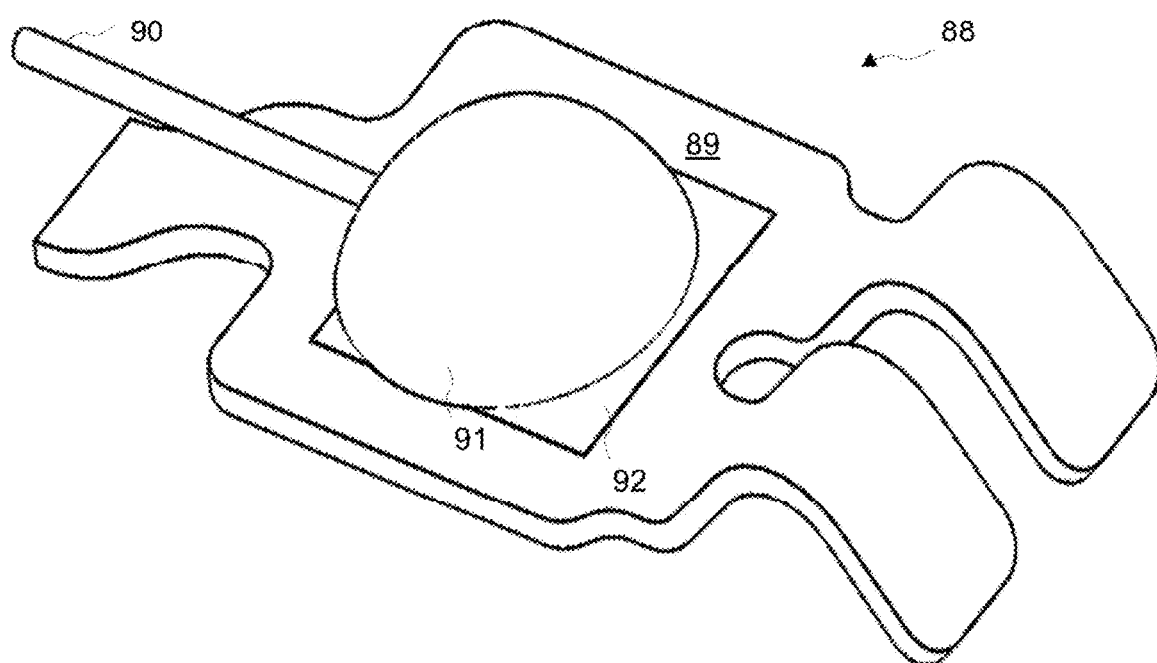
FIG. 112 illustrates an unfixed, load point end of a bimorph arm according to an embodiment.

FIG. 112 illustrates an unfixed, load point end of a bimorph arm according to an embodiment. The unfixed, load point end 88 of a bimorph arm includes a flat surface 89 to affix SMA material, such as an SMA wire 90. A metallic interlayer 92 is disposed on the flat surface 89. The metallic interlayer 92 includes, but is not limited to, a gold layer, a nickel layer, or alloy layer. The SMA wire 90 is affixed to the flat surface 89 by a resistance weld, similar to that illustrated in FIG. 111. An adhesive 91 is disposed on the resistance weld. This enables a more reliable joint between the SMA wire 90 and the unfixed, load point end 88. The adhesive 91 includes, but is not limited to, conductive adhesive, non-conductive adhesive, and other adhesives known in the art.

Figure 113:
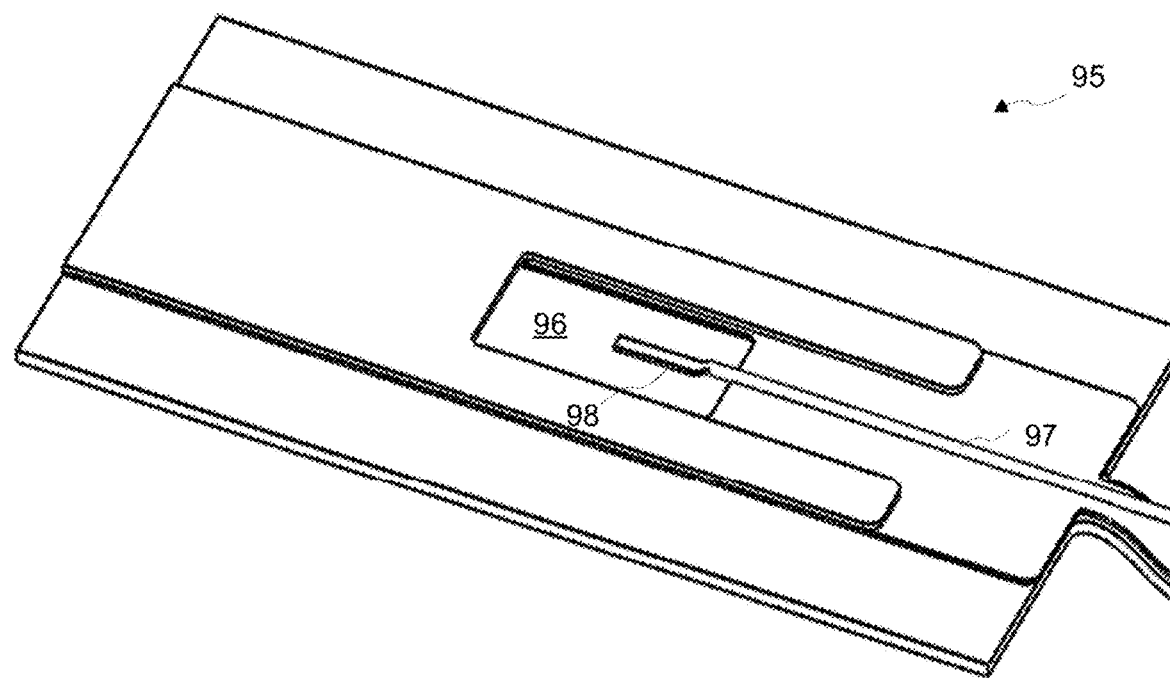
FIG. 113 illustrates a fixed end of a bimorph arm according to an embodiment.

FIG. 113 illustrates a fixed end of a bimorph arm according to an embodiment. The fixed end 95 of a bimorph arm includes a flat surface 96 to affix SMA material, such as an SMA wire 97. The SMA wire 97 is affixed to the flat surface 96 by a resistance weld 98. The resistance weld 98 is formed using techniques including those known in the art.

Figure 114:
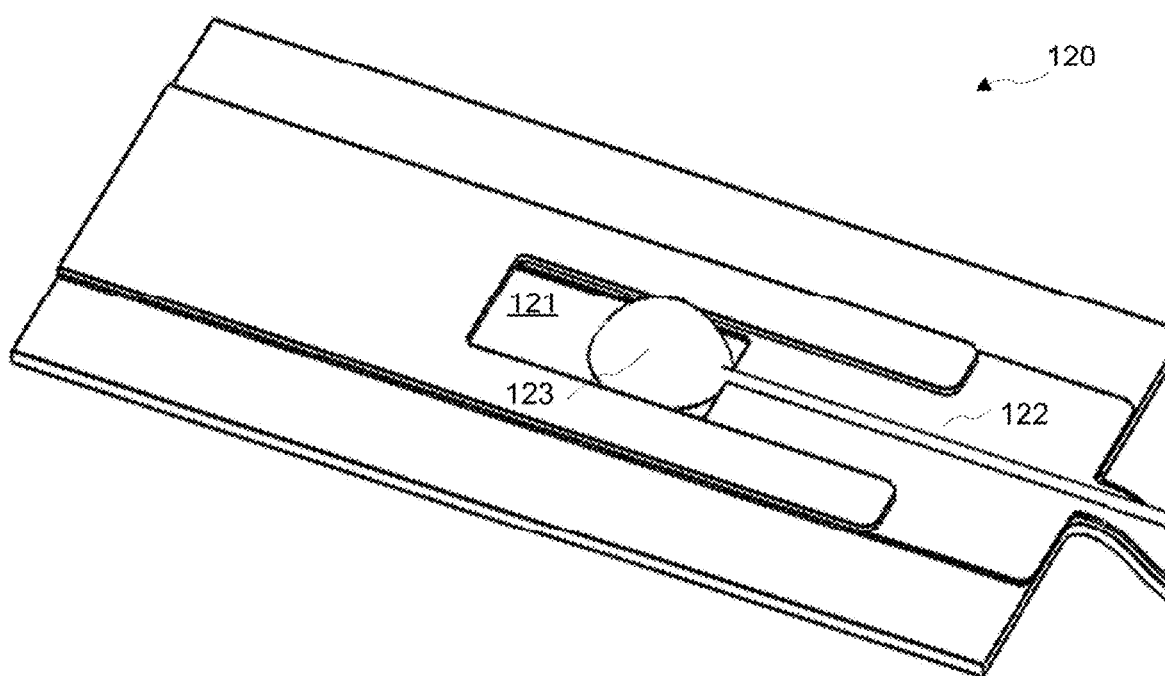
FIG. 114 illustrates a fixed end of a bimorph arm according to an embodiment.

FIG. 114 illustrates a fixed end of a bimorph arm according to an embodiment. The fixed end 120 of a bimorph arm includes a flat surface 121 to affix SMA material, such as an SMA wire 122. The SMA wire 122 is affixed to the flat surface 121 by a resistance weld, similar to that illustrated in FIG. 113. An adhesive 123 is disposed on the resistance weld. This enables a more reliable joint between the SMA wire 122 and the fixed end 120. The adhesive 123 includes, but is not limited to, conductive adhesive, non-conductive adhesive, and other adhesives known in the art.

Figure 115:
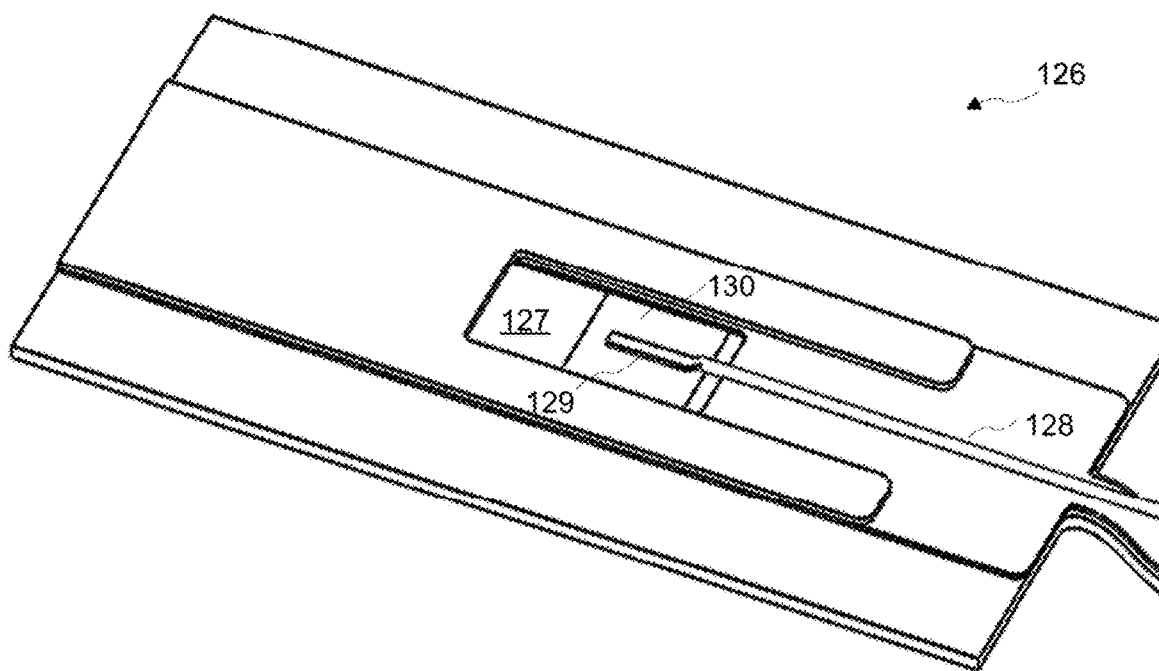
FIG. 115 illustrates a fixed end of a bimorph arm according to an embodiment.

FIG. 115 illustrates a fixed end of a bimorph arm according to an embodiment. The fixed end 126 of a bimorph arm includes a flat surface 127 to affix SMA material, such as an SMA wire 128. A metallic interlayer 130 is disposed on the flat surface 127. The metallic interlayer 130 includes, but is not limited to, a gold layer, a nickel layer, or alloy layer. The SMA wire 128 is affixed to the metallic interlayer 130 disposed on the flat surface 127 by a resistance weld 129.

The resistance weld 129 is formed using techniques including those known in the art. The metallic interlayer 130 enables better adhesion with the fixed end 126.

Figure 116:
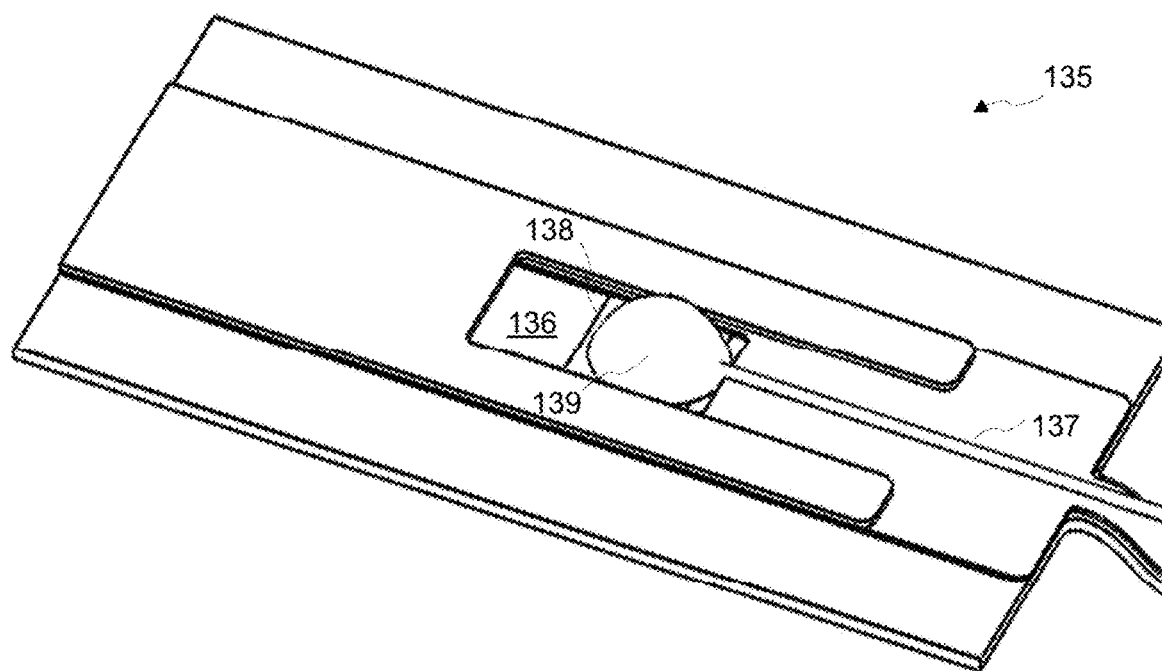
FIG. 116 illustrates a fixed end of a bimorph arm according to an embodiment.

FIG. 116 illustrates a fixed end of a bimorph arm according to an embodiment. The fixed end 135 of a bimorph arm includes a flat surface 136 to affix SMA material, such as an SMA wire 137. A metallic interlayer 138 is disposed on the flat surface 136. The metallic interlayer 138 includes, but is not limited to, a gold layer, a nickel layer, or alloy layer. The SMA wire 137 is affixed to the flat surface 136 by a resistance weld, similar to that illustrated in FIG. 115. An adhesive 139 is disposed on the resistance weld. This enables a more reliable joint between the SMA wire 137 and the fixed end 135. The adhesive 139 includes, but is not limited to, conductive adhesive, non-conductive adhesive, and other adhesives known in the art.

Figure 117:
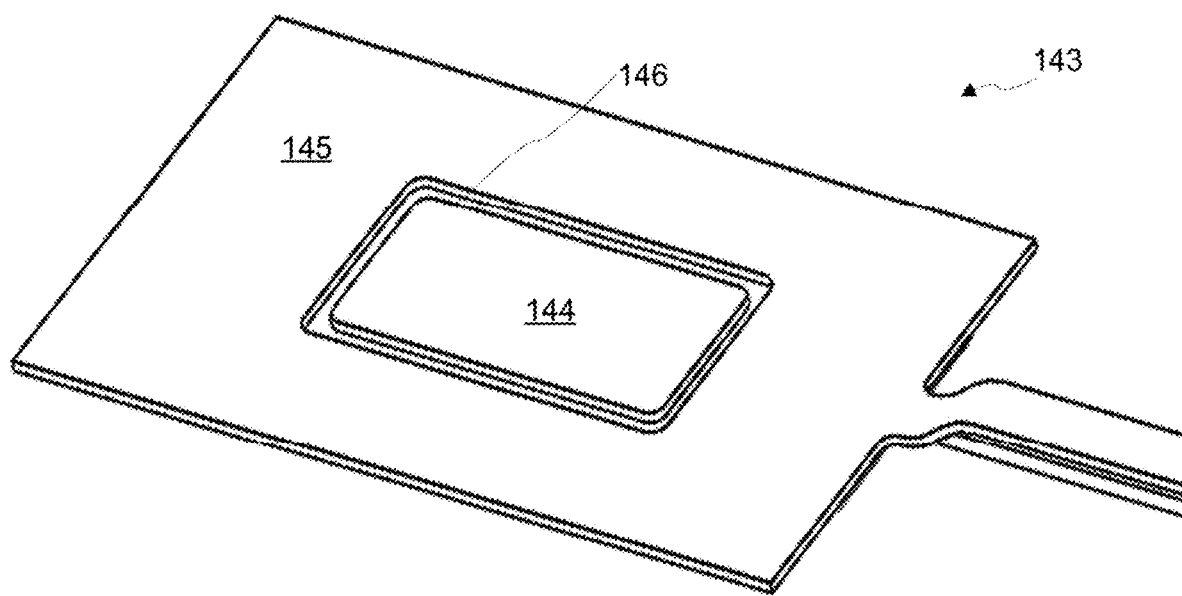
FIG. 117 illustrates a backside view of a fixed end of a bimorph arm according to an embodiment.

FIG. 117 illustrates a backside view of a fixed end of a bimorph arm according to an embodiment. The bimorph arm is configured according to embodiments described herein. The fixed end 143 of a bimorph arm includes an island 144 isolated from the outer portion 145 of the fixed end 143. This enabled the island 144 to be electrically and/or thermally isolated from the outer portion 145. For some embodiments, SMA material affixed to the opposite side of the fixed end 143 of the bimorph arm is electrically coupled with the SMA material, such as an SMA wire, through a via. The island 144 is disposed on an insulator 146, such as those described herein. The island 144 can be formed using etching techniques including those known in the art.

Figure 118:
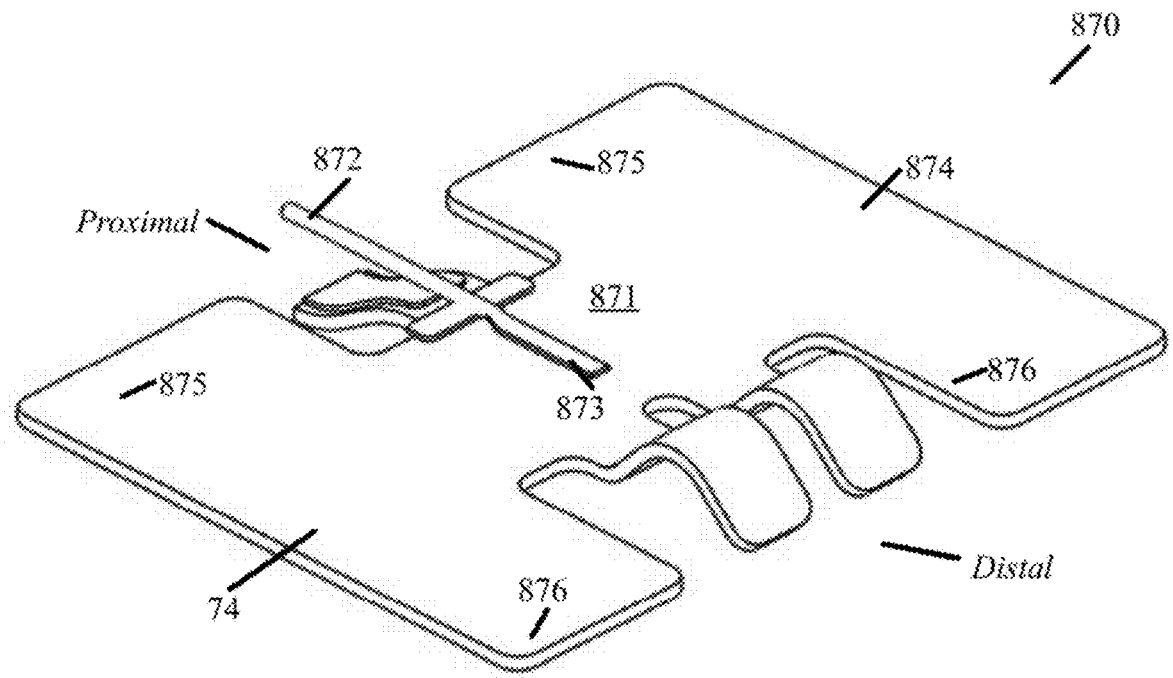

FIG. 118 illustrates an unfixed, load point end 870 of a bimorph arm according to an embodiment. The unfixed, load point end 870 of a bimorph arm includes a flat surface 871 configured to include radiant surface areas 874 extending out from the resistance weld region 873. The radiant surface areas 874 include a distal portion 876 and a proximal portion 875. The flat surface 871 is configured to have SMA material, such as an SMA wire 872, material affixed to the flat surface 871. According to some embodiments, the SMA wire 872 is affixed to the flat surface 871 at a resistance weld region 873 by a resistance weld. The resistance weld is formed using techniques including those known in the art. For other embodiments, the SMA wire 872 is affixed to the flat surface 871 using other attachment techniques including those described herein.

A temperature reduction of the unfixed, load point end 870 is relative to the phase transition temperature of the SMA wire 872. The radiant surface area 874 increases the surface area of the unfixed load point end 870 significantly.

The increased surface area improves the temperature reduction of the unfixed, load point end 870. The increased surface area enables cooling to prevent shape memory alloy phase transition during actuation.

Figure 119:
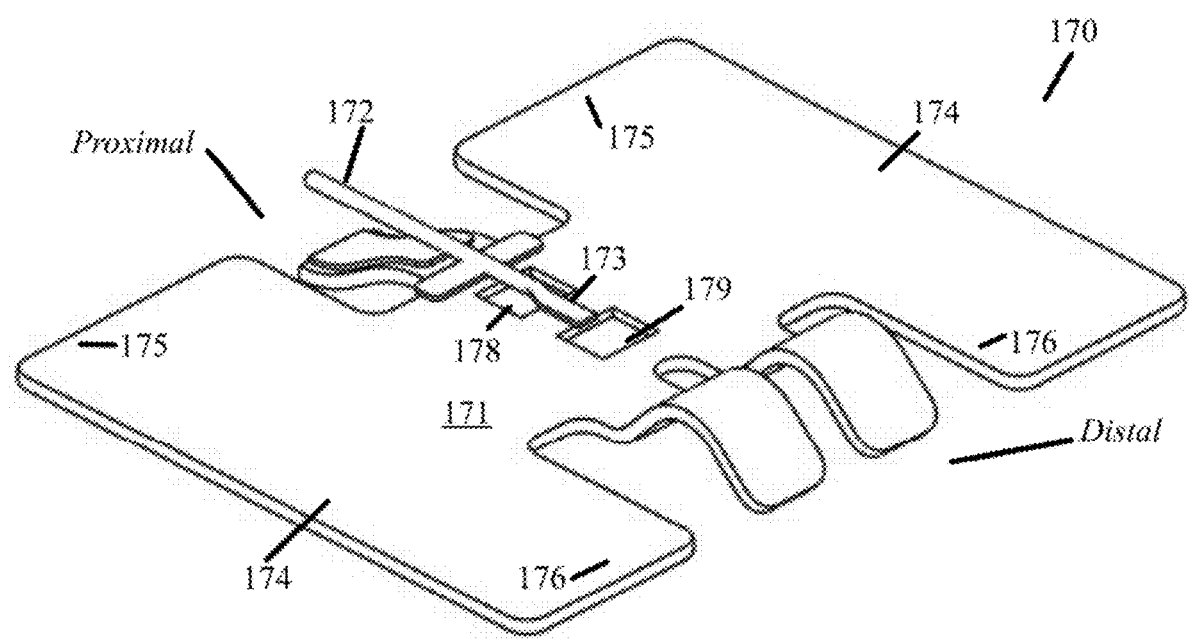

FIG. 119 illustrates an unfixed, load point end 170 of a bimorph arm according to an embodiment. The unfixed, load point end 170 of a bimorph arm includes a flat surface 171 configured to include radiant surface areas 174 extending out from the resistance weld region 173.

The radiant surface areas 174 include a distal portion 176 and a proximal portion 175. The flat surface 171 is configured to have SMA material, such as an SMA wire 172, affixed to the flat surface 171. According to some embodiments, the SMA wire 172 is affixed to the flat surface 171 by a resistance weld to a resistance weld region 173. For other embodiments, the SMA wire 172 is affixed to the flat surface 171 using other attachment techniques including those described herein.

The unfixed, load point end 170 also includes a proximal aperture 178 and a distal aperture 179 separated by the resistance weld region 173. The proximal aperture 178 and distal aperture 179 is formed using techniques including those known in the art. While the apertures 178 and 179 are illustrated as full through features, the apertures 178 and 179 may be partially etched in some examples.

The proximal aperture 178 and a distal aperture 179 physically break the flat surface 171 and define the position of the resistance weld region 173. The apertures 178 and 179, according to some embodiments, are configured to relieve interference between the wire 172 and flat surface 171 near the resistance weld region 173.

Figure 120:
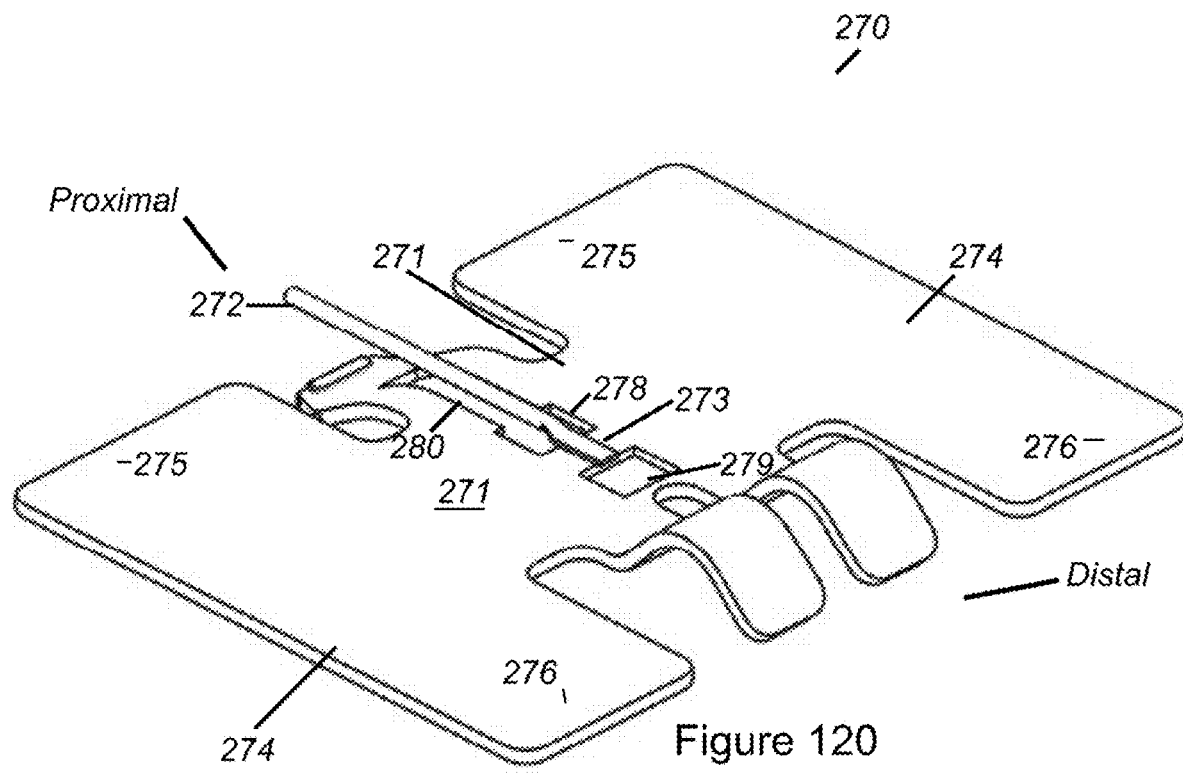

FIG. 120 illustrates an unfixed, load point end 270 of a bimorph arm according to an embodiment. The unfixed, load point end 270 of a bimorph arm includes a flat surface 271 configured to include radiant surface areas 274 extending out from the resistance weld region 273. The flat surface 271 is configured to have SMA material, such as an SMA wire 272, affixed to the flat surface 271. According to some embodiments, the SMA wire 272 is affixed to the flat surface 271 by a resistance weld to a resistance weld region 273. For other embodiments, the SMA wire 272 is affixed to the flat surface 271 using other attachment techniques including those described herein.

The unfixed, load point end 270 also includes a proximal aperture 278 and a distal aperture 279 separated by the resistance weld region 273. The unfixed, load point end 270 also includes an elongated aperture 280 corresponding to a section of the SMA wire 272. The elongated aperture 280 can be removed to create a wire clearance for the SMA wire 272. In some embodiments, the elongated aperture 280 extends from the proximal aperture 278. While the apertures 278, 279, and 280 are illustrated as full through features, the apertures 278, 279, and 280 may be partially etched in some examples.

The proximal aperture 278 and a distal aperture 279 physically break the flat surface 271 and define the position of the resistance weld region 273. Similarly, the elongated aperture 280 physically break the flat surface 271 and define the position of the SMA wire 272. The apertures 278, 279, and 280, according to some embodiments, are configured to relieve interference between the wire 272 and the flat surface 271 near the resistance weld region 273.

Figure 121:
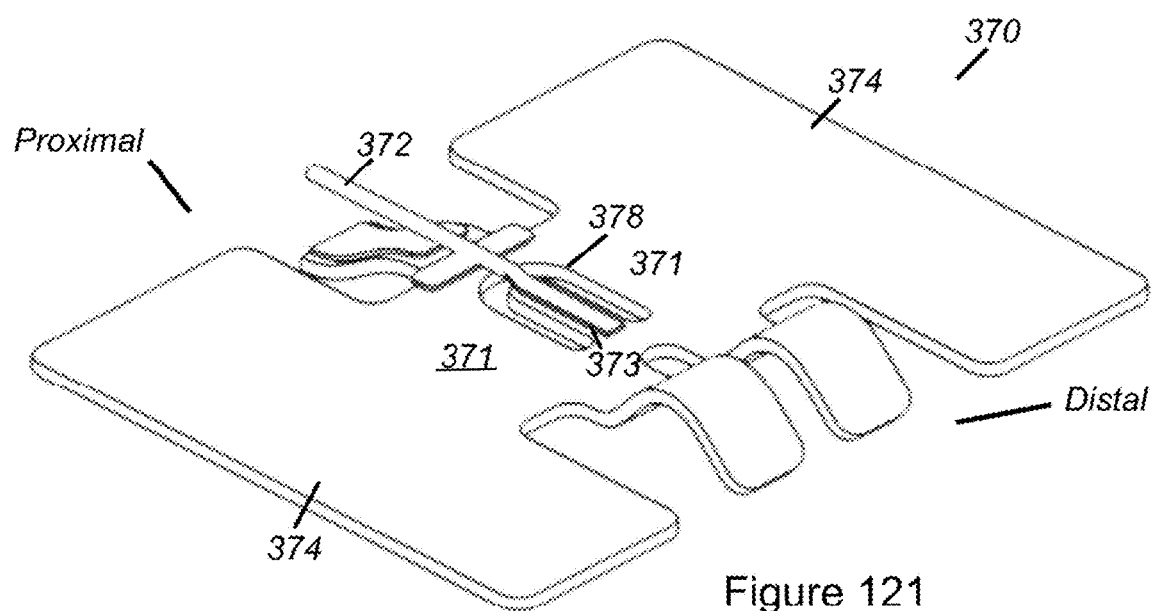

FIG. 121 illustrates an unfixed, load point end 370 of a bimorph arm according to an embodiment. The flat surface 371 is configured to have SMA material, such as an SMA wire 372, affixed to the flat surface 371. According to some embodiments, the SMA wire 372 is affixed to the flat surface 371 by a resistance weld to a resistance weld region 373, which is isolated, at least in part, by a non-linear aperture 378. In some configurations, the non-linear aperture 378 is u-shaped, to physically isolate up to 90% of the resistance weld region 373. The resistance weld region 373 could be mounted on a weld tongue defined by the non-linear aperture 378. For other embodiments, the SMA wire 372 is affixed to the flat surface 371 using other attachment techniques including those described herein. While the non-linear aperture 378 is illustrated as a full through feature, the non-linear aperture 378 may be partially etched in some examples.

The increased surface area from the radiant surface areas 374 enables cooling to prevent shape memory alloy phase transition during actuation. In some alternative embodiments, the resistance weld region 373 may be fully etched from the unfixed, load point end 370. Alternatively, the resistance weld region 373 could also contain a partial etch slot to increase the compliance of the tongue.

Figure 122:
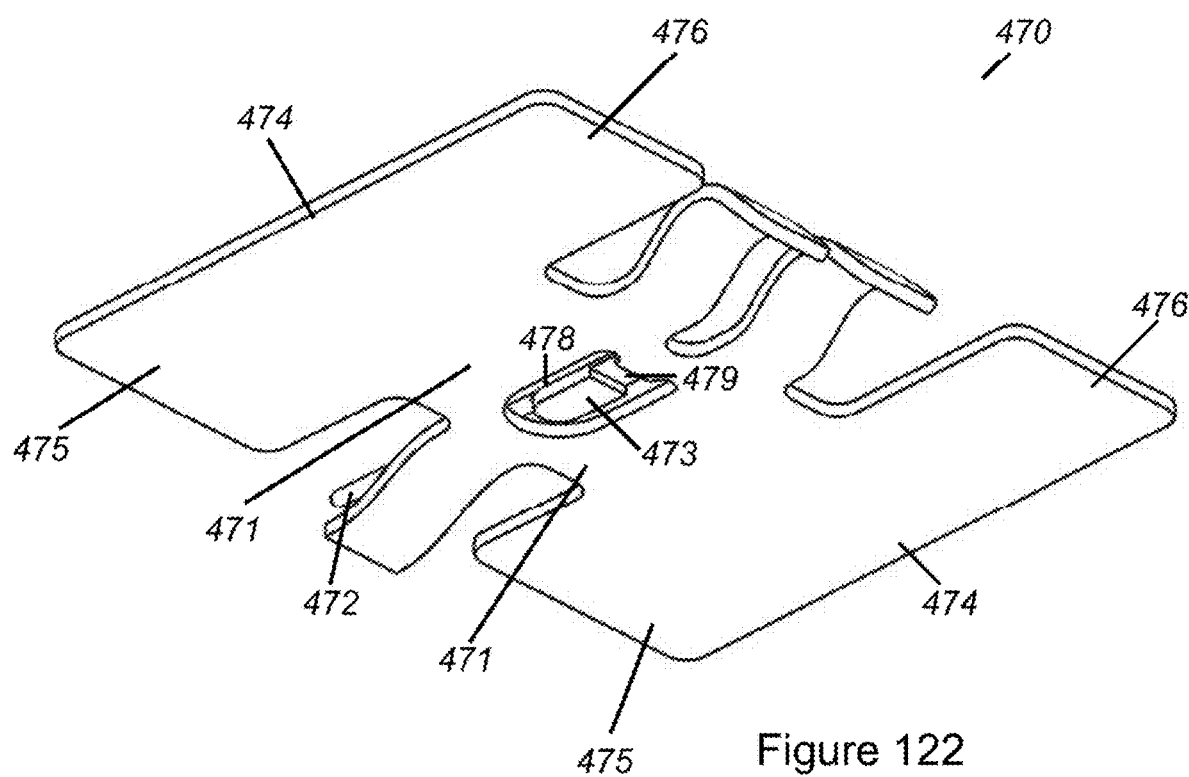

FIG. 122 illustrates an unfixed, load point end 470 of a bimorph arm according to an embodiment. The adjacent flat surfaces 471 are provided to affix SMA material, such as an SMA wire 472. The SMA wire 472 is affixed to the flat surface 471 by a resistance weld region 473, which is isolated, at least in part, by a non-linear aperture 478.

The resistance weld region 473 could be mounted using a partial etch slot 479 in the non-linear aperture 478. In some configurations, the non-linear aperture 478 physically breaks the flat surface 471 and define the position of the resistance weld region 473. The apertures 178 and 179, according to some embodiments, are configured to relieve interference between the wire 172 and flat surface 171 near the resistance weld region 173. While the apertures 178 and 179 are illustrated as full through features, the apertures 178 and 179 may be partially etched in some examples.

The increased surface area from the radiant surface areas 474 enable cooling to prevent shape memory alloy phase transition during actuation.

Figure 123:
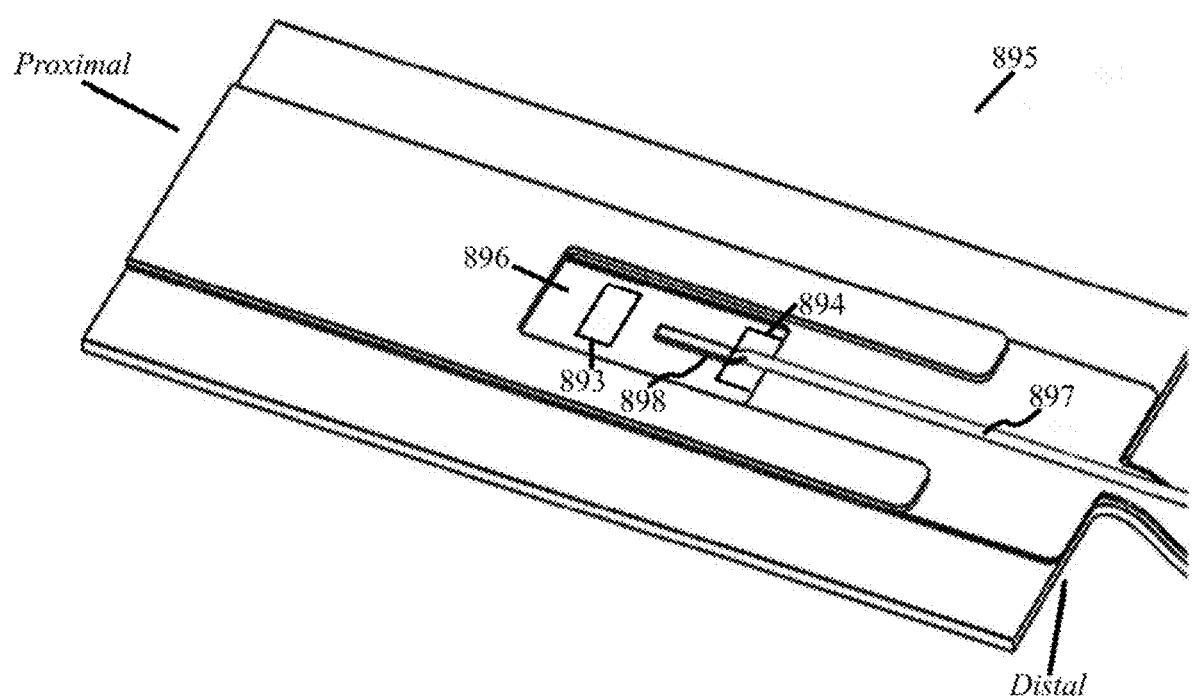
Figure 124:
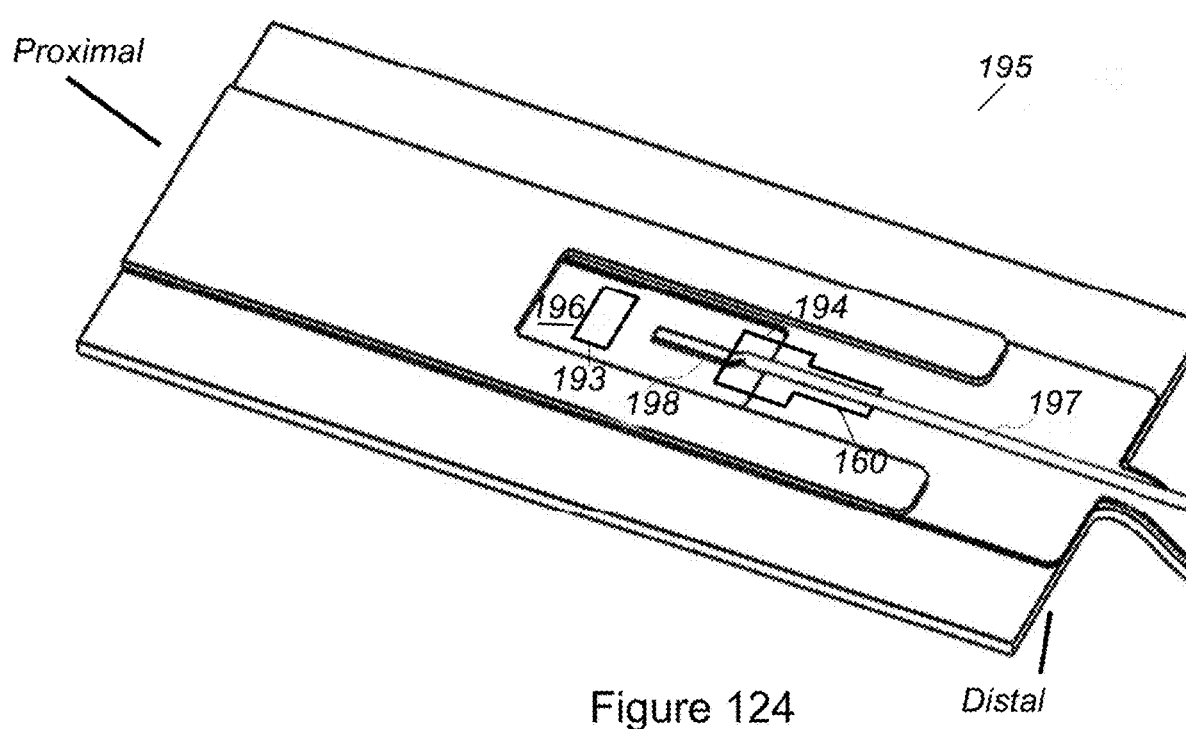
Figure 125:
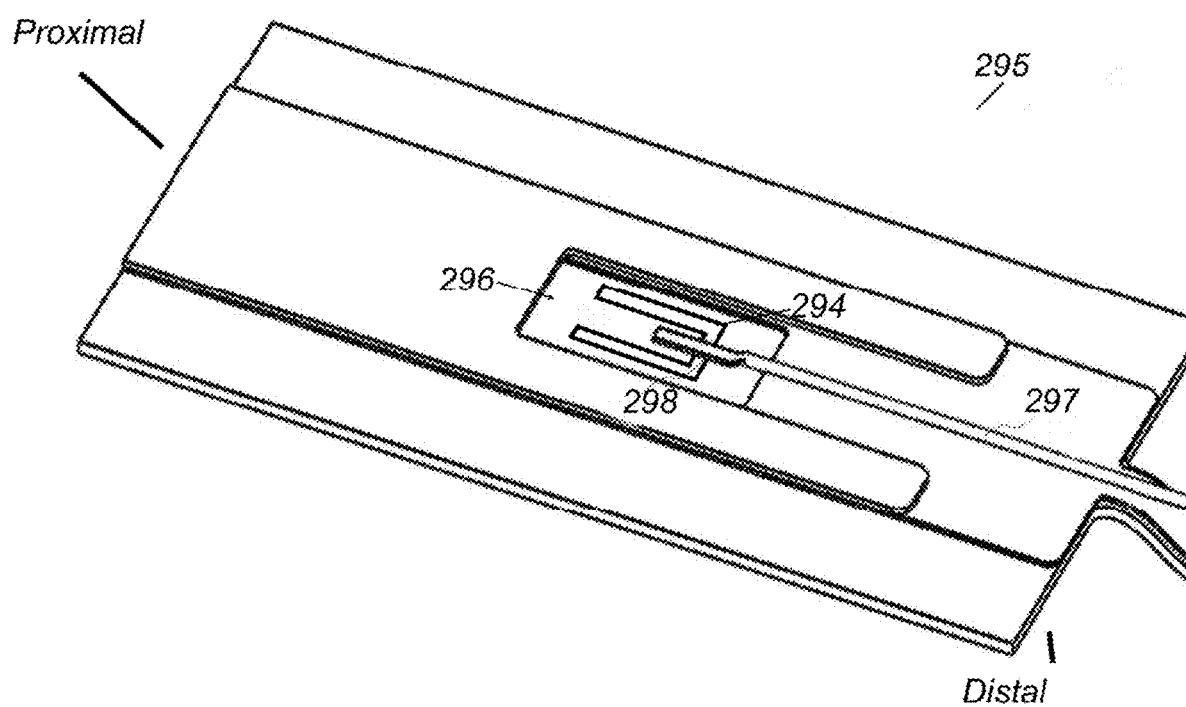

The disclosed embodiments can be applied to fixed ends of the bimorph arm. FIGS. 123-125 are provided herein as example embodiments of fixed ends incorporating the disclosed embodiments.

FIG. 123 illustrates a fixed end of a bimorph arm according to an embodiment. The fixed end 895 of a bimorph arm includes a flat surface 896 to affix SMA material, such as an SMA wire 897. The SMA wire 897 is affixed to the flat surface 896 by a resistance weld region 898. The resistance weld region 898 is formed using techniques including those known in the art.

The fixed end 895 includes a proximal aperture 893 and a distal aperture 894 separated by the resistance weld region 898. The proximal aperture 893 and distal aperture 894 are formed using techniques including those known in the art.

The proximal aperture 893 and a distal aperture 894 physically breaks the flat surface 896 and define the position of the resistance weld 898. The apertures 893 and 894, according to some embodiments, are configured to relieve interference between the SMA wire 897 and the flat surface 896 near the resistance weld region 898. While the apertures 893 and 894 are illustrated as full through features, the apertures 893 and 894 may be partially etched in some examples.

FIG. 124 illustrates a fixed end of a bimorph arm according to an embodiment. The fixed end 195 of a bimorph arm includes a flat surface 196 to affix SMA material, such as an SMA wire 197. The SMA wire 197 is affixed to the flat surface 196 by a resistance weld at a resistance weld region 198. The resistance weld region 198 is formed using techniques including those known in the art.

The fixed end 195 includes a proximal aperture 193 and a distal aperture 194 separated by the resistance weld region 198. The proximal aperture 193 and distal aperture 194 are formed using techniques including those known in the art.

The fixed end 195 also includes an elongated aperture 160 corresponding to a section of the SMA wire 197. The elongated aperture 160 can be removed to provide a wire clearance for the SMA wire 197. In some embodiments, the elongated aperture 160 extends from the distal aperture 194.

The proximal aperture 193 and a distal aperture 194 physically isolate, at least in part, the resistance weld region 198. The elongated aperture 160 physically break the flat surface 196 and define the position of the SMA wire 197. The apertures 193 and 194, according to some embodiments, are configured to relieve interference between the SMA wire 197 and the flat surface 196 near the resistance weld region 198. While the apertures 193 and 194 are illustrated as full through features, the apertures 193 and 194 may be partially etched in some examples.

FIG. 125 illustrates a fixed end 295 of a bimorph arm according to an embodiment. The fixed end 295 of a bimorph arm includes a flat surface 296 to affix SMA material, such as an SMA wire 297. The SMA wire 297 is affixed to the flat surface 296 by a resistance weld at a resistance weld region 298.

The resistance weld region 298 is isolated, at least in part, by a non-linear aperture 294. In some configurations, the non-linear aperture 294 is u-shaped, to physically isolate up to 90% of the resistance weld region 298. The resistance weld 298 could be mounted on a weld tongue defined by the non-linear aperture 294.

The non-linear aperture 294 physically break the flat surface 296 and define the position of the resistance weld region 298. The linear aperture 294, according to some embodiments, is configured to relieve interference between the SMA wire 297 and the flat surface 296 near the resistance weld region 298. In some alternative embodiments, the resistance weld region 298 may be fully etched from the fixed end 295. Alternatively, the resistance weld region 298 could also contain a partial etch slot to reduce a contact area.

Figure 126:
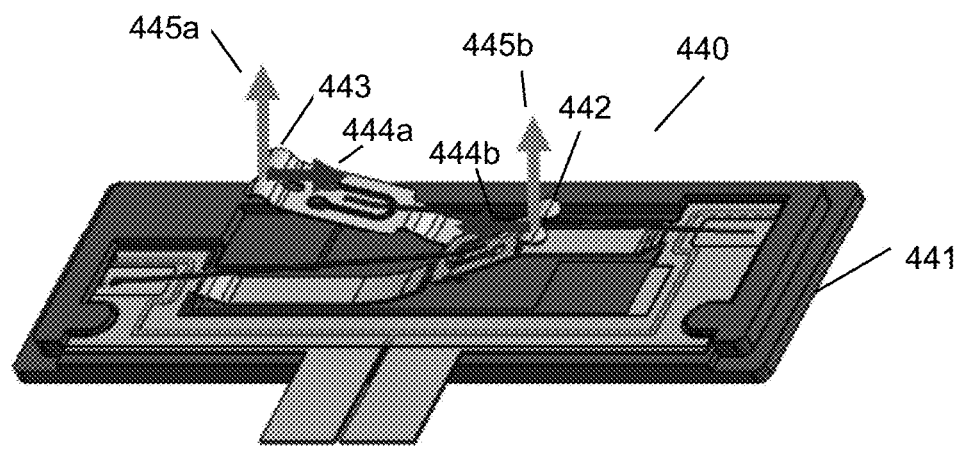

FIG. 126 illustrates a balanced bimorph actuator according to an embodiment. The balanced bimorph actuator 440 includes two bimorph arms 442, 443 formed and configured using techniques including those described herein. For some embodiments the bimorph actuator 440 is fixed to a base 441, such as a carriage for mounting to an outer housing. The bimorph actuator 440 is fixed to the base using techniques including those known in the art, such as adhesive and solder. The balanced bimorph actuator 440 is configured to reduce the net friction force of the bimorph actuator 440 by minimizing or canceling out their own friction components 444a,b since it include two bimorph arms 442, 443 that are arranged in opposite directions. The friction force component 444a,b of each bimorph arm 442, 443 acts in a direction different from the wanted force stroke 445a,b of each bimorph arm 442, 443. According to some embodiments, a balanced bimorph actuator 440 includes at least a first bimorph arm 442 and at least another bimorph arm 443 configured to have a friction force component 444a,b that acts in an opposite direction of the first bimorph arm 442. Thus, the balanced bimorph actuator 440 is configured to balance the sliding friction caused by one or more bimorph arms because of friction force components. This enables more accurate control with less or no need to actively counteract unwanted friction forces. The balanced bimorph actuator including those described herein overcome problems of other bimorph actuators that create a frictional force component at the tip. These other bimorph actuators create a push in the a Y direction and also create an unwanted force in the X direction due to sliding along the surface of the pushed member of the actuator in the X direction. This will create a small amount of unwanted motion in the X direction that the control system will have to compensate for. However, these compensating bimorph actuators will also induce their own unwanted frictional forces. This requires complex control algorithms to achieve good motion performance, for example as used in an optical image stabilization system.

Figure 127:
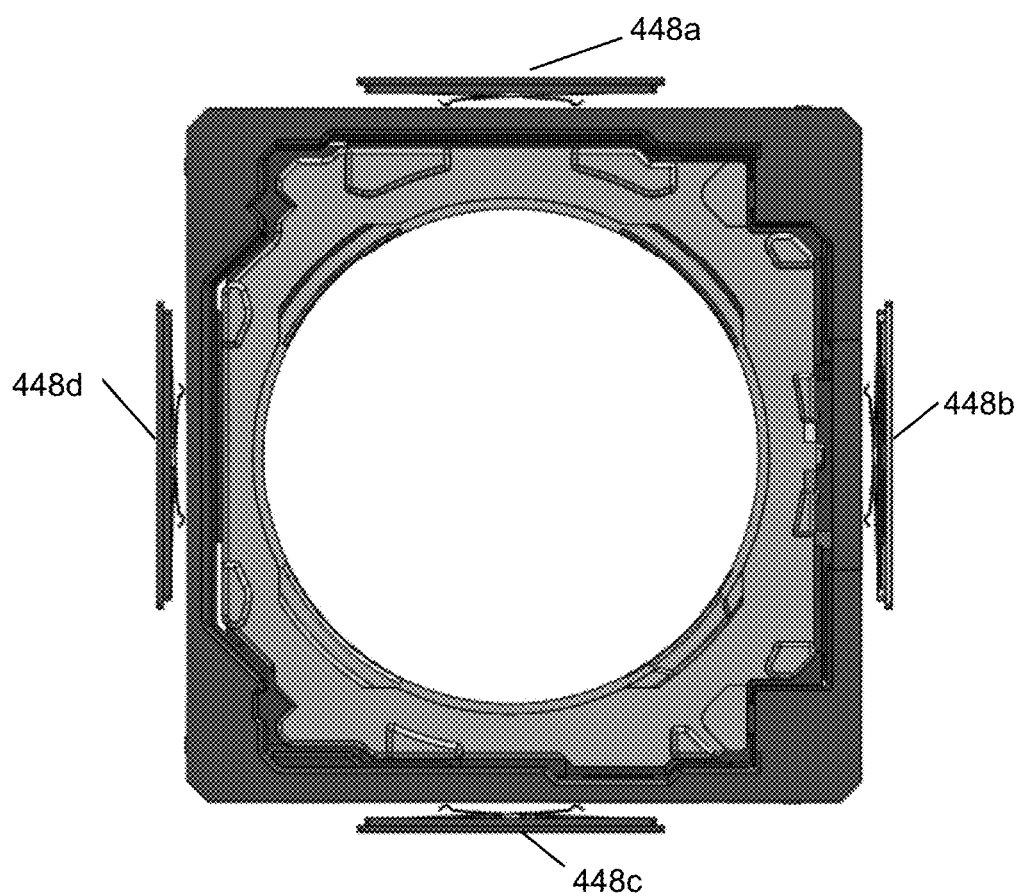

FIG. 127 illustrates an optical image stabilization including balanced bimorph actuators according to an embodiment. The balanced bimorph actuators 448a-d on all sides act to cancel out their own friction components since they are arranged in opposite directions using techniques including those described herein. With approximately net zero friction there is minimal open loop position error. Small errors will be, in some examples, due to typical assembly and component size tolerances and can be easily corrected by using a closed loop control system.

Figure 128:
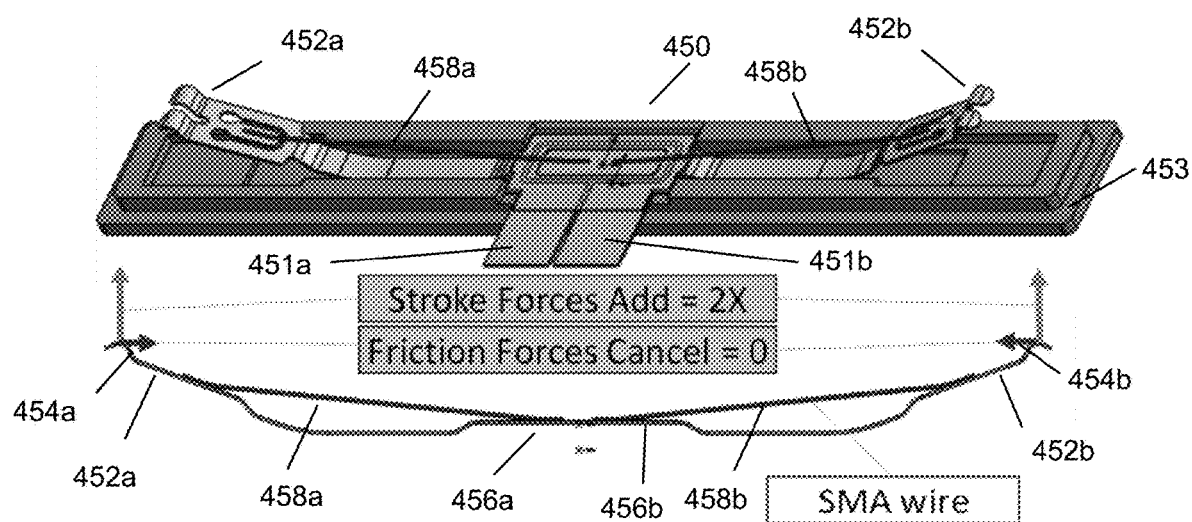

FIG. 128 illustrates a balanced bimorph actuator according to an embodiment. The balanced bimorph actuator 450 includes two bimorph arms 452a,b, such as those described herein, arranged in an inline, mirrored orientation. For some embodiments the bimorph actuator 450 is fixed to a base 453, such as a carriage for mounting to an outer housing. The bimorph actuator 450 is fixed to the base using techniques including those known in the art, such as adhesive and solder. According to some embodiments, a first bimorph arm 452a is configured to have a friction force component 454a in primarily in the direction of the fixed end of the first bimorph arm 456a parallel to a longitudinal axis of the balanced bimorph actuator. The second bimorph arm 452b is configured inline with the first bimorph arm 452a such that the fixed end of the second bimorph arm 456b is adjacent to the fixed end of the first bimorph arm 456a. The second bimorph arm 452b is configured to have a friction force component 454b in a direction opposite to the first bimorph arm 452a. This results in bimorph actuator configured to reduce the net friction force of the bimorph actuator by minimizing or canceling the net friction force. For some embodiments, the net friction force is approximately a net total friction of zero for the balanced bimorph actuator. For some embodiments, each bimorph arm 452a,b of the balanced bimorph actuator includes an SMA wire 458a,b. The SMA wires 458a,b are connected in series and configured receive equal current to both wires. For some embodiments, the first SMA wire 458a is coupled with a actuation control, for example through a 1-channel input to control actuation of the actuator, through a first bimorph arm 452a coupled with a control input pad 451a. The second SMA wire 458b is coupled with ground through a second bimorph arm 452b coupled with a ground pad 451b.

Figure 129:
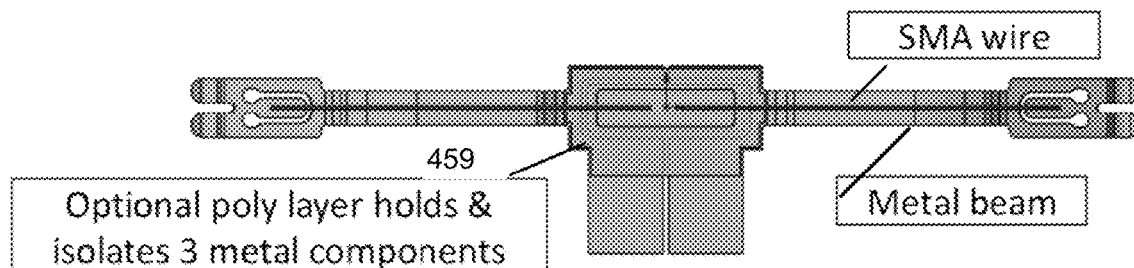

FIG. 129 illustrates a balanced bimorph actuator according to an embodiment including a polyimide layer 459 configured to hold and isolates metal components. Other embodiments of the balanced bimorph actuator do not include a polyimide layer. For some embodiments of the balanced bimorph actuator without a polyimide layer, a control input pad, a ground pad, and a common base island are fixed to a base layer between the fixed ends of the first bimorph arm and the second bimorph arm. For some embodiments the control input pad, the ground pad, and the common base island are fixed to a base layer using an adhesive, such as those known in the art. FIG. 130 illustrates a balanced bimorph actuator according to an embodiment including a common base island 460. The common base island 460 is configured for attaching one end of a first SMA wire and one end of a second SMA wire. For some embodiments, the common base island 460 is electrically isolated from a control input pad 461a and a ground pad 461b before any SMA wires are affixed to the common base island 460. The common base island 460 is formed on the fixed end for a first bimorph arm 462a and a second bimorph arm 462b.

FIG. 131 illustrates a balanced bimorph actuator according to an embodiment. The balanced bimorph actuator includes two bimorph arms 464a,b, such as those described herein, arranged in an reversed inline orientation. For some embodiments the bimorph actuator is fixed to a base 463, such as a carriage for mounting to an outer housing. The bimorph actuator is fixed to the base using techniques including those known in the art, such as adhesive and solder. According to some embodiments, a first bimorph arm 464a is configured to have a friction force component 466a in primarily in the direction of the fixed end 468a of the first bimorph arm 464a parallel to a longitudinal axis of the balanced bimorph actuator. The second bimorph arm 464b is configured inline with the first bimorph arm 464a such that the fixed ends 468a,b of the bimorph arms 464a,b are at opposing ends of the bimorph actuator. Thus, the unfixed end of the first bimorph arm 469a and the unfixed end of the second bimorph 469b are arranged near each other. The second bimorph arm 464b is configured to have a friction force component 466b in a direction opposite to the first bimorph arm 464a. This results in bimorph actuator configured to reduce the net friction force of the bimorph actuator by minimizing or canceling the net friction force. For some embodiments, the net friction force is approximately a net total friction of zero for the balanced bimorph actuator. For some embodiments, each bimorph arm 464a,b of the balanced bimorph actuator includes an SMA wire 467a,b. The SMA wires 467a,b are connected in series and configured receive equal current to both wires, for example through a 1-channel input to control actuation of the actuator. For some embodiments, the first SMA wire 467a is coupled with an actuation control, for example through a 1-channel input to control actuation of the actuator, through a first bimorph arm 452a coupled with a control input pad 451a. The second SMA wire 458b is coupled with ground through a second bimorph arm 452b coupled with a ground pad 451b.

FIG. 132 illustrates a balanced bimorph actuator according to an embodiment using techniques described herein including a polyimide layer 570 configured to hold and isolate metal components. Other embodiments of the balanced bimorph actuator do not include a polyimide layer. For some embodiments of the balanced bimorph actuator without a polyimide layer, a control input pad and a ground pad are fixed adjacent to the first bimorph arm and the second bimorph arm. For some embodiments the control input pad and a ground pad are fixed to a base layer using an adhesive, such as those known in the art. FIG. 133 illustrates a balanced bimorph actuator using techniques described herein according to an embodiment including a control input pad 572 and a ground pad 573.

FIG. 134 illustrates a balanced bimorph actuator according to an embodiment. The balanced bimorph actuator includes two bimorph arms 574a,b, such as those described herein, arranged in an inline, mirrored orientation. For some embodiments the bimorph actuator is fixed to a base 571, such as a carriage for mounting to an outer housing. The bimorph actuator is fixed to the base using techniques including those known in the art, such as adhesive and solder. According to some embodiments, a first bimorph arm 574a is configured to have a friction force component 575a primarily in the direction of the fixed end of the first bimorph arm 576a parallel to a longitudinal axis of the balanced bimorph actuator. The second bimorph arm 574b is configured inline with the first bimorph arm 574a such that the fixed end of the second bimorph arm 576b is adjacent to the fixed end of the first bimorph arm 576a. The second bimorph arm 574b is configured to have a friction force component 575b in a direction opposite to the friction force component of the first bimorph arm 575a. This results in bimorph actuator configured to reduce the net friction force of the bimorph actuator by minimizing or canceling the net friction force. For some embodiments, the net friction force is approximately a net total friction of zero for the balanced bimorph actuator. For some embodiments, a single SMA wire 578 is used and each end of the SMA wire 578 is coupled to a respective unfixed end of each bimorph arm 577*a,b*. The single SMA wire 578 enables more stroke for the balanced bimorph actuator.

FIG. 135 illustrates a balanced bimorph actuator according to an embodiment using techniques described herein including a single SMA wire 579. FIG. 136 illustrates a balanced bimorph actuator according to an embodiment using techniques described herein configured for a single SMA wire, and including a control input pad 480, and a ground pad 481. For some embodiments, the balanced bimorph actuator is configured to include a polyimide layer configured to hold and isolate metal components. Other embodiments of the balanced bimorph actuator do not include a polyimide layer. For some embodiments of the balanced bimorph actuator without a polyimide layer, a control input pad and a ground pad are fixed to a base layer between the fixed ends of the first bimorph arm and the second bimorph arm. For some embodiments the control input pad and a ground pad are fixed to a base layer using an adhesive, such as those known in the art.

FIG. 137 illustrates a balanced bimorph actuator according to an embodiment. The balanced bimorph actuator includes two bimorph arms 482*a,b*, such as those described herein, arranged in a staggered orientation. For some embodiments the bimorph actuator is fixed to a base 489, such as a carriage for mounting to an outer housing. The bimorph actuator is fixed to the base using techniques including those known in the art, such as adhesive and solder. According to some embodiments, a first bimorph arm 482*a* is configured to have a friction force component 483*a* primarily in the direction of the fixed end of the first bimorph arm 484*a* parallel to a longitudinal axis of the first bimorph arm. The second bimorph arm 482*b* is configured to be staggered with the first bimorph arm 482*a* such longitudinal axis of the second bimorph arm is approximately parallel to the longitudinal axis of the first bimorph arm. Further, the fixed ends of the bimorph arms 484*a,b* are at opposing ends of the bimorph actuator. Thus, the unfixed end of the first bimorph arm 484*a* and the unfixed end of the second bimorph 484*b* are staggered with respect to each other. The second bimorph arm 482*a* is configured to have a friction force component 483*a* in a direction opposite to the first bimorph arm 482*a*. This results in bimorph actuator configured to reduce the net friction force of the bimorph actuator by minimizing or canceling the net friction force. For some embodiments, the net friction force is approximately a net total friction of zero for the balanced bimorph actuator. For some embodiments, each bimorph arm 482*a,b* of the balanced bimorph actuator includes an SMA wire 485*a,b*. The SMA wires 485*a,b* are connected in series and configured receive equal current to both wires, for example through a 1-channel input to control actuation of the actuator, such as those described herein.

FIG. 138 illustrates a balanced bimorph actuator with a staggered orientation according to an embodiment including a polyimide layer 486 configured to hold and isolate metal components. Other embodiments of the balanced bimorph actuator do not include a polyimide layer. For some embodiments of the balanced bimorph actuator without a polyimide layer, a control input pad and a ground pad are fixed adjacent to the first bimorph arm and the second bimorph arm. For some embodiments the control input pad and a ground pad are fixed to a base layer using an adhesive, such as those known in the art. FIG. 139 illustrates a balanced bimorph actuator according to an embodiment including a control input pad 487 and a ground pad 488.

FIG. 140 illustrates an optical image stabilization system including balanced bimorph actuators according to an embodiment. The balanced bimorph actuators on all sides act to cancel out their own friction components since they are arranged in opposite directions. With approximately net zero friction there is minimal open loop position error. Small errors will be, in some examples, due to typical assembly and component size tolerances and can be easily corrected by using a closed loop control system.

FIG. 141 illustrates an exploded view of an optical image stabilization system including balanced bimorph actuators according to an embodiment. The optical image stabilization is configured to receive bimorph actuators, such as those described herein, that self locates flush into a pocket 510*a-d* around the perimeter of the outer housing 511. This arrangement enables a smaller X/Y footprint of the bimorph module 512*a-d* by having bimorph actuators 514*a-d*, such as the balanced bimorph actuators described herein, share the same X/Y space as the outer housing 511. This also simplifies assembly of the bimorph module 512*a-d* by enabling bimorph actuators 510*a-d* to be inserted at the final step from the outside. The outer housing 511 can be made from molded plastic, metal or other materials.

FIG. 142 illustrates an optical image stabilization system including balanced bimorph actuators according to an embodiment. The optical image stabilization outer housing 516 is configured to receive bimorph actuators 518*a-d*, such as those described herein, that self locates flush into a pocket on the outer housing 516. This arrangement enables a smaller X/Y footprint of the bimorph module 520*a-d* by having bimorph actuators 518*a-d*, such as the balanced bimorph actuators described herein, share the same X/Y space as the outer housing. This also simplifies assembly of the bimorph module 520*a-d* by enabling bimorph actuators 518*a-d* to be inserted at the final step from the outside. The outer housing 516 can be made from molded plastic, metal or other materials.

FIG. 143 illustrates a sensor shift optical image stabilization system including bimorph actuators according to an embodiment. The optical image stabilization system is configured to receive balanced bimorph actuators, such as those described herein, configured as a balanced carriage/module 522*a-d*. The bimorph carriage/module 522*a-d* configured to insert from the outside of the sensor shift OIS module. For some embodiments, the sensor shift OIS uses the design of the bimorph actuators off center to also induce rotation of the image sensor 524 mounted on a moving image sensor carriage 528 which can be controlled for suppressing roll excitation as well as X/Y excitation. This arrangement enables a smaller X/Y footprint of the bimorph module 522*a-d* by having bimorph actuators, such as the balanced bimorph actuators described herein, share the same X/Y space as the outer housing 526. This also simplifies assembly of the bimorph module 522*a-d* by enabling bimorph actuators to be inserted at the final step from the outside. The outer housing 526 can be made from molded plastic, metal or other materials.

FIG. 144 illustrates an optical image stabilization system including balanced bimorph actuators according to an embodiment. The optical image stabilization is configured to receive bimorph actuators, such as those described herein, that self locates flush into a pocket 530 on the outer housing 532 of an optical image stabilization. This arrangement enables a smaller X/Y footprint of the bimorph module 534*a-d* by having bimorph actuators, such as the balanced bimorph actuators described herein, share the same X/Y space as the outer housing 532. This also simplifies assembly of the bimorph module 534*a-d* by enabling bimorph actuators to be inserted at the final step from the outside. The outer housing 532 can be made from molded plastic, metal or other materials.

FIG. 145 illustrates a metal outer housing 536 for an optical image stabilization system, according to embodiments described herein, manufactured as formed metal that is attached with molded plastic 538*a-d* in an insert molding process. FIG. 146 illustrates a metal outer can/housing 536 embodiment including formed pockets 542*a-d* into the 4 sides of the metal outer can/housing 536 configured to allow for the flush mounting of bimorph actuators 544*a-d*, such as those described herein.

FIG. 147 illustrates an exploded view of an optical image stabilization (OIS) system including balanced bimorph actuators and multiple centering springs according to an embodiment. The optical image stabilization system includes an auto focus (AF) actuator 400 having four AF solder connections 402 or other electrical connections that pass current between the AF actuator 400 and a focus control circuit. For some embodiments, the auto focus actuator 400 includes one or more SMA actuators such as those disclosed herein. The AF actuator 400, according to some embodiments, is disposed on a base 404 that is coupled with the AF actuator 400. The base 404 includes four isolated sections, according to some embodiments, with each of the isolated sections attached to a spring 406*a-d*. The base 404 and the springs 406*a-d*, for some embodiments, are each formed from a single flat component that is split into four isolated sections to create four electrical flat spring circuits to control the movement of an object, for example, the X/Y axes movement of an optical image stabilization and/or Z axis movement of an auto focus.

For some embodiments, the isolated sections of the base 404 and or the springs 406*a-d* are formed using an etching process or other manufacturing technique such as those known in the art. To form the four flat spring circuits, the springs 406*a-d* are welded to the base 404 such that each one of the four springs 406*a-d* is welded to one of the four isolated sections of the base 404. The welds, for some embodiments, are at weld points 408*a-d* included on each of the four flat spring circuits secure the springs 406*a-d* to the isolated sections of the base 404 to create four isolated electrical paths. For some embodiments, the four isolated electrical paths are configured to be used for a closed loop AF. Four OIS solder connections 410*a-d* are configured to connect the flat spring circuits to the OIS control circuit included in the bimorph OIS actuator 412. The OIS control circuit is configured to connect to the printed circuit board (PCB) to enable a camera control circuit to operate an AF actuator 400 and an OIS actuator 412, such as embodiments disclosed herein.

FIG. 148 illustrates a top view of an OIS system including four flat spring circuits. The flat spring circuits 414*a-d*, according to some embodiments, are configured as a stainless steel (SST) circuit to enable a low cost solution for controlling movement of an image sensor. For some embodiments, the flat spring circuits 414*a-d* are formed of 100 micrometer stainless steel that is gold plated. The stiffness of the springs including the flat spring circuits 414*a-d* enable a reliable and steady spring force that can be used for centering the AF actuator with respect to an image sensor or otherwise controlling movement of the AF actuator. The spring 416*a-d* included in the flat spring circuits 414*a-d* is configured to produce low stress during large changes in movement, for example movement in a positive or negative direction, in an x axis and or a y axis. For example, for some embodiments, the maximum stress on a spring during stroke motions of 330 microns is 425 megapascals (Mpa). Minimizing the stress on the spring extends the usable life (e.g., have a fatigue below the infinite fatigue limit of <638 MPa) thereby improving the reliability of the OIS system over other motion control solutions. The spring also is configured to provide a down force on the bearings of a support assembly (e.g., bearings) to provide near zero dynamic tilt impact on an AF module and or an OIS.

FIG. 149 illustrates a base including four springs. The springs 418*a-d*, according to an embodiment, are free formed to create a preload (e.g., the springs may be free formed to have the free end of the spring extend from the base by 6.4 millimeters (mm) in a positive or a negative direction in a z-axis). For some embodiments, a spring is free formed to have a preload in a range including 15-35 millinewtons. The preload of a spring in an OIS system is configured to ensure a moving mass, such as an AF actuator, is held against one or more bearings.

Free forming the spring 418*a-d* may reduce the deflection of the spring 418*a-d* (e.g., the deflection of the spring is reduced to plus or minus 0.1 mm) to reduce the overall height requirement of the flat spring circuit, for example the amount of space in the z axis required for proper operation. FIG. 150 illustrates the spring 429 after it has been welded to the base to create the flat spring circuit. One or more flattening bends in the spring may be formed in the spring before free forming the spring. For some embodiments a spring 429 includes a flattening bend near each end of the spring 429. For example, a spring includes a first flattening bend 430 configured to have a bend in a negative direction, for example a negative 3.5 degrees in a z-axis, and or a second flattening bend 431 configured to have a bend in a positive direction, for example a positive 3.5 degrees in a z-axis. For some embodiments, the flattening bend is in a range including 0 degrees to plus or minus 7 degrees. Other embodiments of the spring include flattening bends configured to have bends in a range as desired to meet design constraints. The one or more flattening bends of the spring enable the spring to achieve a downforce (e.g., +/−25 microNewtons (mN)) while minimizing the amount of spring deflection (e.g., <0.1 mm of arm deflection under normal conditions and <0.2 mm of arm deflection at full spring height). The one or more flattening bends of the spring also configure the spring to move in one direction (e.g., a positive z-axis direction) to minimize the clearance space required below the flat spring circuit. Minimizing the amount of spring deflection and minimizing the spring deflection in a positive z-axis direction reduces the amount of space occupied by the flat spring circuit (e.g., +/−0.2 mm in the z-axis). Accordingly, flattening one or more bends of the spring in the flat spring circuit minimizes the impact of the OIS actuator on the overall camera height enabling the assembly of smaller and more compact electronic camera systems.

FIG. 151 illustrates a bimorph actuator including a crimp according to an embodiment. According to various embodiments, a bimorph actuator 1512 includes a beam 1514, such as those described herein, and one or more SMA materials 1516 such as an SMA ribbon or SMA wire 1516. For some embodiments, the SMA material, such as an SMA wire 1516, is affixed to a fixed end 1518 of the bimorph actuator, such as those fixed ends described herein, and to a load point end 1520 of the bimorph actuator, such as those described herein, so that the beam 1514 is between both ends where the SMA material is affixed. The fixed end 1518 includes a crimp portion 1522 configured to clamp down on a portion of the SMA wire 1516 to affix the wire to the fixed end 1518.

The load point end 1520 includes a crimp portion 1524 configured to clamp down on a portion of the SMA wire 1516 to affix the wire to the load point end 1520. For various embodiments, the ends of the SMA material are electrically and mechanically coupled with contacts configured to supply current to the SMA material using techniques including those known in the art.

It will be understood that terms such as "top," "bottom," "above," "below," and x-direction, y-direction, and z-direction as used herein as terms of convenience that denote the spatial relationships of parts relative to each other rather than to any specific spatial or gravitational orientation. Thus, the terms are intended to encompass an assembly of component parts regardless of whether the assembly is oriented in the particular orientation shown in the drawings and described in the specification, upside down from that orientation, or any other rotational variation.

It will be appreciated that the term "present invention" as used herein should not be construed to mean that only a single invention having a single essential element or group of elements is presented. Similarly, it will also be appreciated that the term "present invention" encompasses a number of separate innovations, which can each be considered separate inventions. Although the present invention has been described in detail with regards to the preferred embodiments and drawings thereof, it should be apparent to those skilled in the art that various adaptations and modifications of embodiments of the present invention may be accomplished without departing from the spirit and the scope of the invention. Additionally, the techniques described herein could be used to make a device having two, three, four, five, six, or more generally n number of bimorph actuators and buckle actuators. Accordingly, it is to be understood that the detailed description and the accompanying drawings as set forth hereinabove are not intended to limit the breadth of the present invention, which should be inferred only from the following claims and their appropriately construed legal equivalents.

What is claimed is:

1. A device comprising:
   a base;
   an actuator coupled to the base;
   one or more springs configured to provide a downforce on the bearing to maintain contact between the actuator and a bearing, wherein one or more flattening bends are formed in each of the one or more springs, and wherein the one or more flattening bends include a first flattening bend bending in a negative direction relative to a z-axis and a second flattening bend bending in a positive direction relative to the z-axis.

2. The device of claim 1, wherein the actuator comprises a shape memory alloy (SMA) material that actuates in response to an electrical current being provided to the SMA material.

3. The device of claim 2, wherein the one or more springs are further configured to center the actuator to return a payload of the actuator in a negative z-direction when the electrical current is removed from the SMA material.

4. The device of claim 2, wherein the actuator includes a slide base that is in contact with the bearing.

5. The device of claim 2, wherein the actuator comprises a first actuator, and the device further includes:
   the first actuator and a second actuator, wherein a SMA material is disposed between each of the the first actuator and the second actuator to provide z-direction movement.

6. The device of claim 1, wherein the one or more springs are free formed to create a preload of the one or more springs of between 15-35 millinewtons.

7. The device of claim 6, wherein a deflection of the one or more springs is reduced to plus or minus 0.1 mm due to the free forming the one or more springs.

8. The device of claim 1, wherein the first flattening bend is around negative 3.5 degrees or ranging between negative 0.1-7 degrees relative to the z-axis, and the second flattening bend is around positive 3.5 degrees or ranging between 0.1-7 degrees relative to the z-axis.

9. The device of claim 1, wherein the payload is a lens carriage connected at least to the actuator.

10. The device of claim 1, wherein the one or more springs provide an electrical connection to the actuator.

11. The device of claim 1, further comprising:
    an outer housing that is configured with one or more pockets around a perimeter of the outer housing, each one or more pockets configured to receive one or more bimorph actuators from the outside of the outer housing.

12. The actuator of claim 11, wherein the one or more bimorph actuators including two bimorph arms arranged in an inline, mirrored orientation or in a staggered orientation.

13. An actuator comprising:
    a base;
    a slide bearing in contact with the base; and
    a spring in contact with the slide bearing, wherein one or more flattening bends are formed in the spring, and wherein the one or more flattening bends include a first flattening bend bending in a negative direction relative to a z-axis and a second flattening bend bending in a positive direction relative to the z-axis.

* * * * *